US012371613B2

United States Patent

(12) United States Patent
Furue et al.

(10) Patent No.: US 12,371,613 B2
(45) Date of Patent: Jul. 29, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Ryuhei Furue, Yokohama (JP); Hirokazu Kuwabara, Yokohama (JP); Makoto Yamamoto, Yokohama (JP); Yuji Suzaki, Yokohama (JP); Yuuki Miyazaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 844 days.

(21) Appl. No.: 17/450,684

(22) Filed: Oct. 12, 2021

(65) Prior Publication Data

US 2022/0209117 A1 Jun. 30, 2022

(30) Foreign Application Priority Data

Dec. 30, 2020 (KR) ........................ 10-2020-0187680

(51) Int. Cl.
*H01L 51/50* (2006.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS

2019/0115538 A1 4/2019 Lim et al.
2020/0185626 A1 6/2020 Yuuki
(Continued)

FOREIGN PATENT DOCUMENTS

KR 10-2019-0042791 A 4/2019
KR 10-2019-0132645 A 11/2019
(Continued)

*Primary Examiner* — Gregory D Clark
(74) *Attorney, Agent, or Firm* — Womble Bond Dickinson (US) LLP

(57) ABSTRACT

An organic electroluminescence device of one or more embodiments includes a first electrode, a hole transport region disposed on the first electrode, an emission layer disposed on the hole transport region, an electron transport region disposed on the emission layer and a second electrode disposed on the electron transport region, wherein the first electrode and the second electrode each independently includes at least one selected among Ag, Mg, Cu, Al, Pt, Pd, Au, Ni, Nd, Ir, Cr, Li, Ca, LiF/Ca, LiF/Al, Mo, Ti, In, Sn, Zn, compounds thereof, mixtures thereof, and oxides thereof, and the emission layer includes a polycyclic compound represented by Formula 1, thereby showing long life and high efficiency:

Formula 1

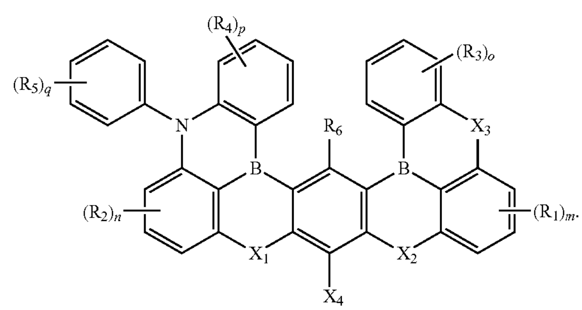

20 Claims, 6 Drawing Sheets

(51) Int. Cl.
*C09K 11/06* (2006.01)
*H10K 85/30* (2023.01)
*H10K 50/11* (2023.01)
*H10K 101/10* (2023.01)

(52) U.S. Cl.
CPC ...... *C09K 2211/1018* (2013.01); *H10K 50/11* (2023.02); *H10K 2101/10* (2023.02)

(56) References Cited

U.S. PATENT DOCUMENTS

2020/0190115 A1 6/2020 Hatakeyama et al.
2022/0115595 A1* 4/2022 Park .................... H10K 85/322

FOREIGN PATENT DOCUMENTS

KR 10-2020-0071192 A 6/2020
KR 10-2020-0107848 A 9/2020
WO WO 2018/074167 A1 4/2018
WO WO 2018/212169 A1 11/2018
WO WO 2020/040298 A1 * 2/2020 ............ H01L 51/50
WO WO 2020/101001 A1 5/2020

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0187680, filed on Dec. 30, 2020, in the Korean Intellectual Property Office, the entire content of which is hereby incorporated by reference.

BACKGROUND

1. Field

One or more aspects of embodiments of the present disclosure herein relate to an organic electroluminescence device and a polycyclic compound for an organic electroluminescence device.

2. Description of Related Art

Recently, the development of an organic electroluminescence display as an image display is being actively conducted. The organic electroluminescence display is different from a liquid crystal display and is a self-luminescent display in which holes and electrons injected from a first electrode and a second electrode recombine in an emission layer so that a light-emitting material including an organic compound in the emission layer emits light to achieve display of images.

In the application of an organic electroluminescence device to a display, the decrease of a driving voltage, the increase of emission efficiency and the life (e.g., lifespan) of the organic electroluminescence device are desired, and development of materials for an organic electroluminescence device capable of stably (or suitably) achieving these characteristics is being continuously conducted.

SUMMARY

One or more aspects of embodiments of the present disclosure are directed toward an organic electroluminescence device and a polycyclic compound for an organic electroluminescence device, and more particularly, an organic electroluminescence device with high efficiency and a polycyclic compound included in an emission layer of an organic electroluminescence device.

One or more embodiments of the present disclosure are directed toward a polycyclic compound represented by Formula 1 below:

Formula 1

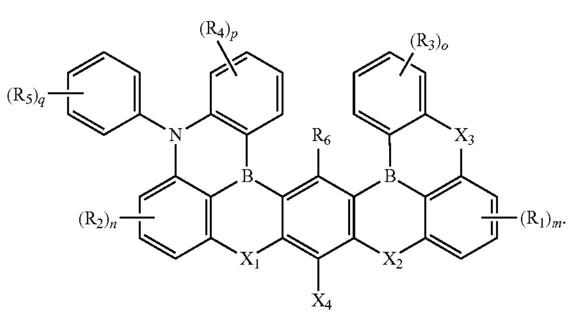

In Formula 1, $X_1$ to $X_3$ may be each independently O, S, Se or $NAr_1$, "m" and "n" may be each independently an integer of 0 to 3, "o" and "p" may be each independently an integer of 0 to 4, "q" may be an integer of 0 to 5, $Ar_1$ may be a substituted or unsubstituted aryl group of 6 to 30 ring-forming carbon atoms, or a substituted or unsubstituted heteroaryl group of 2 to 30 ring-forming carbon atoms, $R_1$ to $R_6$ may be each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, $X_4$ may be a substituted phenyl group, a substituted or unsubstituted aryl group of 7 to 30 ring-forming carbon atoms, or a substituted or unsubstituted heterocycle of 2 to 30 ring-forming carbon atoms, or may be represented by Formula 2 below:

Formula 2

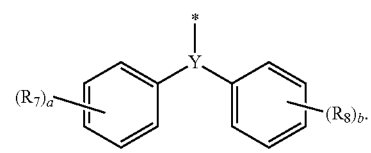

In Formula 2, Y may be B, P, P═O, P═S, or N, $R_7$ and $R_8$ may be each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and "a" and "b" may be each independently an integer of 0 to 5.

In one or more embodiments, Formula 1 may be represented by any one selected from among Formula 3-1 to Formula 3-5 below:

Formula 3-1

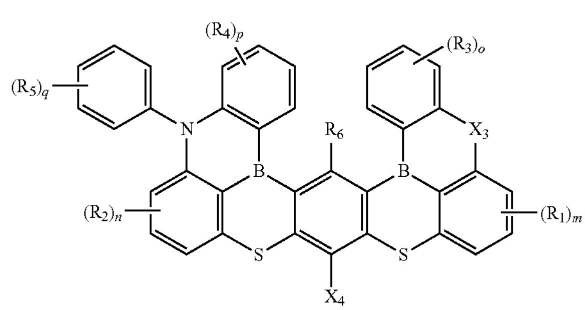

-continued

Formula 3-2

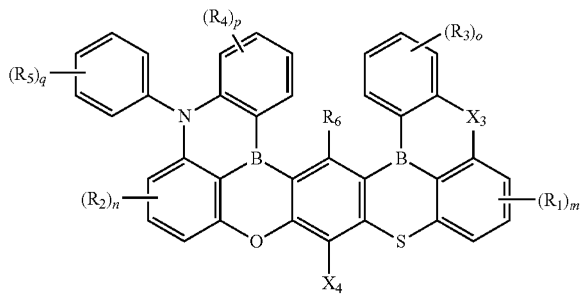

Formula 3-3

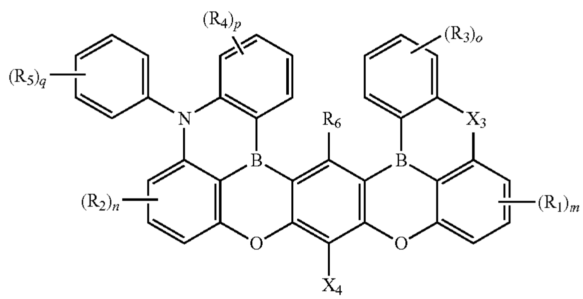

Formula 3-4

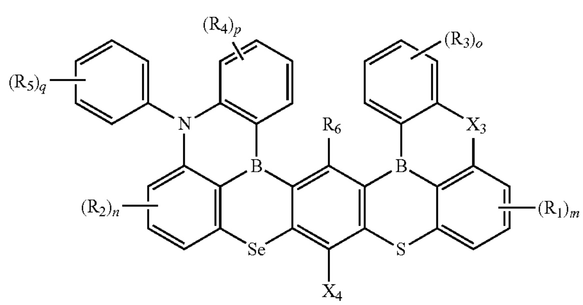

Formula 3-5

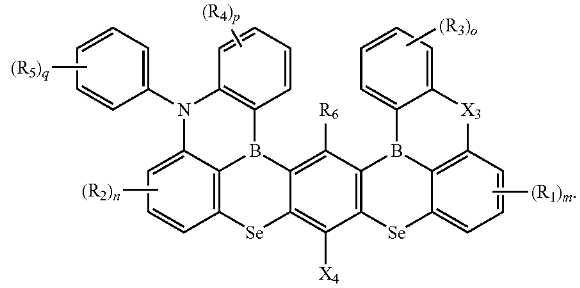

In Formula 3-1 to Formula 3-5, $X_3$, $X_4$, $R_1$ to $R_6$, and "m" to "q" are the same as defined in Formula 1.

In one or more embodiments, in Formula 1, a sum of "m" and "n" may be 1 or more, and at least one selected from among $R_1$ and $R_2$ may be the substituted or unsubstituted amine group.

In one or more embodiments, Formula 1 may be represented by Formula 4 below:

Formula 4

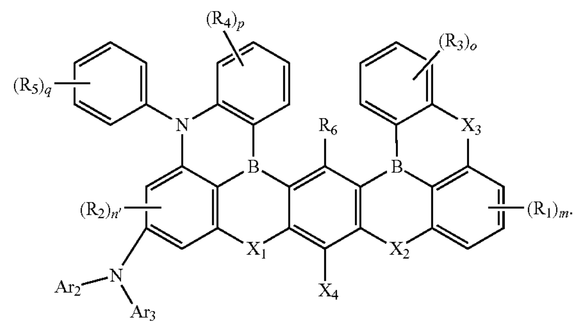

In Formula 4, n' may be an integer of 0 to 2, $Ar_2$ and $Ar_3$ may be each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $X_1$ to $X_4$, $R_1$ to $R_6$, "m" and "o" to "q" are the same as defined in Formula 1.

In one or more embodiments, Formula 4 may be represented by Formula 5 below:

Formula 5

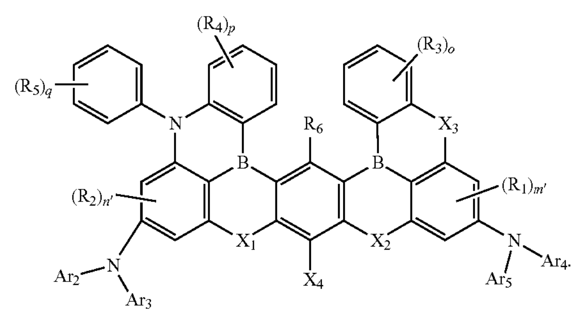

In Formula 5, m' may be an integer of 0 to 2, $Ar_4$ and $Ar_5$ may be each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $X_1$ to $X_4$, $R_1$ to $R_6$, $Ar_2$, $Ar_3$, n' (i.e., "n'"), and "o" to "q" are the same as defined in Formula 4.

In one or more embodiments, $Ar_2$ to $Ar_5$ may be each independently represented by Formula 6 below:

Formula 6

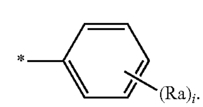

In Formula 6, Ra may be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and "i" may be an integer of 0 to 5.

In one or more embodiments, Formula 1 may be represented by Formula 7 below:

Formula 7

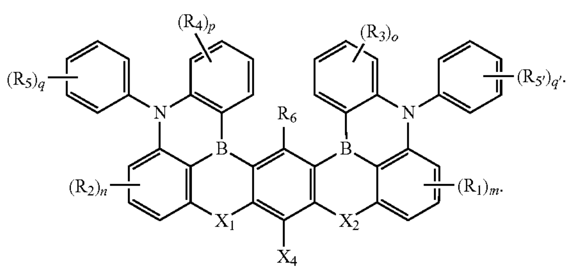

In Formula 7, q' may be an integer of 0 to 5, $R_5$' may be a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and $X_1$, $X_2$, $X_4$, $R_1$ to $R_6$, and "m" to "q" are the same as defined in Formula 1.

In one or more embodiments, Formula 5 may be represented by Formula 8 below:

Formula 8

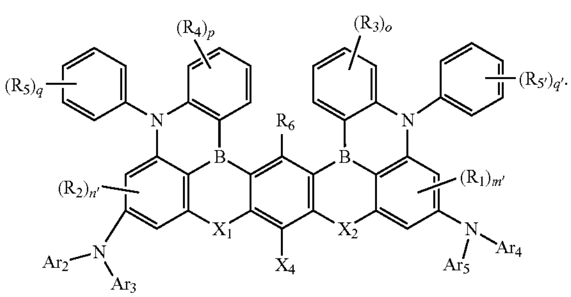

In Formula 8, q' may be an integer of 0 to 5, $R_5$' may be a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and $X_1$, $X_2$, $X_4$, $R_1$ to $R_6$, $Ar_2$ to $Ar_5$, m', n', and "o" to "q" are the same as defined in Formula 5.

In one or more embodiments, Formula 2 may be represented by any one selected from among Formulae 2-1 to 2-6 below:

2-1

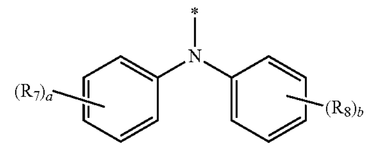

2-2

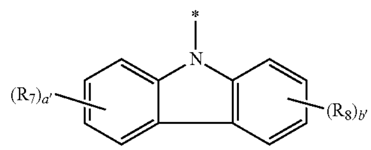

2-3

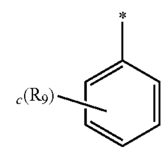

2-4

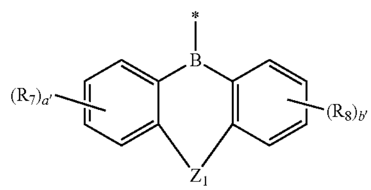

2-5

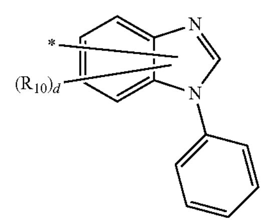

2-6

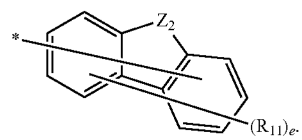

In Formulae 2-1 to 2-6, $Z_1$ may be O, S, or $NAr_6$, $Ar_6$ may be a phenyl group, $Z_2$ may be O, or S, $R_9$ to $R_{11}$ may be each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, a', b', and "d" may be each independently an integer of 0 to 4, "c" may be an integer of 0 to 5, "e" may be an integer of 0 to 7, and $R_7$, $R_8$, "a" and "b" are the same as defined in Formula 1.

In one or more embodiments, the polycyclic compound represented by Formula 1 may be at least one selected among the compounds represented in Compound Group 1.

In one or more embodiments of the present disclosure, there is provided an organic electroluminescence device including a first electrode, a hole transport region on the first electrode, an emission layer on the hole transport region, an electron transport region on the emission layer, and a second electrode on the electron transport region, wherein the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, In, Sn, Zn, compounds thereof, mixtures thereof, and oxides thereof, and the emission layer includes the polycyclic compound of one or more embodiments.

In one or more embodiments, the emission layer may emit delayed fluorescence.

In one or more embodiments, the emission layer may be a delayed fluorescence emission layer including a first compound and a second compound, and the first compound may include the polycyclic compound of one or more embodiments.

In one or more embodiments, the emission layer may be a thermally activated delayed fluorescence emission layer.

BRIEF DESCRIPTION OF THE FIGURES

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
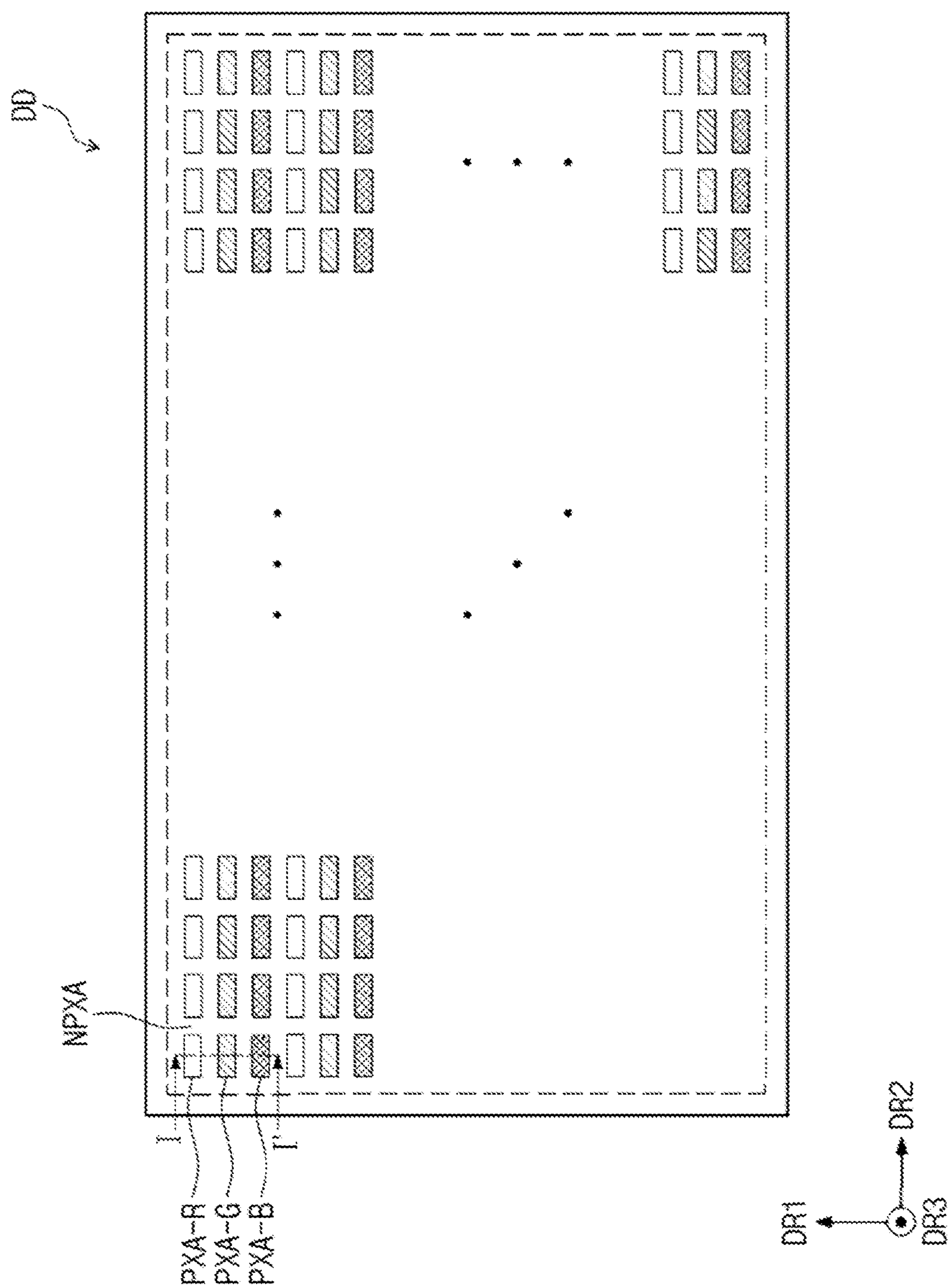
FIG. 1 is a plan view showing a display apparatus according to one or more embodiments of the present disclosure.

The present disclosure may have various modifications and may be embodied in different forms, and certain embodiments will be explained in more detail with reference to the accompanying drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part (without any intervening layers therebetween), or intervening layers may also be present. Similarly, when a layer, a film, a region, a plate, etc. is referred to as being "under" or "below" another part, it can be "directly under" the other part (without any intervening layers therebetween), or intervening layers may also be present. Also, when an element is referred to as being disposed "on" another element, it can be disposed under the other element.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the term "disposed" as used herein may refer to being positioned and/or provided.

Hereinafter, embodiments of the present disclosure will be explained referring to the drawings.

Figure 2:
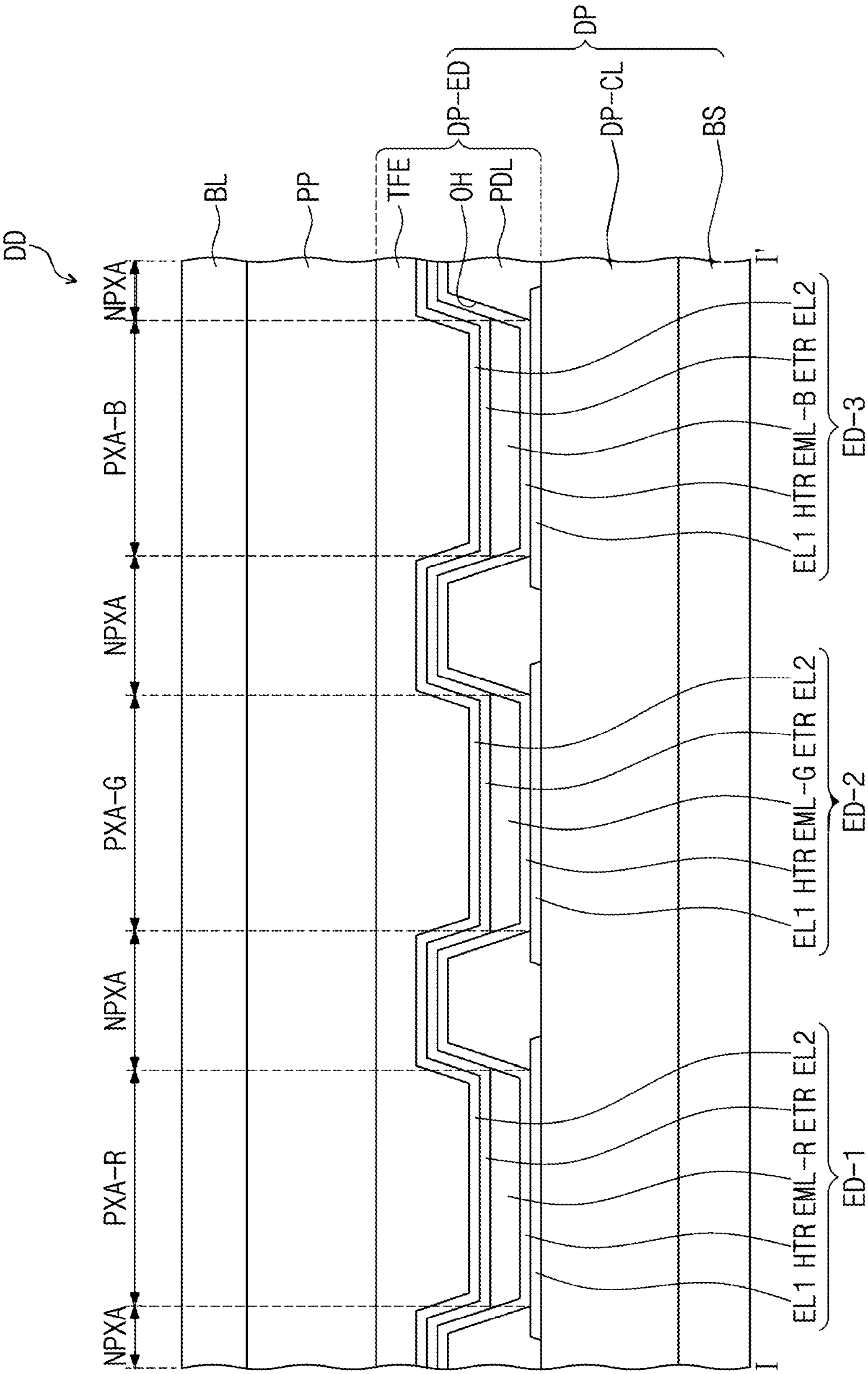
FIG. 2 is a cross-sectional view showing a display apparatus according to one or more embodiments of the present disclosure.

FIG. 1 is a plan view showing one or more embodiments of a display apparatus DD. FIG. 2 is a cross-sectional view of a display apparatus DD of one or more embodiments. FIG. 2 is a cross-sectional view showing a part corresponding to line I-I'.

The display apparatus DD may include a display panel DP and an optical layer PP disposed on the display panel DP. The display panel DP includes organic electroluminescence devices ED-1, ED-2 and ED-3. The display apparatus DD may include multiple organic electroluminescence devices ED-1, ED-2 and ED-3. The optical layer PP may be disposed on the display panel DP and control reflected light by external light at the display panel DP. The optical layer PP may include, for example, a polarization layer and/or a color filter layer. In one or more embodiments, different from the drawings, the optical layer PP may be omitted in the display apparatus DD of one or more embodiments.

The display panel DP may include a base layer BS, a circuit layer DP-CL provided on the base layer BS and a display device layer DP-ED. The display device layer DP-ED may include a pixel definition layer PDL, organic electroluminescence devices ED-1, ED-2 and ED-3 disposed in the pixel definition layer PDL, and an encapsulating layer TFE disposed on the organic electroluminescence devices ED-1, ED-2 and ED-3.

The base layer BS may be a member providing a base surface where the display device layer DP-ED is disposed. The base layer BS may be a glass substrate, a metal substrate, a plastic substrate, etc. However, one or more embodiments of the present disclosure are not limited thereto, and the base layer BS may be an inorganic layer, an organic layer, or a composite material layer (e.g., including an organic material and an inorganic material).

In one or more embodiments, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the organic electroluminescence devices ED-1, ED-2 and ED-3 of the display device layer DP-ED.

Each of the organic electroluminescence devices ED-1, ED-2 and ED-3 may have the structures of organic electroluminescence devices ED of embodiments according to FIG. 3 to FIG. 6, which will be explained in more detail hereinbelow. Each of the organic electroluminescence devices ED-1, ED-2 and ED-3 may include a first electrode EL1, a hole transport region HTR, emission layers EML-R, EML-G and EML-B, respectively, an electron transport region ETR and a second electrode EL2.

In FIG. 2, shown is an embodiment where the emission layers EML-R, EML-G and EML-B of organic electroluminescence devices ED-1, ED-2 and ED-3, which are in opening portions OH defined in a pixel definition layer PDL, are disposed, and a hole transport region HTR, an electron transport region ETR and a second electrode EL2 are provided as common layers in all organic electroluminescence devices ED-1, ED-2 and ED-3. However, one or more embodiments of the present disclosure are not limited thereto. Different from FIG. 2, in one or more embodiments, the hole transport region HTR and the electron transport region ETR may be patterned and provided in the opening portions OH defined in the pixel definition layer PDL. For example, in one or more embodiments, the hole transport region HTR, the emission layers EML-R, EML-G and EML-B, and the electron transport region ETR of the organic electroluminescence devices ED-1, ED-2 and ED-3 may be patterned by an ink jet printing method and provided.

An encapsulating layer TFE may cover the organic electroluminescence devices ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer structure of multiple layers. The encapsulating layer TFE includes at least one insulating layer. The encapsulating layer TFE according to one or more embodiments may include at least one inorganic layer (hereinafter, encapsulating inorganic layer). In some embodiments, the encapsulating layer TFE according to one or more embodiments may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while filling the opening portion OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be areas emitting light produced from the organic electroluminescence devices ED-1, ED-2 and ED-3, respectively. The luminous areas PXA-R, PXA-G and PXA-B may be separated from each other on a plane (e.g., in plan view).

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In one or more embodiments, in the disclosure, each of the luminous areas PXA-R, PXA-G and PXA-B may correspond to each pixel. The pixel definition layer PDL may divide the organic electroluminescence devices ED-1, ED-2 and ED-3. The emission layers EML-R, EML-G and EML-B of the organic electroluminescence devices ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the organic electroluminescence devices ED-1, ED-2 and ED-3. In the display apparatus DD of one or more embodiments, shown in FIG. 1 and FIG. 2, three luminous areas PXA-R, PXA-G and PXA-B emitting red light, green light and blue light respectively are illustrated as one or more embodiments. For example, the display apparatus DD of one or more embodiments may include a red luminous area PXA-R, a green luminous area PXA-G and a blue luminous area PXA-B, which are separated from each other.

In the display apparatus DD according to one or more embodiments, multiple organic electroluminescence devices ED-1, ED-2 and ED-3 may emit light having different wavelength regions. For example, in one or more embodiments, the display apparatus DD may include a first organic electroluminescence device ED-1 emitting (e.g., to emit) red light, a second organic electroluminescence device ED-2 emitting (e.g., to emit) green light, and a third organic electroluminescence device ED-3 emitting (e.g., to emit) blue light. For example, the red luminous area PXA-R, the green luminous area PXA-G, and the blue luminous area PXA-B of the display apparatus DD may respectively correspond to the first organic electroluminescence device ED-1, the second organic electroluminescence device ED-2, and the third organic electroluminescence device ED-3.

However, one or more embodiments of the present disclosure are not limited thereto, and the first to third organic electroluminescence devices ED-1, ED-2 and ED-3 may emit light in the same wavelength region, or at least one thereof may emit light in a different wavelength region. For example, all of the first to third organic electroluminescence devices ED-1, ED-2 and ED-3 may emit blue light.

The luminous areas PXA-R, PXA-G and PXA-B in the display apparatus DD according to one or more embodiments may be arranged in a stripe shape (e.g., stripe pattern). Referring to FIG. 1, multiple red luminous areas PXA-R may be arranged with each other along a second direction DR2, multiple green luminous areas PXA-G may be arranged with each other along the second direction DR2, and multiple blue luminous areas PXA-B may be arranged with each other along the second direction DR2. In one or more embodiments, the red luminous area PXA-R, the green luminous area PXA-G and the blue luminous area PXA-B may be arranged by turns (e.g., alternatingly with each other) along a first direction DR1.

In FIG. 1 and FIG. 2, the areas of the luminous areas PXA-R, PXA-G and PXA-B are shown similar, but one or more embodiments of the present disclosure are not limited thereto. The areas of the luminous areas PXA-R, PXA-G and PXA-B may be different from each other according to the wavelength region of light emitted. As used herein, the areas of the luminous areas PXA-R, PXA-G and PXA-B may mean areas on a plane defined by the first direction DR1 and the second direction DR2.

In one or more embodiments, the arrangement of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required for the display apparatus DD. For example, the arrangement of the luminous areas PXA-R, PXA-G and PXA-B may be a PenTile®/PENTILE® arrangement (PENTILE® is a registered trademark owned by Samsung Display Co., Ltd.), or a diamond arrangement.

In one or more embodiments, the areas of the luminous areas PXA-R, PXA-G and PXA-B may be different from each other. For example, in one or more embodiments, the area of the green luminous area PXA-G may be smaller than the area of the blue luminous area PXA-B, but one or more embodiments of the present disclosure are not limited thereto.

Hereinafter, FIG. 3 to FIG. 6 are cross-sectional views schematically showing organic electroluminescence devices according to embodiments. The organic electroluminescence device ED according to one or more embodiments may include a first electrode EL1, a hole transport region HTR, an emission layer EML, an electron transport region ETR, and a second electrode EL2 stacked in order.

The organic electroluminescence device ED of one or more embodiments may include a polycyclic compound of one or more embodiments, which will be explained in more detail hereinbelow, in the emission layer EML disposed between the first electrode EL1 and the second electrode EL2. However, one or more embodiments of the present disclosure are not limited thereto, and the organic electroluminescence device ED may include the polycyclic compound in a hole transport region HTR or an electron transport region ETR, which are multiple functional layers disposed between the first electrode EL1 and the second electrode EL2, in addition to the emission layer EML, or may include the polycyclic compound in a capping layer CPL disposed on the second electrode EL2.

Figure 3:
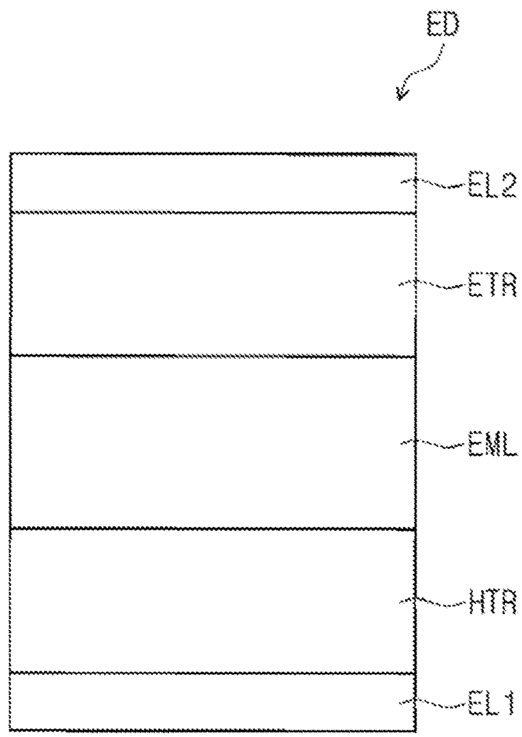
FIG. 3 is a cross-sectional view schematically showing an organic electroluminescence device according to one or more embodiments of the present disclosure.
Figure 4:
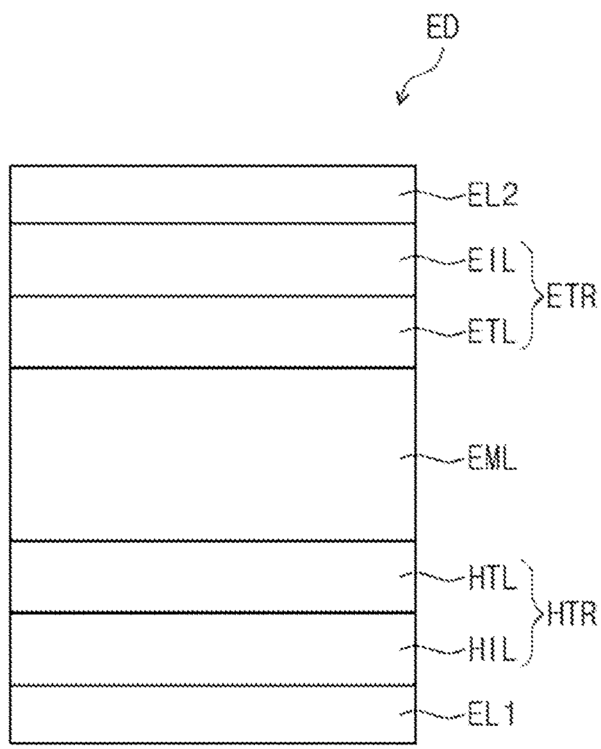
FIG. 4 is a cross-sectional view schematically showing an organic electroluminescence device according to one or more embodiments of the present disclosure.
Figure 5:
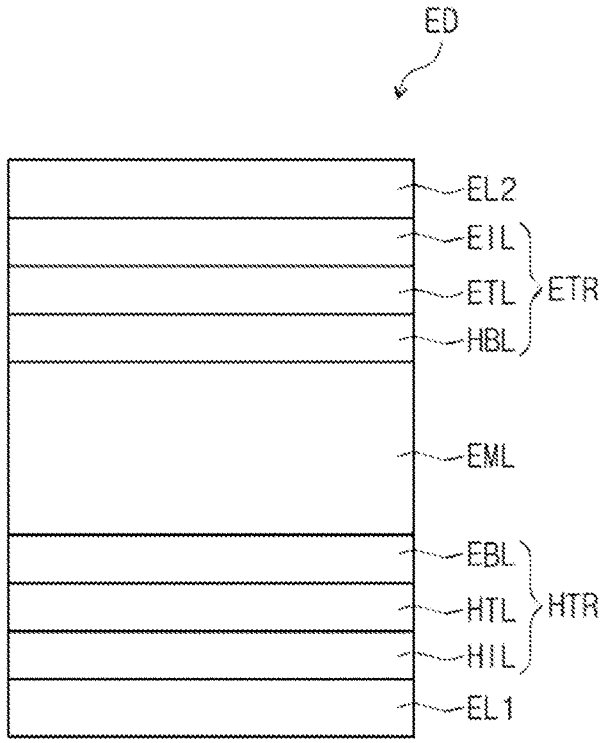
FIG. 5 is a cross-sectional view schematically showing an organic electroluminescence device according to one or more embodiments of the present disclosure.
Figure 6:
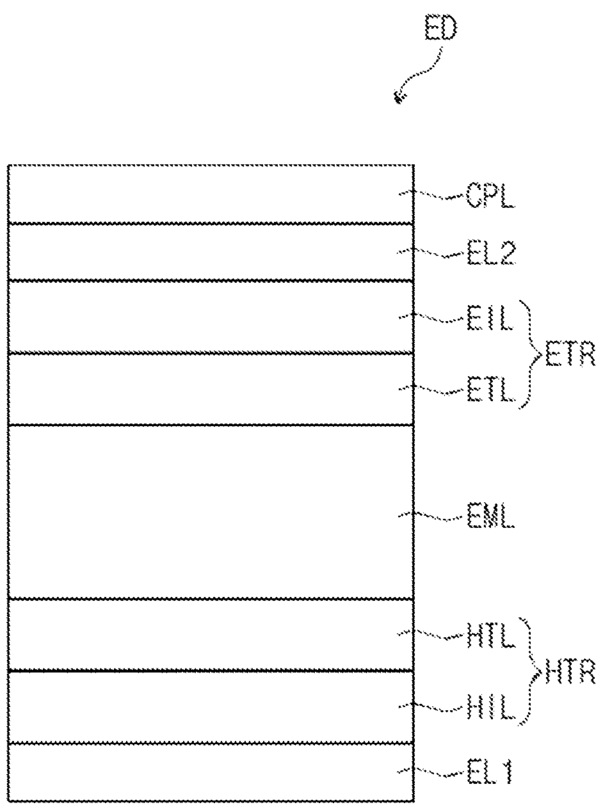
FIG. 6 is a cross-sectional view schematically showing an organic electroluminescence device according to one or more embodiments of the present disclosure.

In one or more embodiments, when compared with FIG. 3, FIG. 4 shows the cross-sectional view of an organic electroluminescence device ED of one or more embodiments, wherein a hole transport region HTR includes a hole injection layer HIL and a hole transport layer HTL, and an electron transport region ETR includes an electron injection layer EIL and an electron transport layer ETL. When compared with FIG. 3, FIG. 5 shows the cross-sectional view of an organic electroluminescence device ED of one or more embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of an organic electroluminescence device ED of one or more embodiments, including a capping layer CPL disposed on the second electrode EL2.

The first electrode EL1 has conductivity. The first electrode EL1 may be formed using a metal alloy or any suitable conductive compound. The first electrode EL1 may be an anode or a cathode. However, one or more embodiments of the present disclosure are not limited thereto. In one or more embodiments, the first electrode EL1 may be a pixel electrode. The first electrode EU may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, one or more compounds thereof, and/or one or more mixtures thereof (for example, a mixture of Ag and Mg). In one or more embodiments, the first electrode EU may have a structure of multiple layers including a reflective layer or a transflective layer formed using any of the above materials, and a transmissive conductive layer formed using ITO, IZO, ZnO, and/or ITZO. For example, the first electrode EU may have a three-layer structure of ITO/Ag/ITO. However, one or more embodiments of the present disclosure are not limited thereto. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one selected from among a hole injection layer HIL, a hole transport layer HTL, a hole buffer layer, and an electron blocking layer EBL. The thickness of the hole transport region HTR may be, for example, from about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, or may have a structure of a single layer formed using a hole injection material and a hole transport material. In one or more embodiments, the hole transport region HTR may have a structure of a single layer formed using multiple different materials, or a structure stacked from the first electrode EU of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below.

Formula H-1

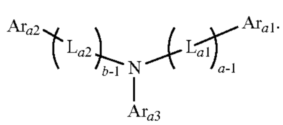

In Formula H-1 above, $L_{a1}$ and $L_{a2}$ may be each independently a direct linkage, a substituted or unsubstituted arylene group of 6 to 30 ring-forming carbon atoms, or a substituted or unsubstituted heteroarylene group of 2 to 30 ring-forming carbon atoms. "a-1" and "b-1" may be each independently an integer of 0 to 10. In one or more embodiments, if "a-1" and/or "b-1" is an integer of 2 or more, multiple $L_{a1}$ and/or $L_{a2}$ may be each independently a substituted or unsubstituted arylene group of 6 to 30 ring-forming carbon atoms, or a substituted or unsubstituted heteroarylene group of 2 to 30 ring-forming carbon atoms.

In Formula H-1, $Ar_{a1}$ to $Ar_{a3}$ may be each independently a substituted or unsubstituted aryl group of 6 to 30 ring-forming carbon atoms, or a substituted or unsubstituted heteroaryl group of 2 to 30 ring-forming carbon atoms.

The compound represented by Formula H-1 may be a monoamine compound. In one or more embodiments, the compound represented by Formula H-1 may be a diamine compound in which at least one selected from among $Ar_{a1}$ to $Ar_{a3}$ includes an amine group as a substituent. In one or more embodiments, the compound represented by Formula H-1 may be a carbazole-based compound in which at least one selected from among $Ar_{a1}$ to $Ar_{a3}$ includes a substituted or unsubstituted carbazole group, and/or a fluorene-based compound in which at least one selected from among $Ar_{a1}$ to $Ar_{a1}$ includes a substituted or unsubstituted fluorene group.

The compound represented by Formula H-1 may be represented by any one selected from among the compounds in Compound Group H below. However, the compounds shown in Compound Group H are only illustrations, and the compound represented by Formula H-1 is not limited to the compounds represented in Compound Group H below.

Compound Group H

H-1-1

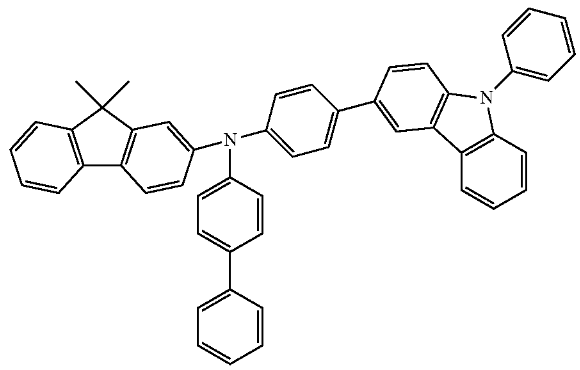

H-1-2

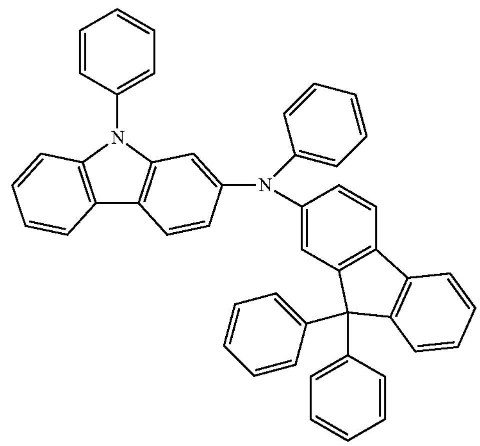

H-1-3

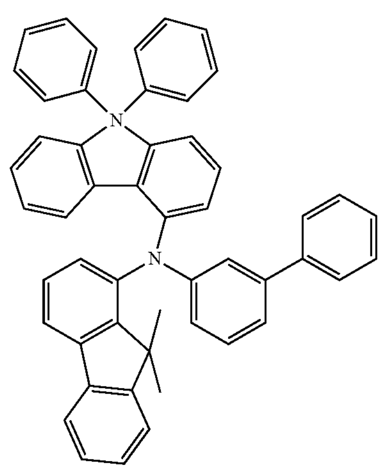

-continued
H-1-4
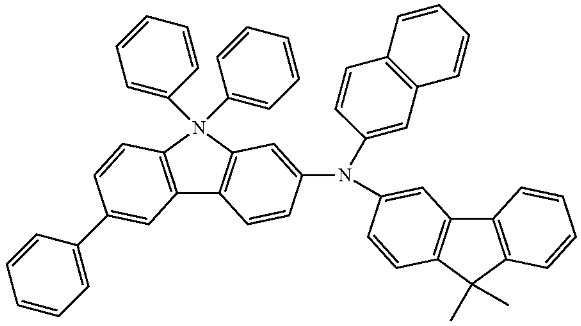
H-1-5
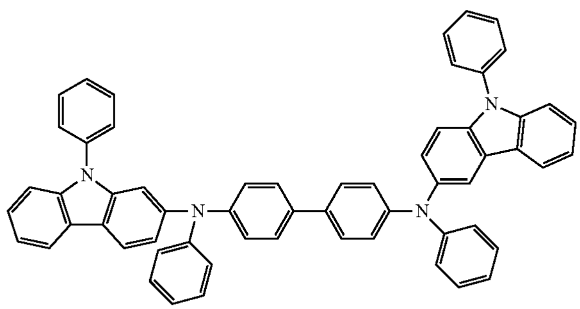
H-1-6
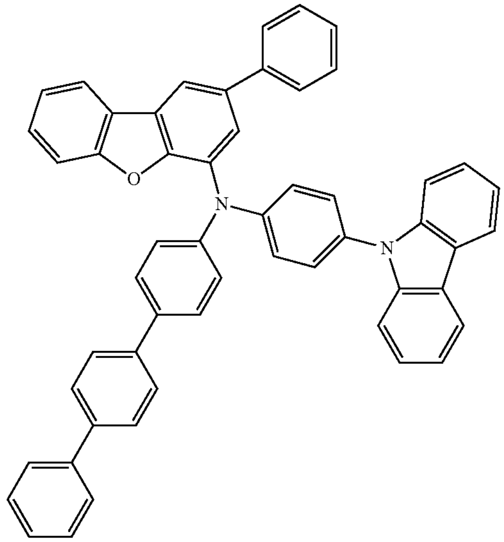
-continued
H-1-7
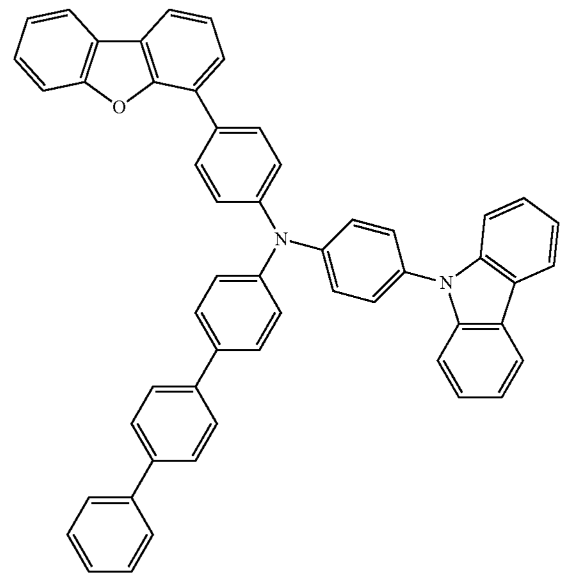
H-1-8
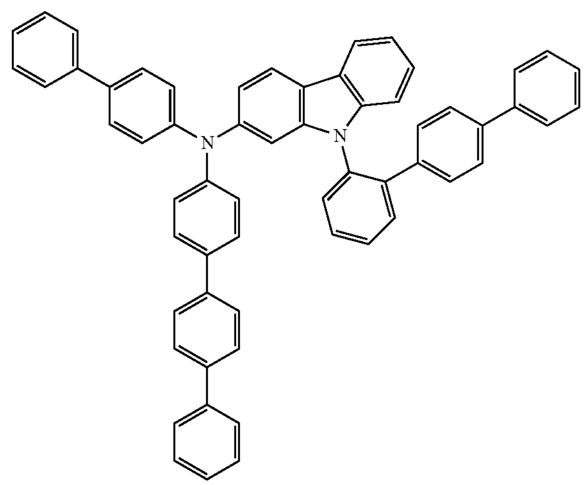
H-1-9
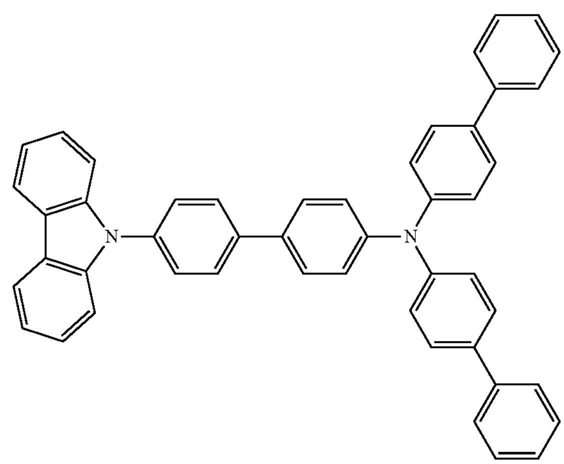

H-1-10
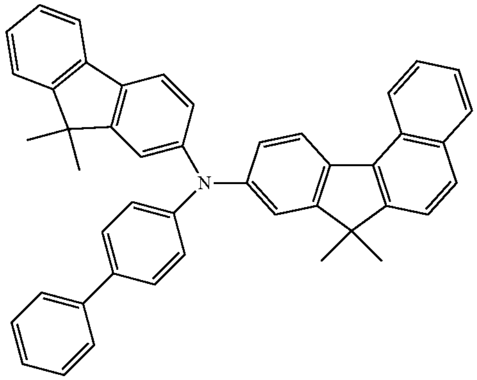
H-1-11
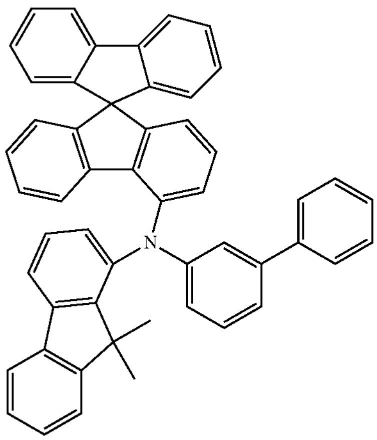
H-1-12
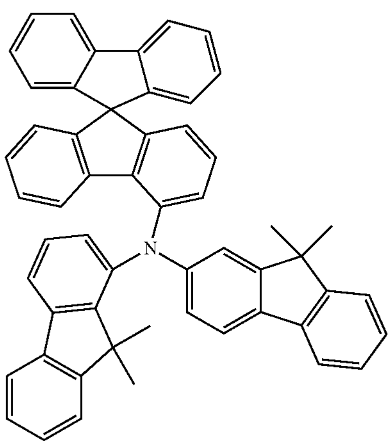
H-1-13
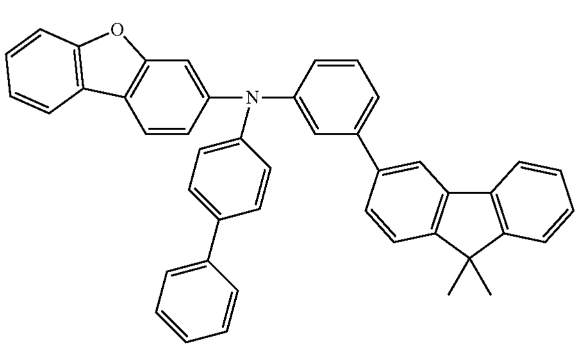
H-1-14
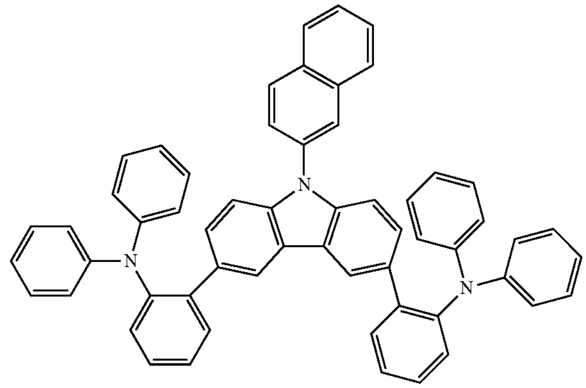
H-1-15
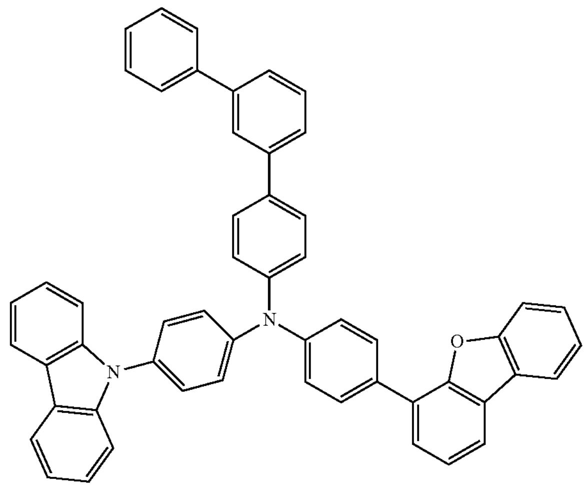
H-1-16
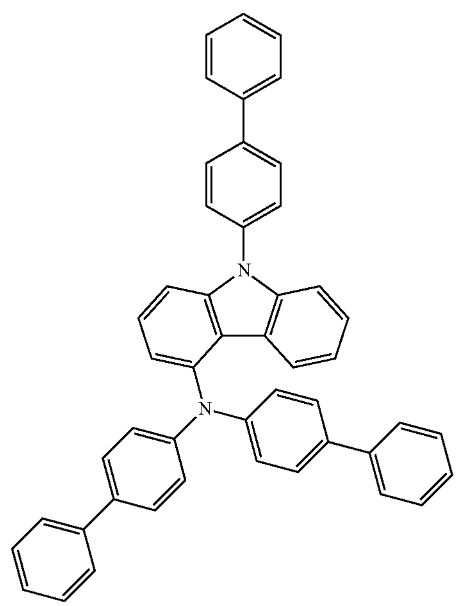

-continued

H-1-17

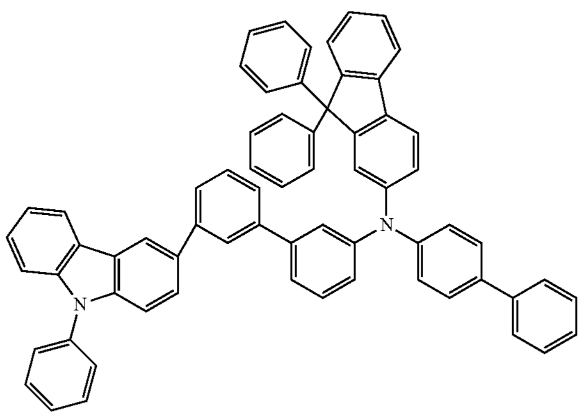

H-1-18

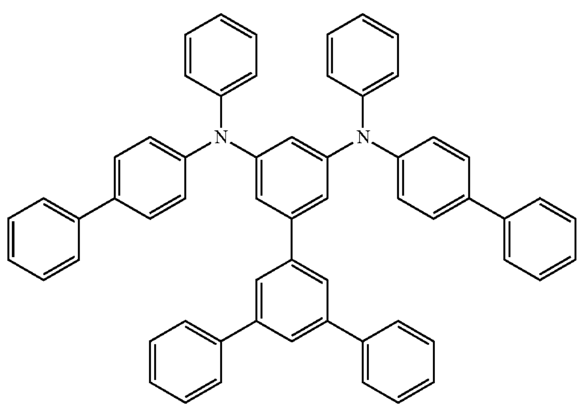

H-1-19

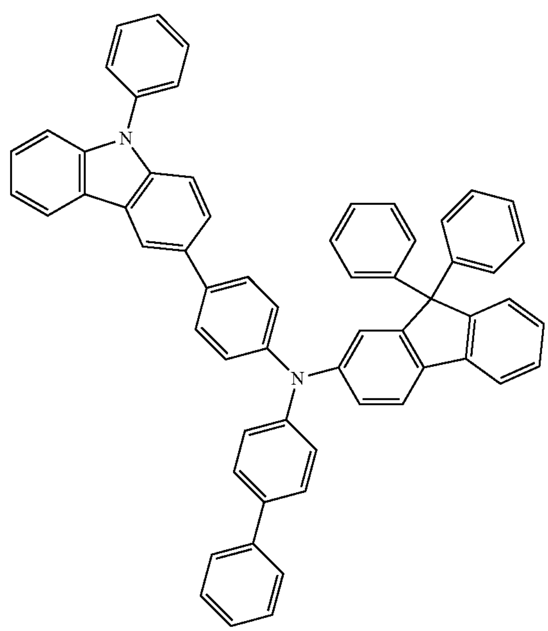

The hole transport region HTR may include a phthalocyanine compound (such as copper phthalocyanine), $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(1-naphthyl)-N-phenylamino]-triphenylamine (1-TNATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl) borate], and/or dipyrazino[2,3-f:2',3'-h]quinoxaline-2,3,6,7,10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one selected from among the hole injection layer HIL, hole transport layer HTL, and electron blocking layer EBL.

The thickness of the hole transport region HTR may be from about 100 Å to about 10,000 Å, for example, from about 100 Å to about 5,000 Å. The thickness of the hole injection region HIL may be, for example, from about 30 Å to about 1,000 Å. The thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL, and the electron blocking layer EBL satisfy their respective above-described ranges, satisfactory (or suitable) hole transport properties may be achieved without a substantial increase of a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one selected from among quinone derivatives, metal oxides, and cyano group-containing compounds, without limitation. For example, non-limiting examples of the p-dopant may include quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), etc. However, one or more embodiments of the present disclosure are not limited thereto.

As described above, the hole transport region HTR may further include at least one of a hole buffer layer or an electron blocking layer EBL, in addition to the hole injection layer HIL and the hole transport layer HTL. The hole buffer layer may compensate resonance distance according to the wavelength of light emitted from an emission layer EML and may increase light emitting efficiency. As materials included in the hole buffer layer, any of the materials which may be included in the hole transport region HTR may be used. The electron blocking layer EBL is a layer playing the role of blocking or reducing the injection of electrons from an electron transport region ETR to a hole transport region HTR.

The emission layer EML is provided on the hole transport region HTR. The emission layer EML may have a thickness of, for example, about 100 Å to about 1,000 Å, or about 100 Å to about 300 Å. The emission layer EML may have a single layer formed using a single material, a single layer formed using multiple different materials, or a multilayer structure having multiple layers formed using multiple different materials.

The emission layer EML may emit one of red light, green light, blue light, yellow light, or cyan light. The emission layer EML may include a fluorescence emitting material and/or a phosphorescence emitting material.

In one or more embodiments, the emission layer EML may be a fluorescence emission layer. For example, a portion of light emitted from the emission layer EML may be due to thermally activated delayed fluorescence (TADF). Particularly, the emission layer EML may include light emitting components emitting thermally activated delayed fluorescence, and in one or more embodiments, the emission layer EML may be an emission layer emitting thermally activated delayed fluorescence which emits blue light.

The emission layer EML of the organic electroluminescence device ED of one or more embodiments includes the polycyclic compound according to one or more embodiments of the present disclosure.

In one or more embodiments, in the description, the term "substituted or unsubstituted" corresponds to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the halogen atom may be a fluorine atom, a chlorine atom, a bromine atom, and/or an iodine atom.

In the description, the alkyl group may be a linear, branched or cyclic. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkenyl group may mean a hydrocarbon group including one or more carbon double bonds in the middle and/or at the terminal of an alkyl group of 2 or more carbon atoms. The alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the alkynyl group may mean a hydrocarbon group including one or more carbon triple bonds in the middle and/or at the terminal of an alkyl group of 2 or more carbon atoms. The alkynyl group may be a linear chain or a branched chain. The carbon number is not specifically limited but may be 2 to 30, 2 to 20, or 2 to 10. Examples of the alkynyl group may include an ethynyl group, a propynyl group, etc., without limitation.

In the description, the hydrocarbon ring group means an optional functional group or substituent derived from an aliphatic hydrocarbon ring, or an optional functional group or substituent derived from an aromatic hydrocarbon ring. The carbon number for forming rings of the hydrocarbon ring group may be 5 to 60, 5 to 30, or 5 to 20.

In the description, the aryl group means an optional functional group or substituent derived from an aromatic hydrocarbon ring. The aryl group may be a monocyclic aryl group or a polycyclic aryl group. The carbon number for forming rings of the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the heterocyclic group (e.g., heterocycle) may mean an optional functional group or substituent derived from a ring including one or more selected from among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may each independently be a monocycle or a polycycle.

In the description, the heterocyclic group may include one or more selected from among B, O, N, P, Si and S as heteroatoms. In case where the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The carbon number for forming rings of the heterocyclic group may be 2 to 30, 2 to 20, or 2 to 10.

In the description, the aliphatic heterocyclic group may include one or more selected from among B, O, N, P, Si and S as heteroatoms. The carbon number for forming rings of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the heteroaryl group may include one or more selected from among B, O, N, P, Si, and S as heteroatoms. If the heteroaryl group includes two or more heteroatoms, two or more heteroatoms may be the same or different. The heteroaryl group may be a monocyclic heterocyclic group or polycyclic heterocyclic group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the carbon number of the amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, the silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the thio group may include an alkyl thio group and an aryl thio group. The thio group may mean the above-defined alkyl group or aryl group combined with a sulfur atom. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In one or more embodiments, in the description, "—— *" means a position to be connected (e.g., a binding site).

The polycyclic compound according to one or more embodiments of the present disclosure is represented by Formula 1 below.

Formula 1

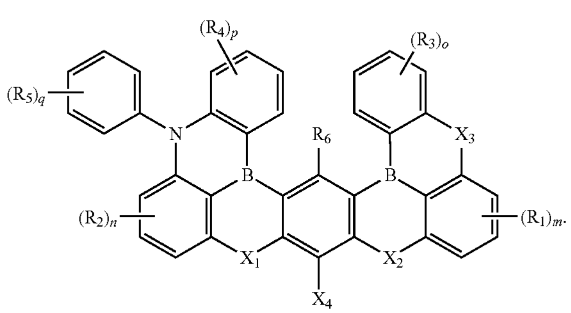

In Formula 1, $X_1$ to $X_3$ are each independently O, S, Se or $NAr_1$.

In Formula 1, "m" and "n" are each independently an integer of 0 to 3. In one or more embodiments, if "m" is an integer of 2 or more, multiple $R_1$ groups are the same or different, and if "n" is an integer of 2 or more, multiple $R_2$ groups are the same or different.

In Formula 1, "o" and "p" are each independently an integer of 0 to 4. In one or more embodiments, if "o" is an integer of 2 or more, multiple $R_3$ groups are the same or different, and if "p" is an integer of 2 or more, multiple $R_4$ groups are the same or different.

In Formula 1, "q" is an integer of 0 to 5, and if "q" is an integer of 2 or more, multiple $R_5$ groups are the same or different.

In Formula 1, $Ar_1$ is a substituted or unsubstituted aryl group of 6 to 30 ring-forming carbon atoms, or a substituted or unsubstituted heteroaryl group of 2 to 30 ring-forming carbon atoms.

In Formula 1, $R_1$ to $R_6$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, and/or combined with an adjacent group to form a ring.

In Formula 1, $X_4$ is a substituted phenyl group, a substituted or unsubstituted aryl group of 7 to 30 ring-forming carbon atoms, or a substituted or unsubstituted heterocycle of 2 to 30 ring-forming carbon atoms, or is represented by Formula 2 below.

Formula 2

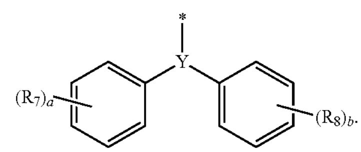

In Formula 2, Y is B, P, P═O, P═S, or N.

In Formula 2, $R_7$ and $R_8$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula 2, "a" and "b" are each independently an integer of 0 to 5. In one or more embodiments, if "a" is an integer of 2 or more, multiple $R_7$ groups are the same or different, and if "b" is an integer of 2 or more, multiple $R_8$ groups are the same or different.

In one or more embodiments, Formula 1 may be represented by any one selected from among Formula 3-1 to Formula 3-5 below.

Formula 3-1

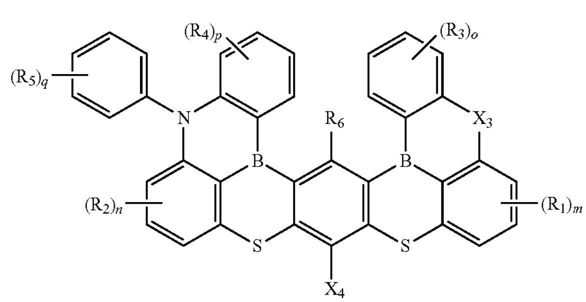

-continued

Formula 3-2

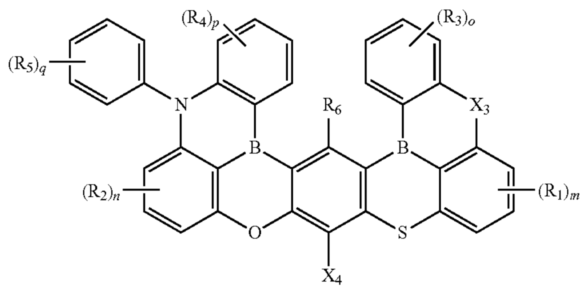

Formula 3-3

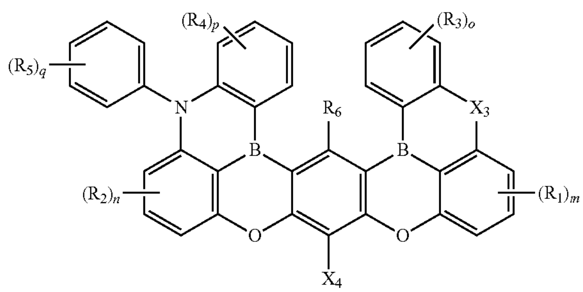

Formula 3-4

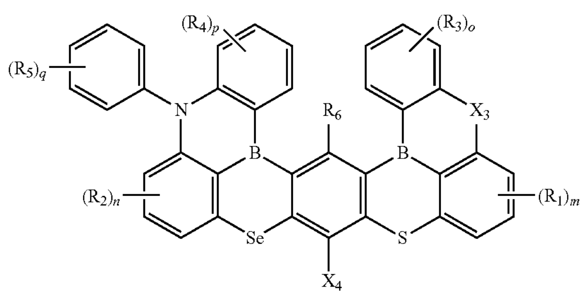

Formula 3-5

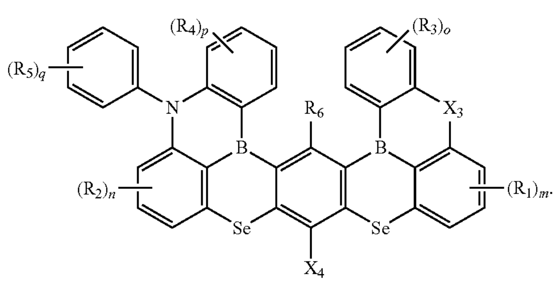

In Formula 3-1 to Formula 3-5, $X_3$, $X_4$, $R_1$ to $R_6$, and "m" to "q" are the same as defined in Formula 1.

In one or more embodiments, the sum of "m" and "n" in Formula 1 may be 1 or more, and at least one selected from among $R_1$ and $R_2$ may be the substituted or unsubstituted amine group.

For example, Formula 1 may be represented by Formula 4 or Formula 5 below.

Formula 4

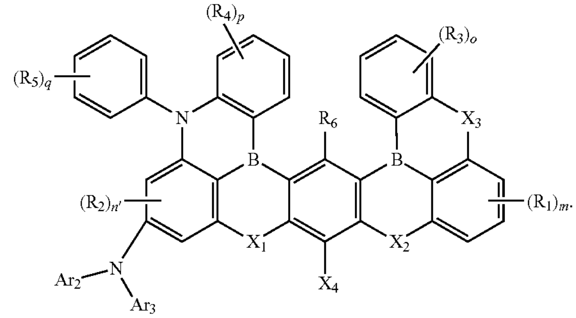

In Formula 4, n' may be an integer of 0 to 2.

In Formula 4, $Ar_2$ and $Ar_3$ may be each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 4, $X_1$ to $X_3$, $R_1$ to $R_6$, "m" and "o" to "q" are the same as defined in Formula 1.

Formula 5

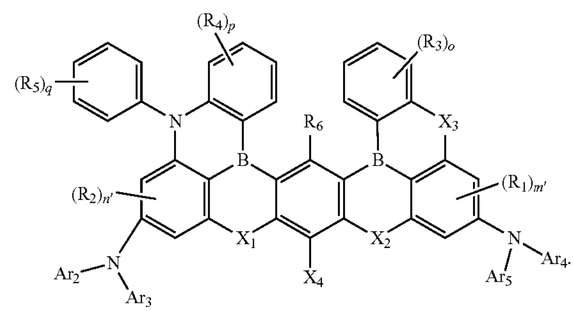

In Formula 5, m' may be an integer of 0 to 2.

In Formula 5, $Ar_4$ and $Ar_5$ may be each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 5, $X_1$ to $X_4$, $R_1$ to $R_6$, $Ar_2$, $Ar_3$, n', and "o" to "q" are the same as defined in Formula 4.

In one or more embodiments, An in Formula 1 and $Ar_2$ to $Ar_5$ in Formula 4 and Formula 5 may be each independently represented by Formula 6 below.

Formula 6

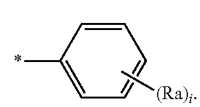

In Formula 6, Ra may be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

"i" is an integer of 0 to 5, and if "i" is an integer of 2 or more, multiple Ra groups are the same or different.

In one or more embodiments, Formula 1 may be represented by Formula 7 below.

Formula 7

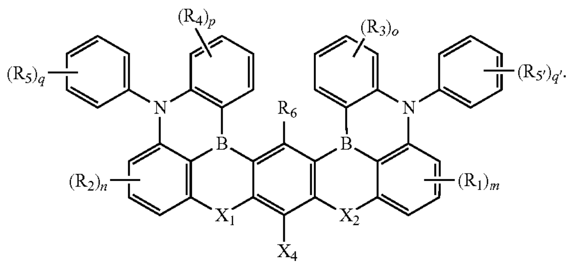

In Formula 7, q' may be an integer of 0 to 5. In one or more embodiments, if q' is an integer of 2 or more, multiple $R_5'$ groups are the same or different.

In Formula 7, $R_5'$ may be a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula 7, $X_1$, $X_2$, $X_4$, $R_1$ to $R_6$, and "m" to "q" are the same as defined in Formula 1.

In one or more embodiments, Formula 5 may be represented by Formula 8 below.

Formula 8

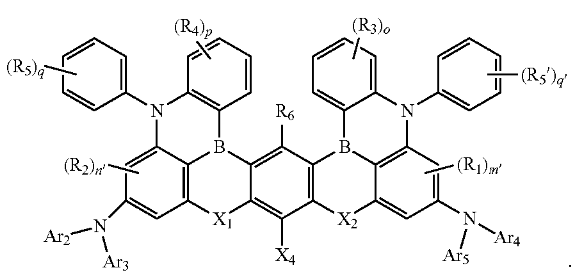

In Formula 8, q' is an integer of 0 to 5. In one or more embodiments, if q' is an integer of 2 or more, multiple $R_5'$ groups are the same or different.

In Formula 8, $R_5'$ may be a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula 8, $X_1$, $X_2$, $X_4$, $R_1$ to $R_6$, $Ar_2$ to $Ar_5$, m', n', and "o" to "q" are the same as defined in Formula 5.

In one or more embodiments, Formula 2 may be represented by any one selected from Formulae 2-1 to 2-6 below.

2-1

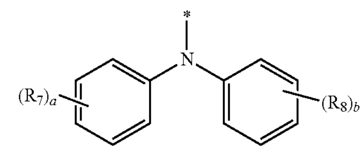

2-2

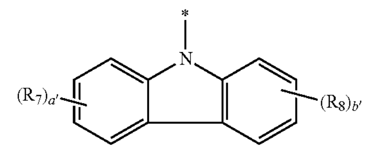

2-3

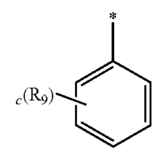

2-4

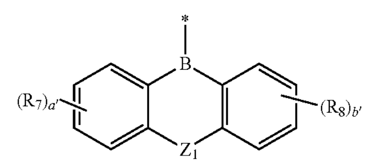

2-5

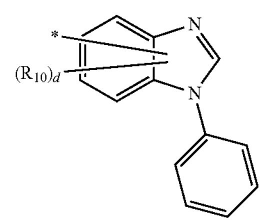

2-6

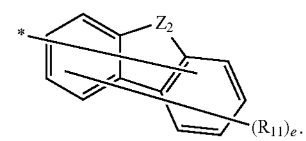

In Formulae 2-1 to 2-6, $Z_1$ may be O, S, or $NAr_6$, and $Z_2$ may be O, or S. $Ar_6$ may be a phenyl group.

In Formulae 2-1 to 2-6, $R_9$ to $R_{11}$ may be each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formulae 2-1 to 2-6, a', b', and "d" are each independently an integer of 0 to 4. In one or more embodiments, if a' is an integer of 2 or more, multiple $R_7$ groups are the same or different, if b' is an integer of 2 or more, multiple $R_8$ groups are the same or different, and if "d" is an integer of 2 or more, multiple $R_{10}$ groups are the same or different.

In Formula 2-3, "c" is an integer of 0 to 5. In one or more embodiments, if "c" is an integer of 2 or more, multiple $R_9$ groups are the same or different.

In Formula 2-6, “e” is an integer of 0 to 7. In one or more embodiments, if “e” is an integer of 2 or more, multiple Ru groups are the same or different.

In Formulae 2-1 to 2-6, $R_7$, $R_8$, “a” and “b” are the same as defined in Formula 2.

In one or more embodiments, the polycyclic compound represented by Formula 1 may be any one selected from among the compounds represented in Compound Group 1 below. However, one or more embodiments of the present disclosure are not limited thereto.

Compound Group 1

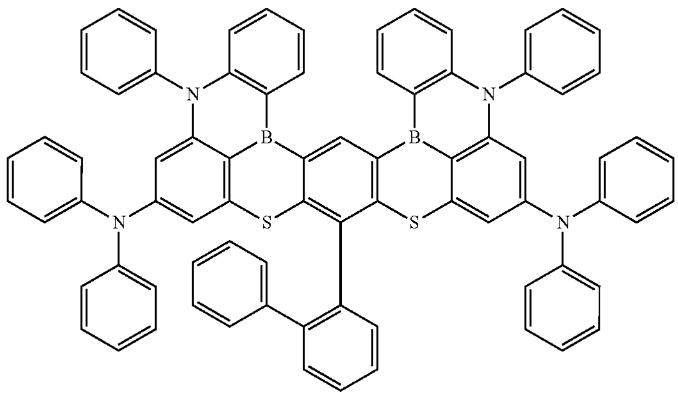

1

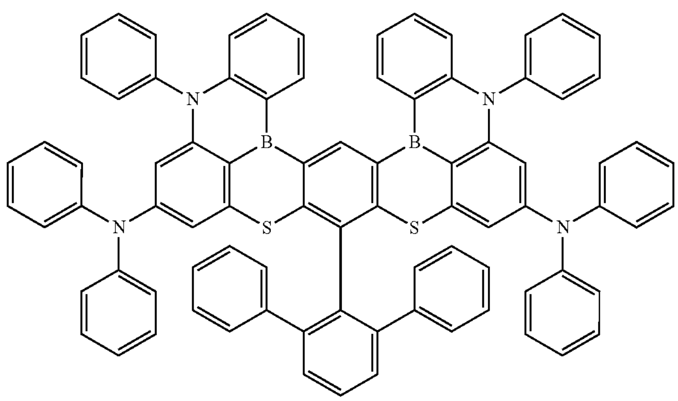

2

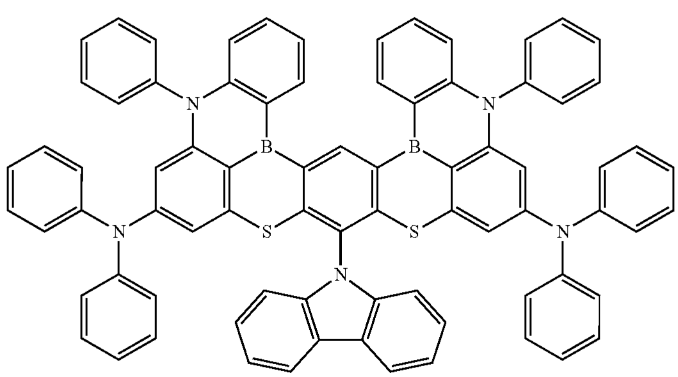

3

-continued
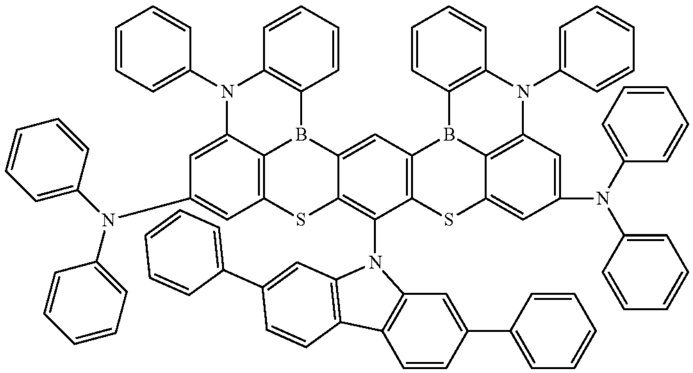
4
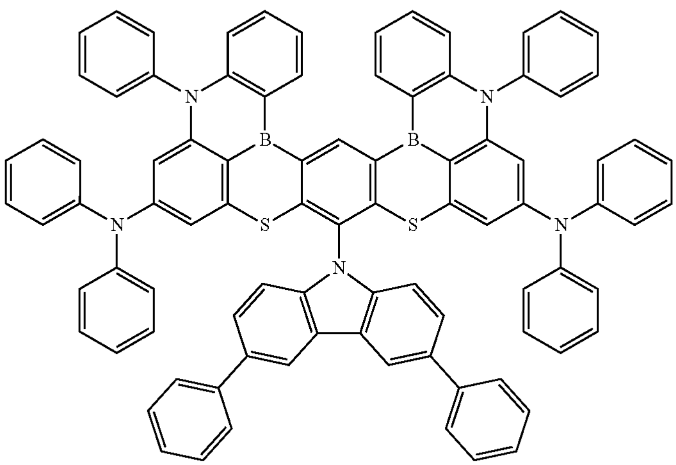
5
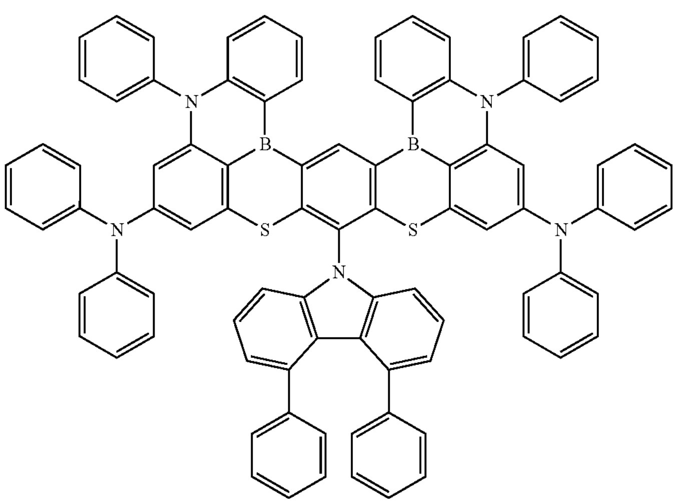
6

-continued
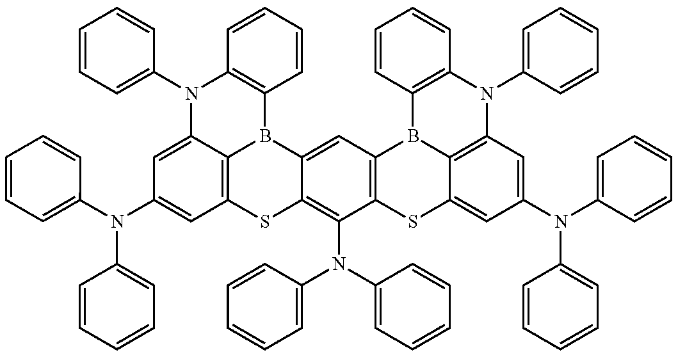
7
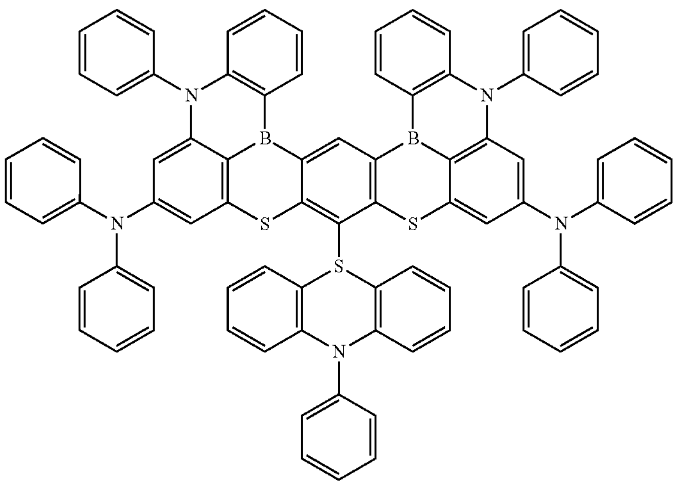
8
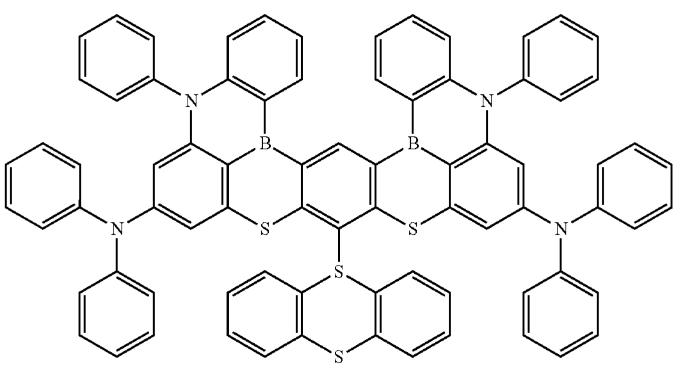
9
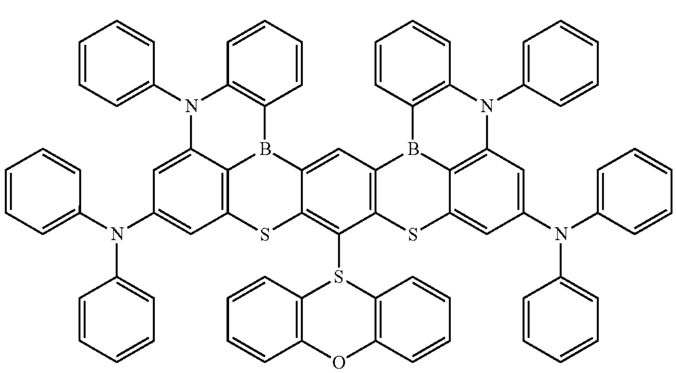
10

-continued
11
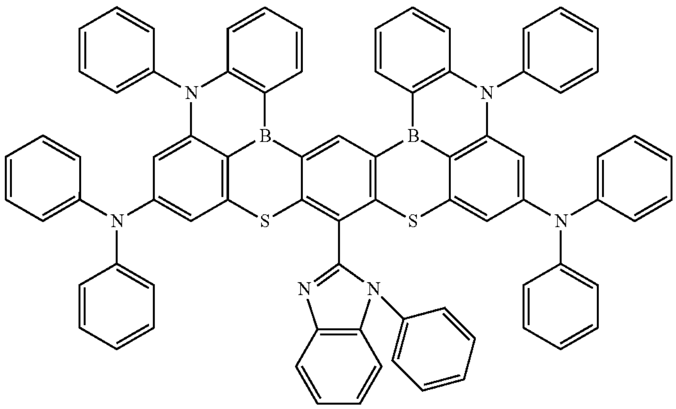
12
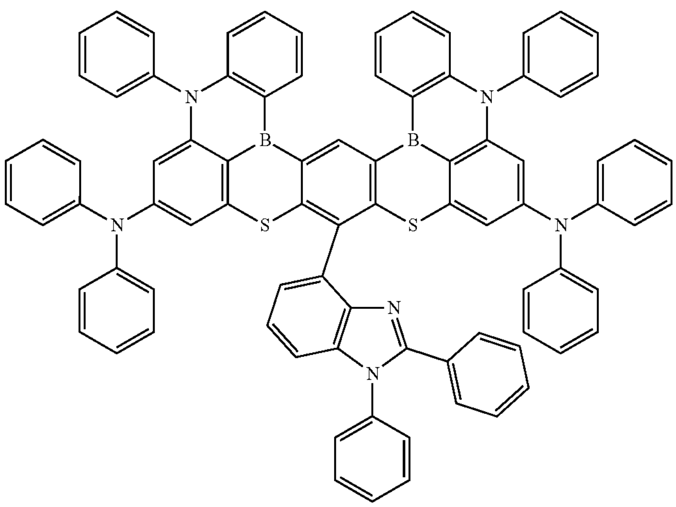
13
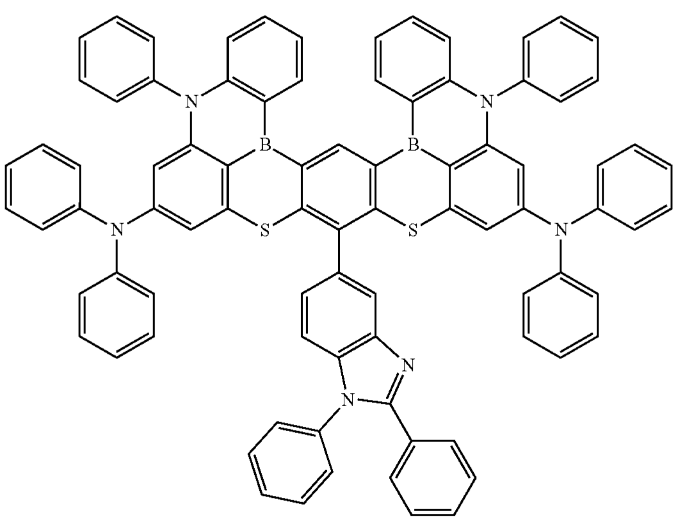

-continued
14
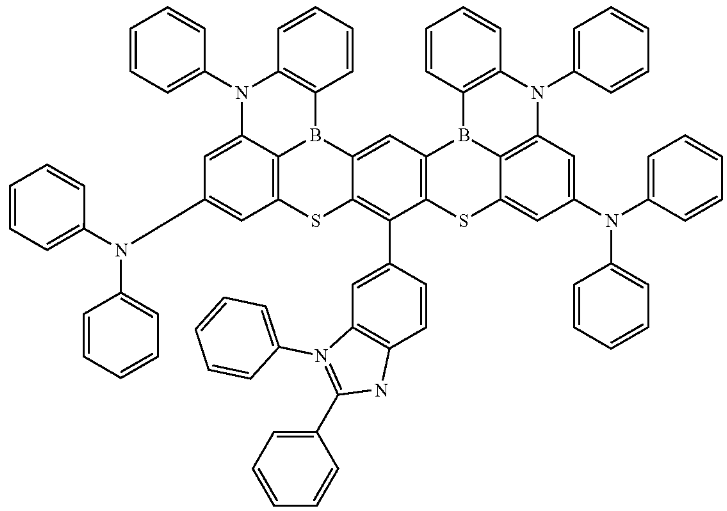
15
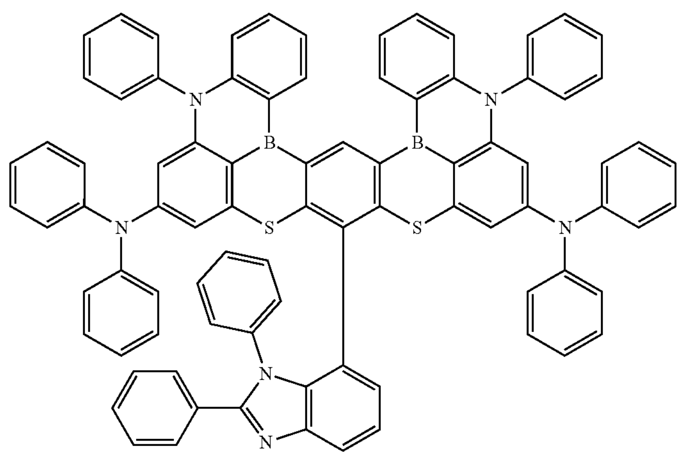
16
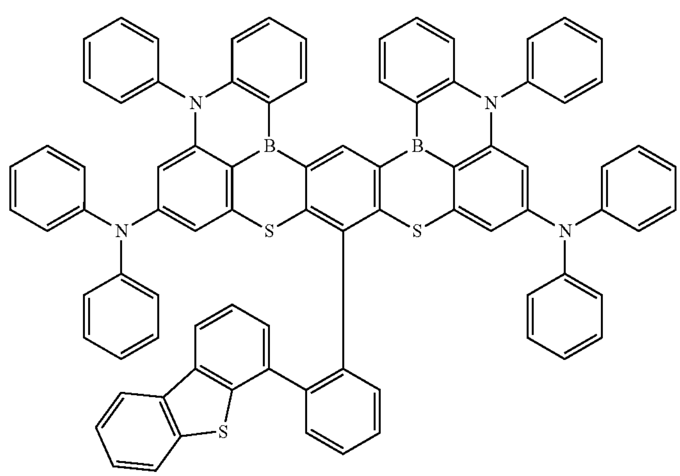

-continued
17
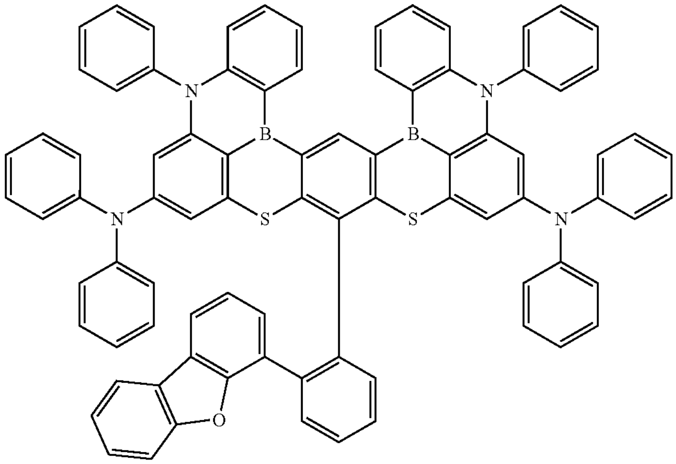
18
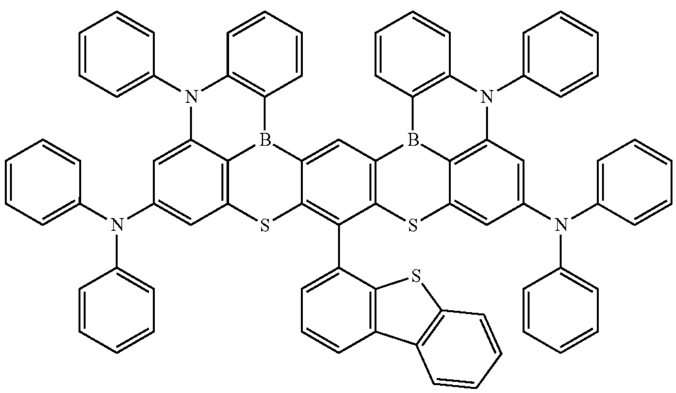
19
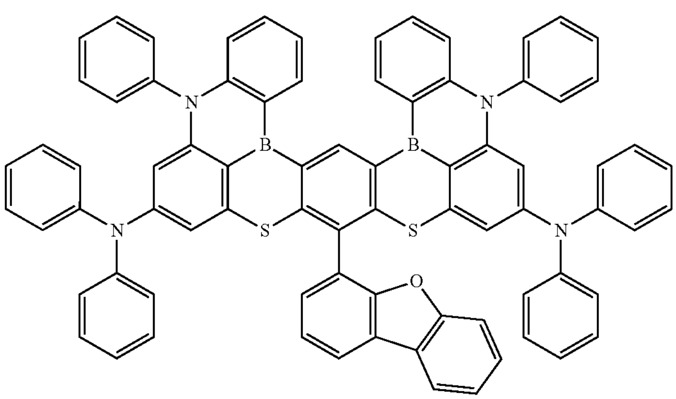

-continued
20
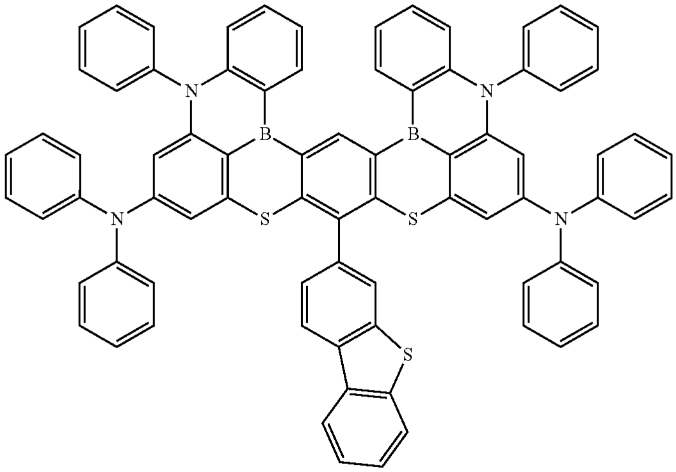
21
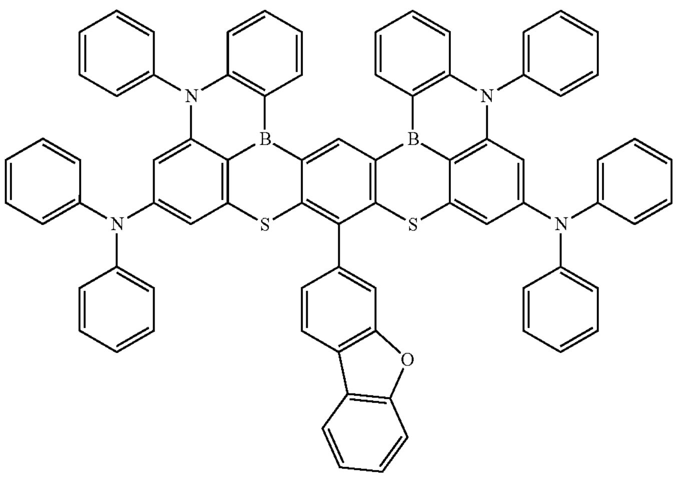
22
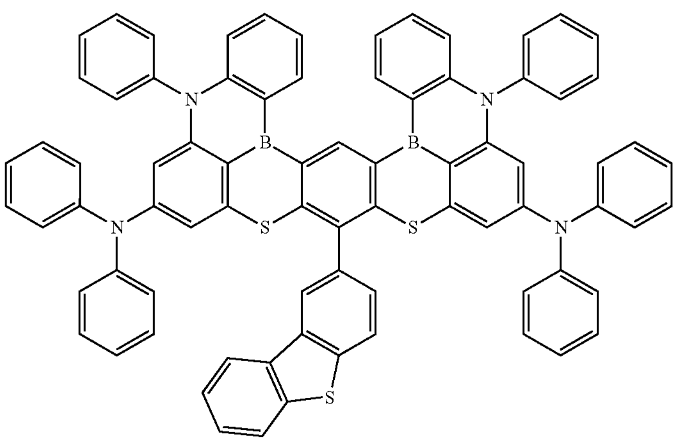

-continued
23
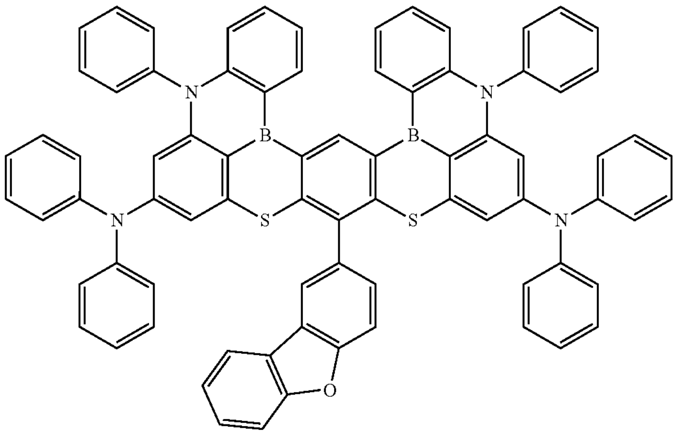
24
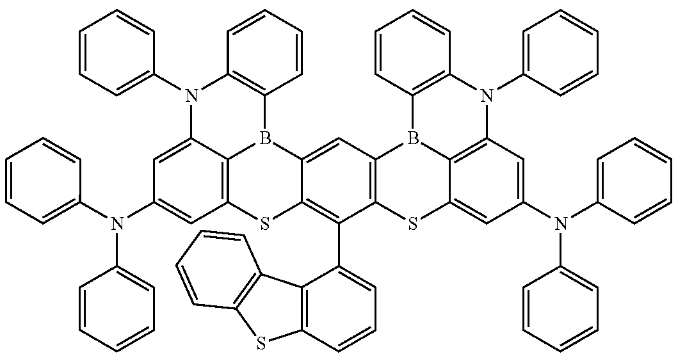
25
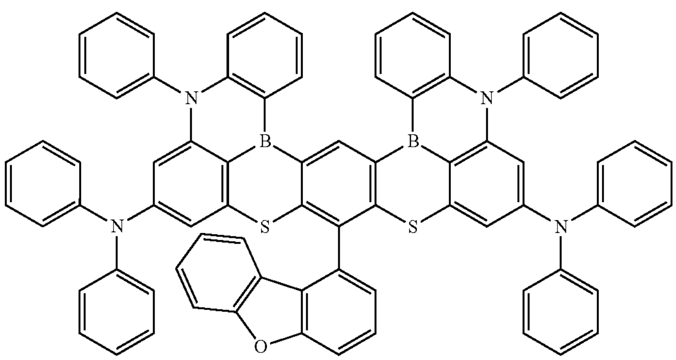
26
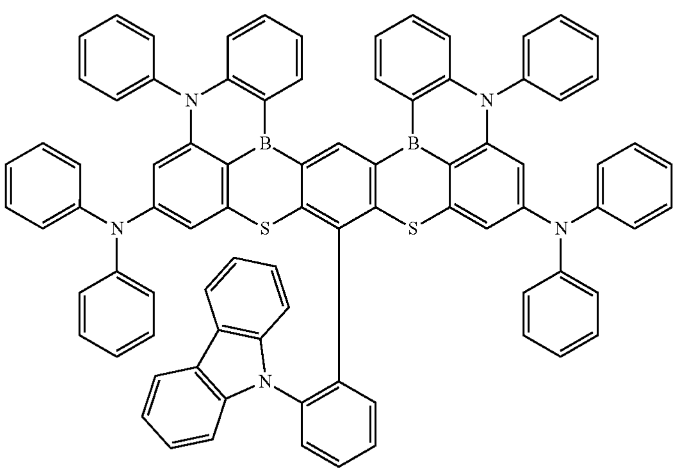

-continued
27
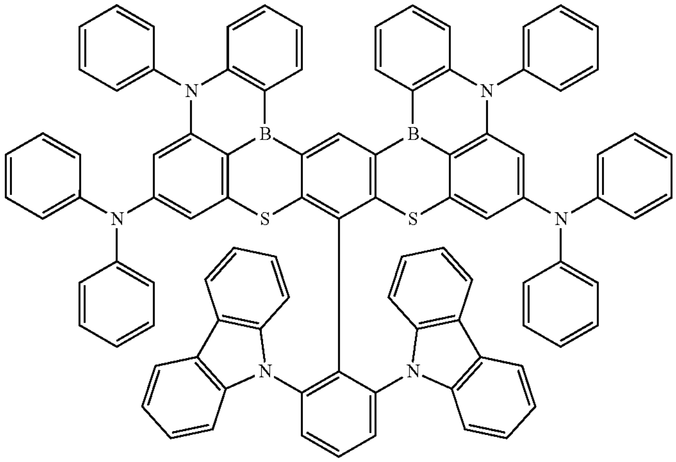
28
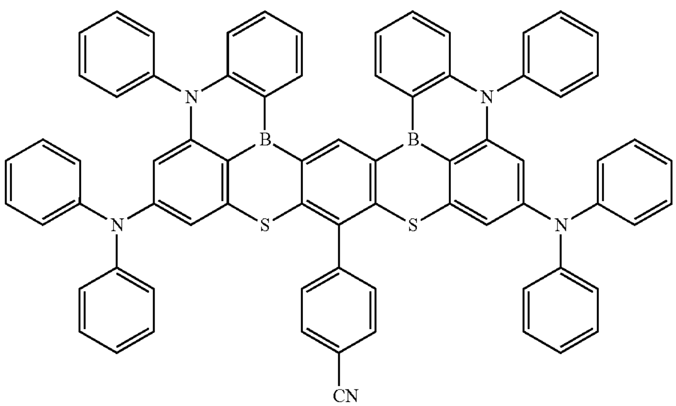
29
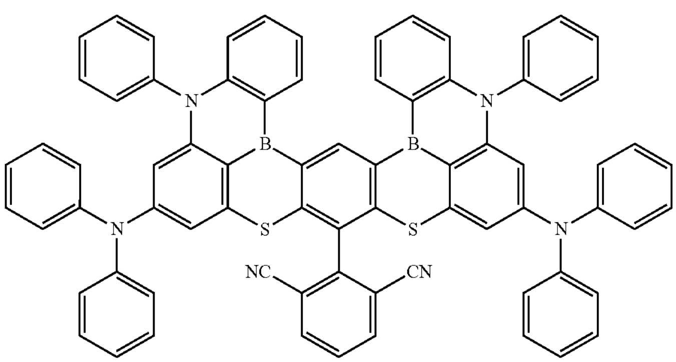

-continued
30
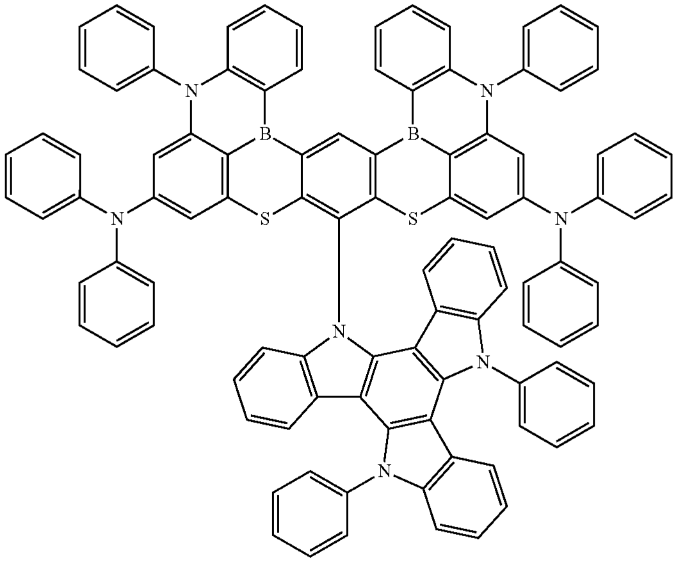
31
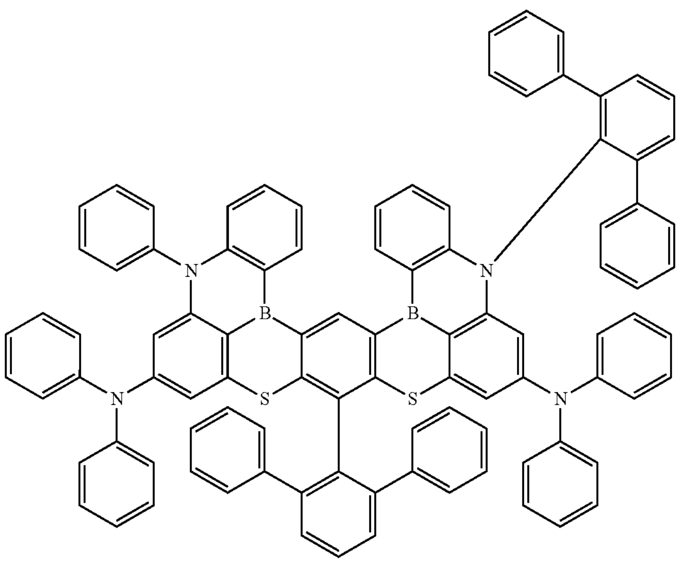
32
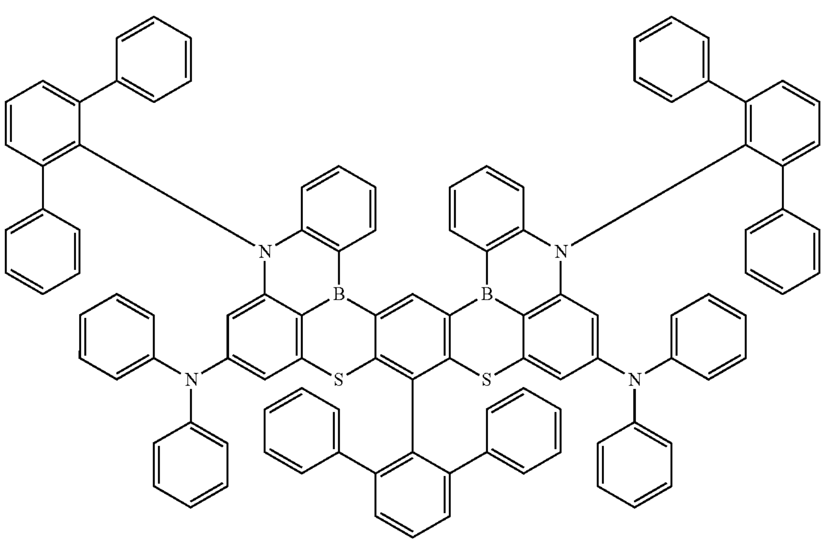

-continued
33
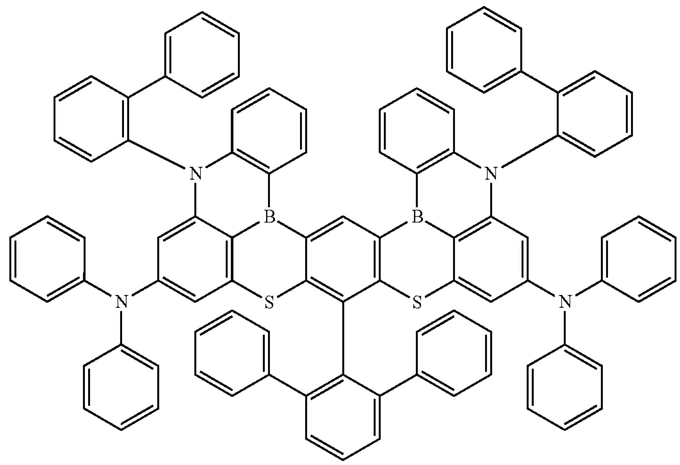
34
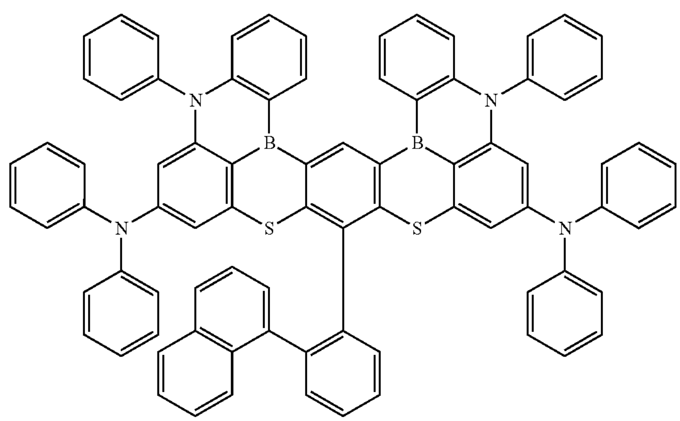
35
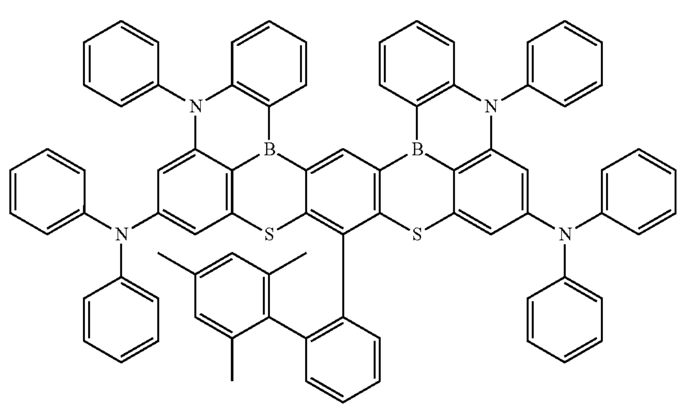

-continued
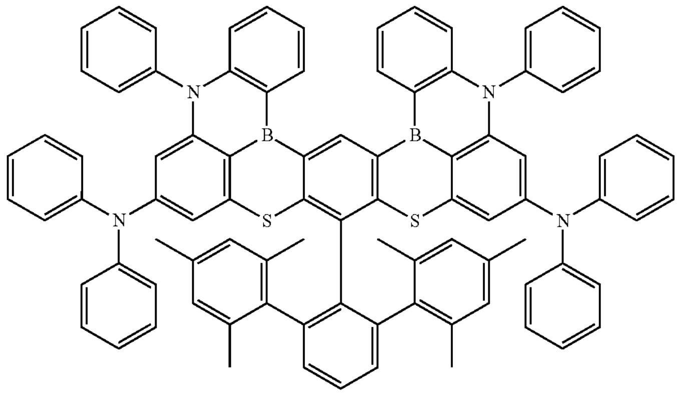
36
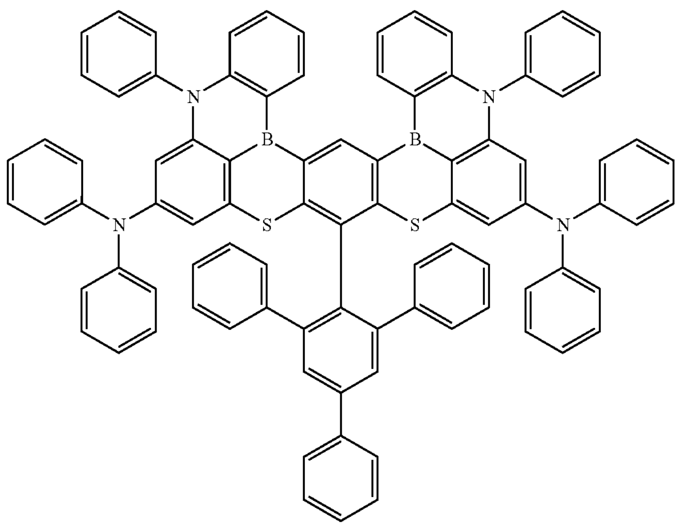
37
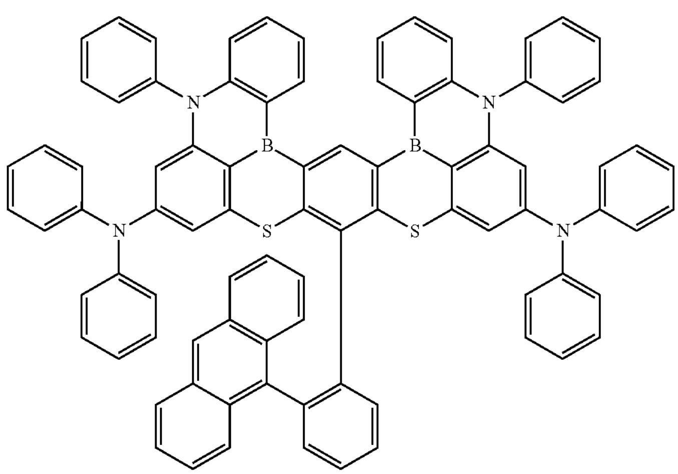
38

-continued
39
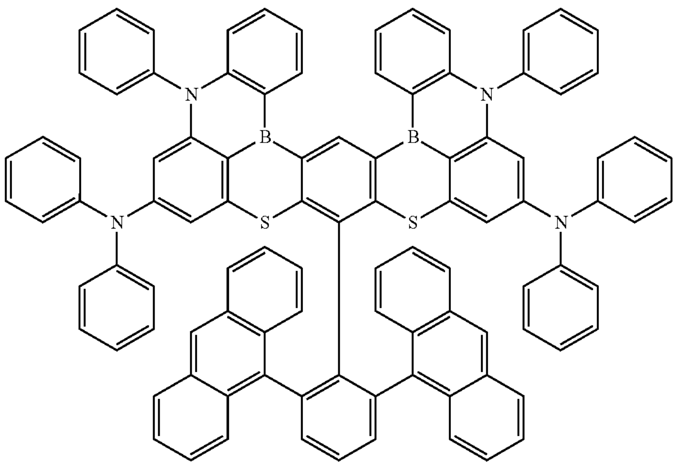
40
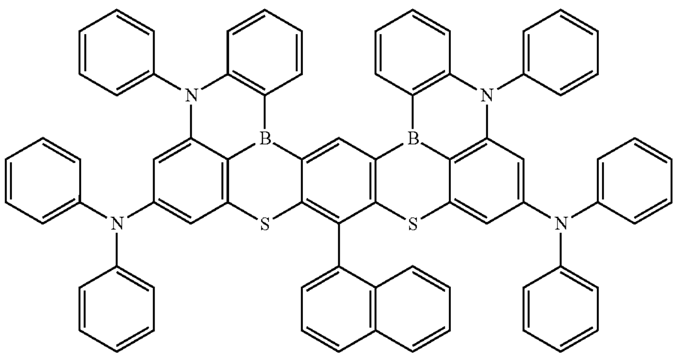
41
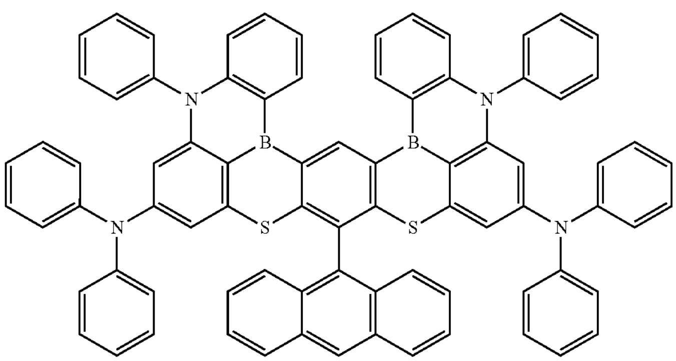
42
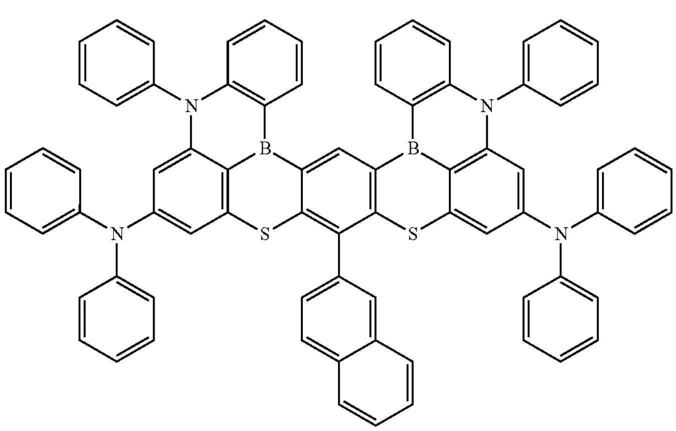

-continued
43
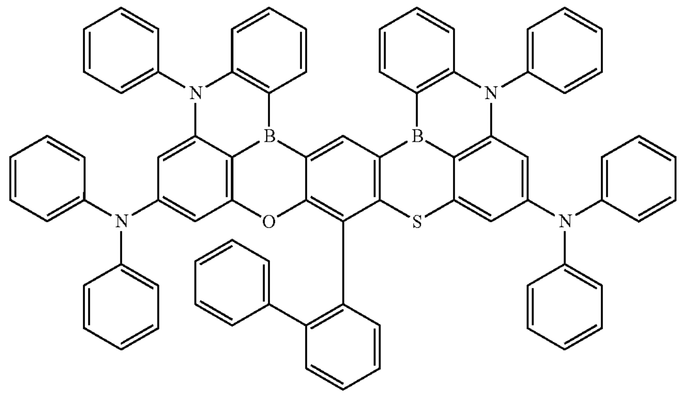
44
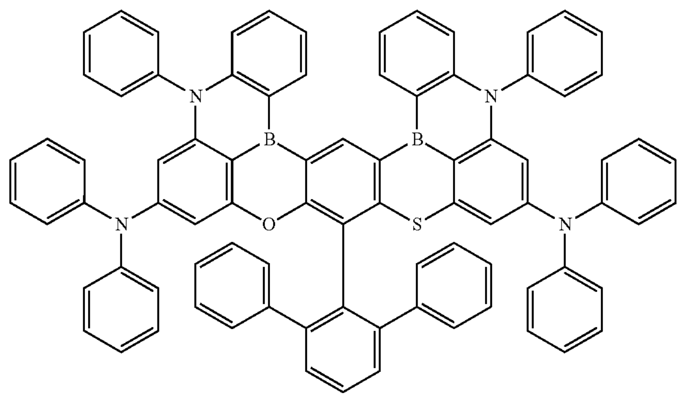
45
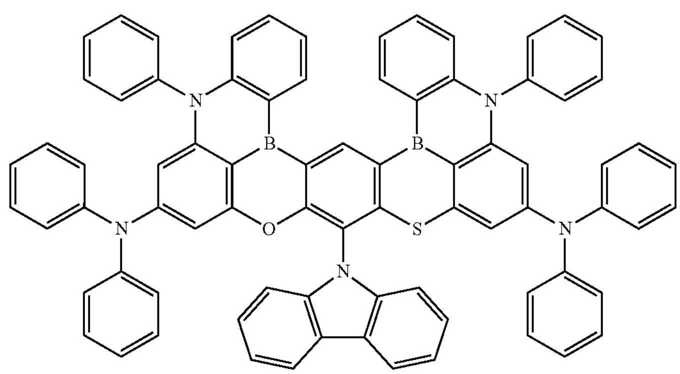
46
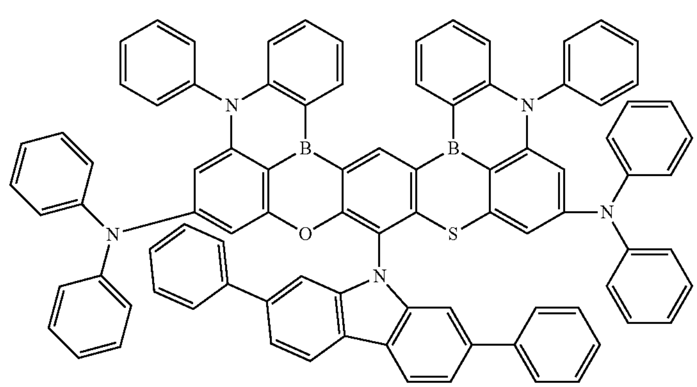

-continued
47
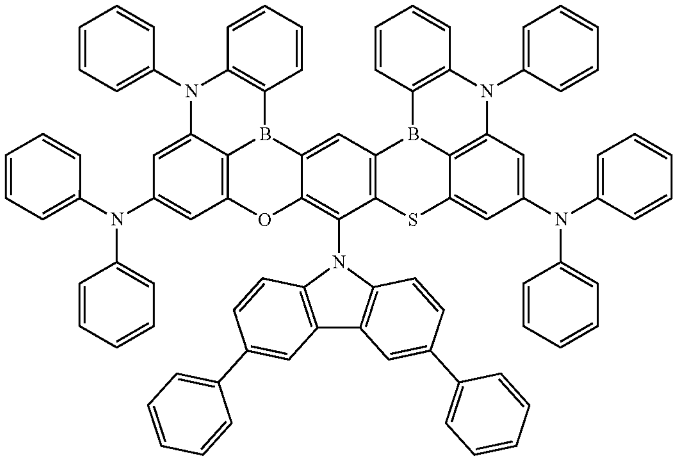
48
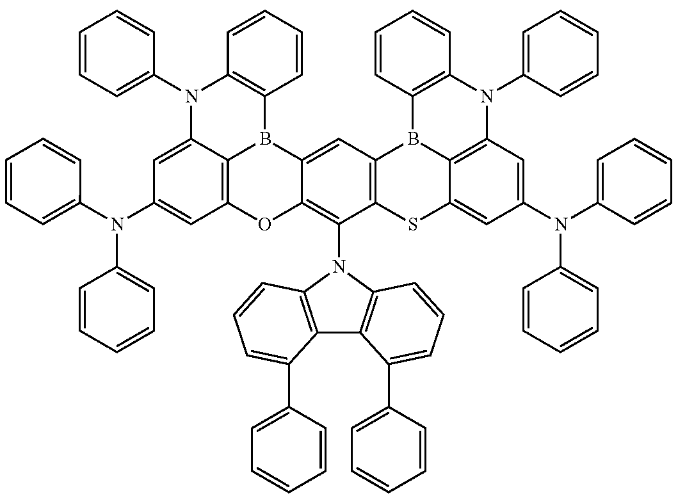
49
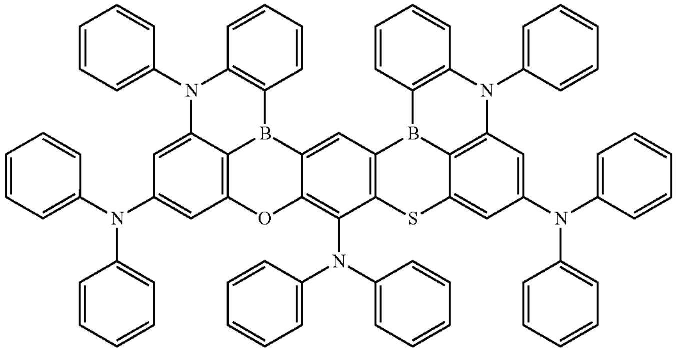

-continued
50
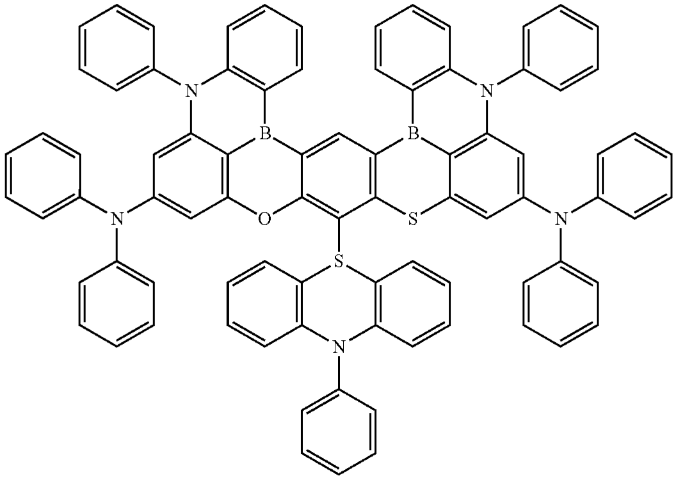
51
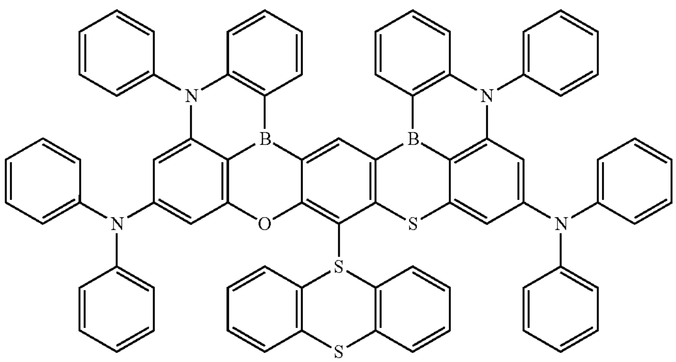
52
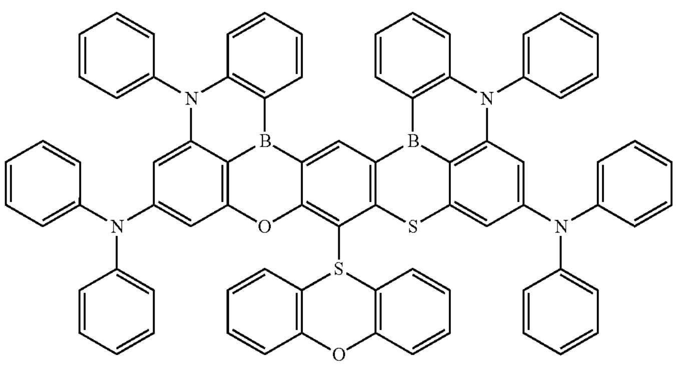
53
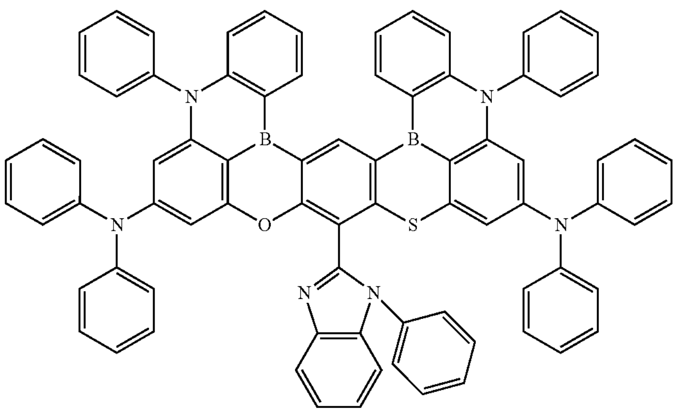

-continued
54
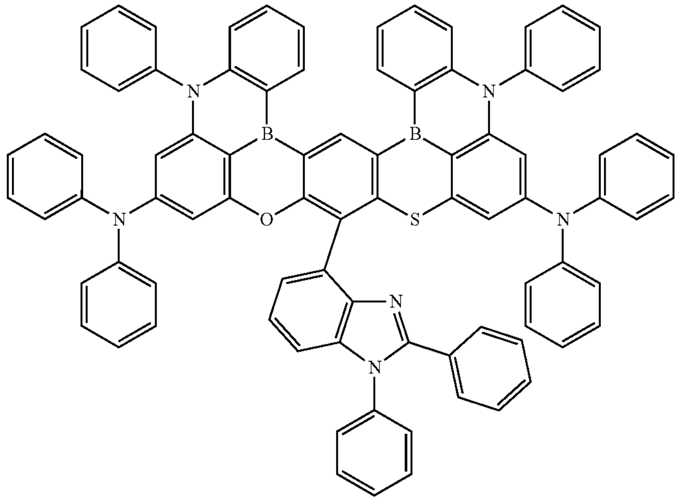
55
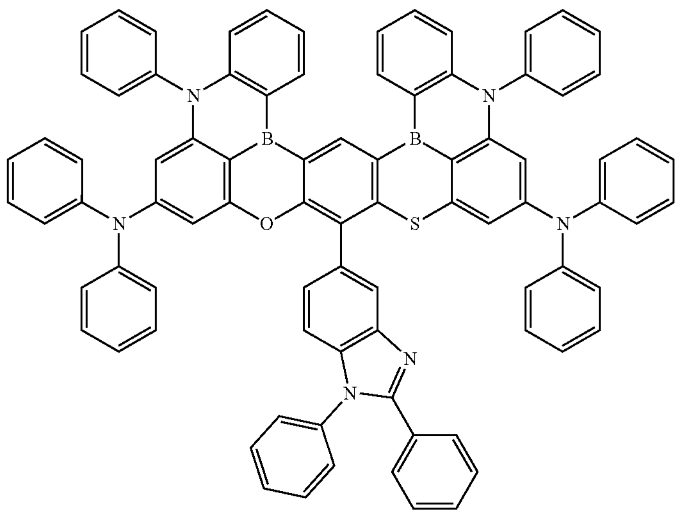
56
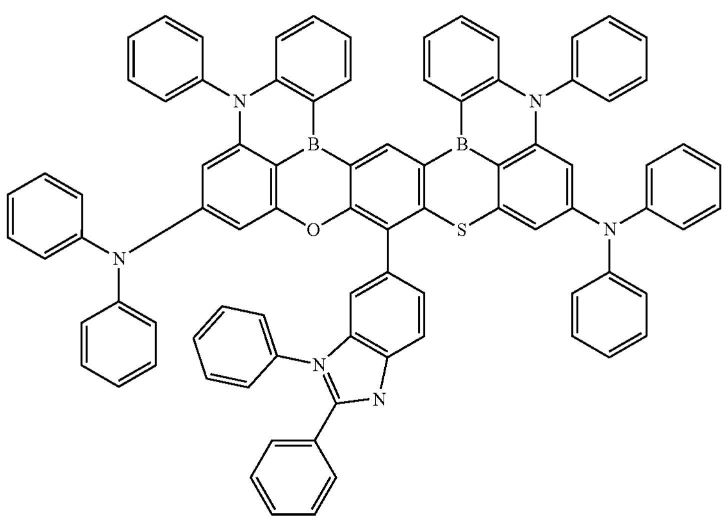

-continued
57
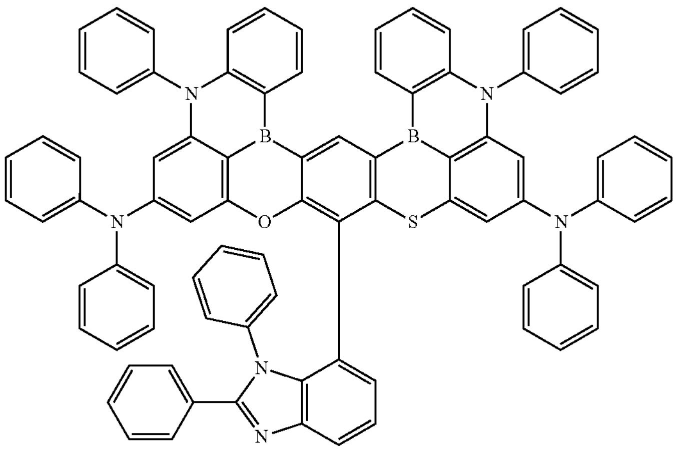
58
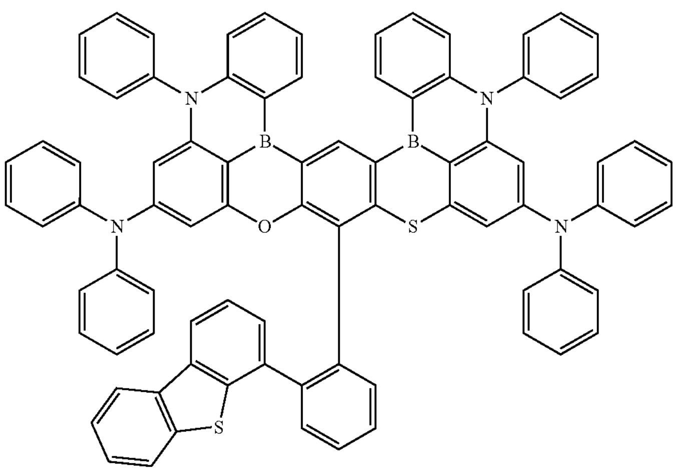
59
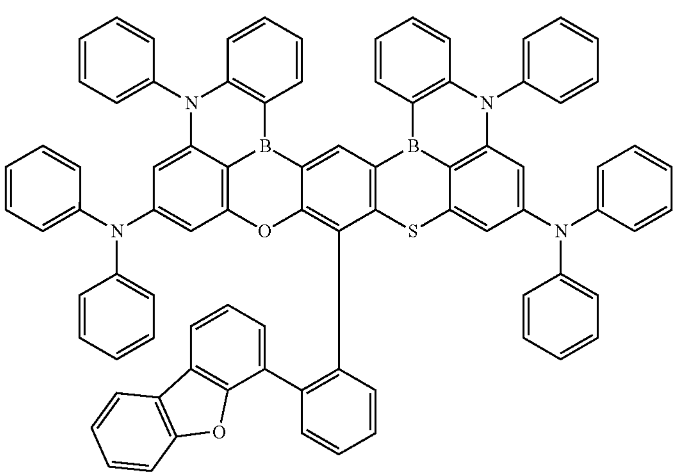

-continued
60
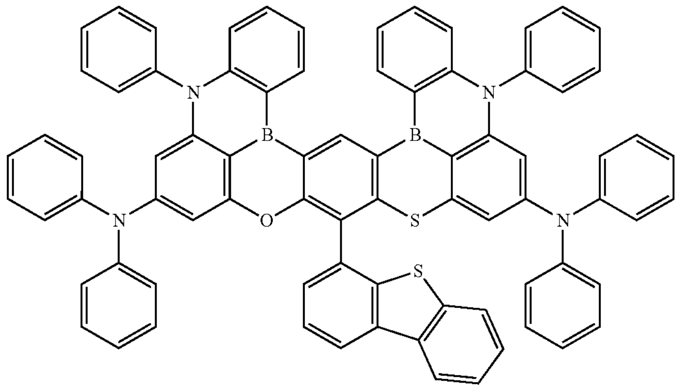
61
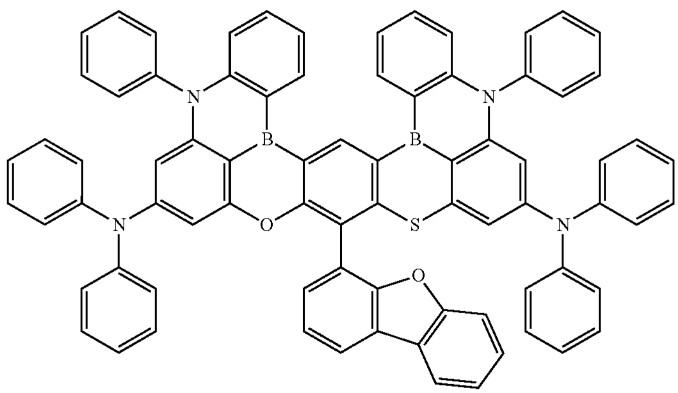
62
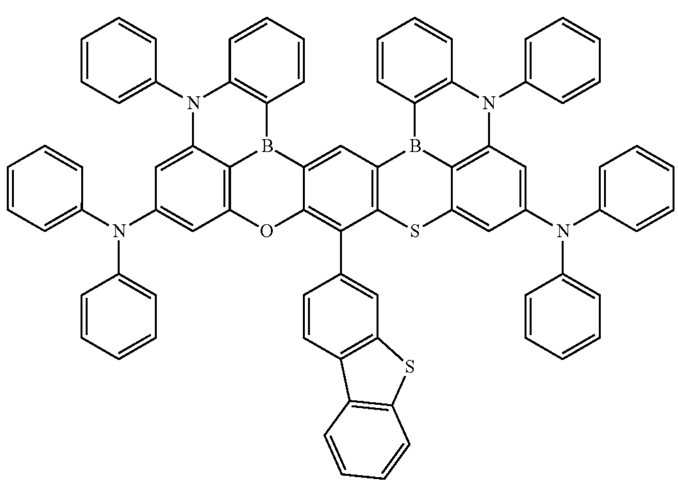

-continued
63
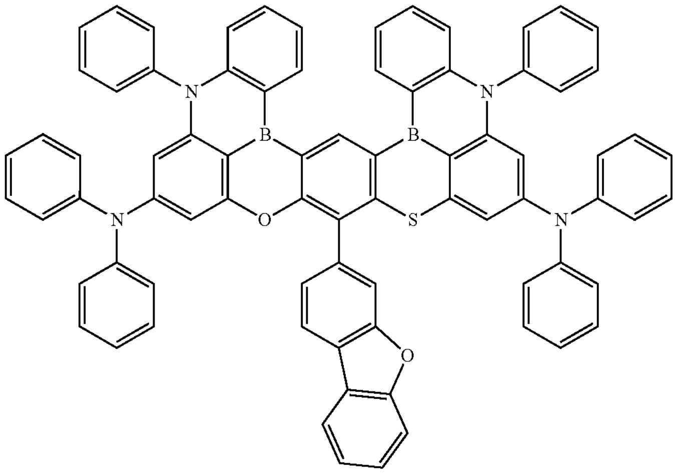
64
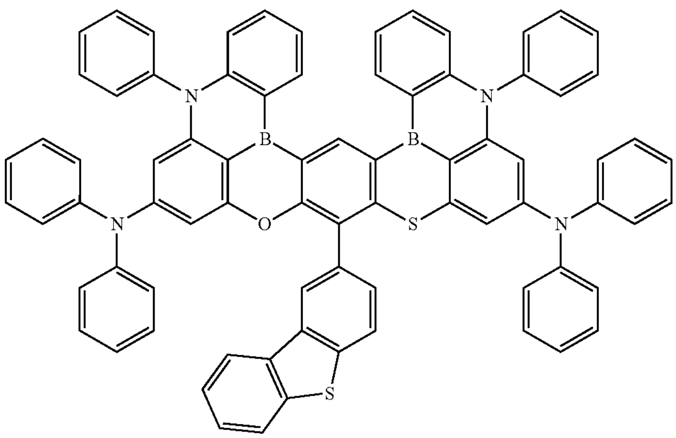
65
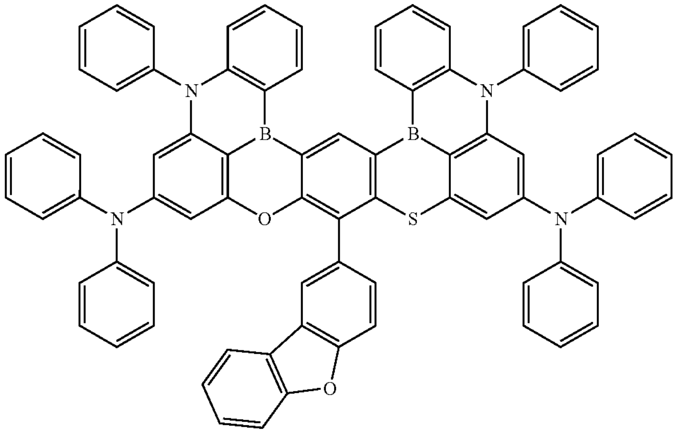

-continued
66
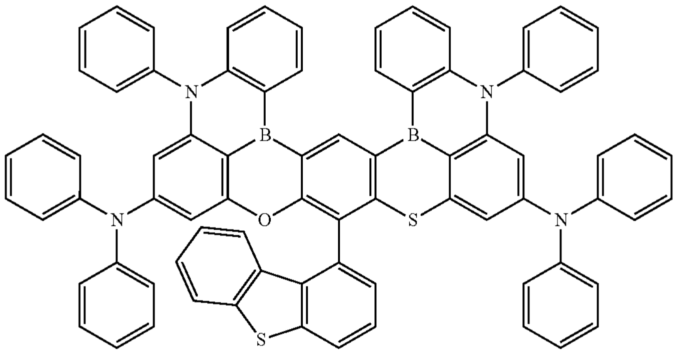
67
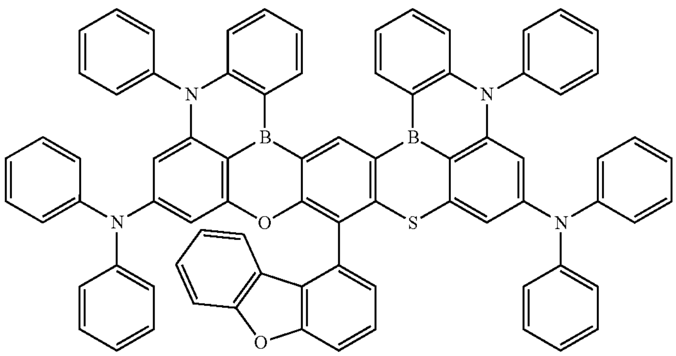
68
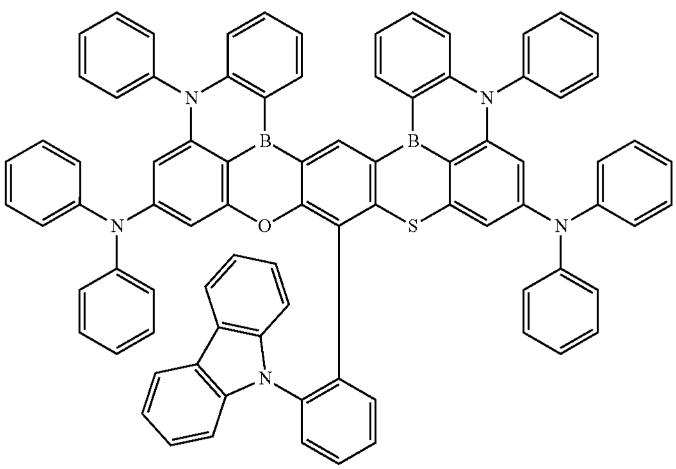
69
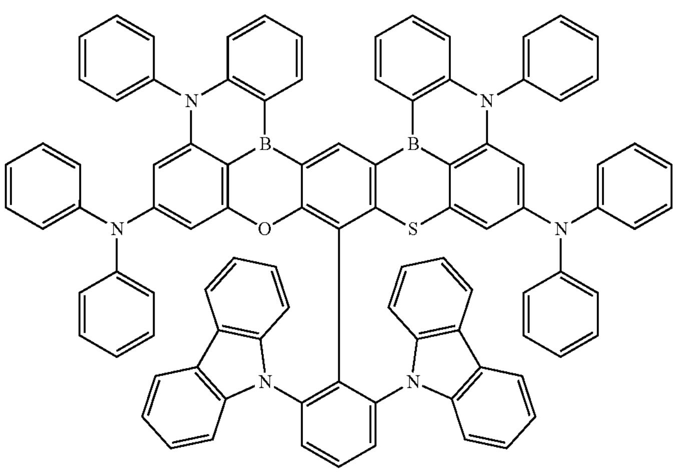

-continued
70
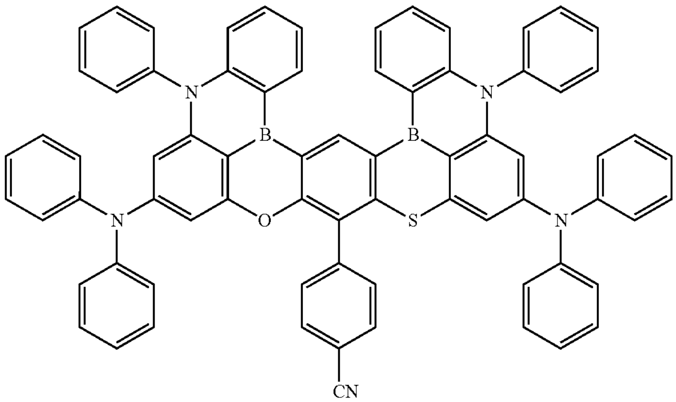
71
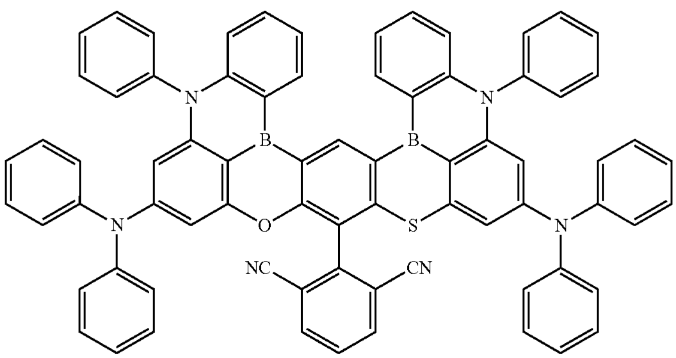
72
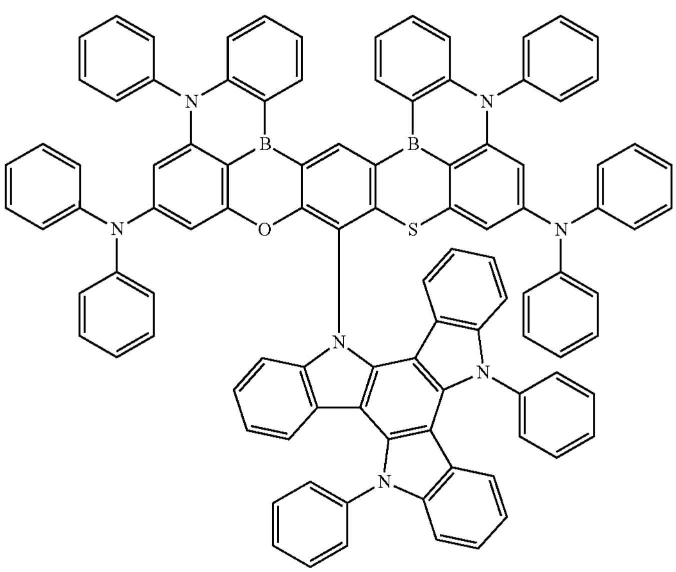

-continued
73
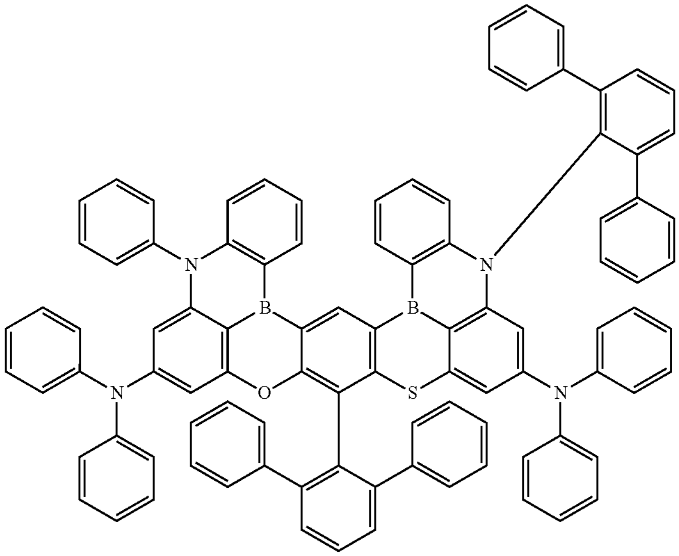
74
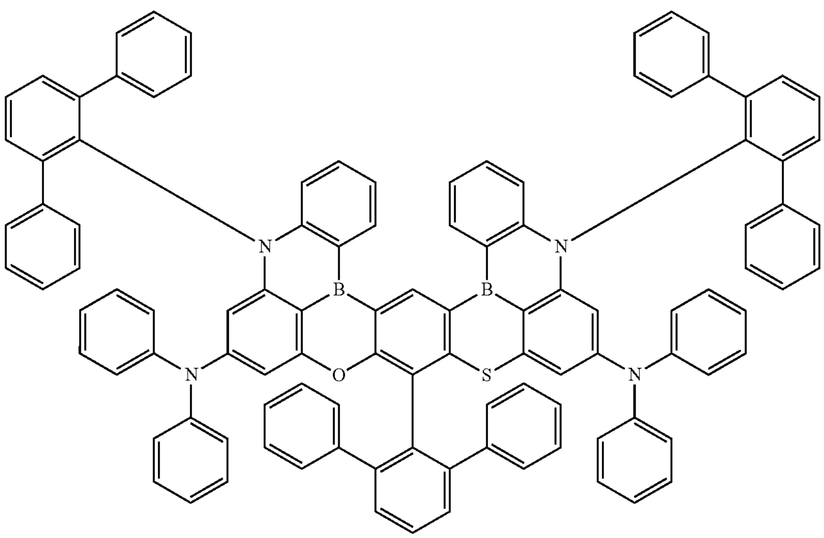
75
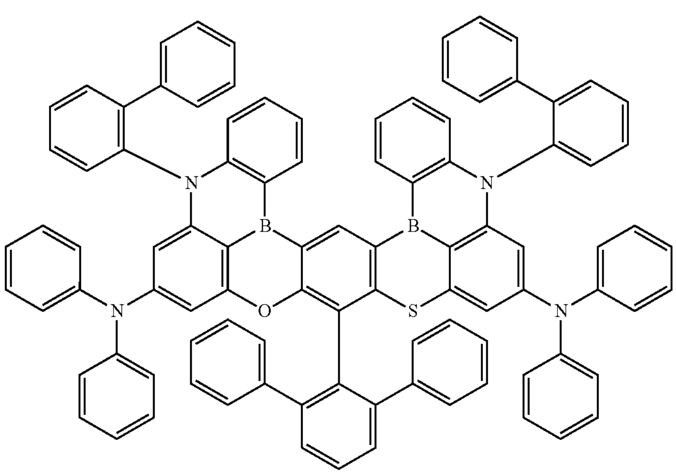

-continued
76
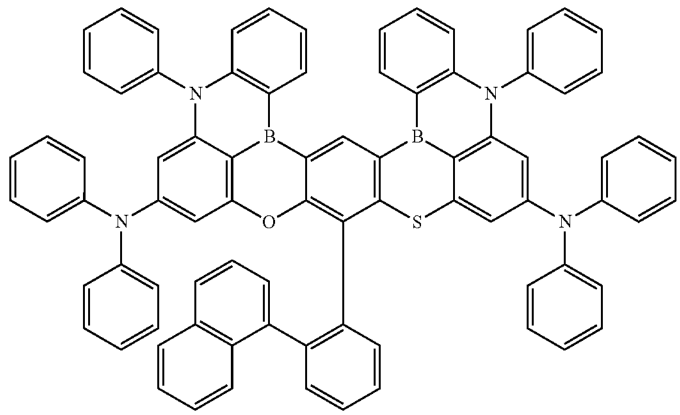
77
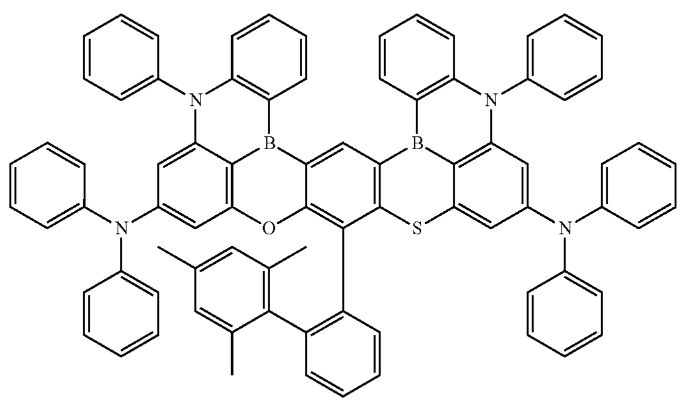
78
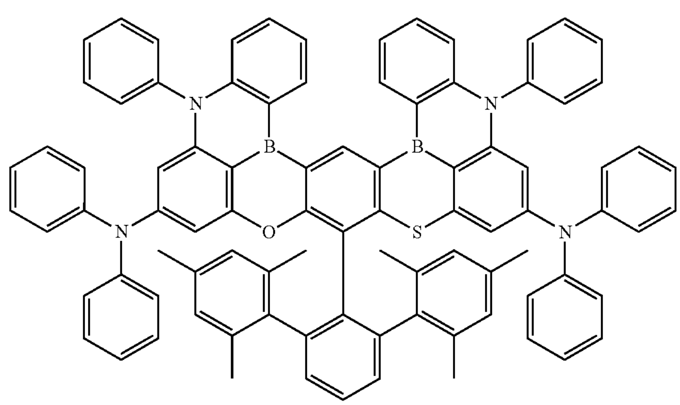

-continued
79
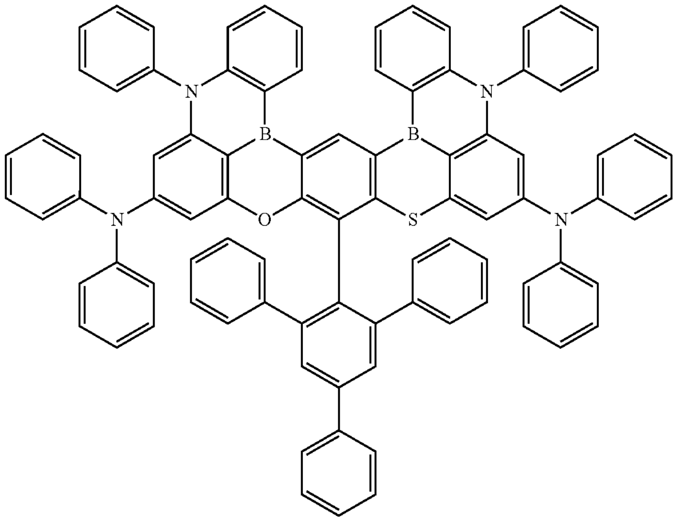
80
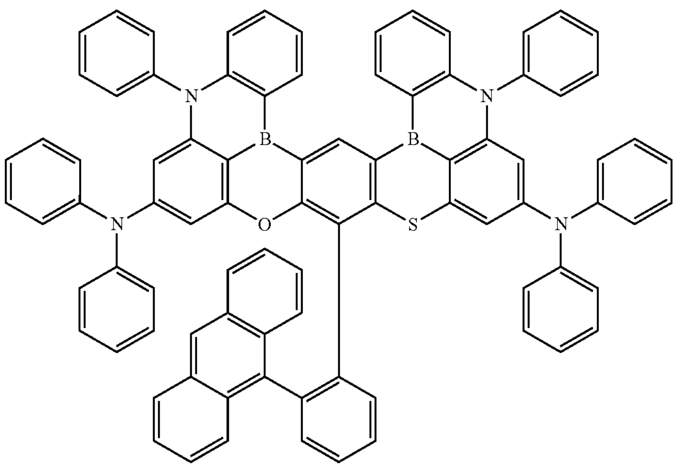
81
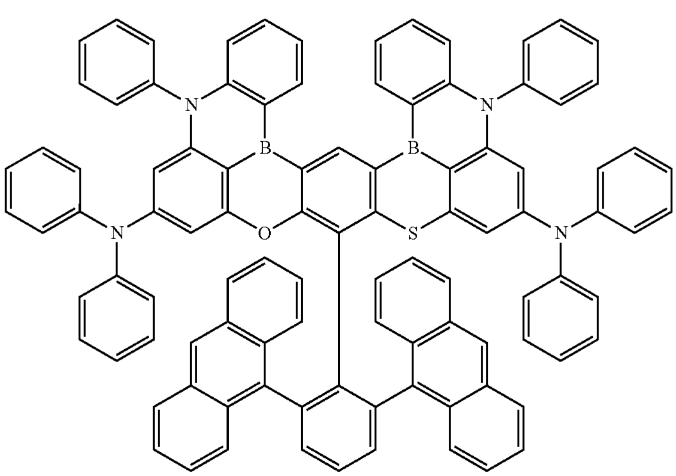

-continued
81-a
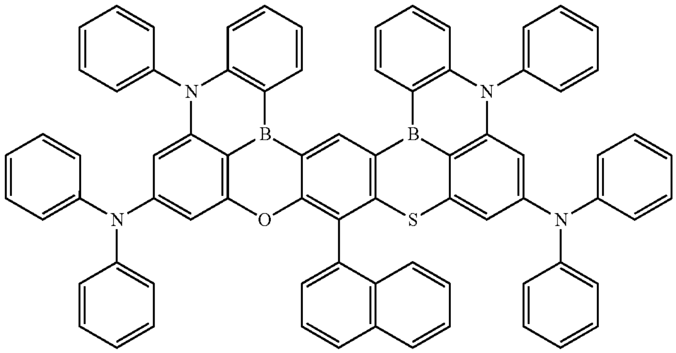
82
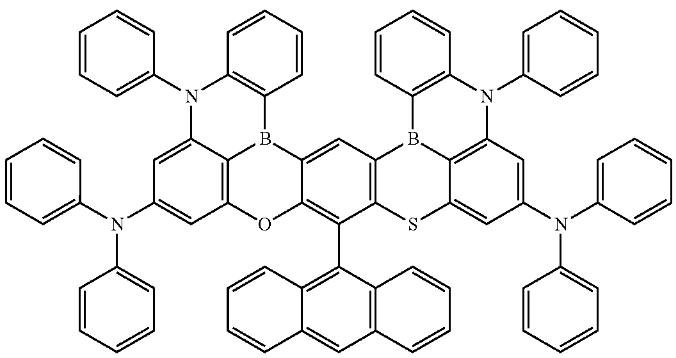
83
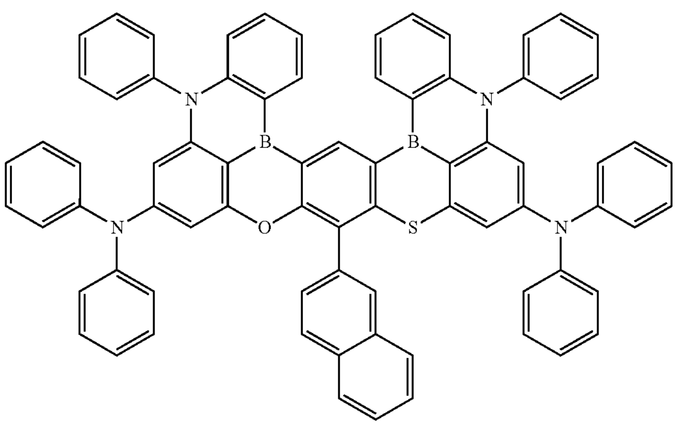
84
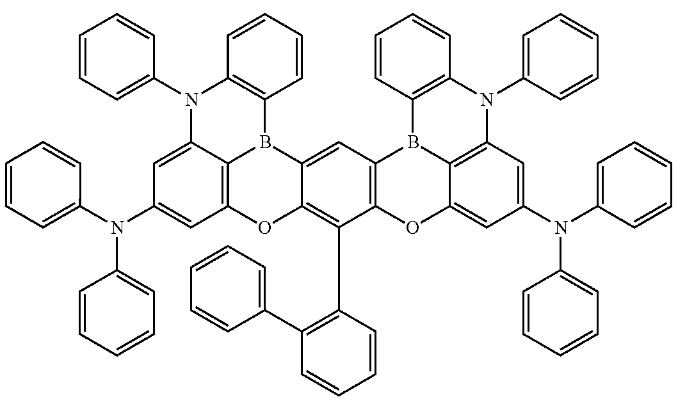

-continued
85
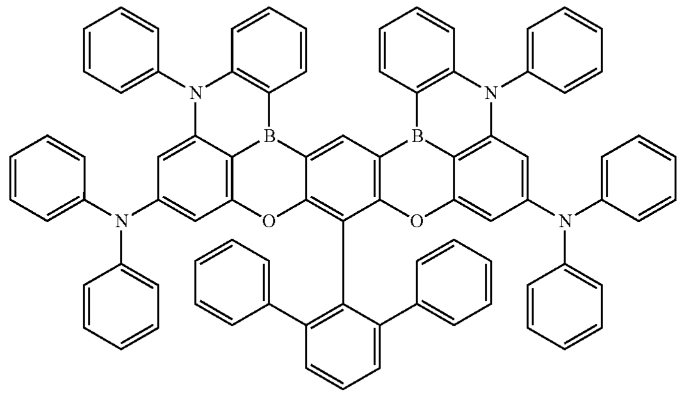
86
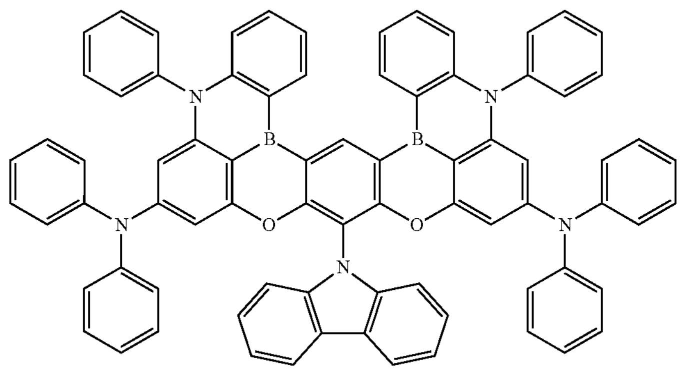
87
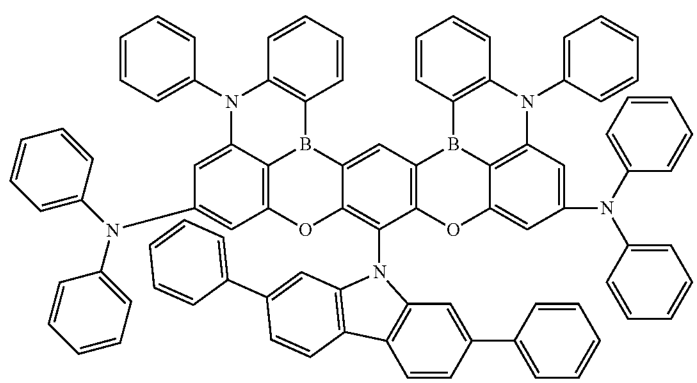
88
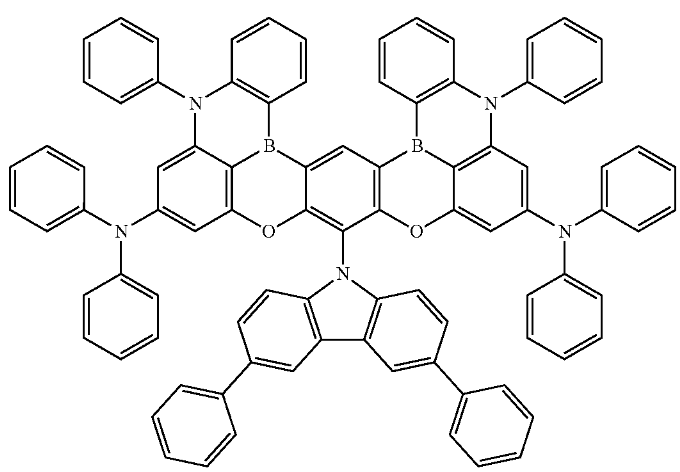

-continued
89
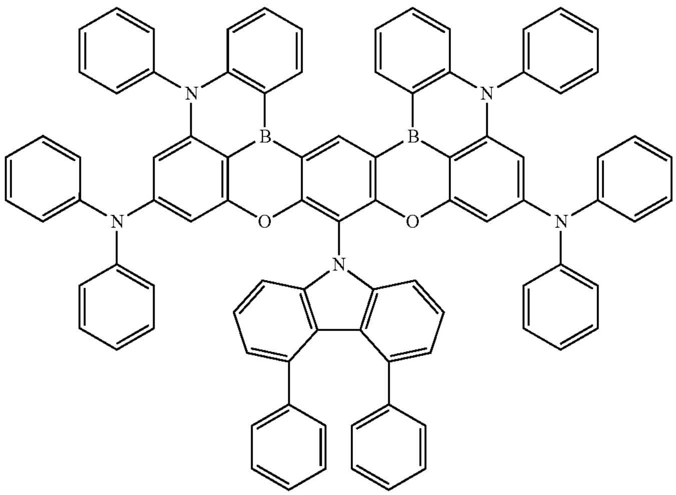
90
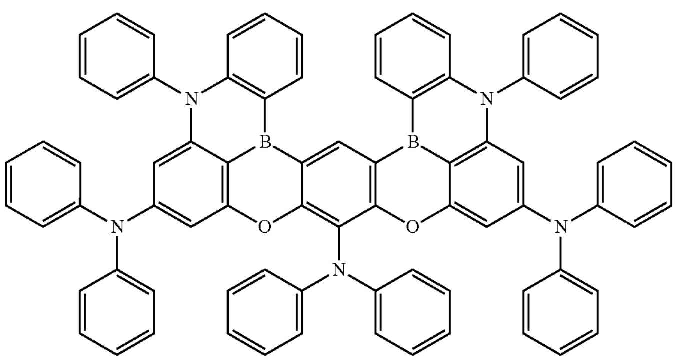
91
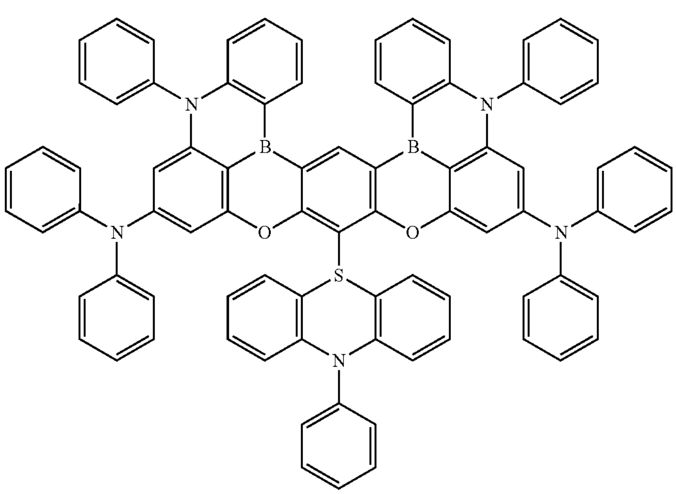

-continued
92
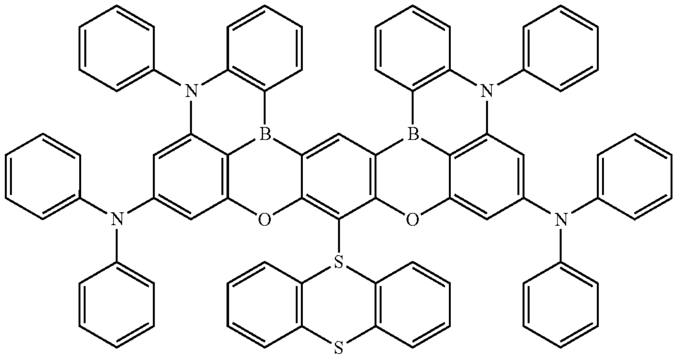
93
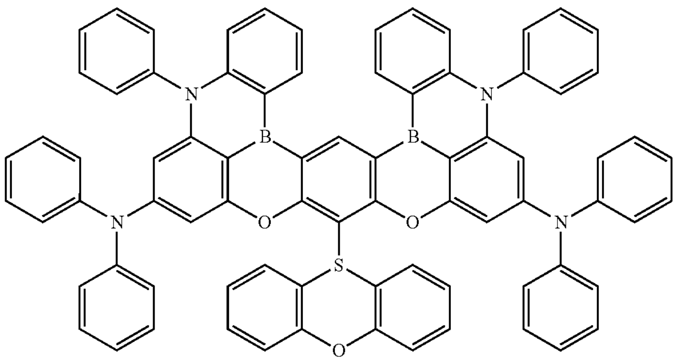
94
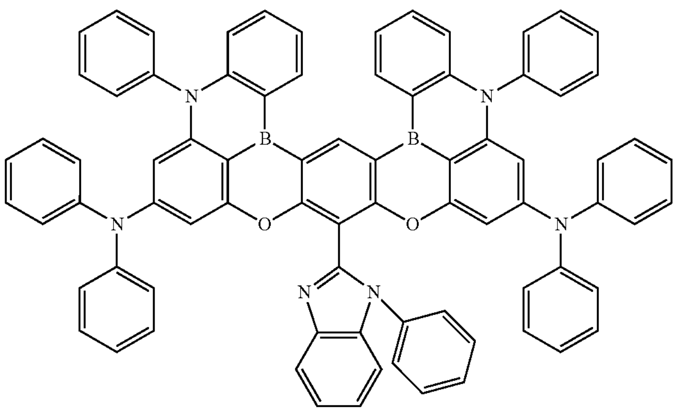
95
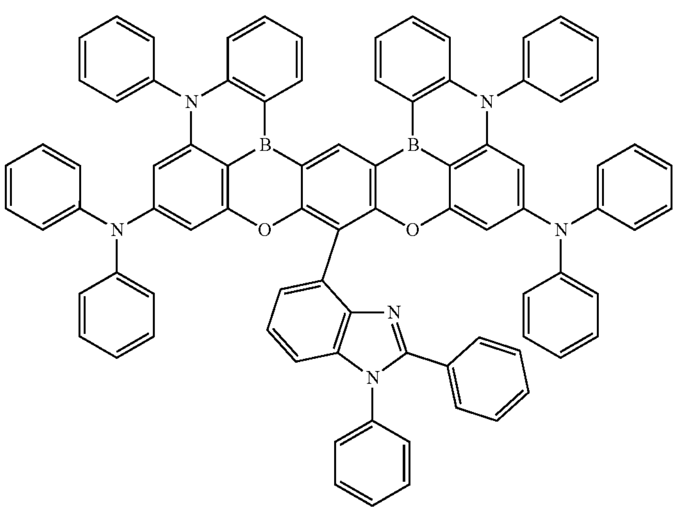

-continued
96
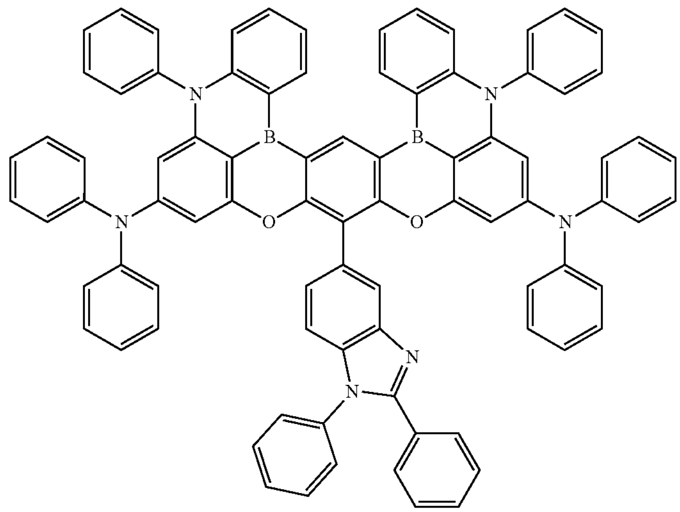
97
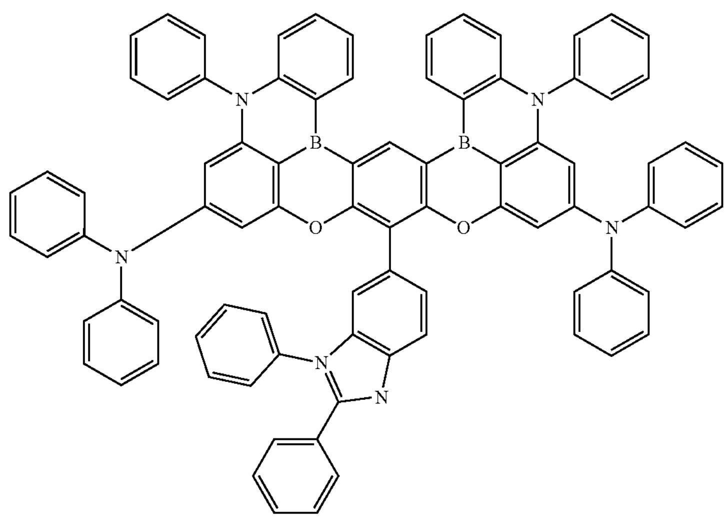
98
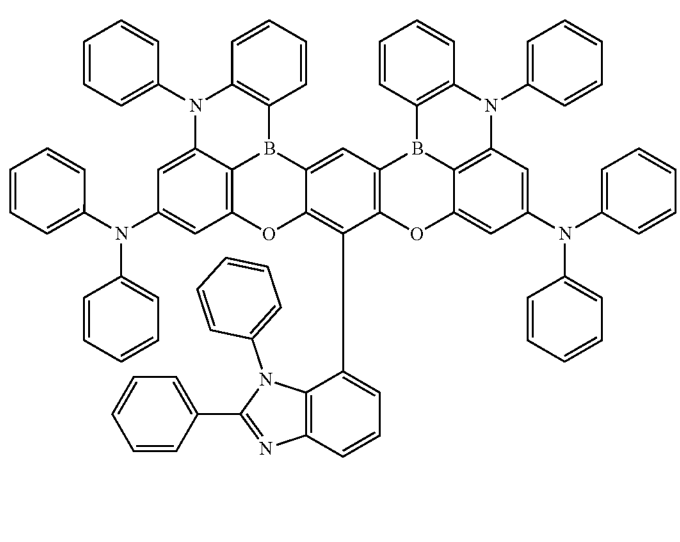

-continued
99
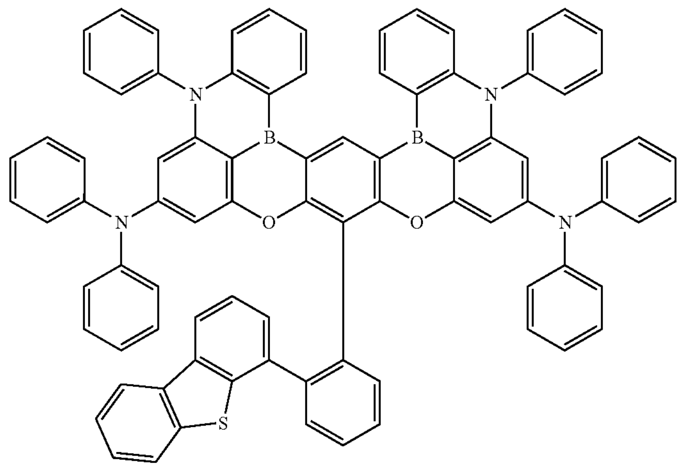
100
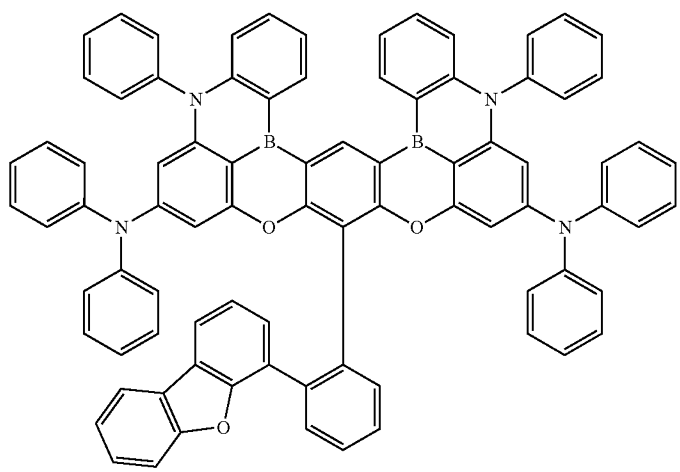
101
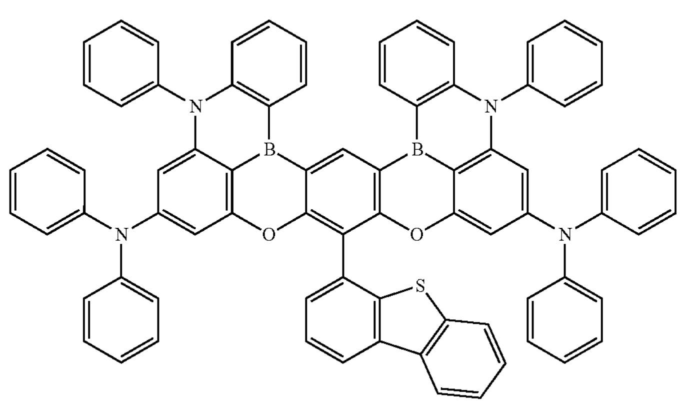

-continued
102
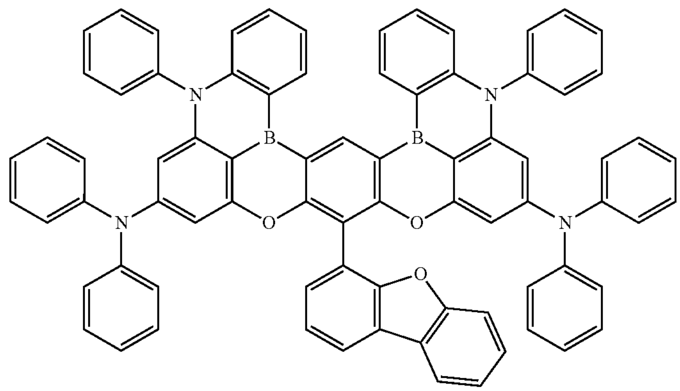
103
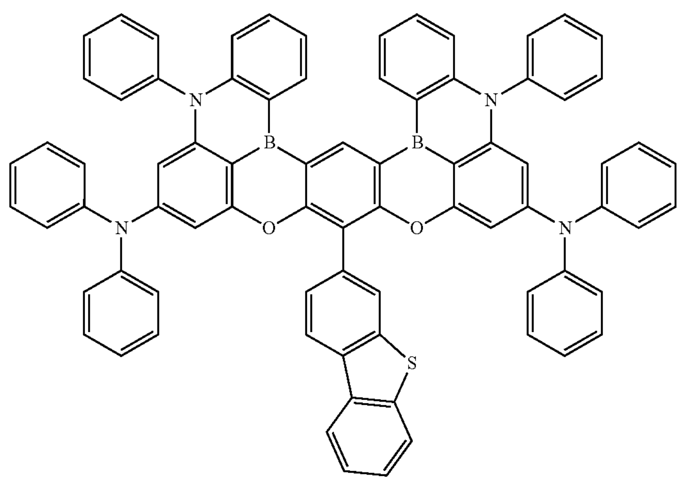
104
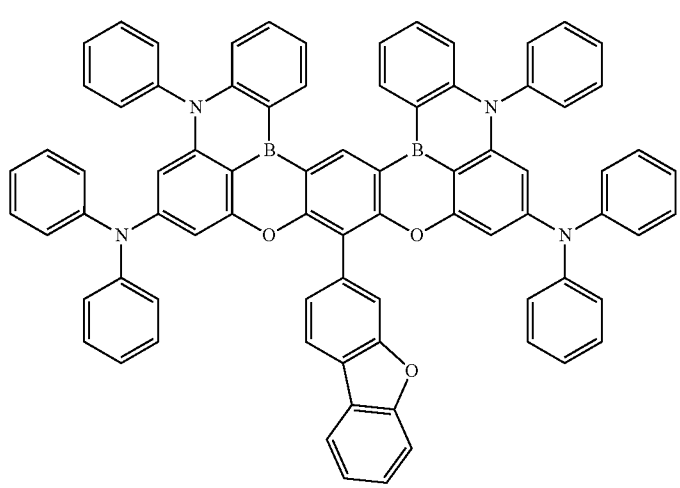

-continued
105
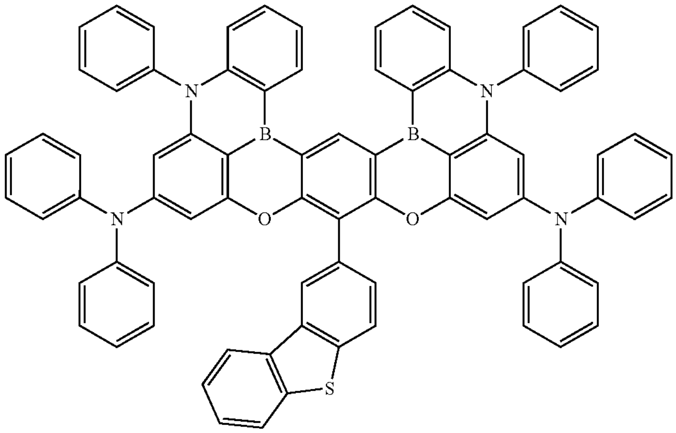
106
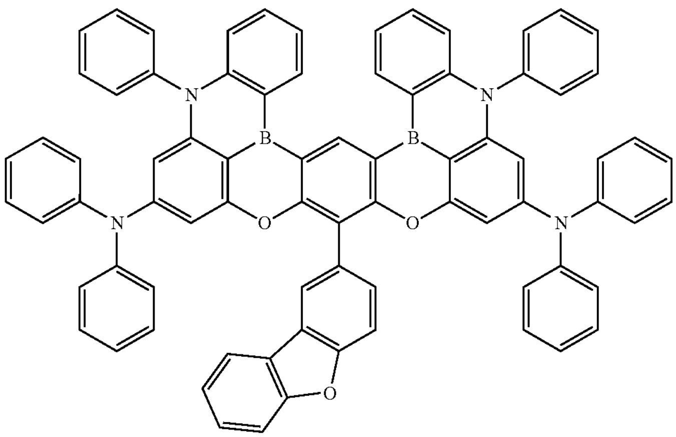
107
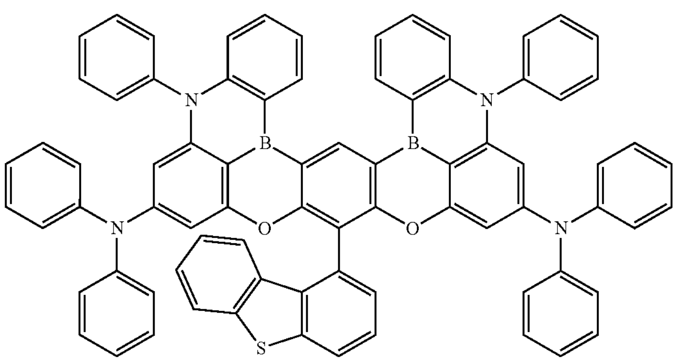
108
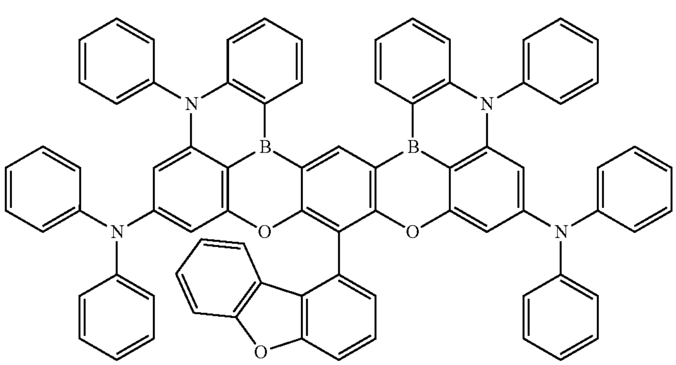

-continued
109
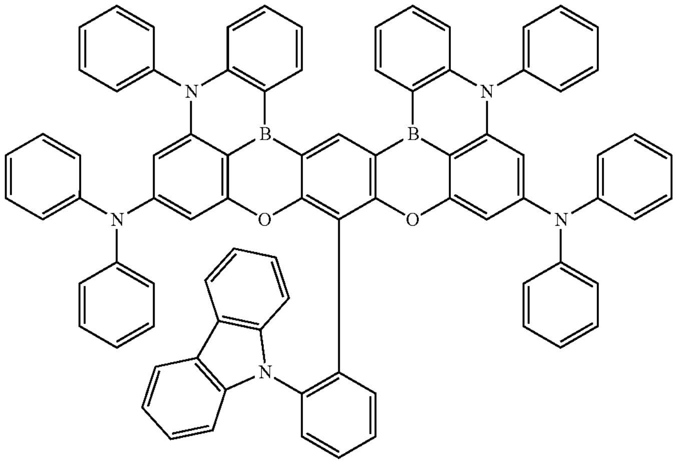
110
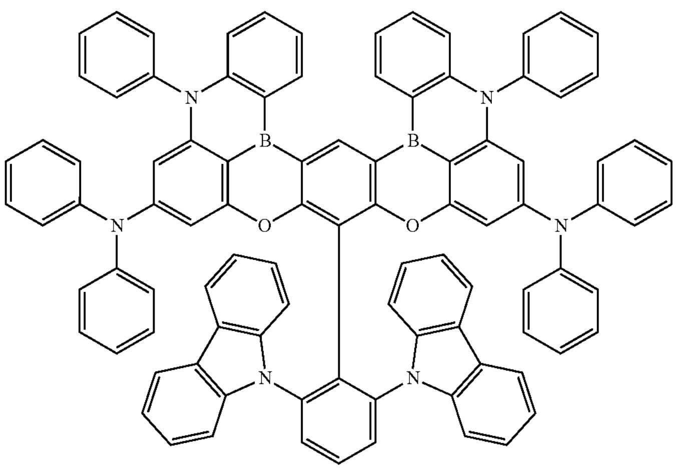
111
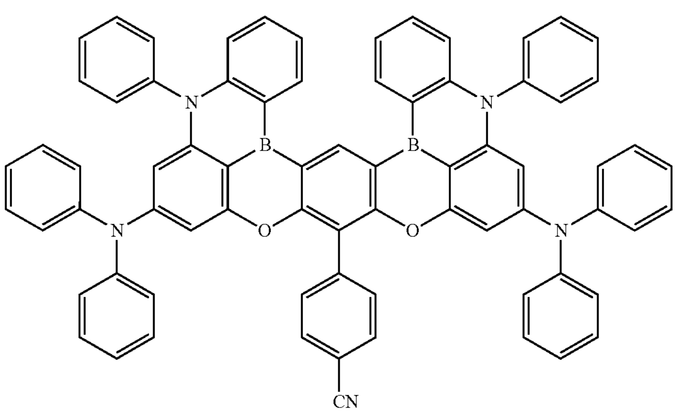

-continued
112
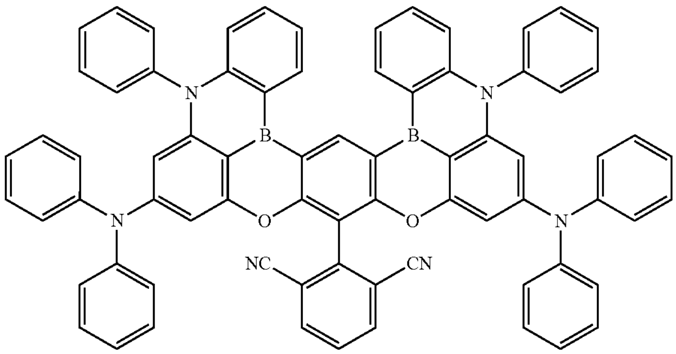
113
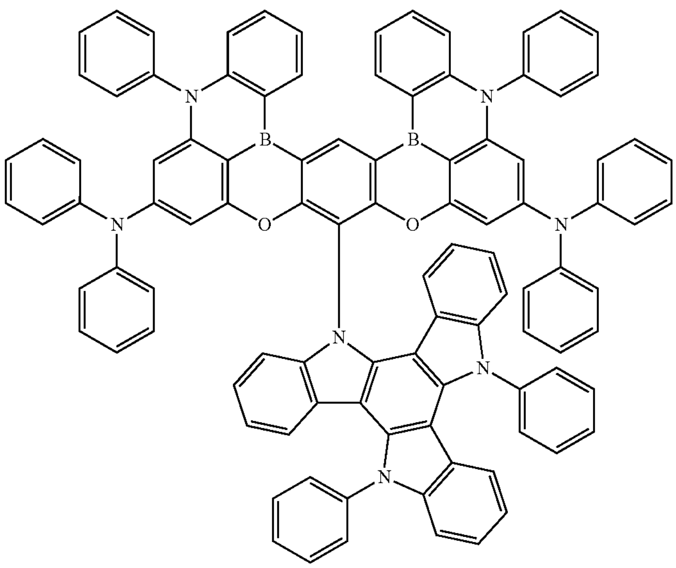
114
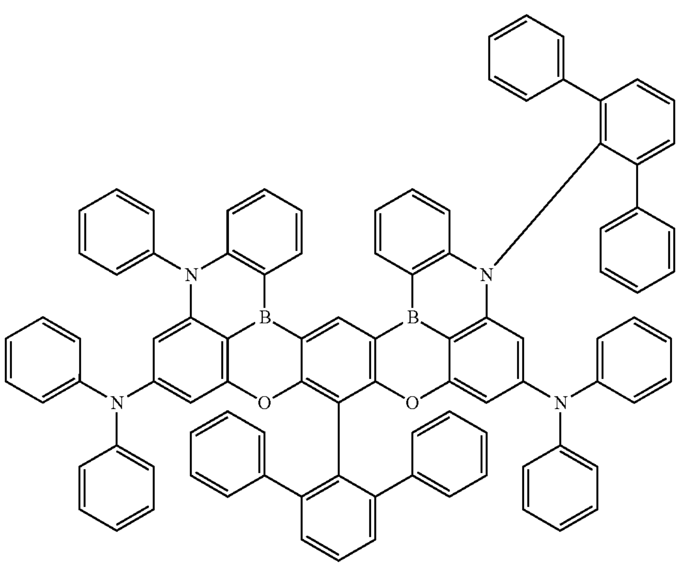

-continued
115
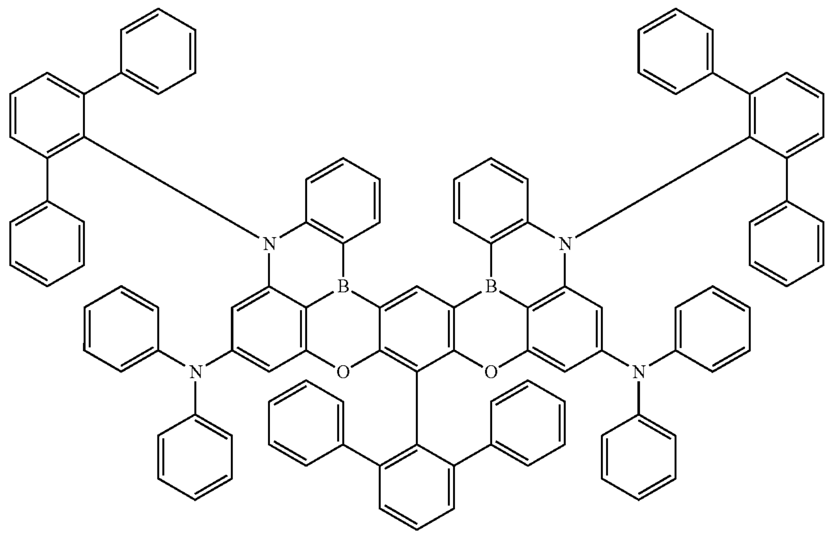
116
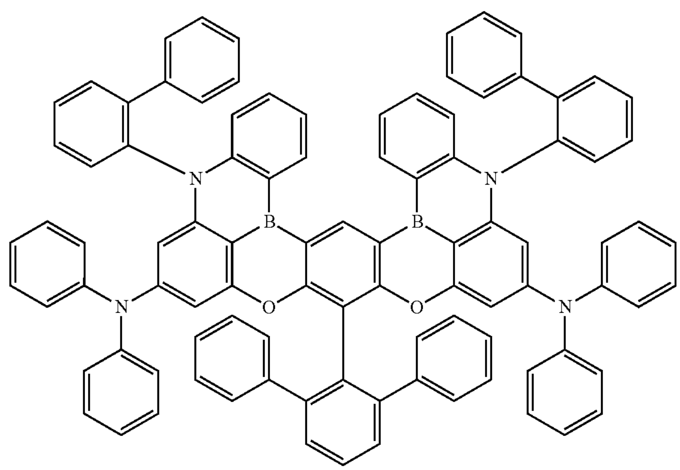
117
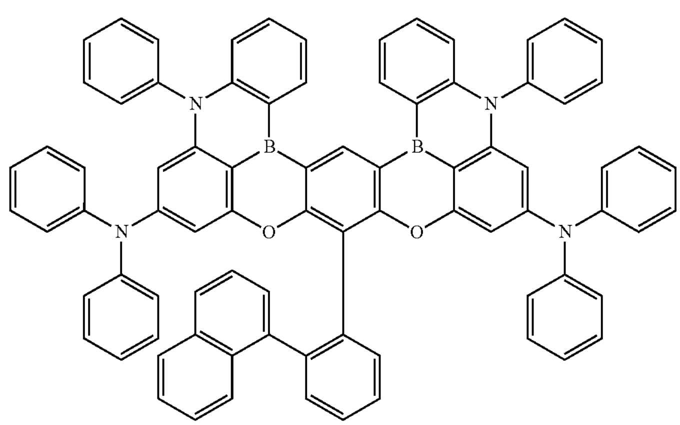

-continued
118
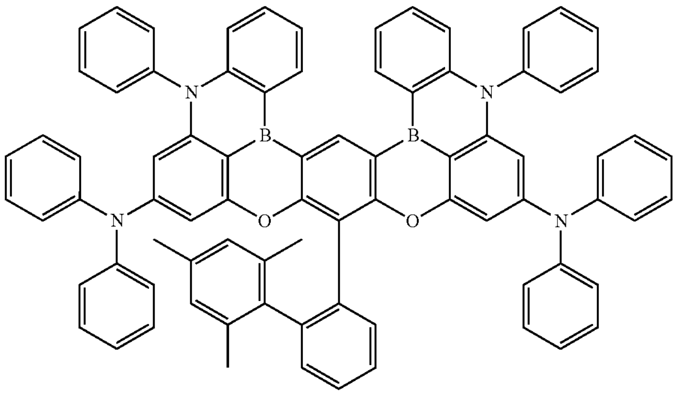
119
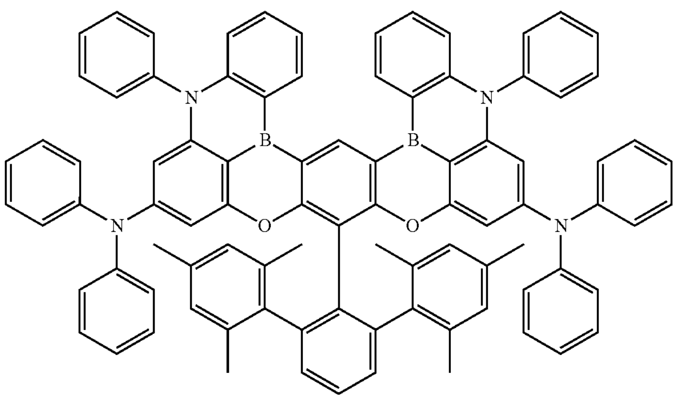
120
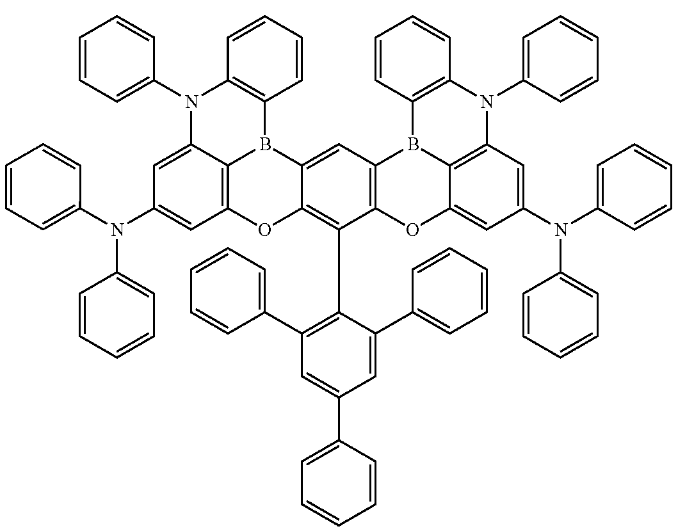

-continued
121
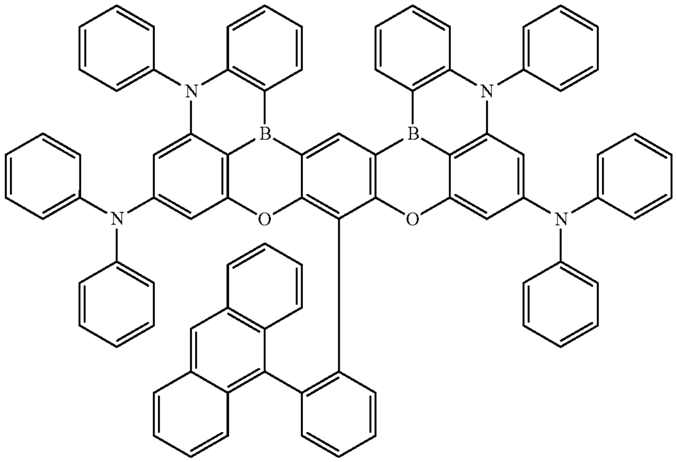
122
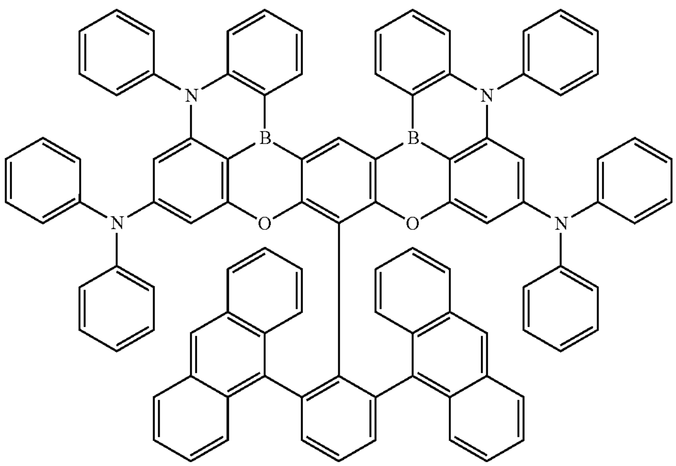
123
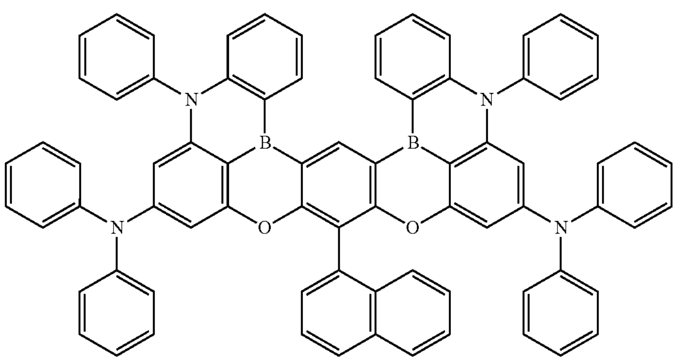
124
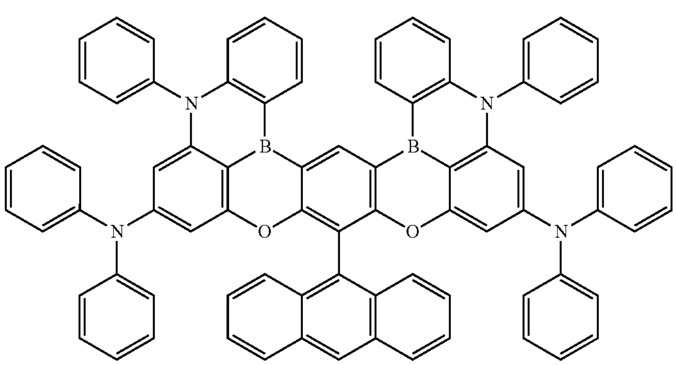

-continued
125
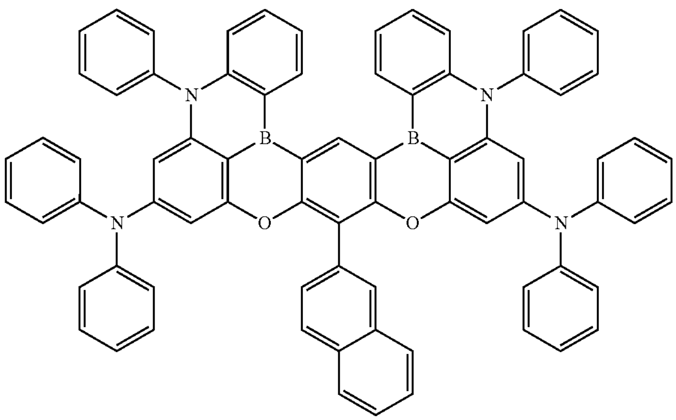
126
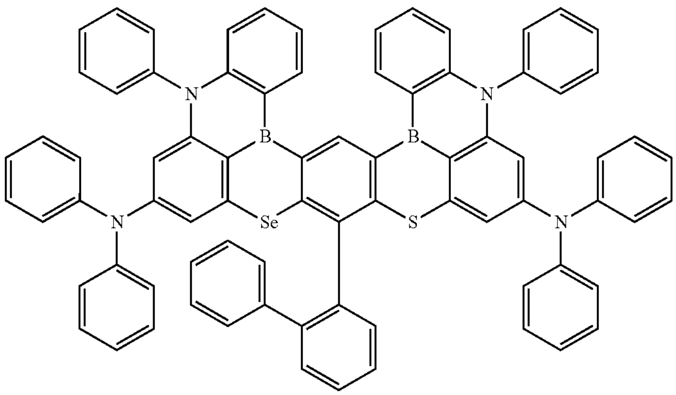
127
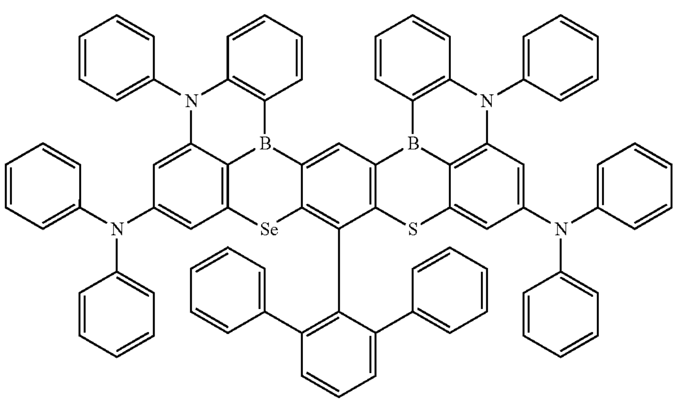
128
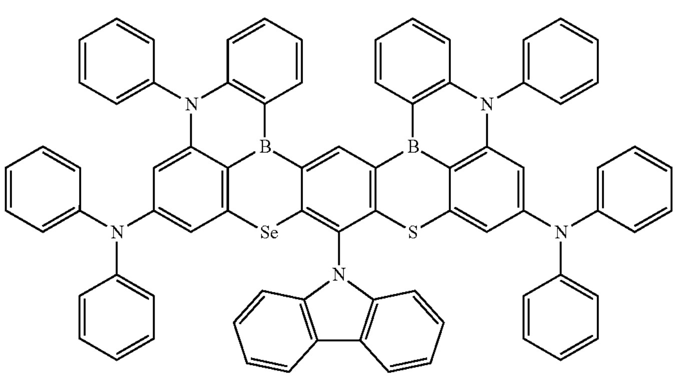

-continued
129
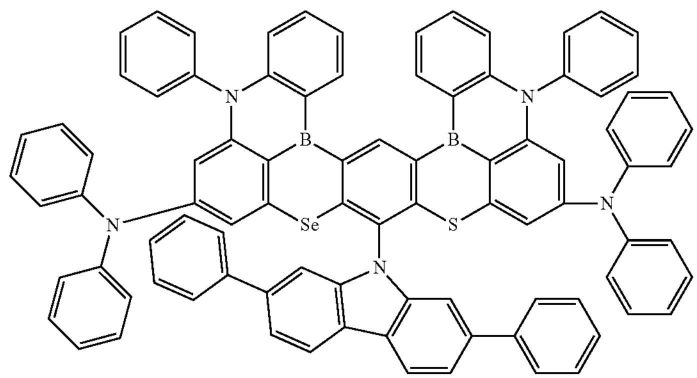
130
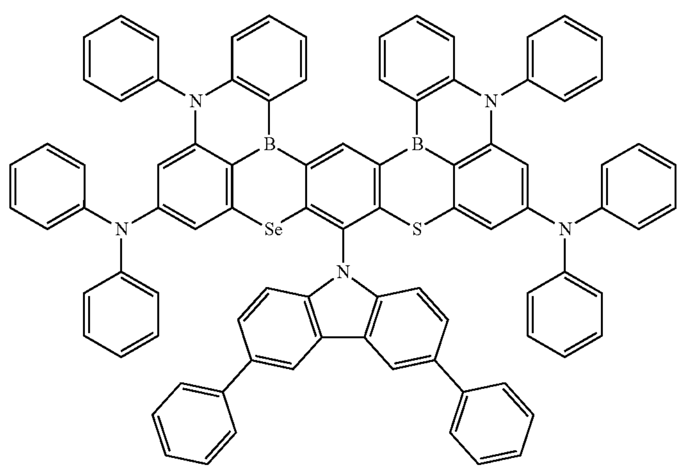
131
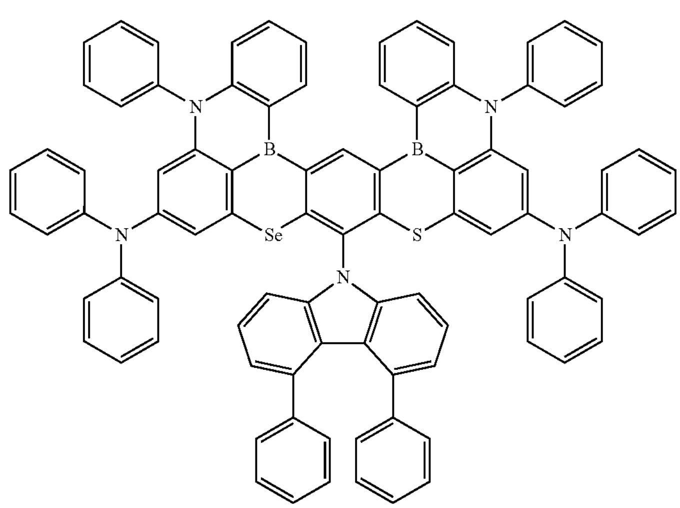

-continued
132
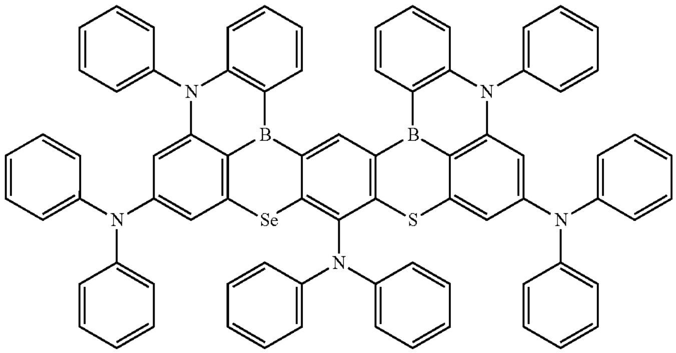
133
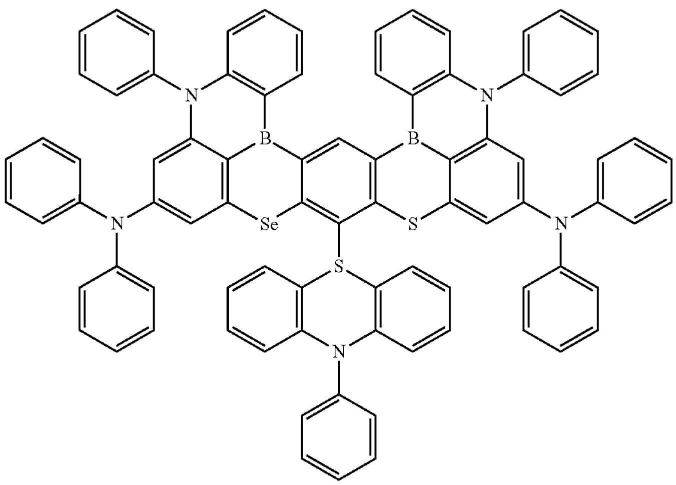
134
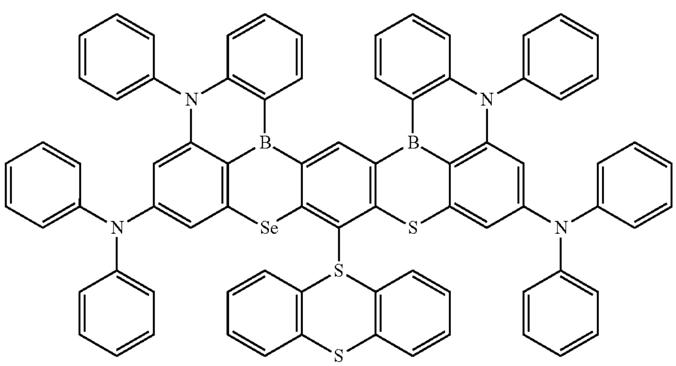
135
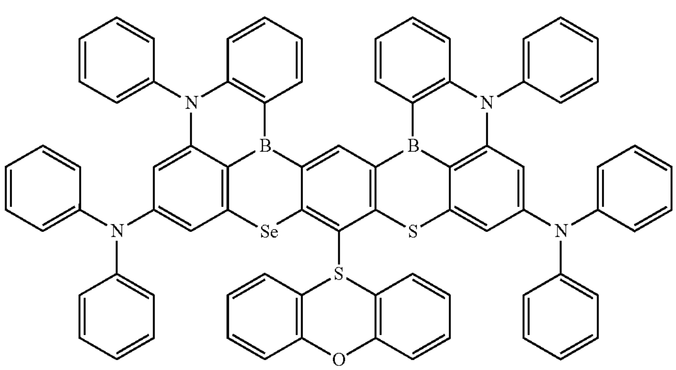

-continued
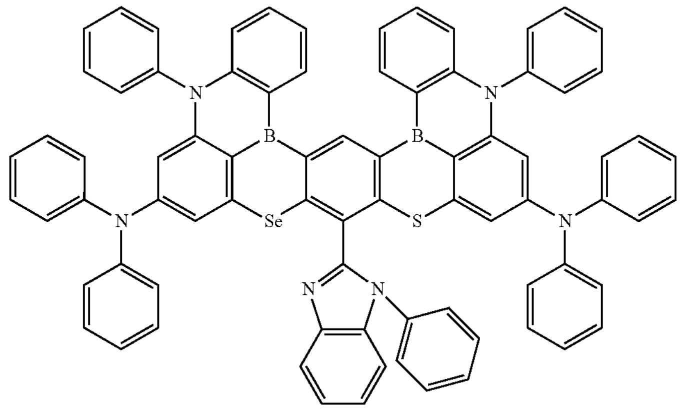
136
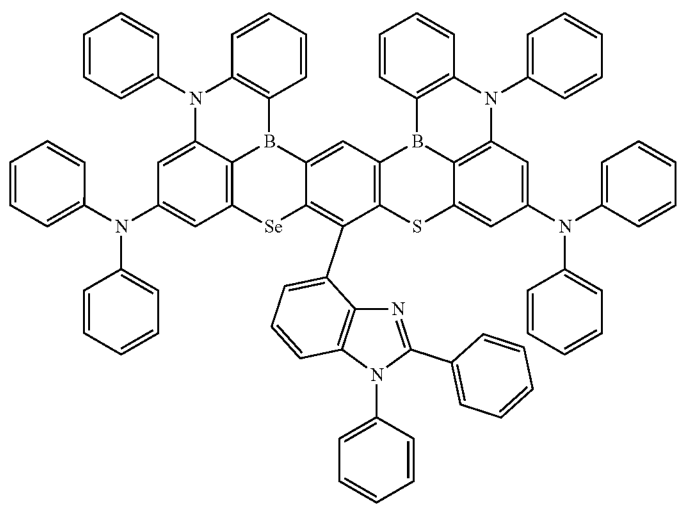
137
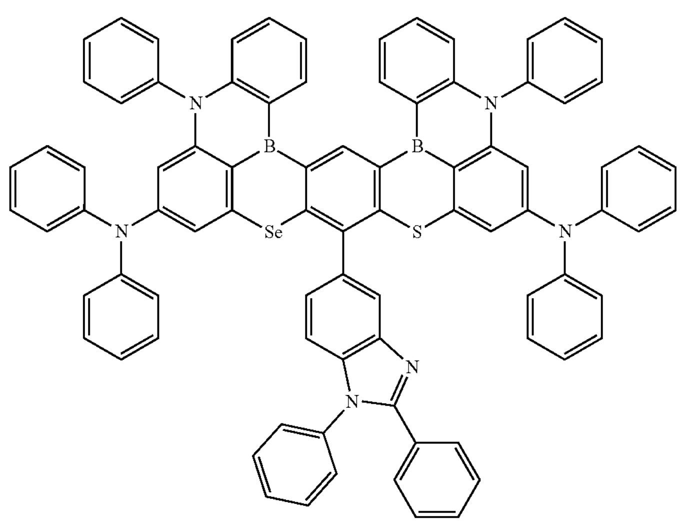
138

-continued
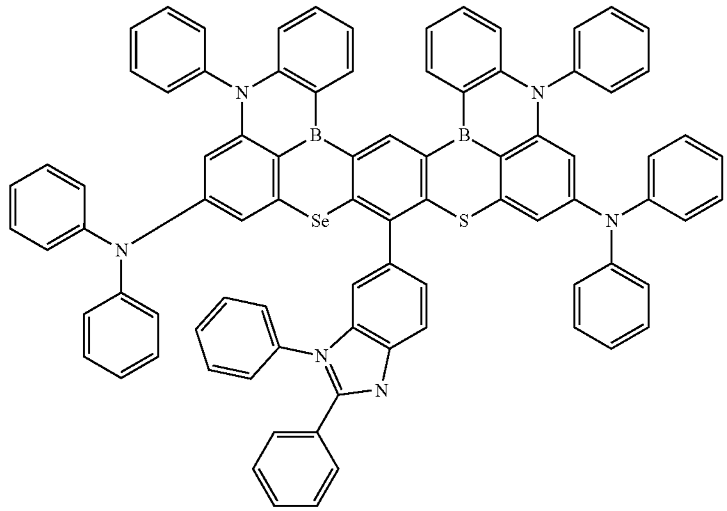
139
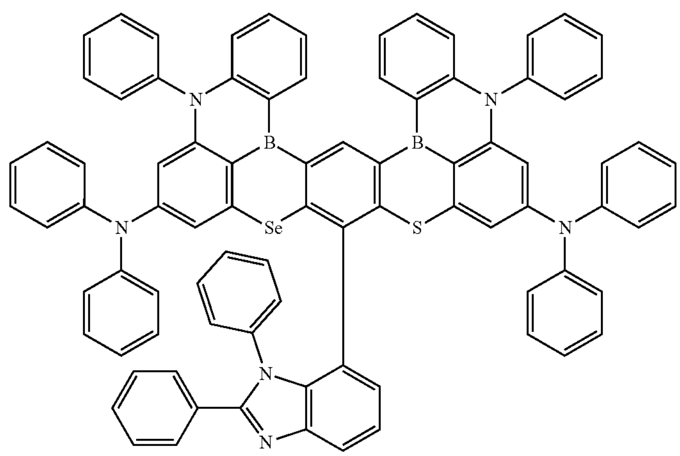
140
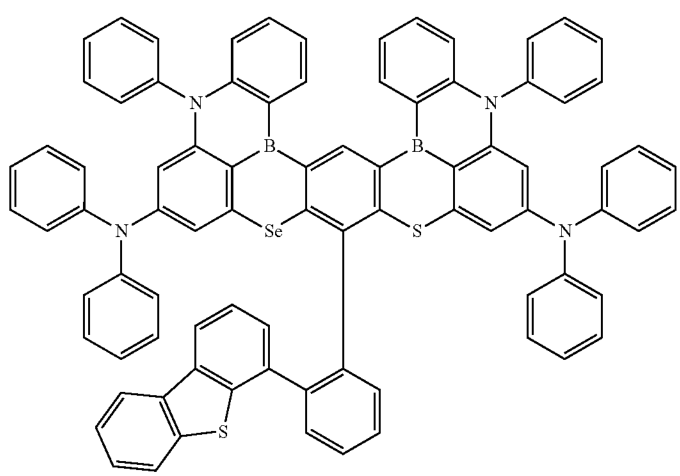
141

-continued
142
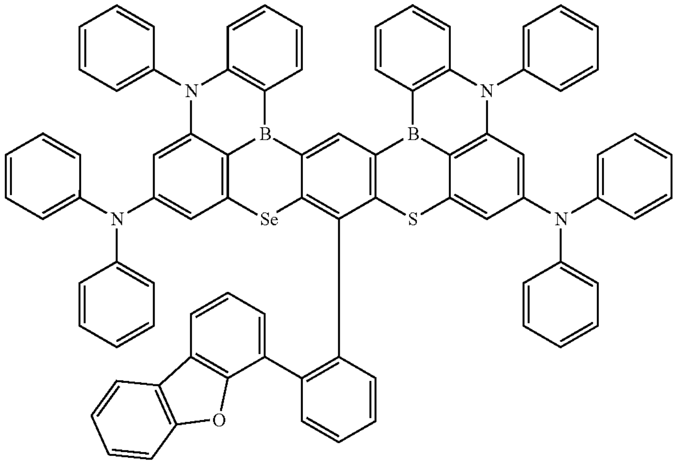
143
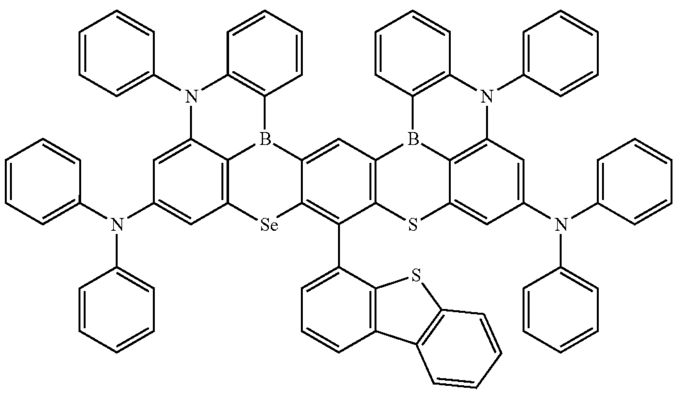
144
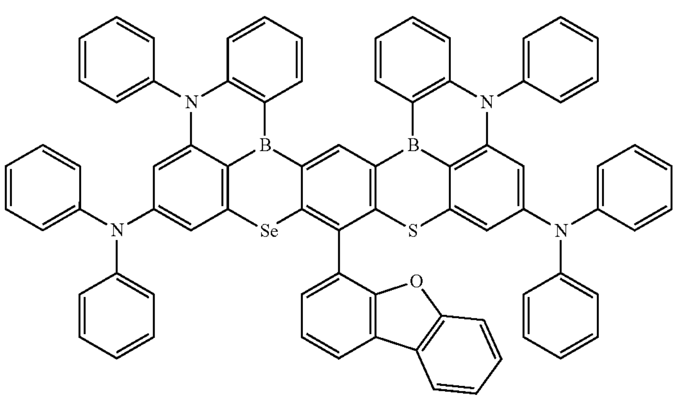

-continued
145
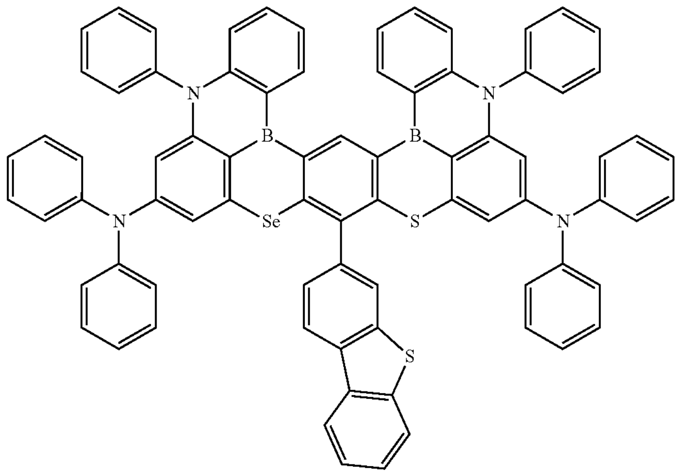
146
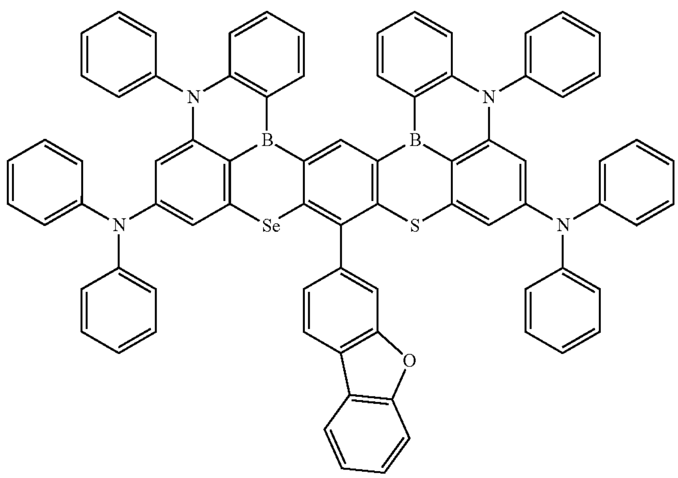
147
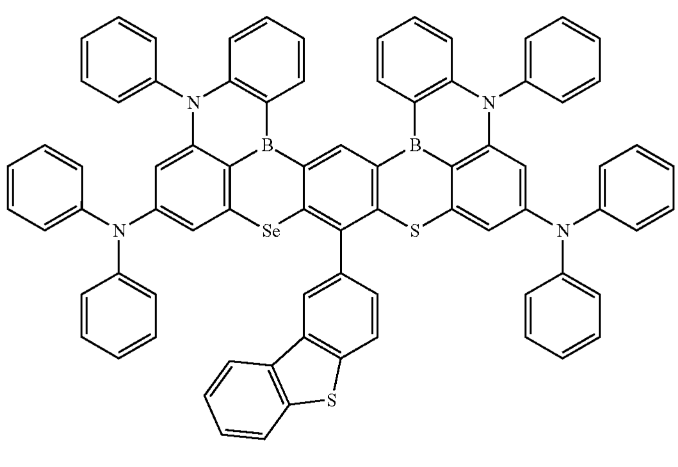

-continued
148
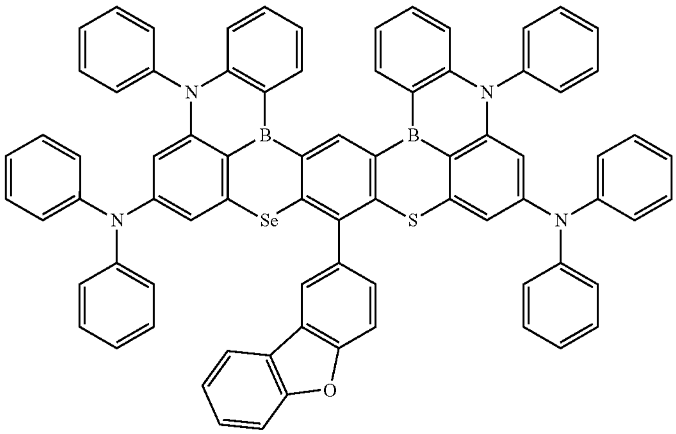
149
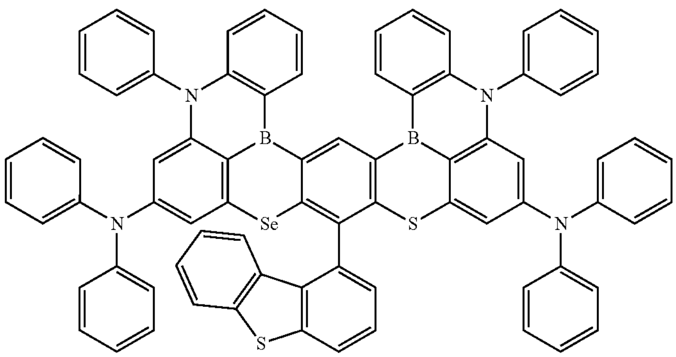
150
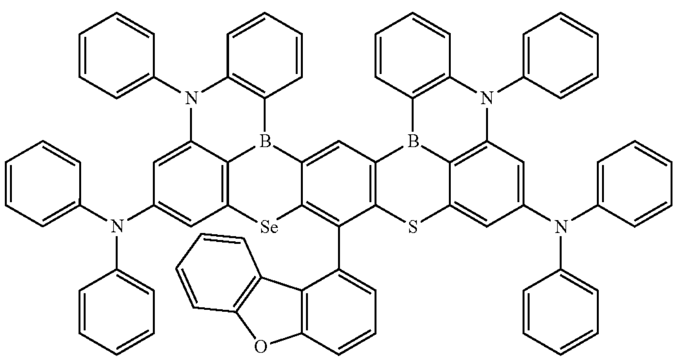
151
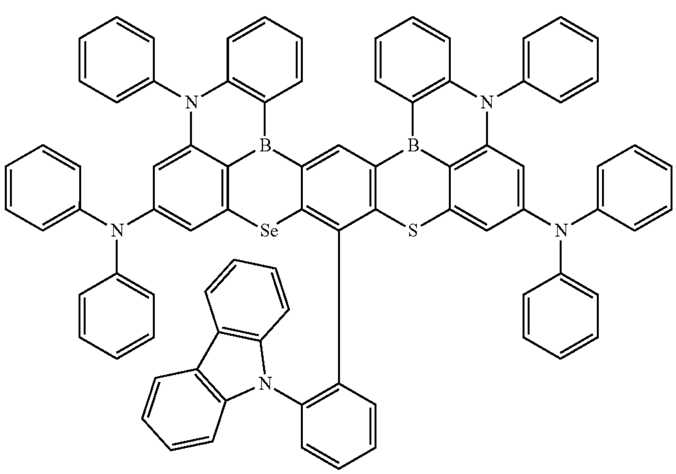

-continued
152
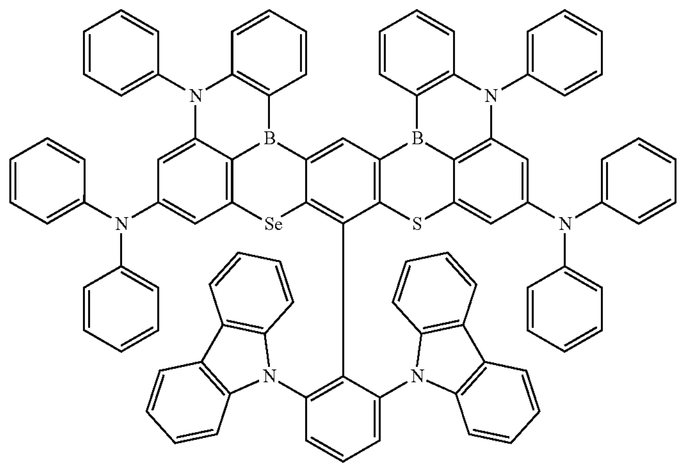
153
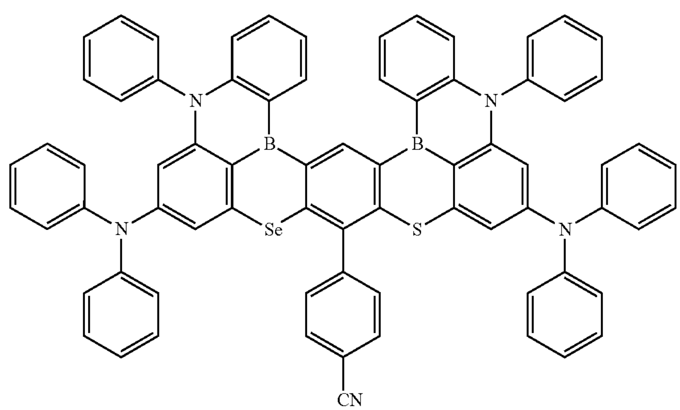
154
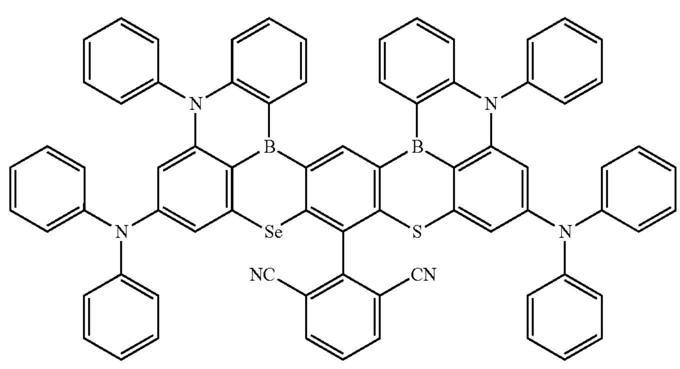

-continued
155
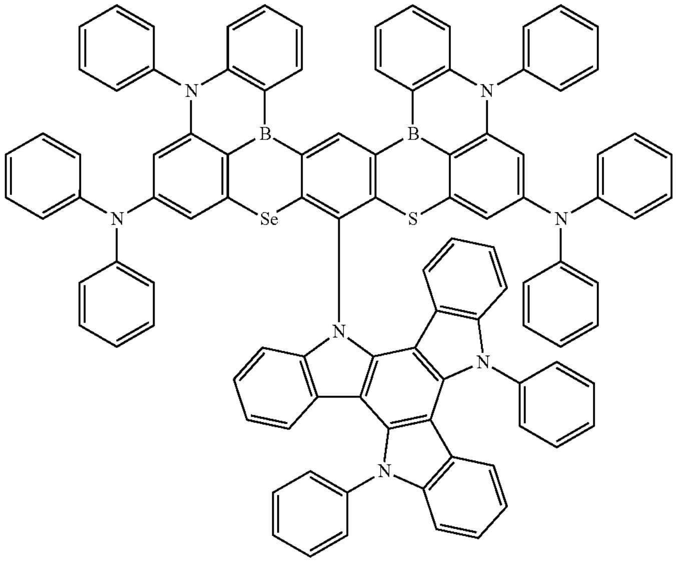
156
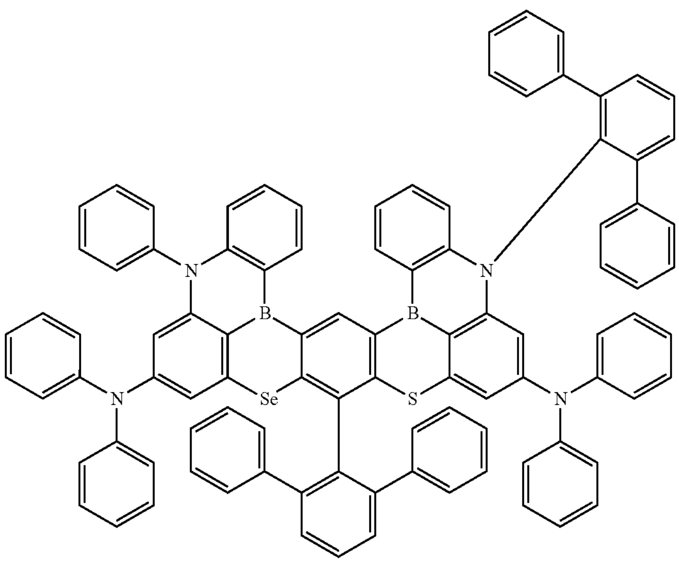
157
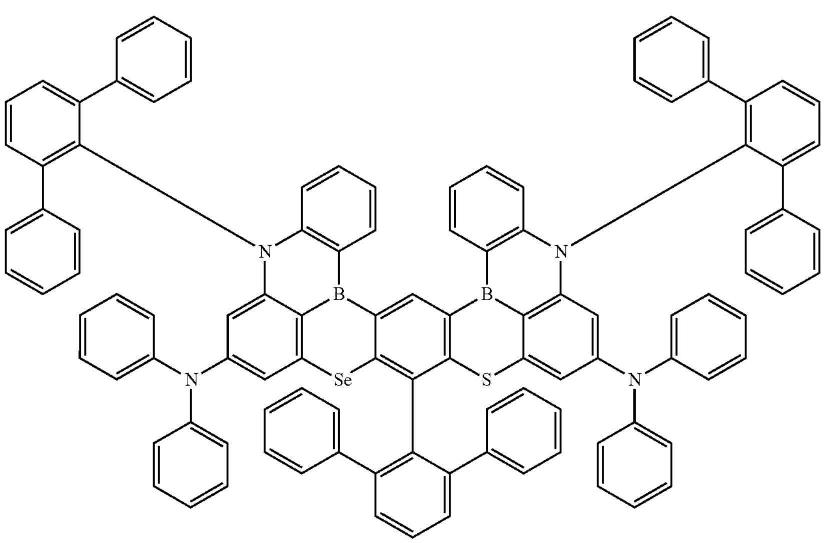

-continued
158
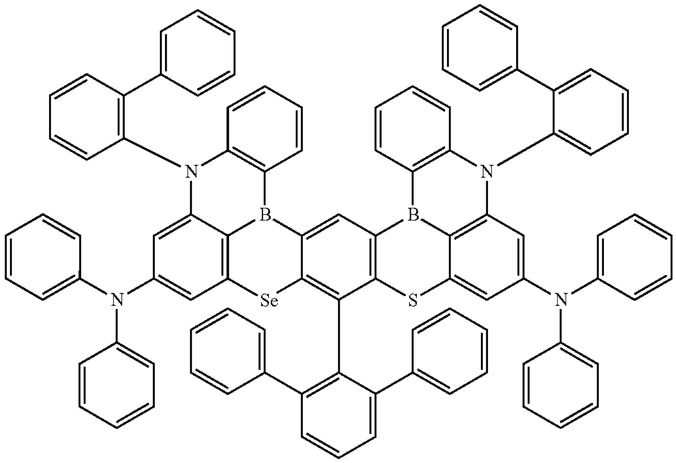
159
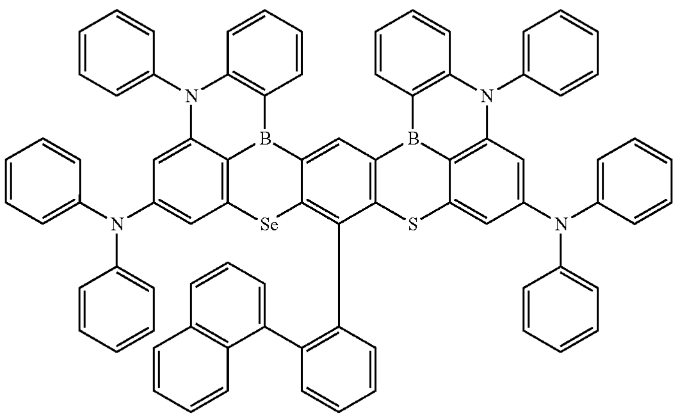
160
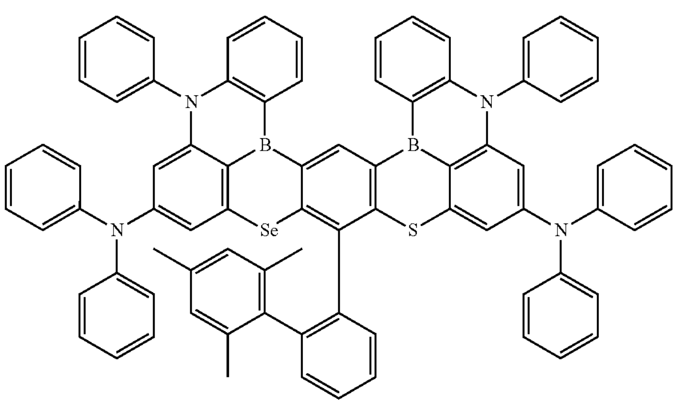

-continued
161
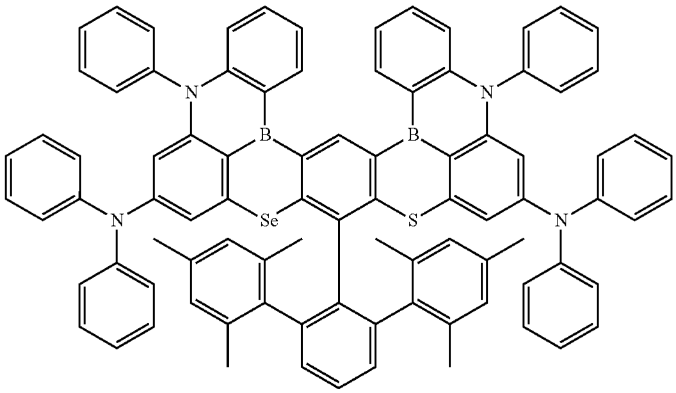
162
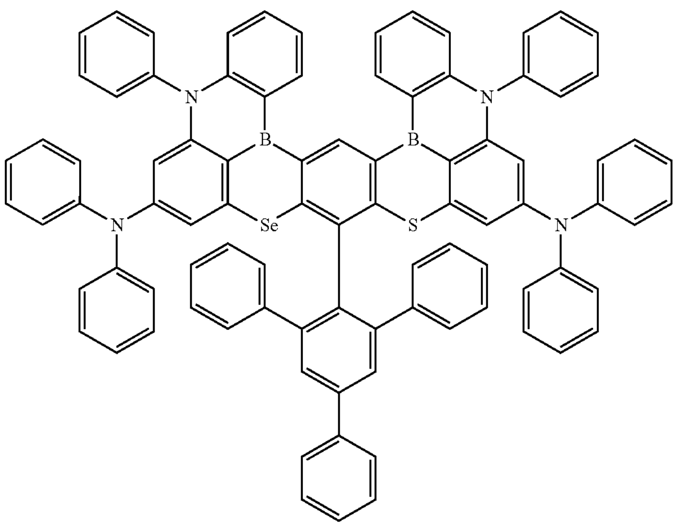
163
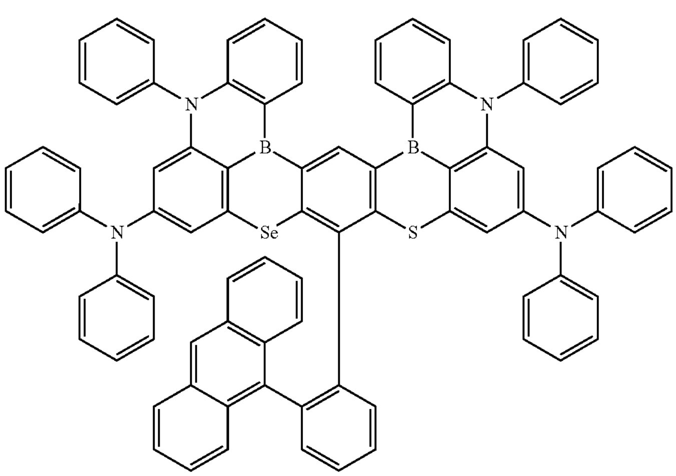

-continued
164
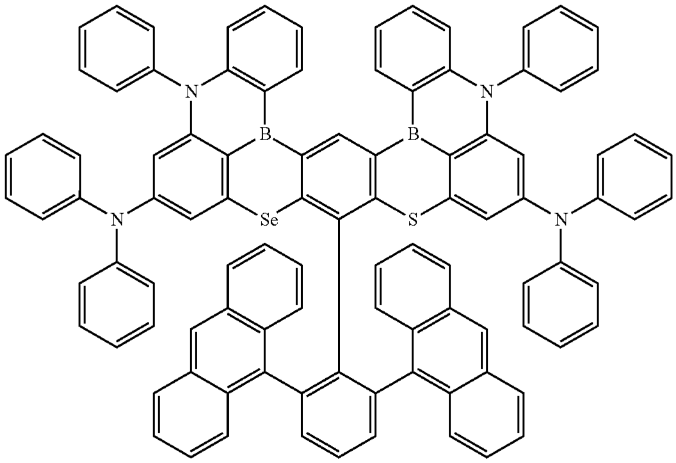
165
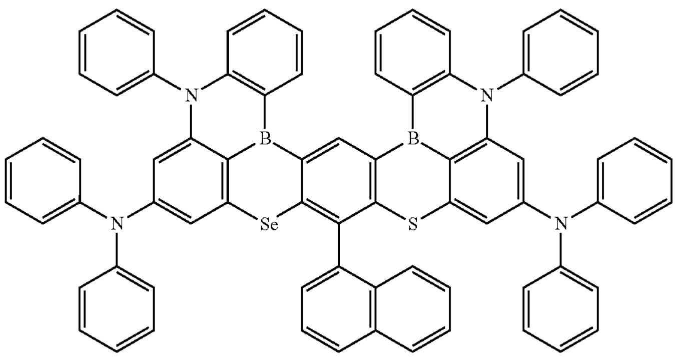
166
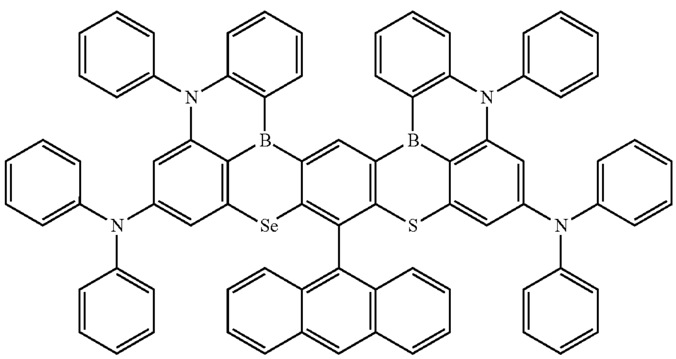
167
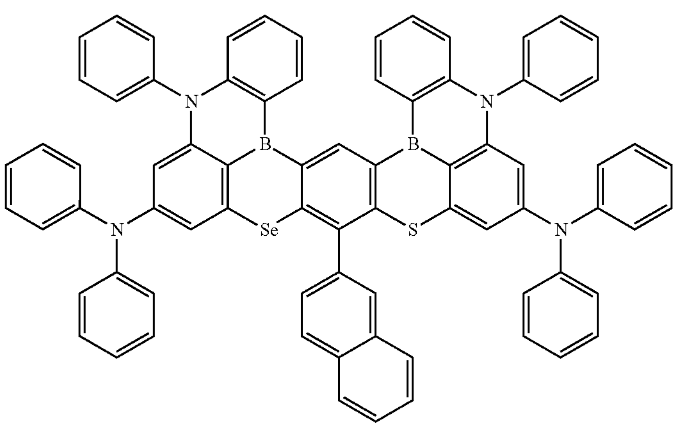

-continued
168
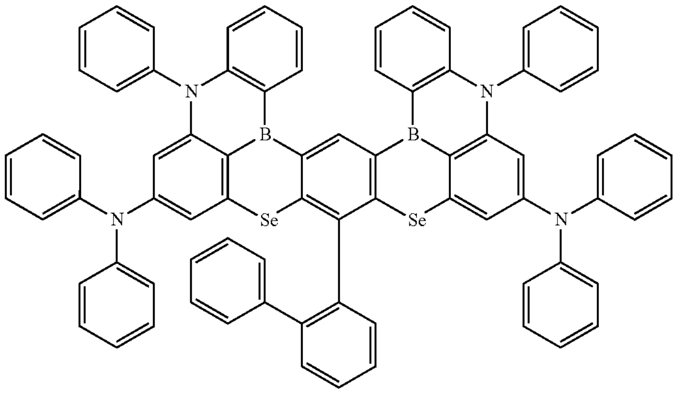
169
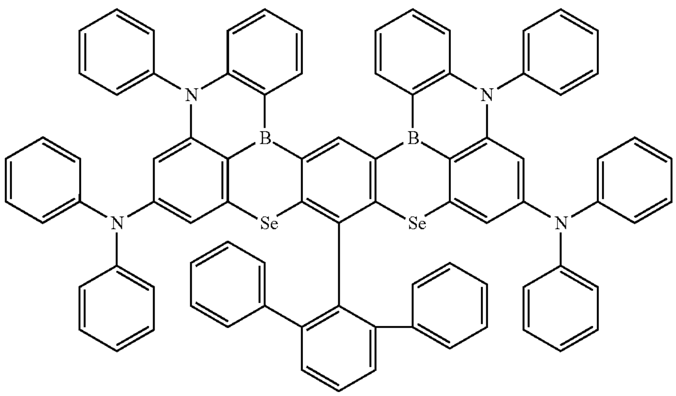
170
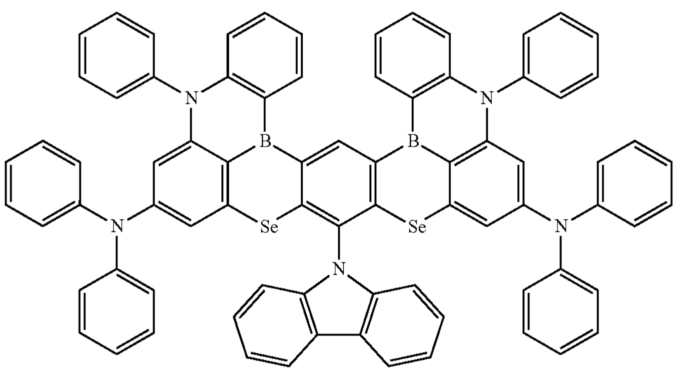
171
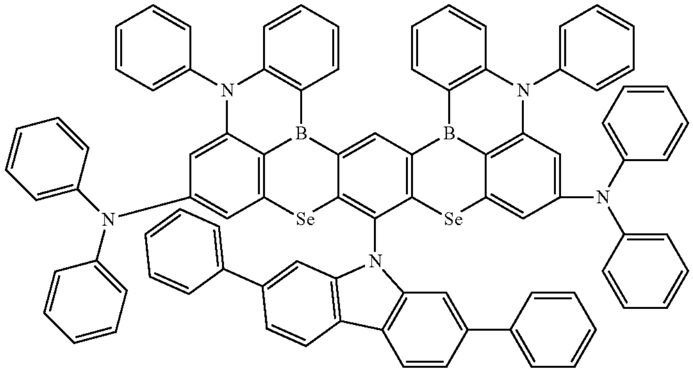

-continued
172
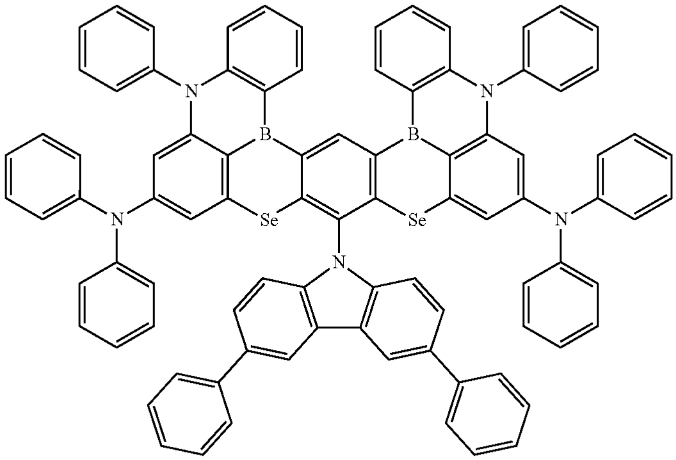
173
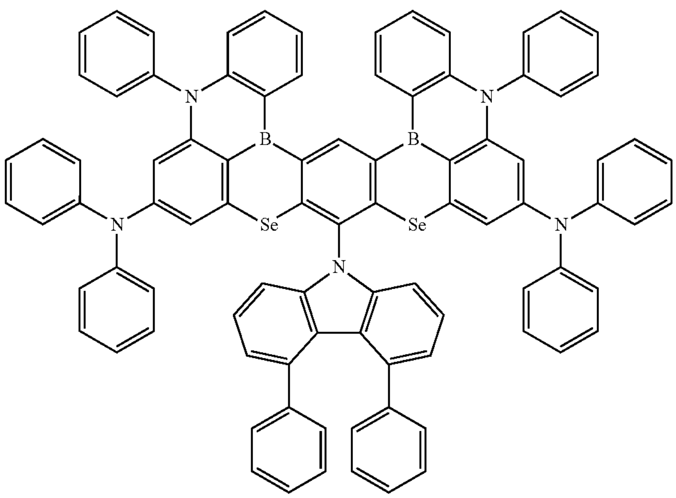
174
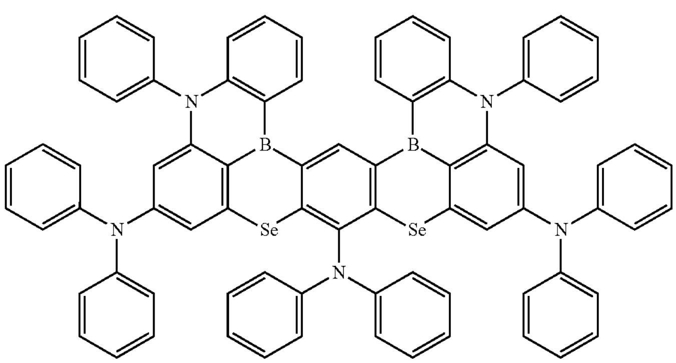

-continued
175
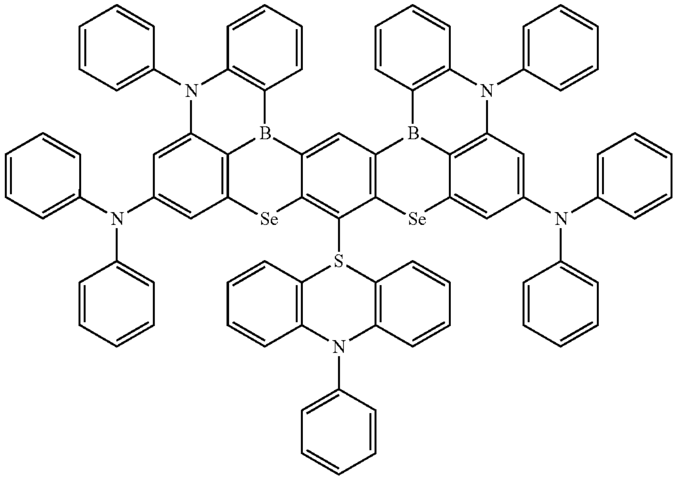
176
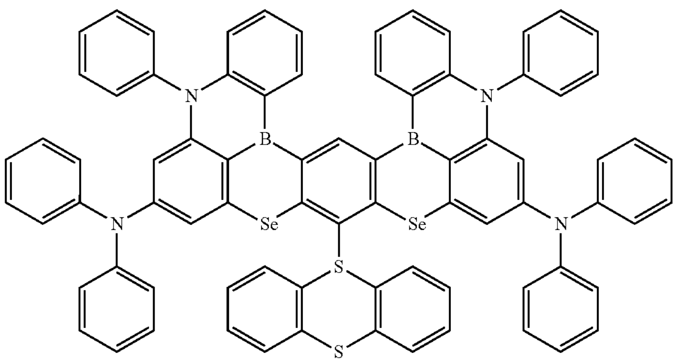
177
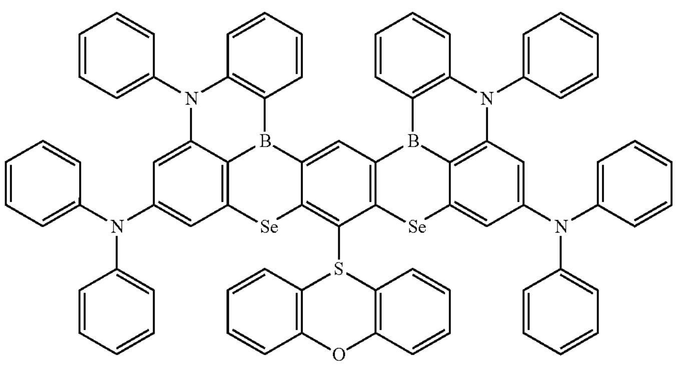
178
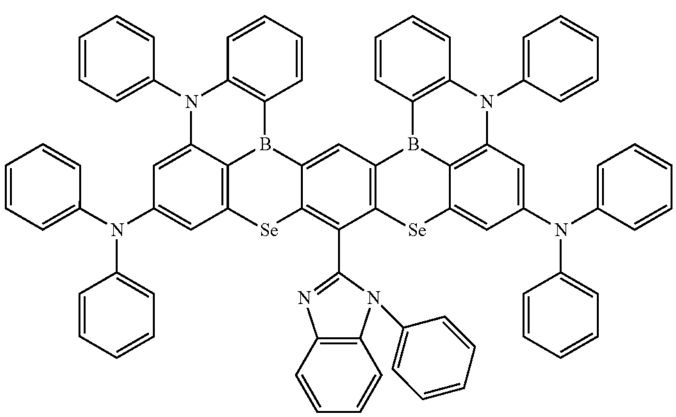

-continued
179
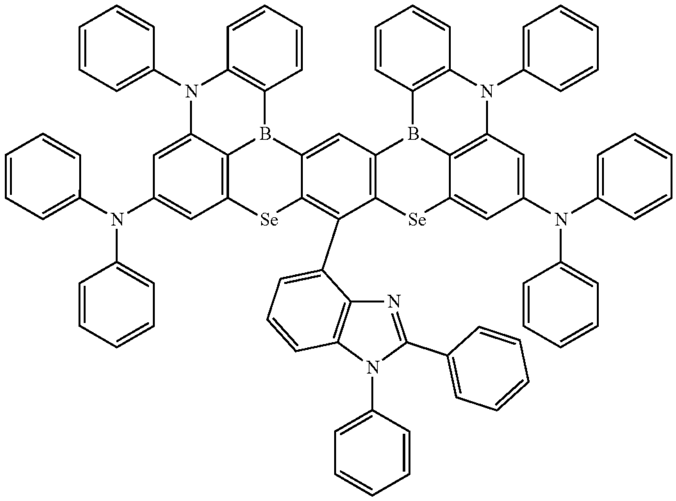
180
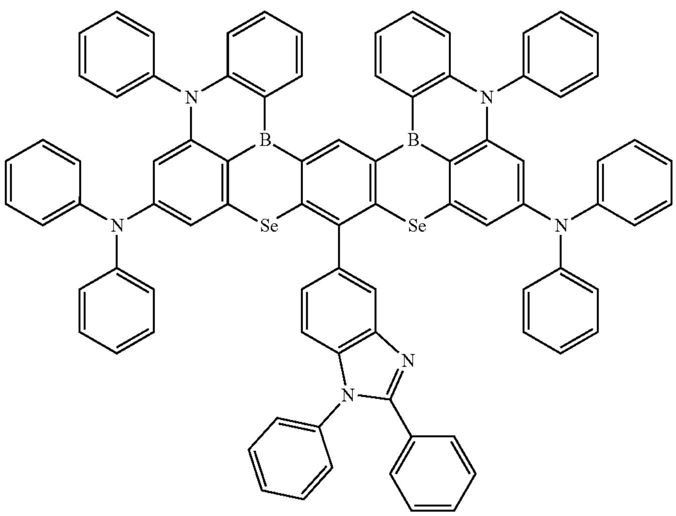
181
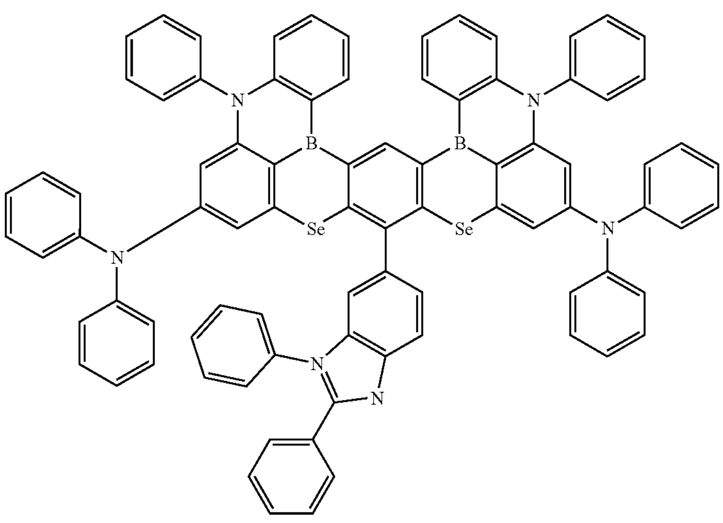

-continued
182
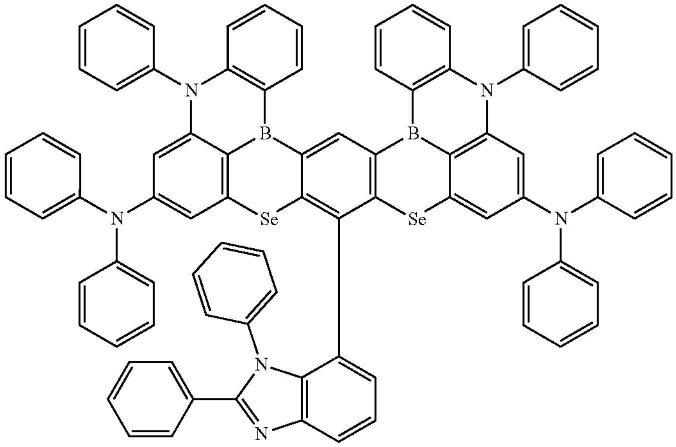
183
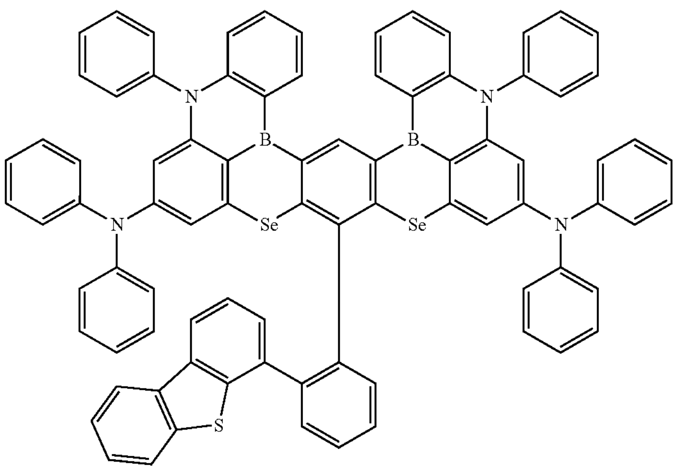
184
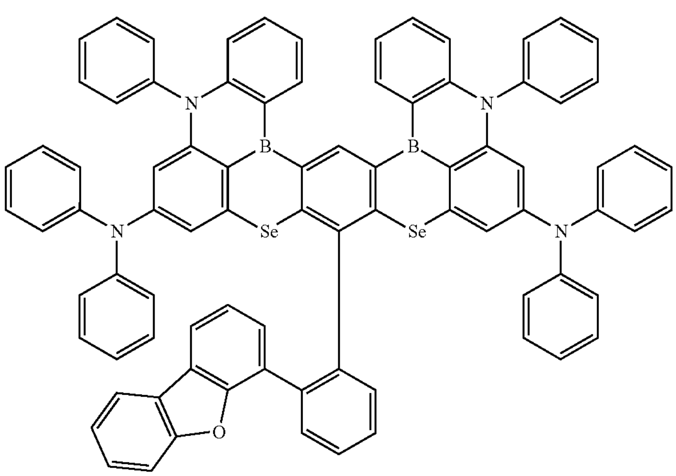

-continued
185
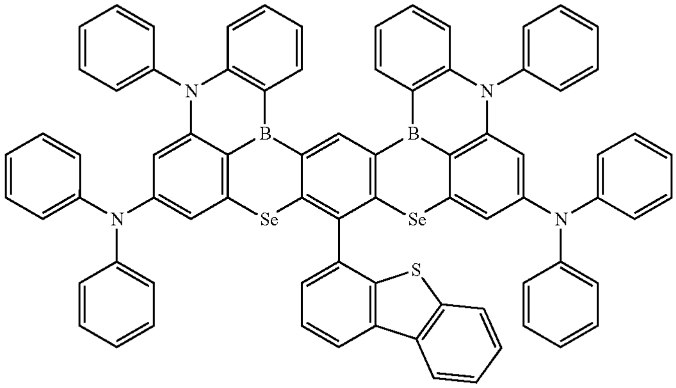
186
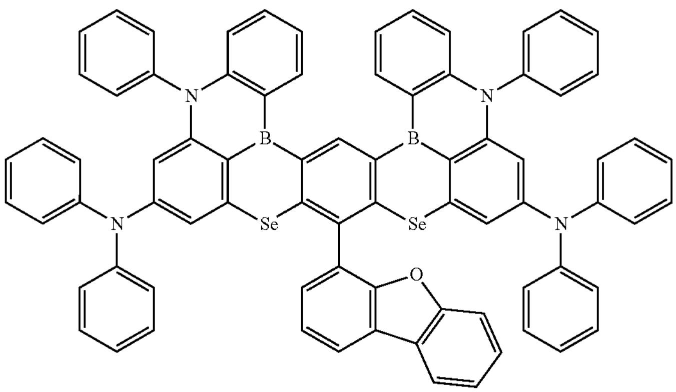
187
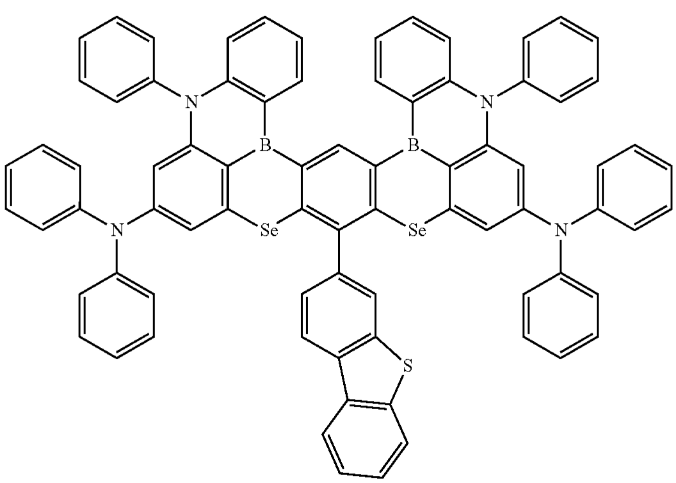

-continued
188
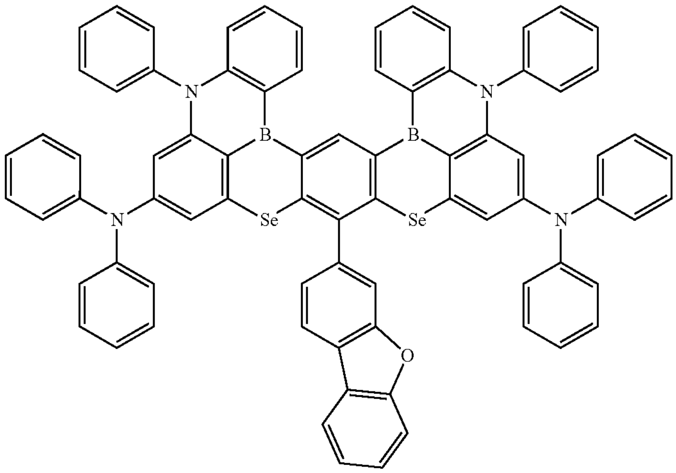
189
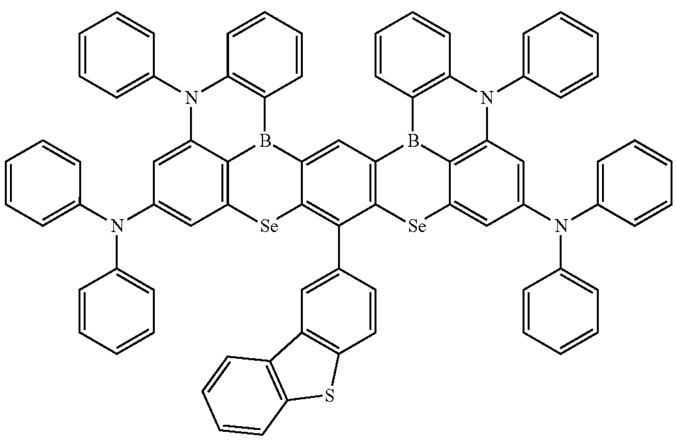
190
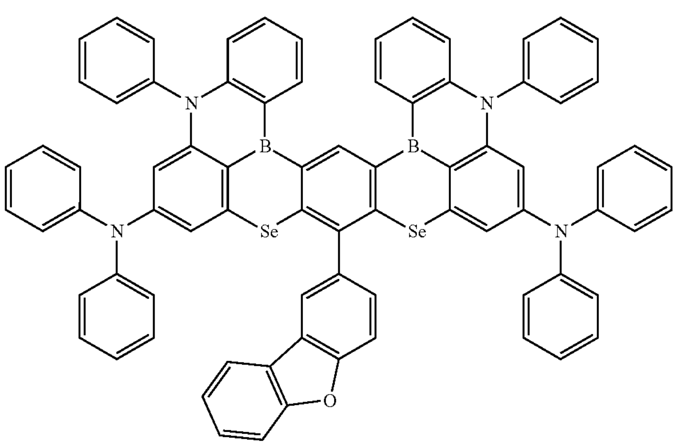

-continued
191
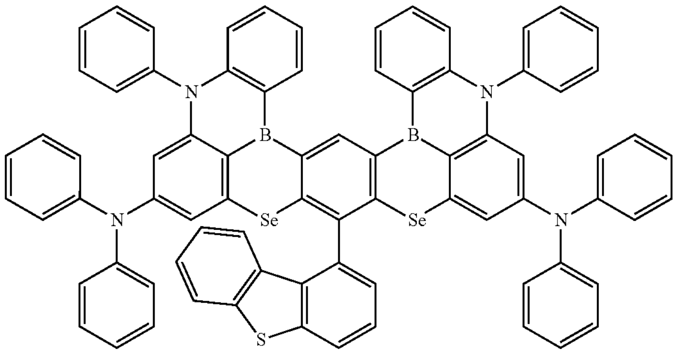
192
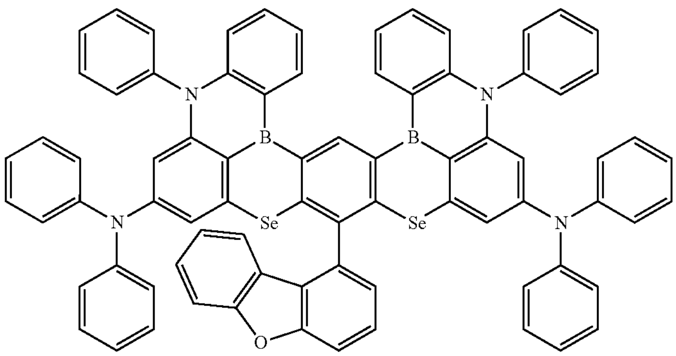
193
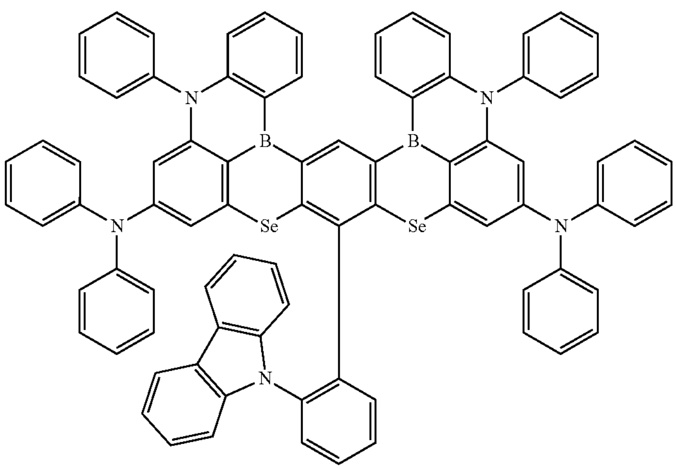
194
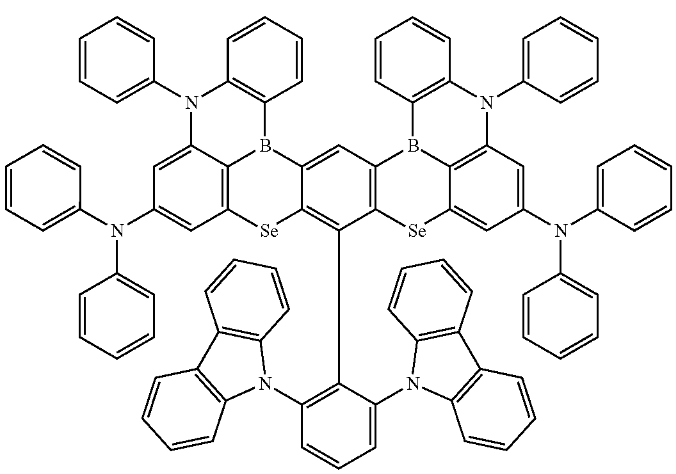

-continued
195
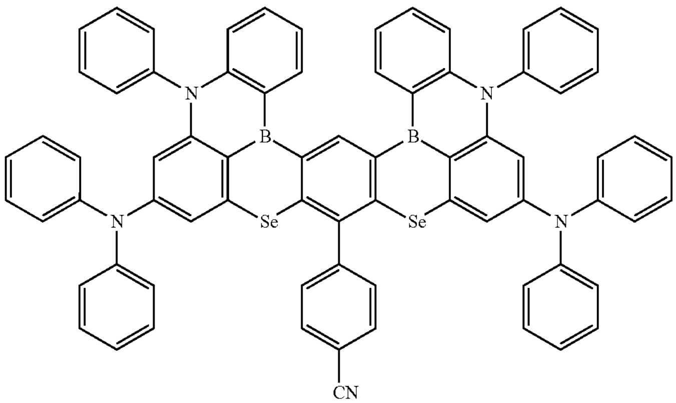
196
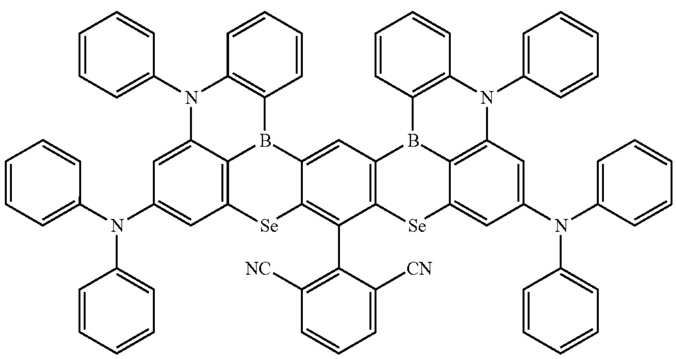
197
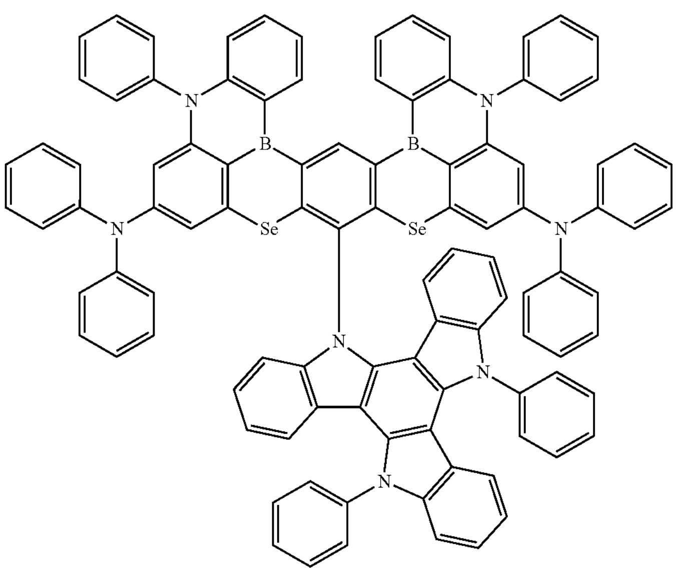

-continued
198
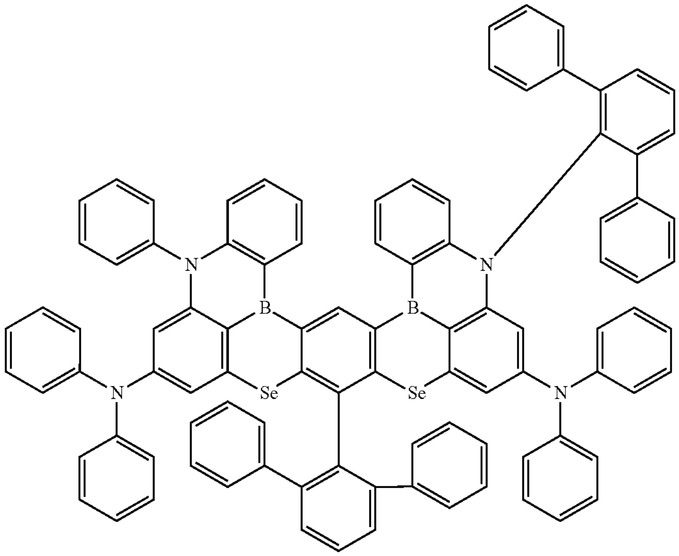
199
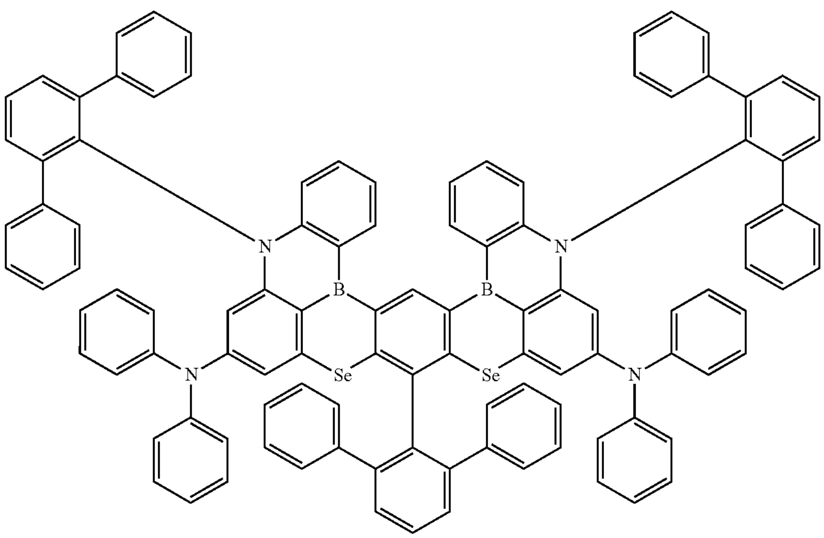
200
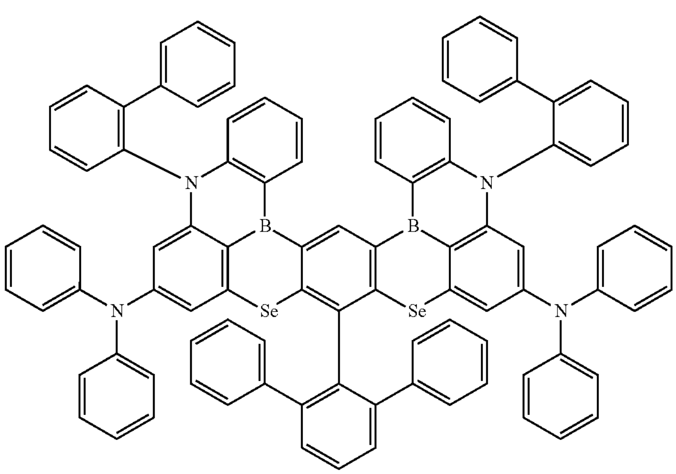

-continued
201
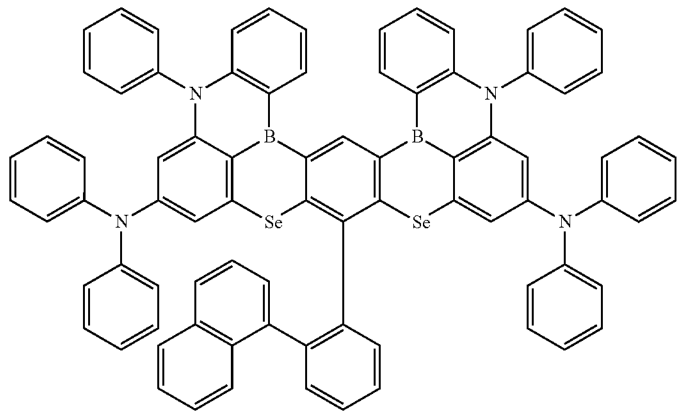
202
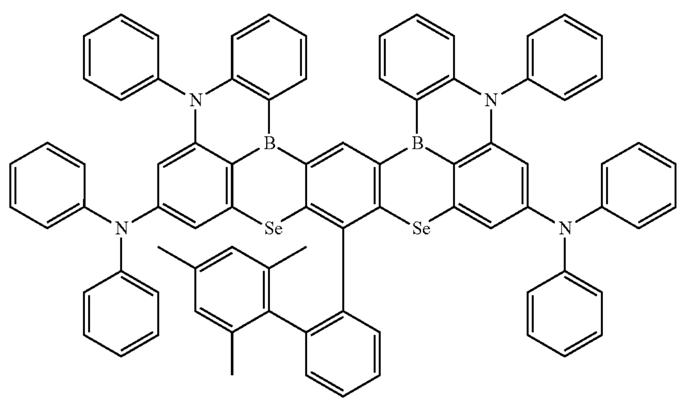
203
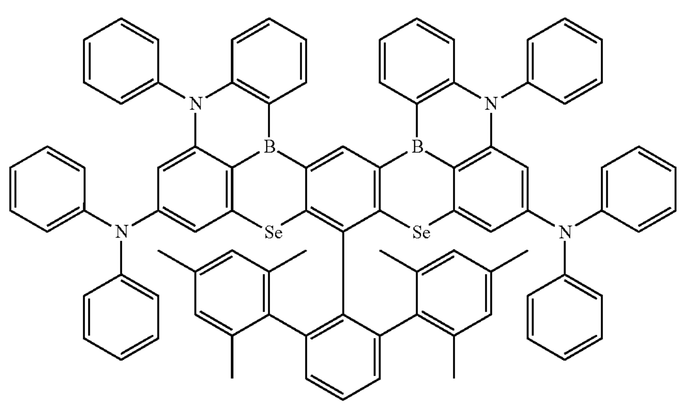

-continued
204
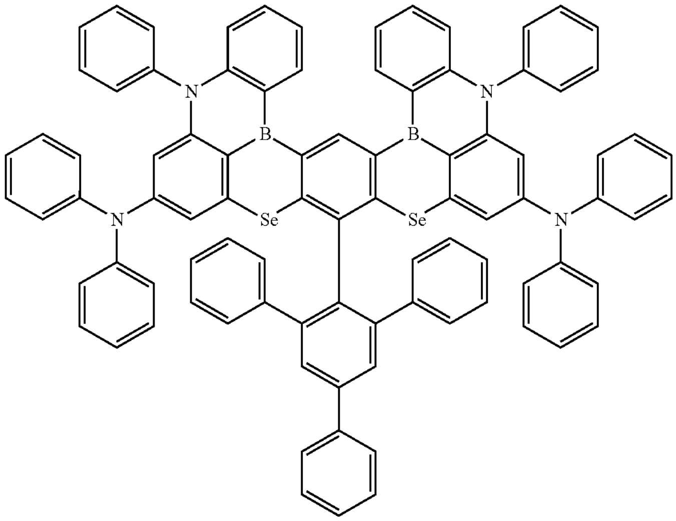
205
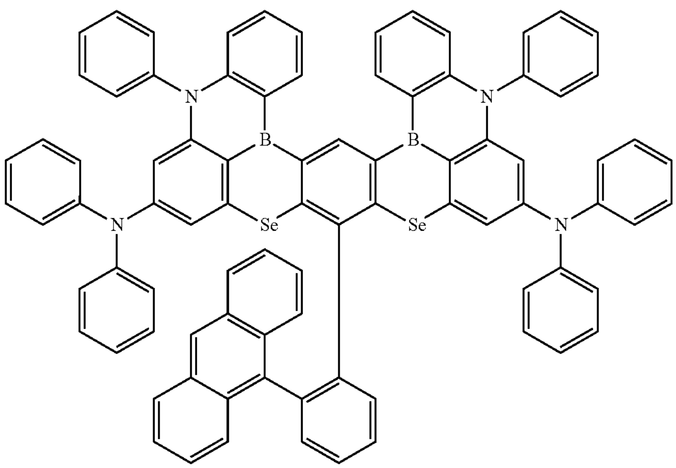
206
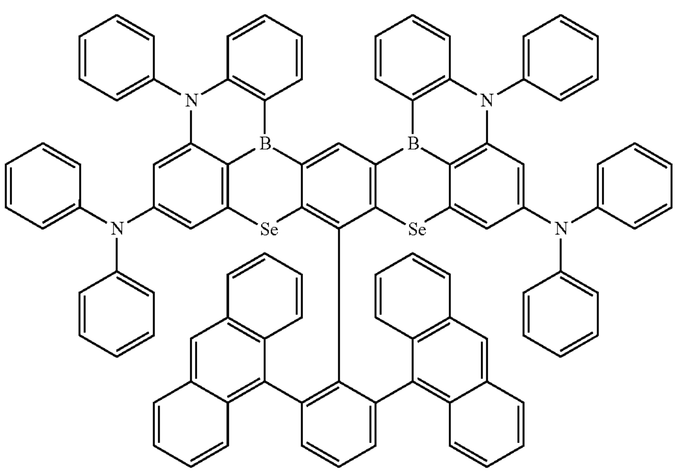

-continued
207
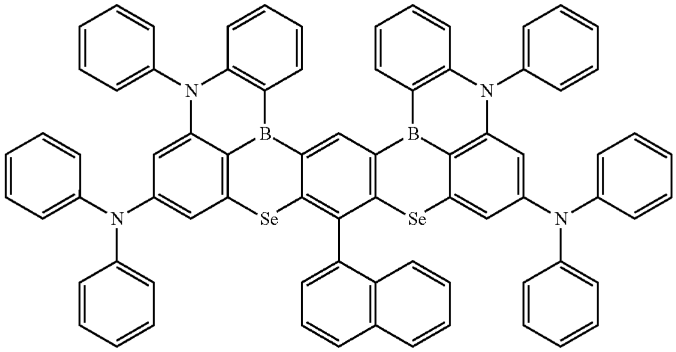
208
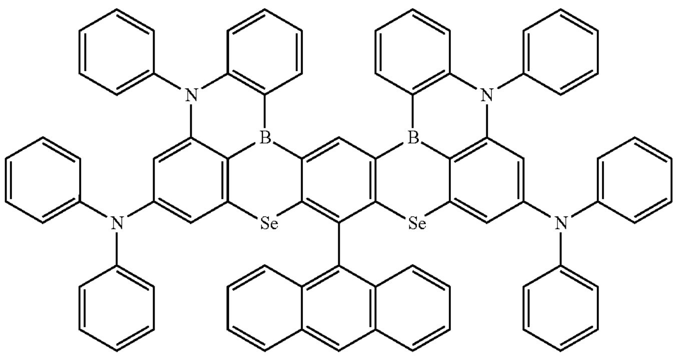
209
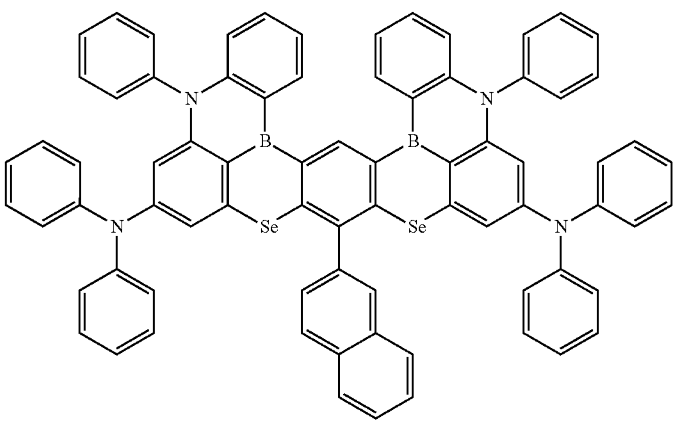
D-1
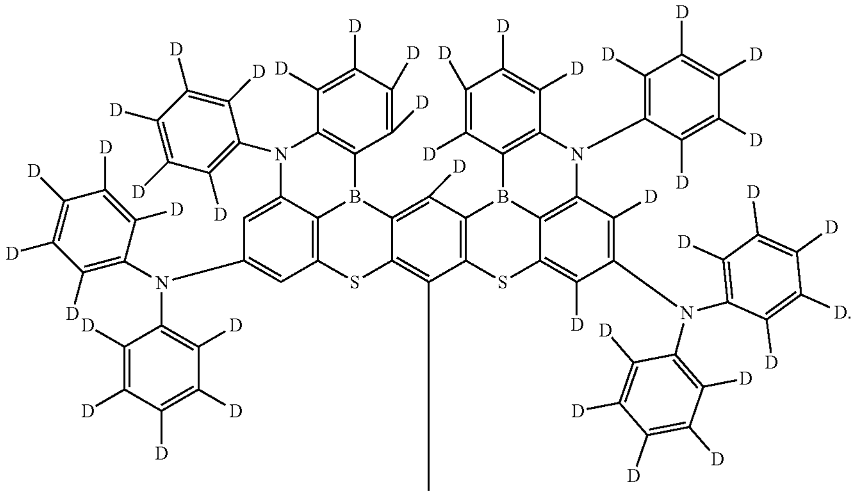

-continued

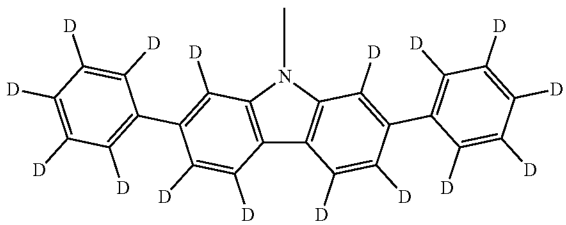

The polycyclic compound may be used in an organic electroluminescence device ED of one or more embodiments to improve the efficiency and life (e.g., lifespan) of the organic electroluminescence device. For example, the polycyclic compound may be used in an emission layer EML of the organic electroluminescence device ED of one or more embodiments to improve the efficiency and life (e.g., lifespan) of the organic electroluminescence device.

In one or more embodiments, the emission layer EML may be a delayed fluorescence emission layer including a first compound and a second compound, and the polycyclic compound of one or more embodiments, represented by Formula 1, may be included in the first compound of the emission layer EML. For example, the first compound may be a dopant, and the second compound may be a host.

In one or more embodiments, the host may be a host for emitting delayed fluorescence, and the dopant may be a dopant for emitting delayed fluorescence. In one or more embodiments, the polycyclic compound of one or more embodiments, represented by Formula 1, may be included as the dopant material of an emission layer EML. For example, the polycyclic compound of one or more embodiments, represented by Formula 1, may be used as a TADF dopant.

In one or more embodiments, the organic electroluminescence device ED of one or more embodiments may include multiple emission layers. The multiple emission layers may be stacked in order and provided. For example, an organic electroluminescence device ED including the multiple emission layers may emit white light. The organic electroluminescence device including the multiple emission layers may be an organic electroluminescence device with a tandem structure. If the organic electroluminescence device ED includes multiple emission layers, at least one emission layer EML may include the above-described polycyclic compound according to the present disclosure.

In the organic electroluminescence device ED of one or more embodiments, the emission layer EML may include anthracene derivative(s), pyrene derivative(s), fluoranthene derivative(s), chrysene derivative(s), dihydrobenzanthracene derivative(s), and/or triphenylene derivative(s). For example, the emission layer EML may further include anthracene derivative(s) and/or pyrene derivative(s).

The emission layer EML may further include a host and a dopant, and the emission layer EML may include a compound represented by Formula E-1 below. The compound represented by Formula E-1 below may be used as a fluorescence host material.

Formula E-1

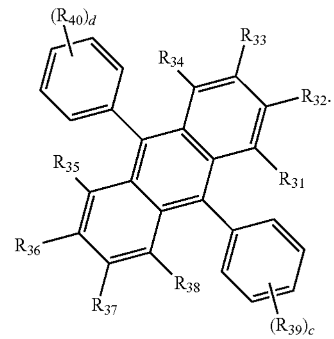

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In one or more embodiments, $R_{31}$ to $R_{40}$ may be combined with an adjacent group, respectively from each other, to form a saturated hydrocarbon ring, an unsaturated hydrocarbon ring, a saturated heterocycle, or an unsaturated heterocycle.

In Formula E-1, "c" and "d" may be each independently an integer of 0 to 5.

Formula E-1 may be represented by any one selected from among Compound E1 to Compound E19 below.

E1

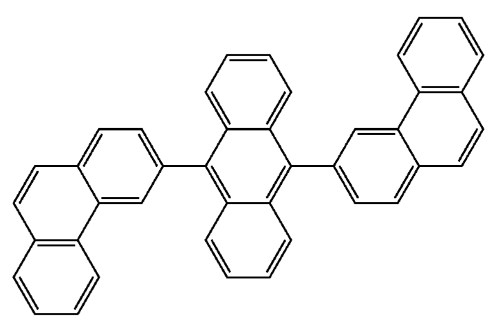

-continued
E2
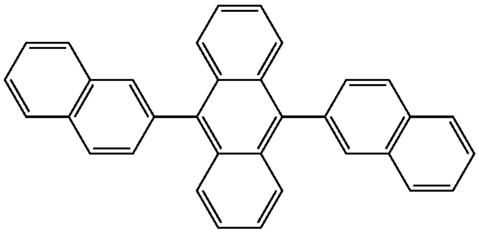
E3
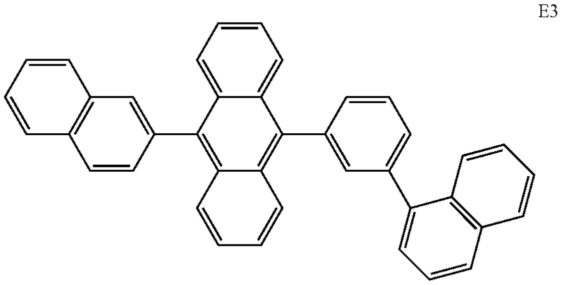
E4
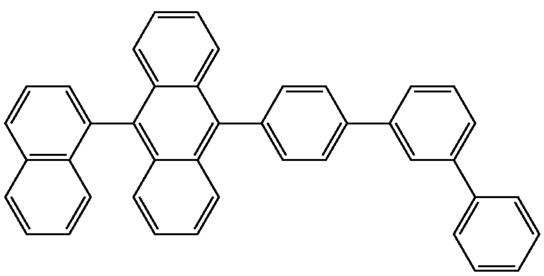
E5
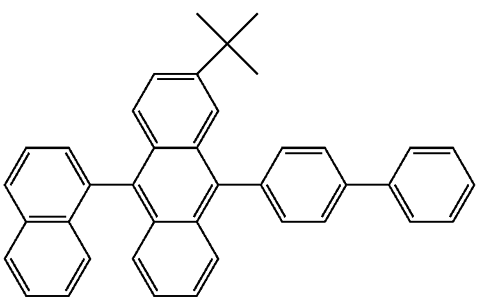
E6
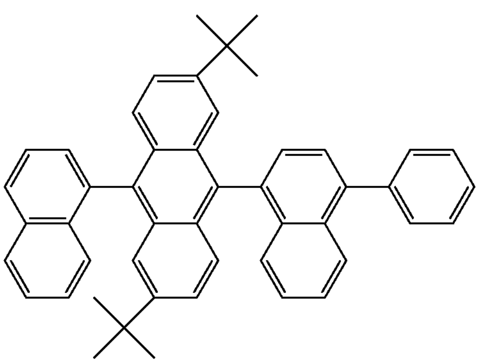
-continued
E7
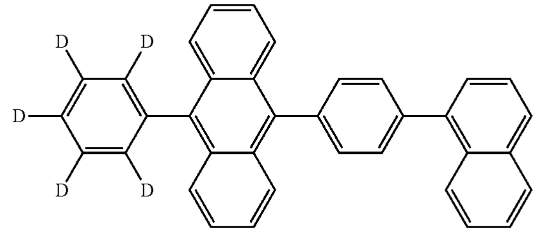
E8
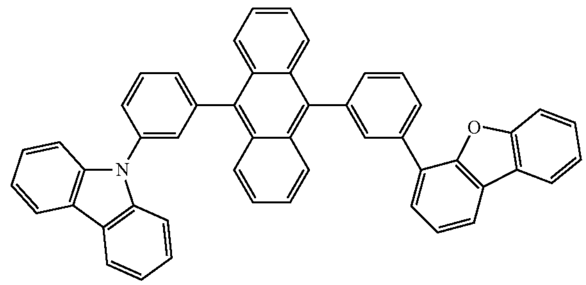
E9
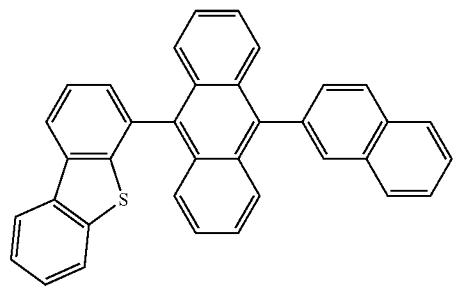
E10
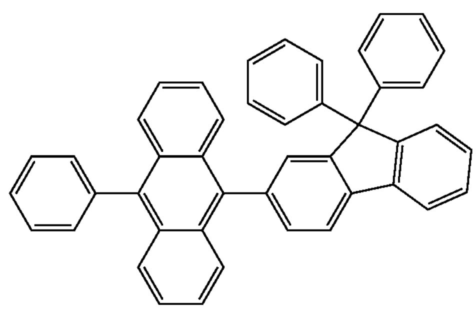
E11
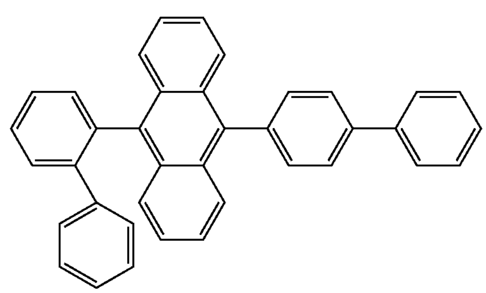

-continued
E12
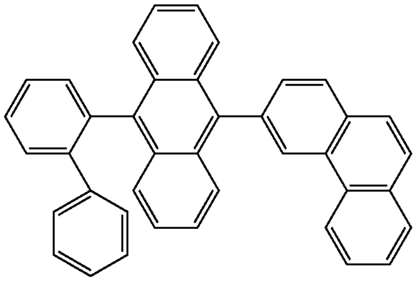
E13
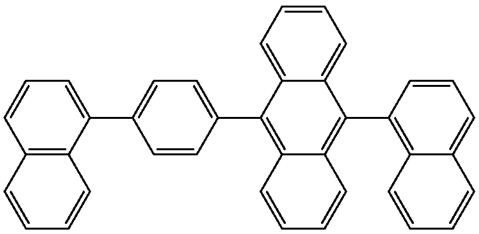
E14
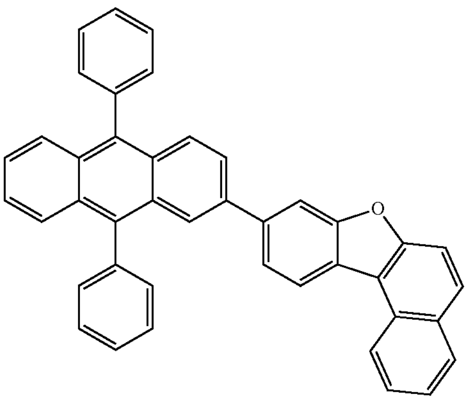
E15
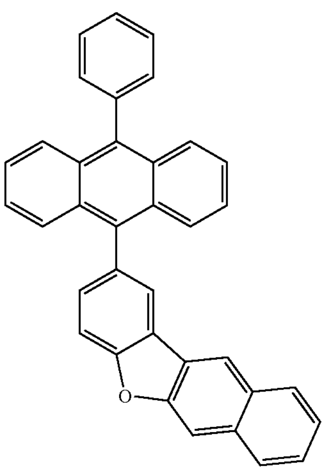
E16
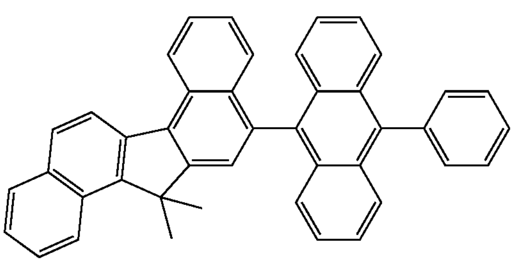
-continued
E17
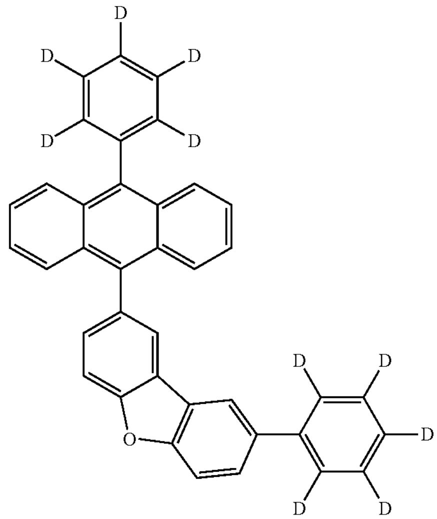
E18
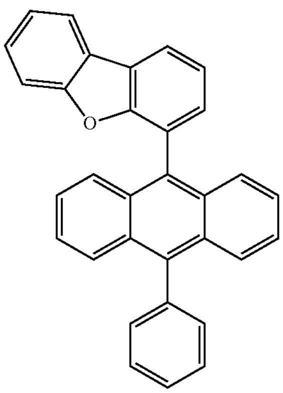
E19
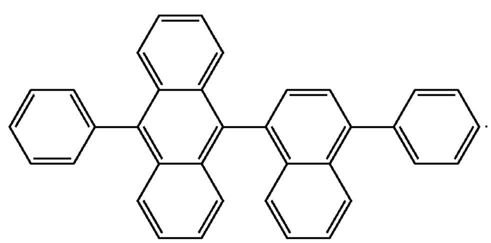
In one or more embodiments, the emission layer EML may include a compound represented by Formula E-2a or Formula E-2b below. The compound represented by Formula E-2a or Formula E-2b below may be used as a phosphorescence host material.

Formula E-2a

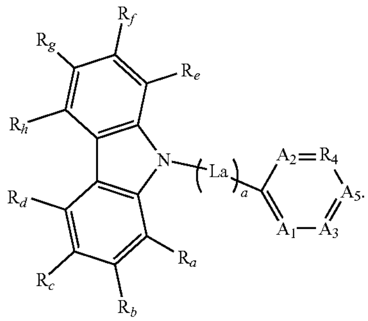

In Formula E-2a, "a" is an integer of 0 to 10, La may be a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "a" is an integer of 2 or more, multiple La may be each independently a substituted or unsubstituted arylene group of 6 to 30 ring-forming carbon atoms, or a substituted or unsubstituted heteroarylene group of 2 to 30 ring-forming carbon atoms.

In addition, in Formula E-2a, $A_1$ to $A_5$ may be each independently N or CRi. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may be combined with an adjacent group to form a hydrocarbon ring or a heterocycle including N, O, S, etc. as a ring-forming atom.

In one or more embodiments, in Formula E-2a, two or three selected from $A_1$ to $A_5$ may be N, and the remainder may be $CR_i$.

Formula E-2b $$(\mathrm{Cbz1}) - (L_b)_b - (\mathrm{Cbz2}).$$

In Formula E-2b, Cbz1 and Cbz2 may be each independently an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" is an integer of 0 to 10, and if "b" is an integer of 2 or more, multiple $L_b$ may be each independently a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2 below. However, the compounds shown in Compound Group E-2 below are only illustrations, and the compound represented by Formula E-2a or Formula E-2b is not limited to the compounds represented in Compound Group E-2 below.

Compound Group E-2

E-2-1

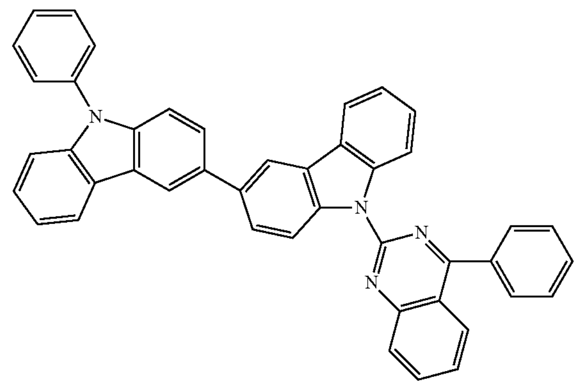

E-2-2

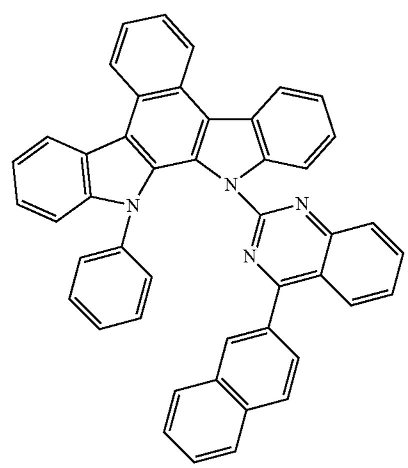

E-2-3

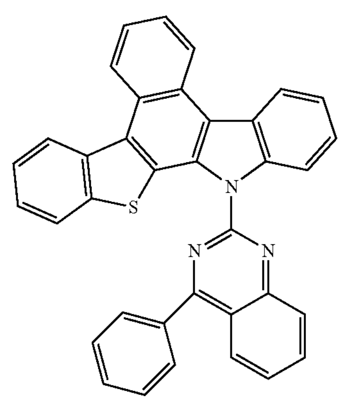

-continued
E-2-4
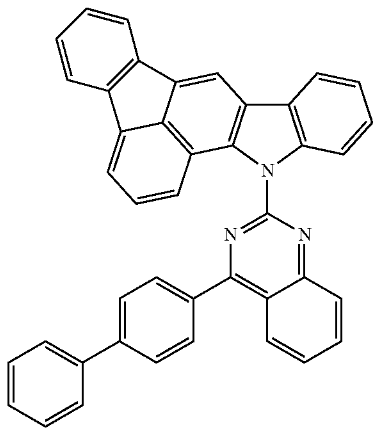
E-2-5
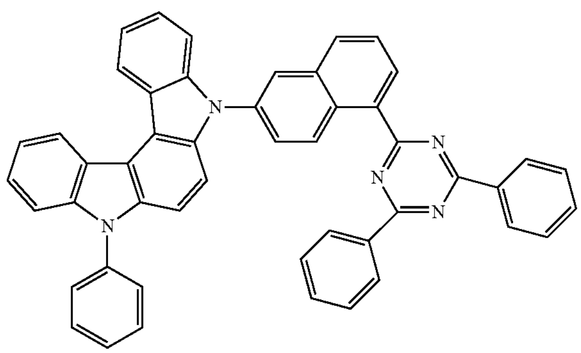
E-2-6
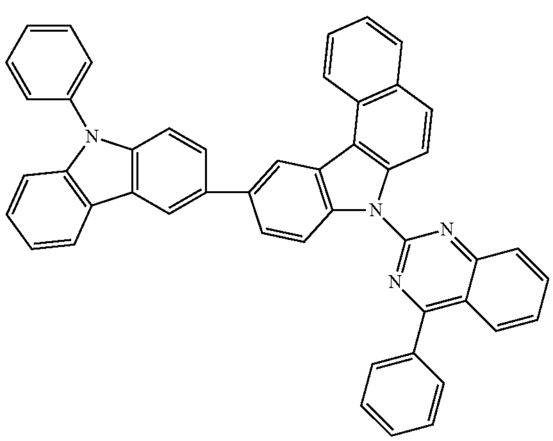
-continued
E-2-7
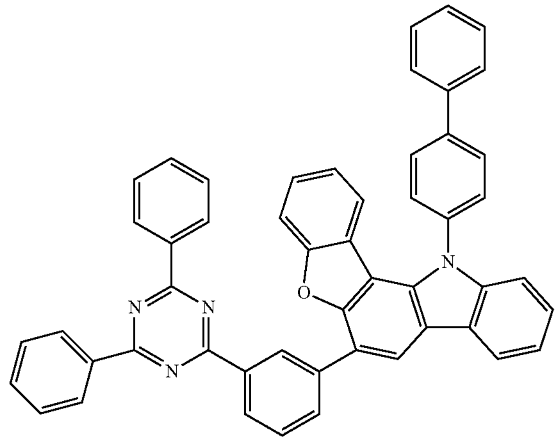
E-2-8
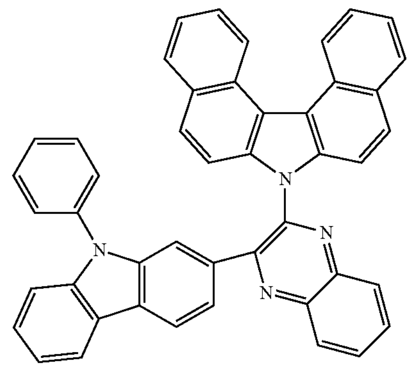
E-2-9
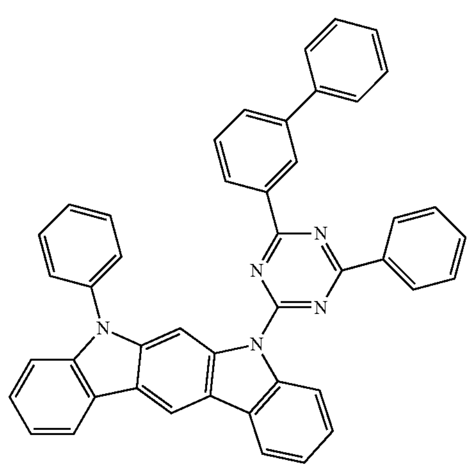

E-2-10
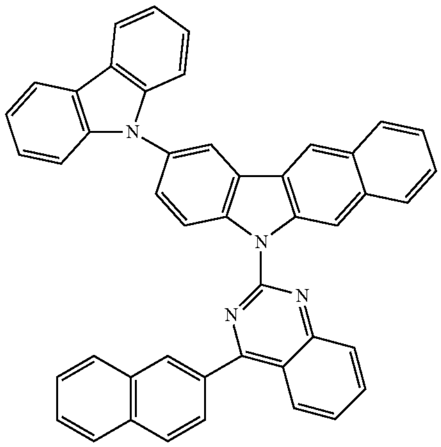
E-2-11
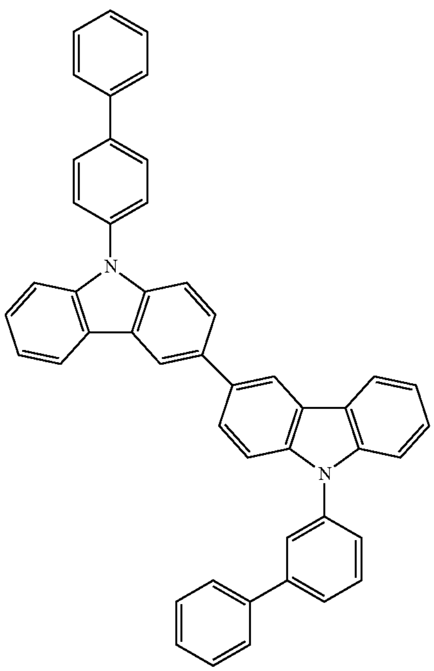
E-2-12
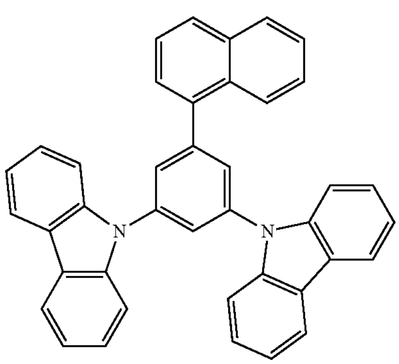
E-2-13
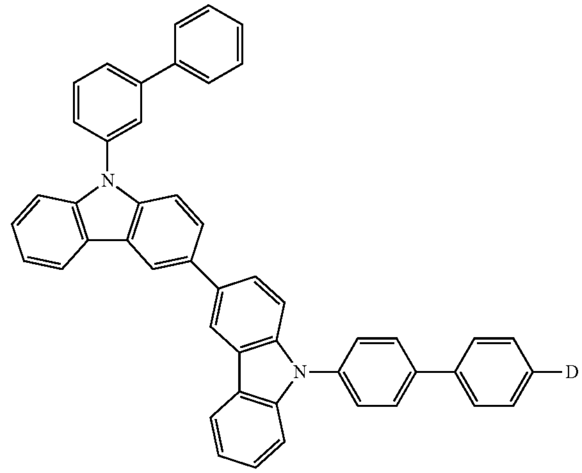
E-2-14
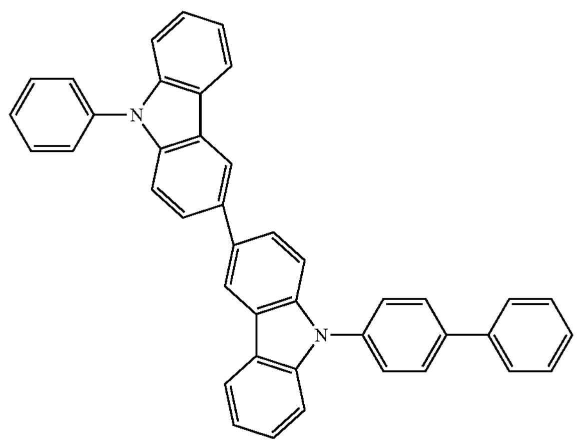
E-2-15
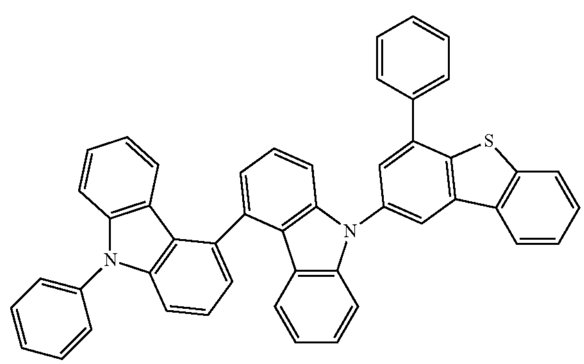

-continued
E-2-16
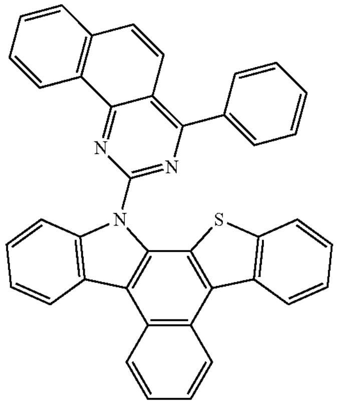
E-2-17
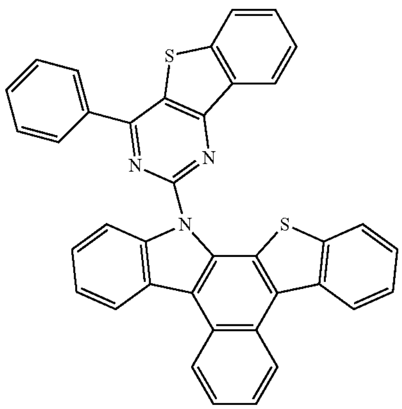
E-2-18
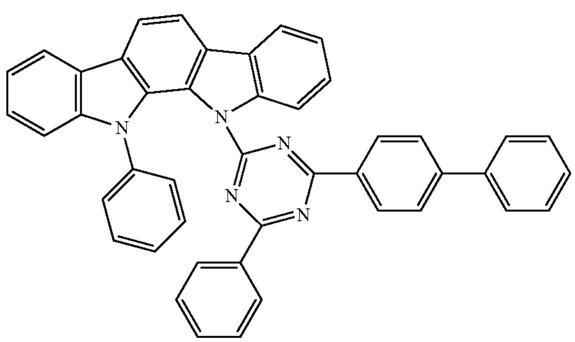
E-2-19
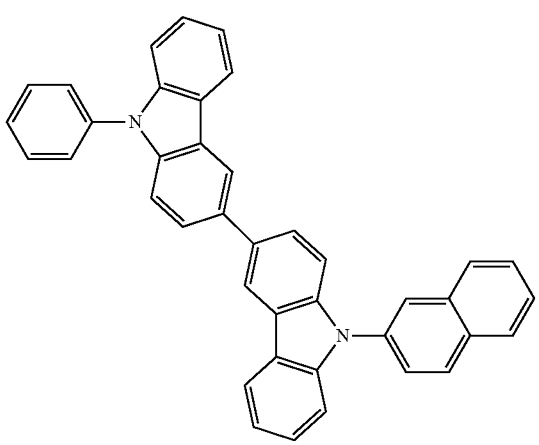
-continued
E-2-20
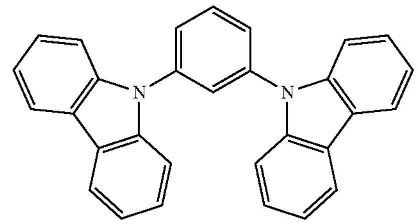
E-2-21
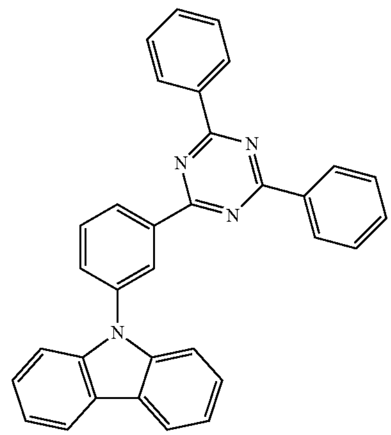
E-2-22
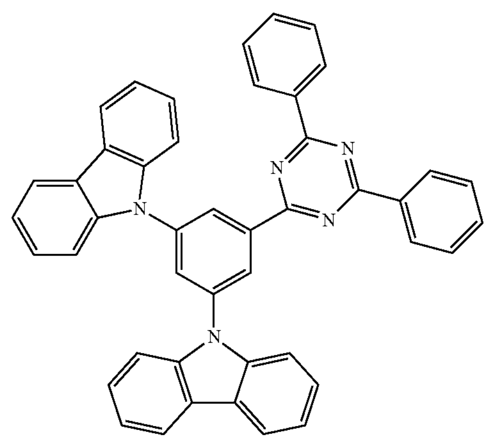
E-2-23
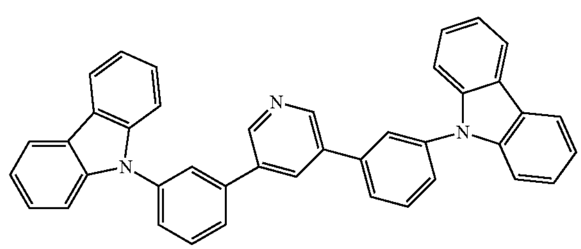

-continued

E-2-24

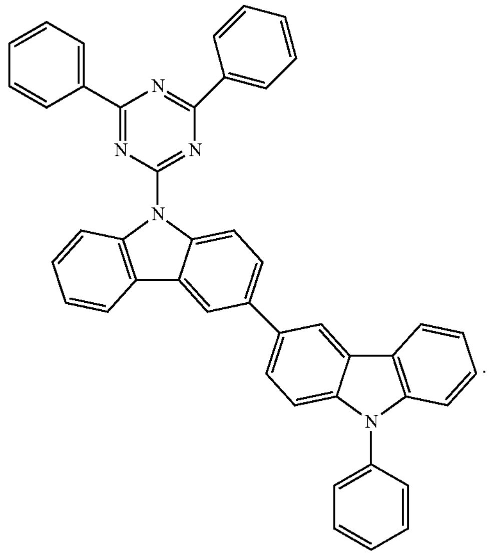

The emission layer EML may further include a suitable host material. For example, the emission layer EML may include as a host material, at least one of bis[2-(diphenylphosphino)phenyl] ether oxide (DPEPO), 4,4'-bis(carbazol-9-yl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, one or more embodiments of the present disclosure are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b below. The compound represented by Formula M-a or Formula M-b may be used as a phosphorescence dopant material.

Formula M-a

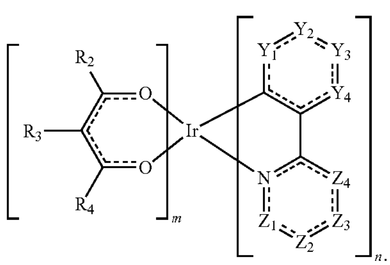

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" is 0 or 1, and "n" is 2 or 3. In Formula M-a, if "m" is 0, "n" is 3, and if "m" is 1, "n" is 2.

The compound represented by Formula M-a may be used as a phosphorescence dopant.

The compound represented by Formula M-a may be represented by any one selected from among Compounds M-a1 to M-a25 below. However, Compounds M-a1 to M-a25 below are illustrations, and the compound represented by Formula M-a is not limited to the compounds represented by Compounds M-a1 to M-a25 below.

M-a1

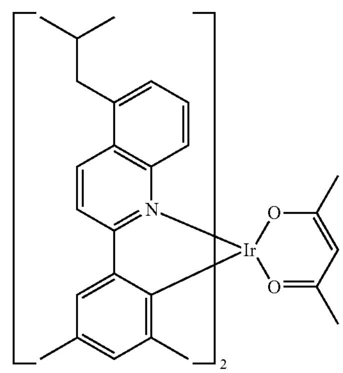

M-a2

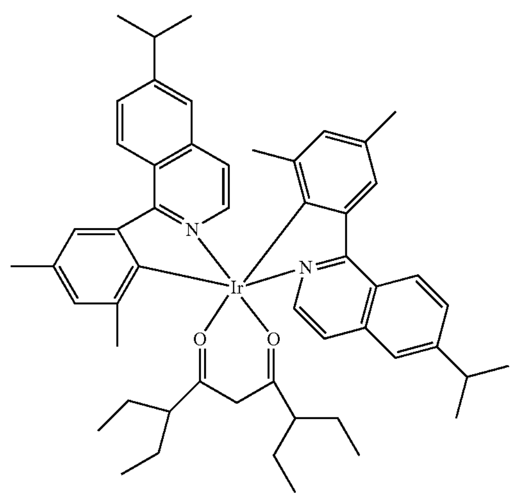

M-a3

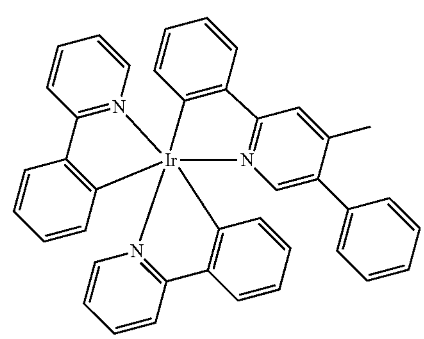

M-a4
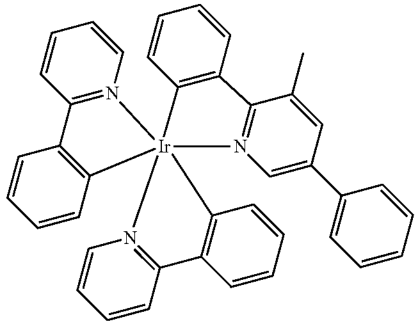
M-a5
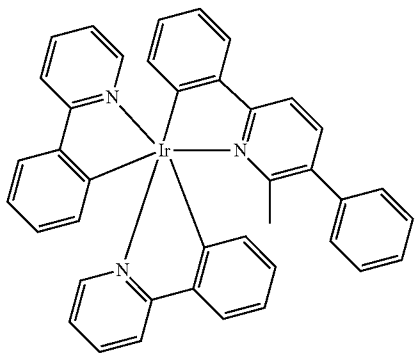
M-a6
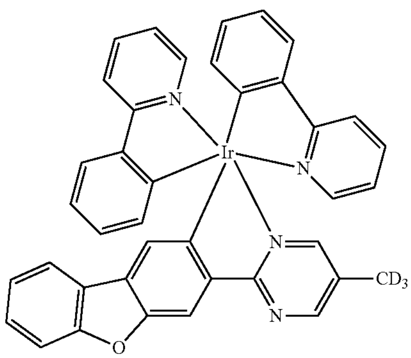
M-a7
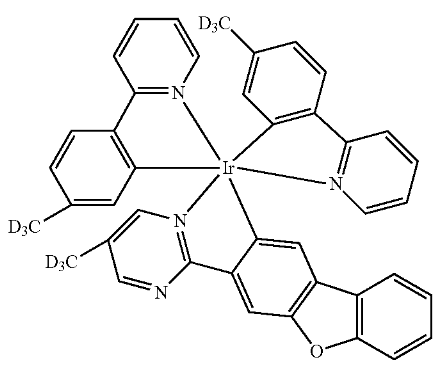
M-a8
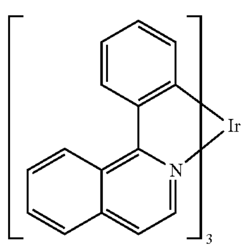
M-a9
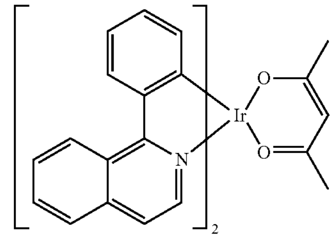
M-a10
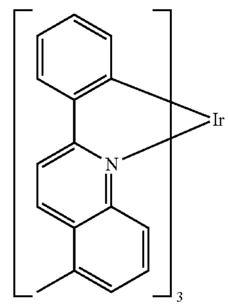
M-a11
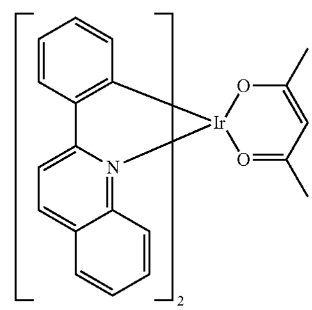
M-a12
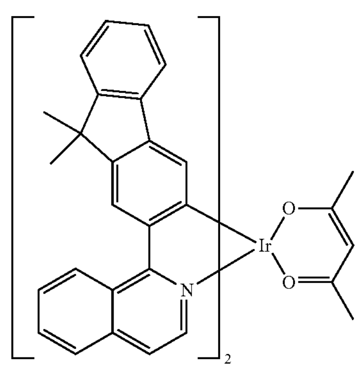
M-a13
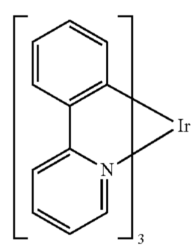

-continued
M-a14
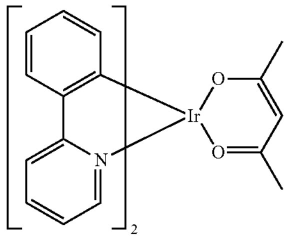
M-a15
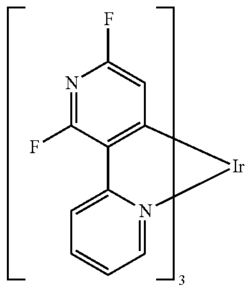
M-a16
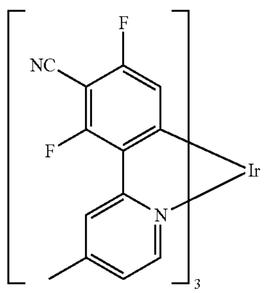
M-a17
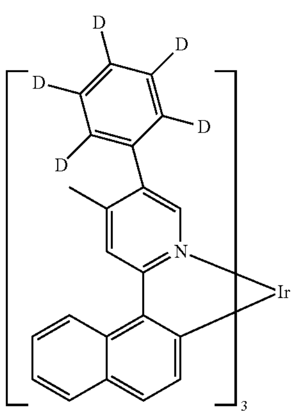
M-a18
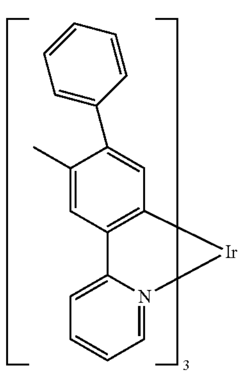
-continued
M-a19
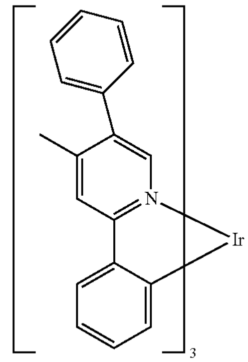
M-a20
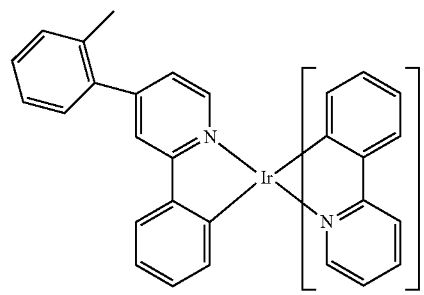
M-a21
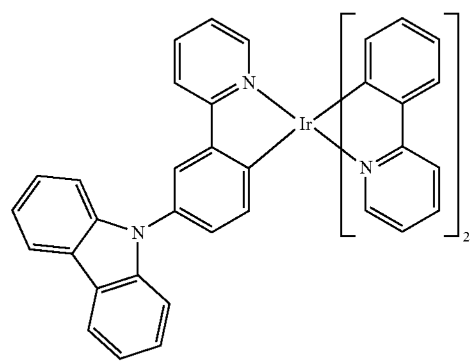
M-a22
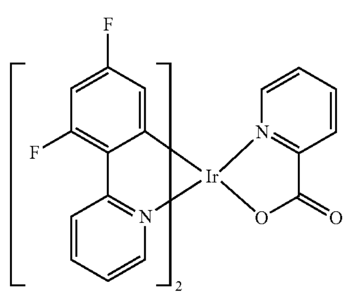
M-a23
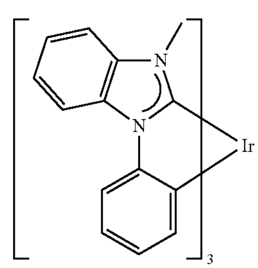

-continued

M-a24

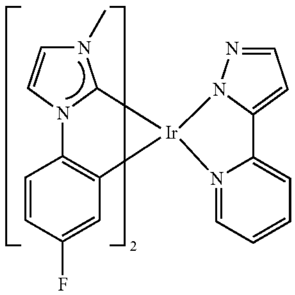

M-a25

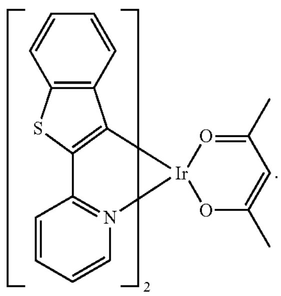

Compound M-a1 and Compound M-a2 may be used as red dopant materials, and Compound M-a3 to Compound M-a5 may be used as green dopant materials.

Formula M-b

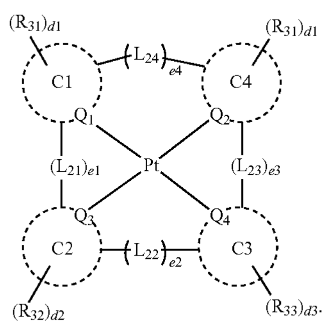

In Formula M-b, $Q_1$ to $Q_4$ are each independently C or N, C1 to C4 are each independently a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ are each independently a direct linkage,

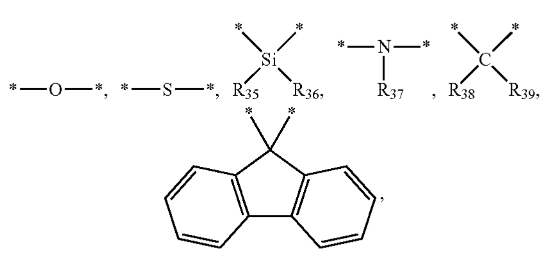

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are illustrations, and the compound represented by Formula M-b is not limited to the compounds represented below M-b-1

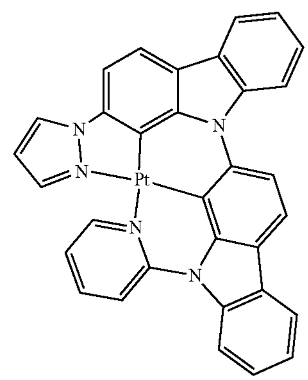

M-b-2

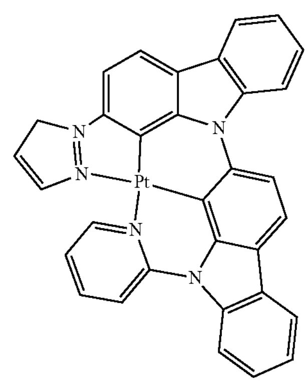

M-b-3

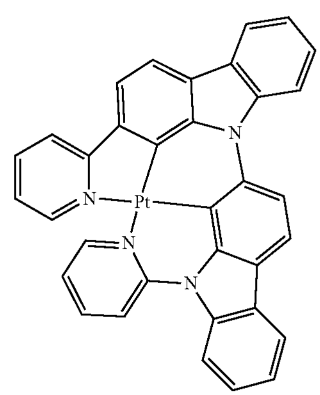

-continued
M-b-4
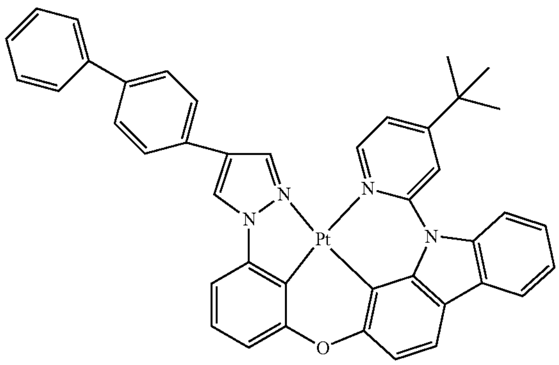
M-b-5
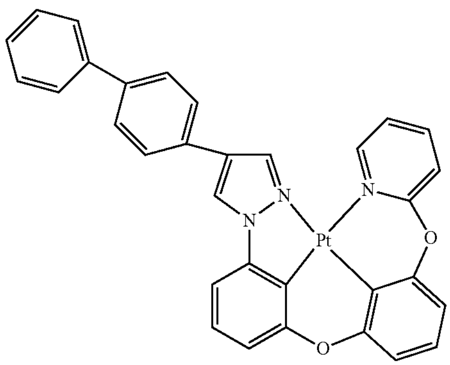
M-b-6
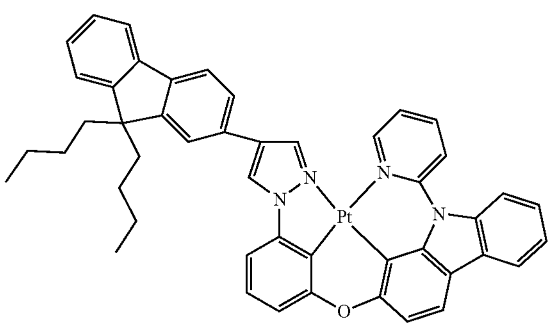
M-b-7
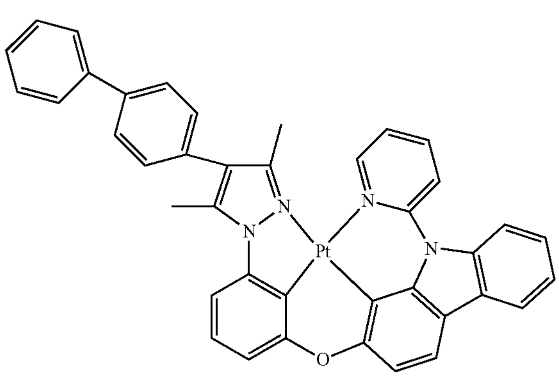
-continued
M-b-8
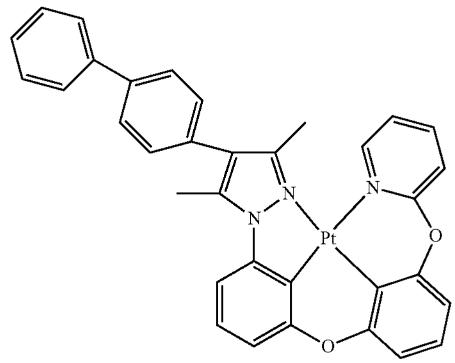
M-b-9
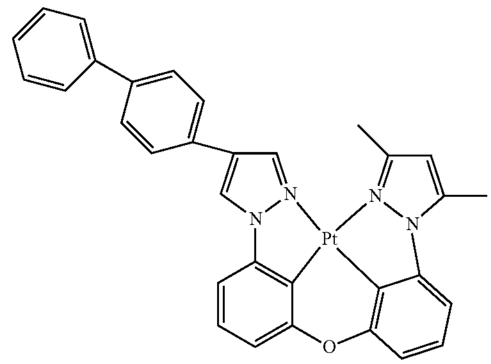
M-b-10
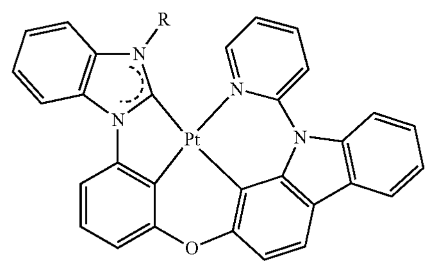
M-b-11
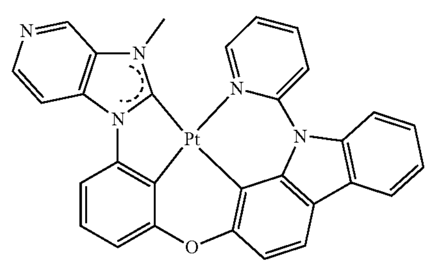
M-b-12
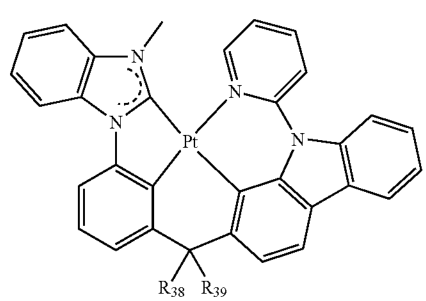
In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include any one selected from among Formula F-a to Formula F-c below. The compounds represented by Formula F-a to Formula F-c below may be used as fluorescence dopant materials.

Formula F-a

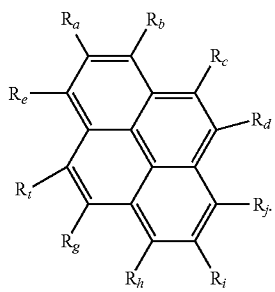

In Formula F-a, two selected from $R_a$ to $R_j$ may be each independently substituted with *—$NAr_1Ar_2$. The remainder not substituted with *—$NAr_1Ar_2$ selected from among $R_a$ to $R_j$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may be each independently a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including O or S as a ring-forming atom.

Formula F-b

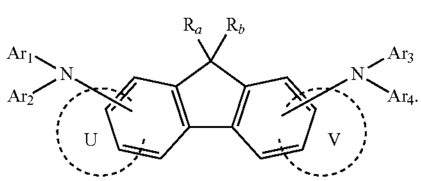

In Formula F-b, $R_a$ and $R_b$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-b, U and V may be each independently 0 or 1. In Formula F-b, U means the number of rings combined at position U, and V means the number of rings combined at position V. For example, if the number of U or V is 1, the ring designated by U or V forms a fused ring, and if U or V is 0, the ring designated by U or V is not present. For example, if U is 0, and V is 1, or if U is 1, and V is 0, a fused ring having the fluorene core of Formula F-b may be a ring compound with four rings. If both U and V are 0, the fused ring of Formula F-b may be a ring compound with three rings. If both U and V are 1, a fused ring having the fluorene core of Formula F-b may be a ring compound with five rings.

In Formula F-b, if U or V is 1, U and V may be each independently a substituted or unsubstituted hydrocarbon ring of 5 to 30 ring-forming carbon atoms, or a substituted or unsubstituted heterocycle of 2 to 30 ring-forming carbon atoms.

Formula F-c

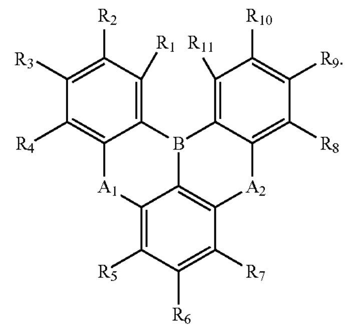

In Formula F-c, $A_1$ and $A_2$ may be each independently O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may be each independently combined with the substituents of an adjacent ring to form a fused ring. For example, if $A_1$ and $A_2$ may be each independently $NR_m$, $A_1$ may be combined with $R_4$ or $R_5$ to form a ring. In one or more embodiments, $A_2$ may be combined with $R_7$ or $R_8$ to form a ring.

In one or more embodiments, the emission layer EML may include, as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivative(s) thereof (for example, 2,5,8,11-tetra-t-butylperylene (TBP)), pyrene and/or the derivative(s) thereof (for example, 1,1-dipyrene, 1,4-dipyrenylbenzene, and/or 1,4-bis(N,N-diphenylamino)pyrene), etc.

The emission layer EML may include a suitable phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb), and/or thulium (Tm). For example, iridium(III) bis(4,6- difluorophenylpyridinato-N,C2')picolinate (Flrpic), bis(2,4-difluorophenylpyridinato)-tetrakis(1-pyrazolyl)borate iridium (III) (Fir6), and/or platinum octaethyl porphyrin (PtOEP) may be used as the phosphorescence dopant. However, one or more embodiments of the present disclosure are not limited thereto.

In the organic electroluminescence device ED of one or more embodiments, as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, one or more embodiments of the present disclosure are not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure formed using multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1 below.

Formula ET-1

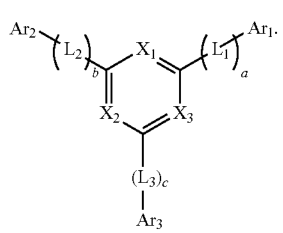

In Formula ET-1, at least one selected from among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may be each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "a" to "c" are each independently integers of 2 or more, respective $L_1$ to $L_3$ may be each independently a substituted or unsubstituted arylene group of 6 to 30 ring-forming carbon atoms, or a substituted or unsubstituted heteroarylene group of 2 to 30 ring-forming carbon atoms.

If the electron transport region ETR includes an electron transport layer ETL, the electron transport region ETR may include an anthracene-based compound. However, one or more embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and/or one or more mixtures thereof, without limitation.

The electron transport region ETR may include at least one selected from among Compounds ET1 to ET36 below.

ET1

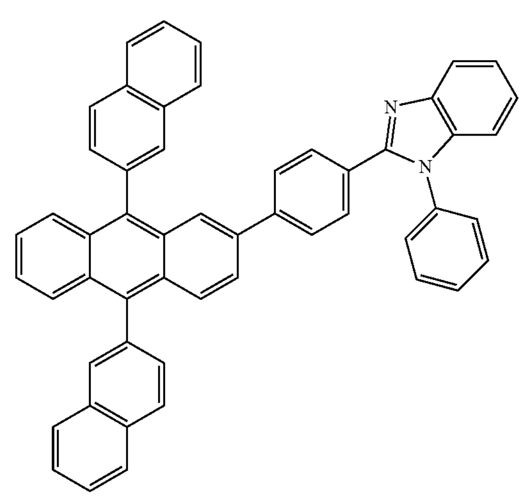

-continued
ET2
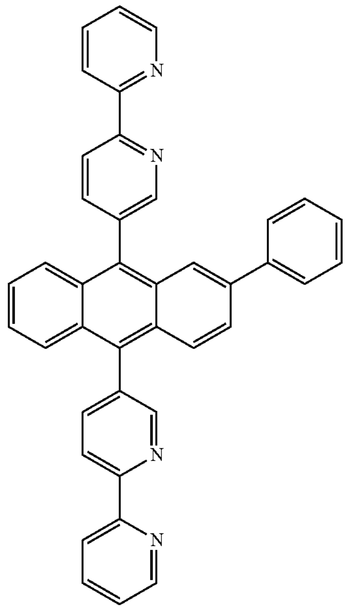
ET3
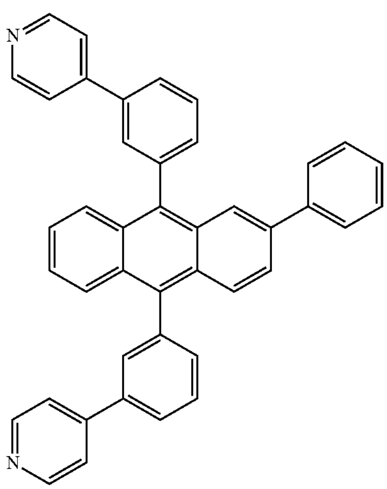
ET4
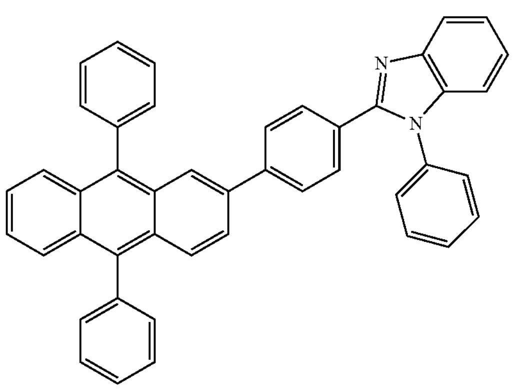
-continued
ET5
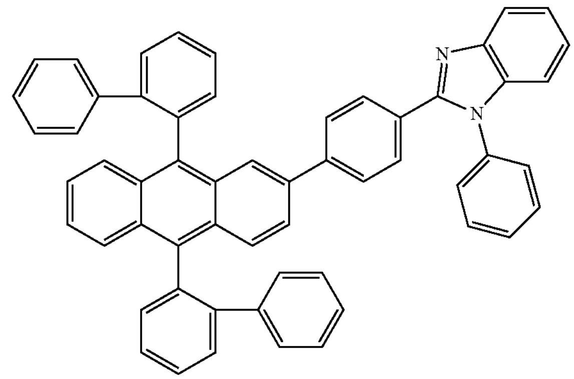
ET6
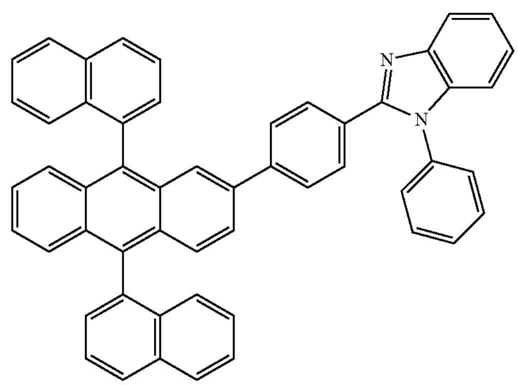
ET7
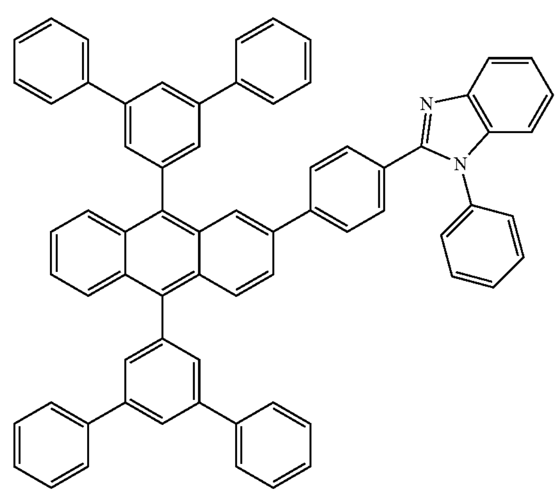

-continued
ET8
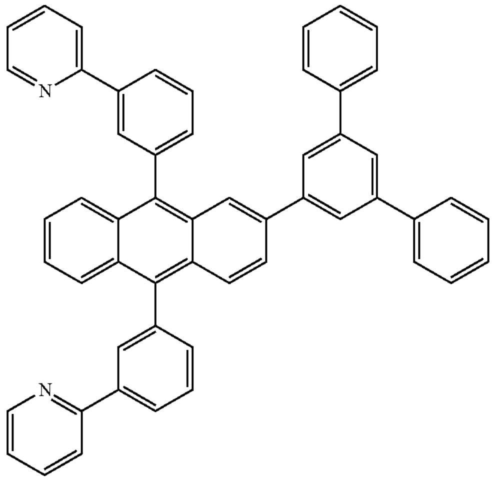
ET9
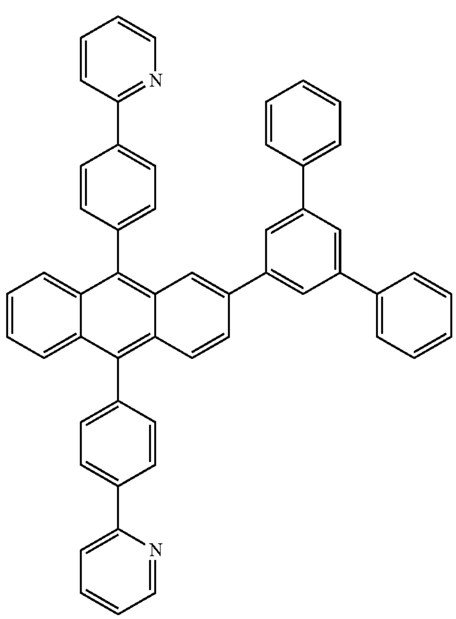
-continued
ET10
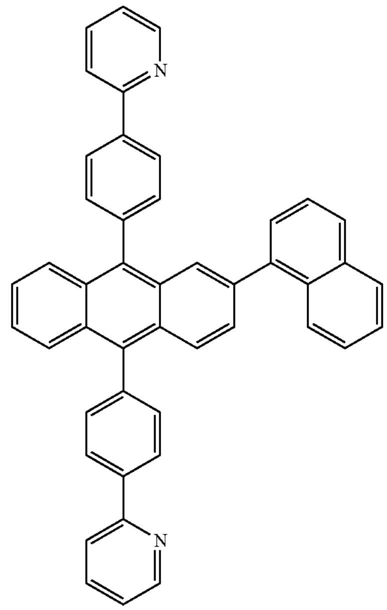
ET11
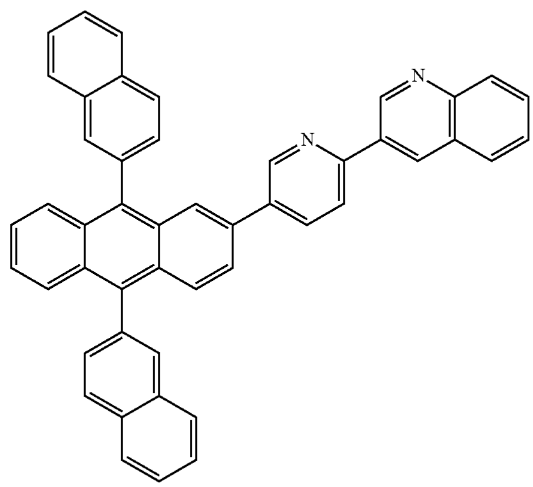
ET12
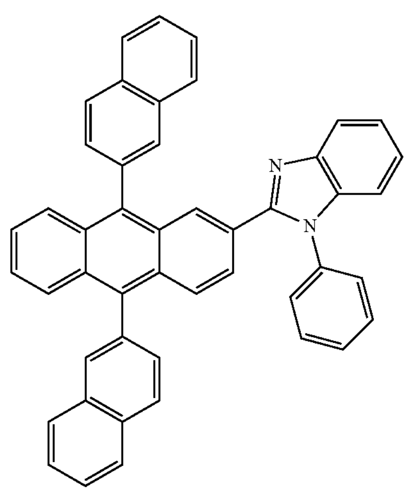

-continued
ET13
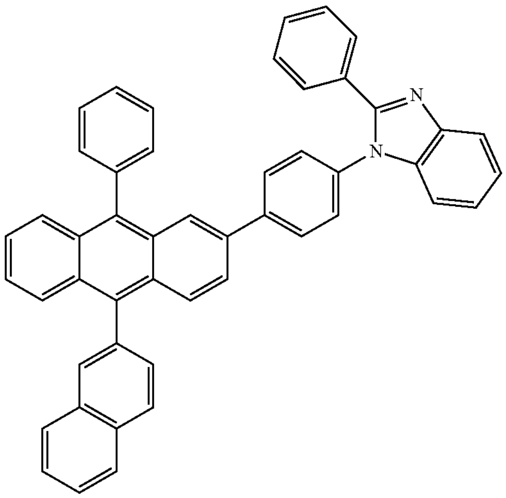
ET14
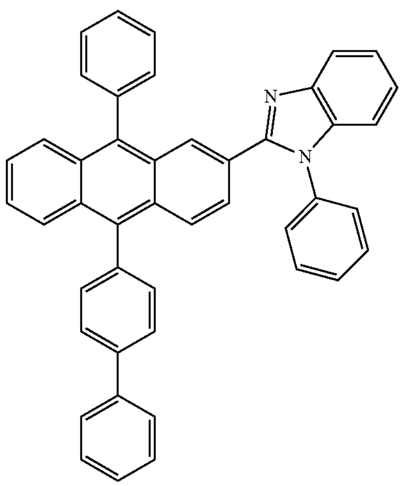
ET15
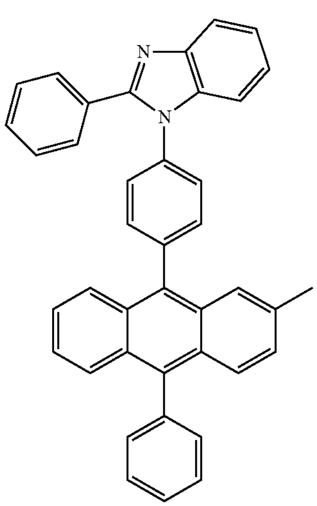
-continued
ET16
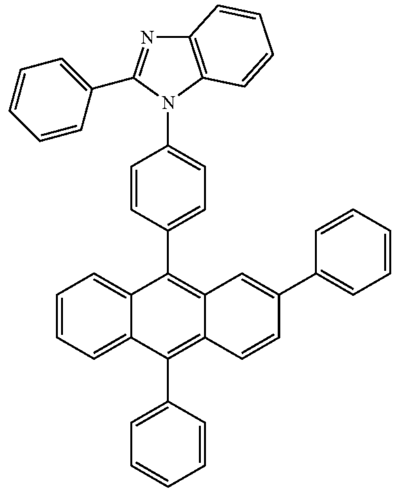
ET17
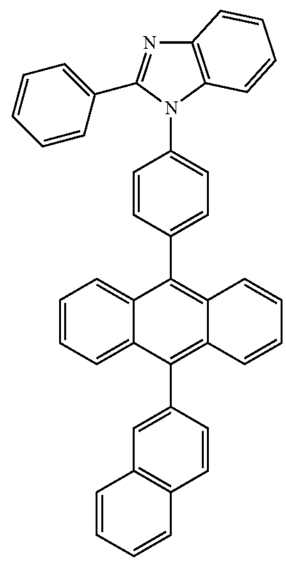
ET18
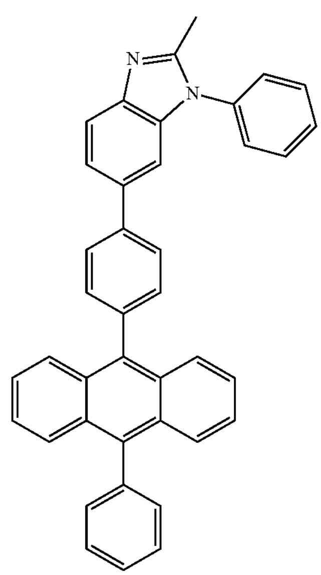

-continued
ET19
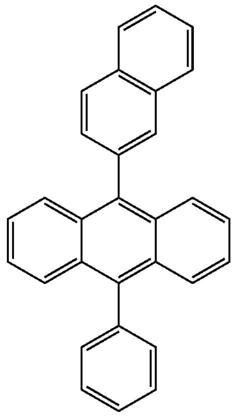
ET20
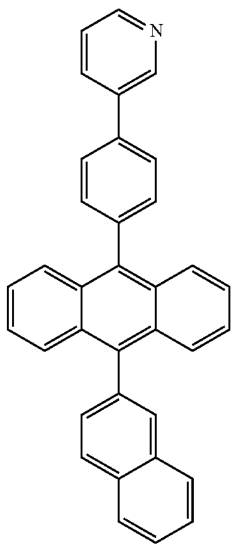
ET21
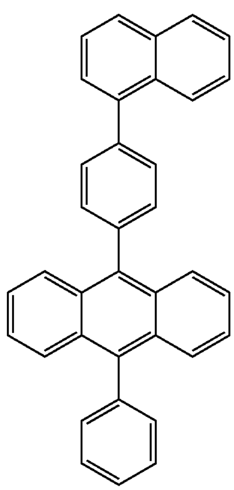
-continued
ET22
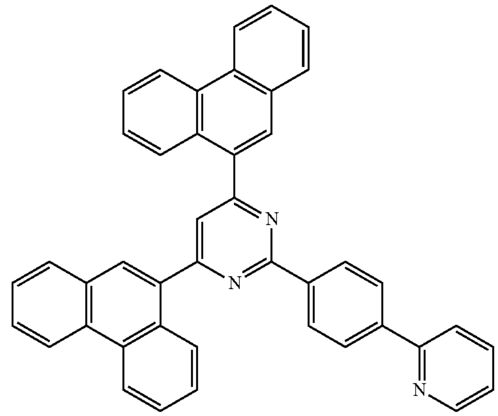
ET23
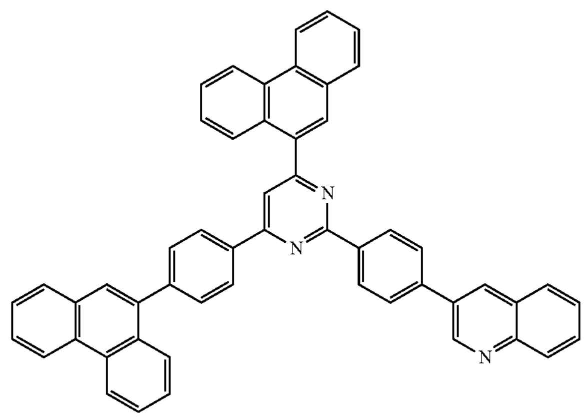
ET24
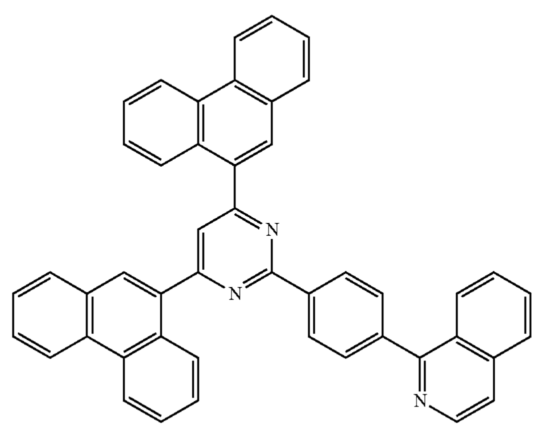

-continued
ET25
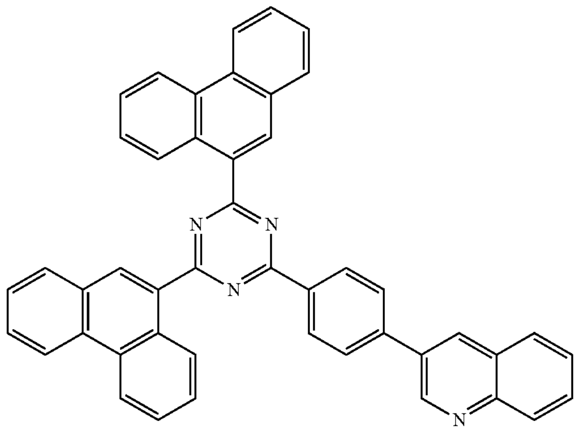
ET26
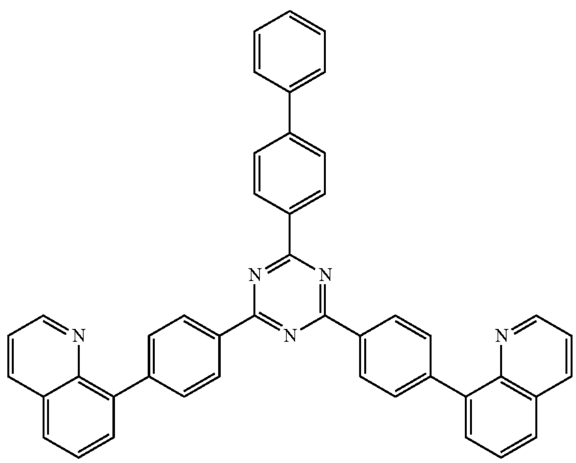
ET27
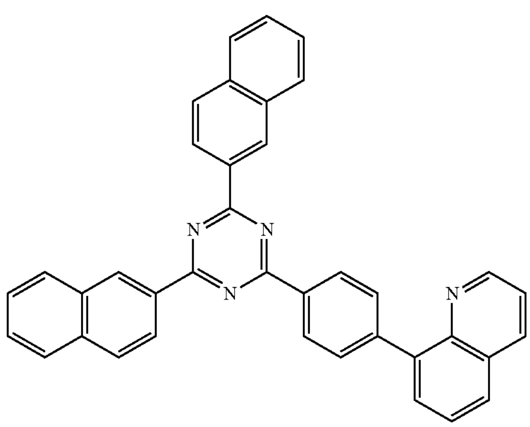
-continued
ET28
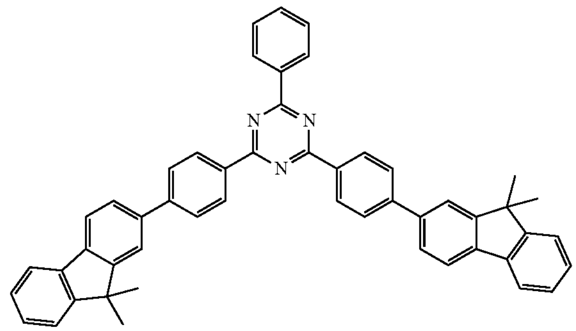
ET29
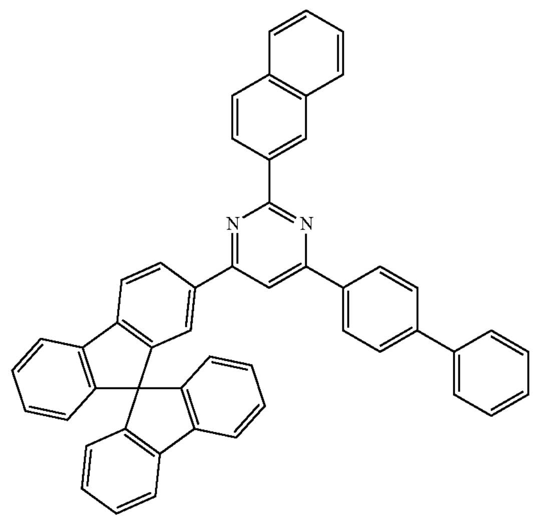
ET30
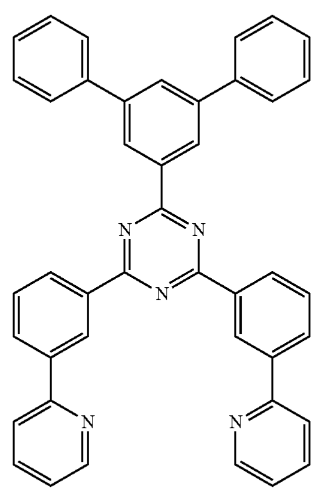

-continued

ET31

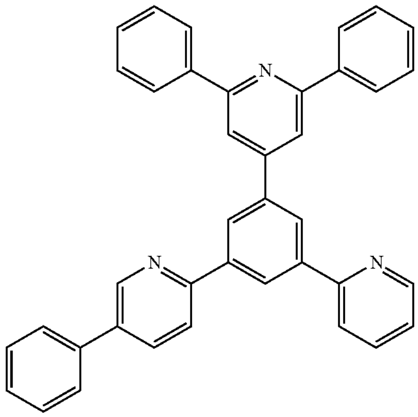

ET32

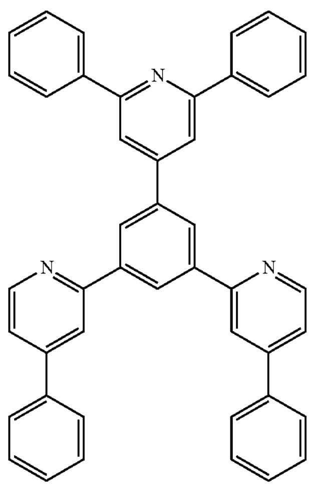

ET33

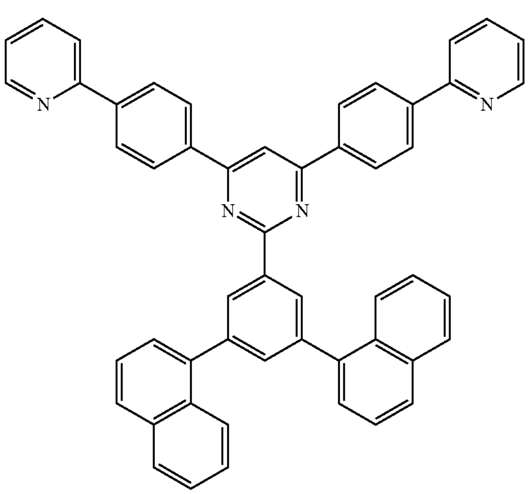

-continued

ET34

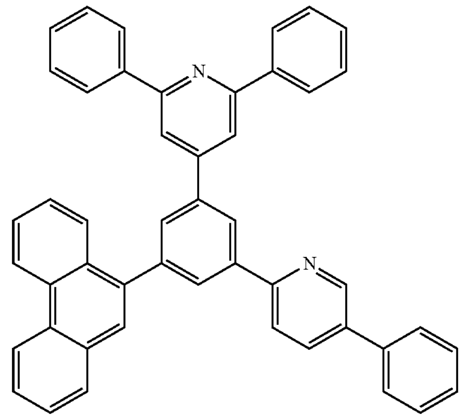

ET35

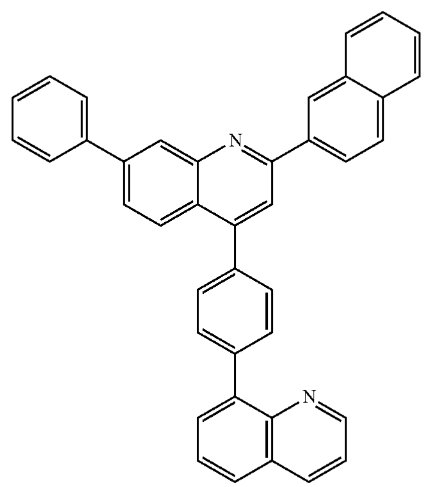

ET36

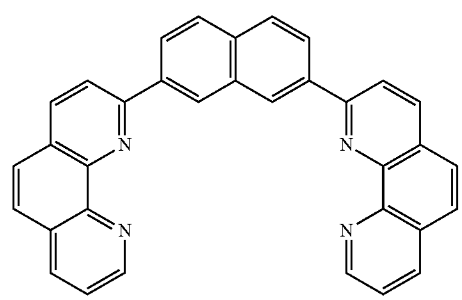

In one or more embodiments, the electron transport region ETR may include a metal halide (such as LiF, NaCl, CsF, RbCl, RbI, CuI and/or KI), a metal in lanthanoides (such as Yb), or a co-deposited material of the metal halide and the metal in lanthanoides. For example, the electron transport region ETR may include KI:Yb, RbI:Yb, etc., as the co-deposited material. In one or more embodiments, the electron transport region ETR may use a metal oxide (such as $Li_2O$ and/or BaO), and/or 8-hydroxy-lithium quinolate (Liq). However, one or more embodiments of the present disclosure are not limited thereto. The electron transport region ETR also may be formed using a mixture material of an electron transport material and an insulating organo metal salt. The organo metal salt may be a material having an energy band gap of about 4 eV or more. For example, the organo metal salt may include, for example, metal acetate(s), metal benzoate(s), metal acetoacetate(s), metal acetylacetonate(s), and/or metal stearate(s). However, one or more embodiments of the present disclosure are not limited thereto.

The electron transport region ETR may include the compounds of the electron transport region in at least one selected from among an electron injection layer EIL, an electron transport layer ETL, and a hole blocking layer HBL.

If the electron transport region ETR includes the electron transport layer ETL, the thickness of the electron transport layer ETL may be from about 100 Å to about 1,000 Å, for example, from about 150 Å to about 500 Å. If the thickness of the electron transport layer ETL satisfies any of the above-described ranges, satisfactory (or suitable) electron transport properties may be obtained without a substantial increase of a driving voltage. If the electron transport region ETR includes the electron injection layer EIL, the thickness of the electron injection layer EIL may be from about 1 Å to about 100 Å, for example, from about 3 Å to about 90 Å. If the thickness of the electron injection layer EIL satisfies any of the above described ranges, satisfactory (or suitable) electron injection properties may be obtained without inducing a substantial increase of a driving voltage.

The second electrode EL2 is provided on the electron transport region ETR. The second electrode EL2 may be a common electrode. The second electrode EL2 may be a cathode or an anode, but one or more embodiments of the present disclosure are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, one or more compounds thereof, and/or one or more mixtures thereof (for example, AgMg, AgYb, and/or MgAg). In one or more embodiments, the second electrode EL2 may have a multilayered structure including a reflective layer or a transflective layer formed using any of the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, and/or oxides of any of the aforementioned metal materials.

In one or more embodiments, the second electrode EL2 may be connected (e.g., coupled) with an auxiliary electrode. If the second electrode EL2 is connected (e.g., coupled) with the auxiliary electrode, the resistance of the second electrode EL2 may decrease.

In one or more embodiments, on the second electrode EL2 of the organic electroluminescence device ED of one or more embodiments, a capping layer CPL may be further disposed. The capping layer CPL may include a multilayer or a single layer.

In one or more embodiments, the capping layer CPL may be an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or may include an epoxy resin, and/or acrylate such as methacrylate. In one or more embodiments, a capping layer CPL may include at least one selected from among Compounds P1 to P5 below, but one or more embodiments of the present disclosure are not limited thereto.

P1

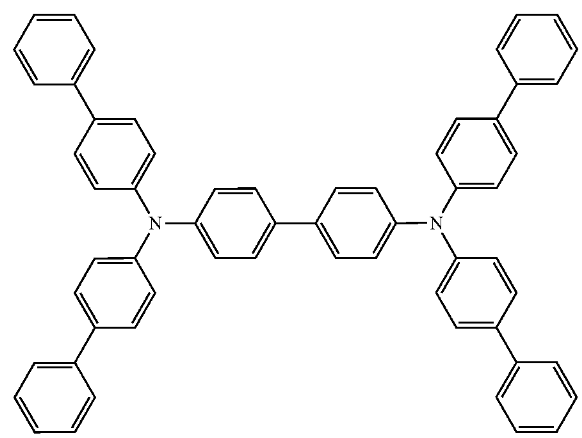

P2

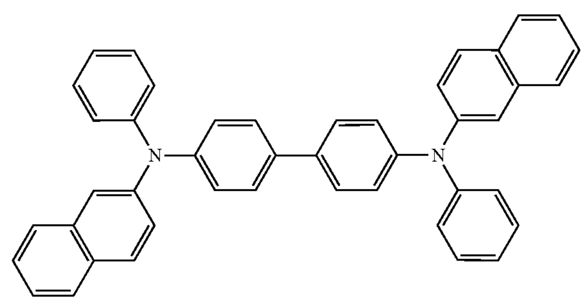

P3

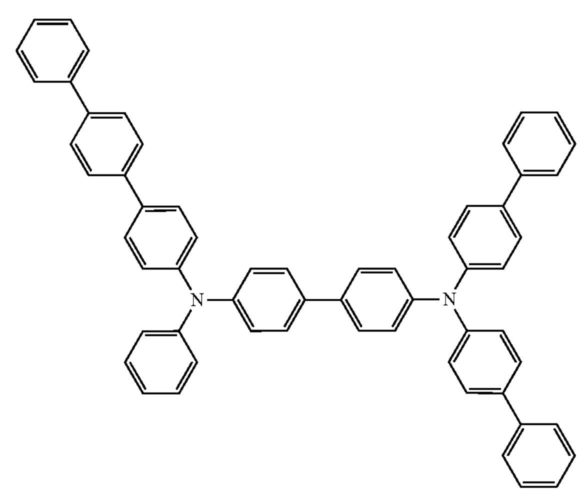

-continued

P4

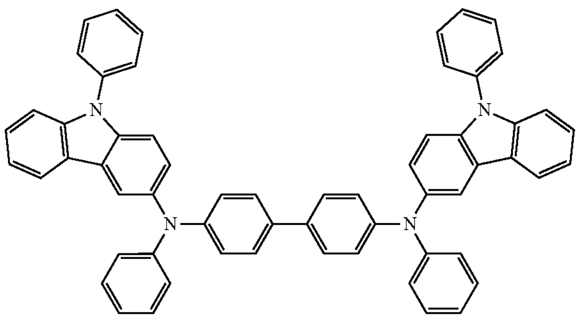

P5

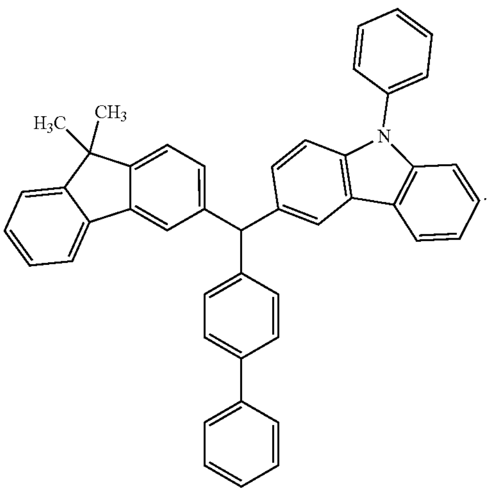

In one or more embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
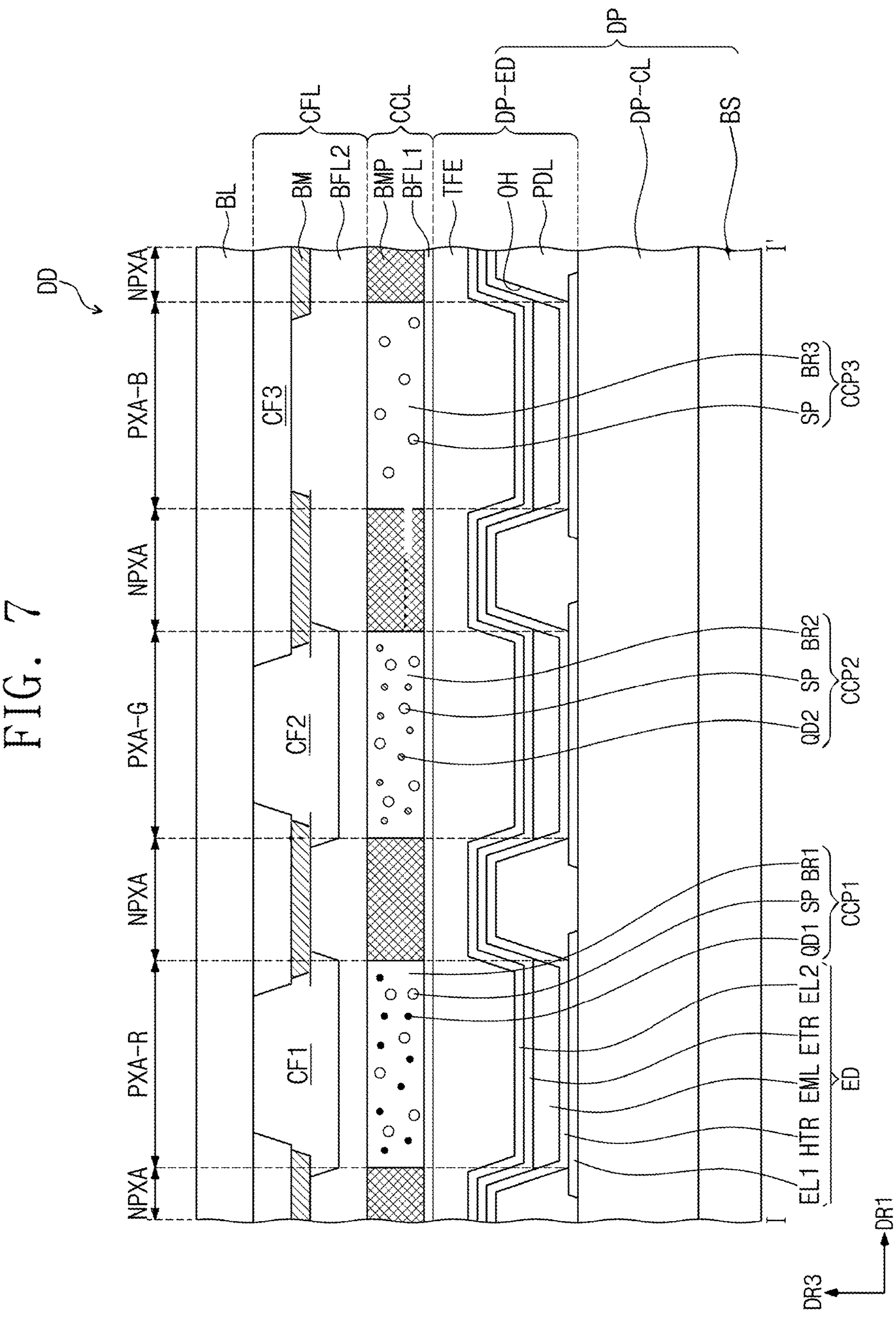
FIG. 7 is a cross-sectional view showing a display apparatus according to one or more embodiments of the present disclosure.
Figure 8:
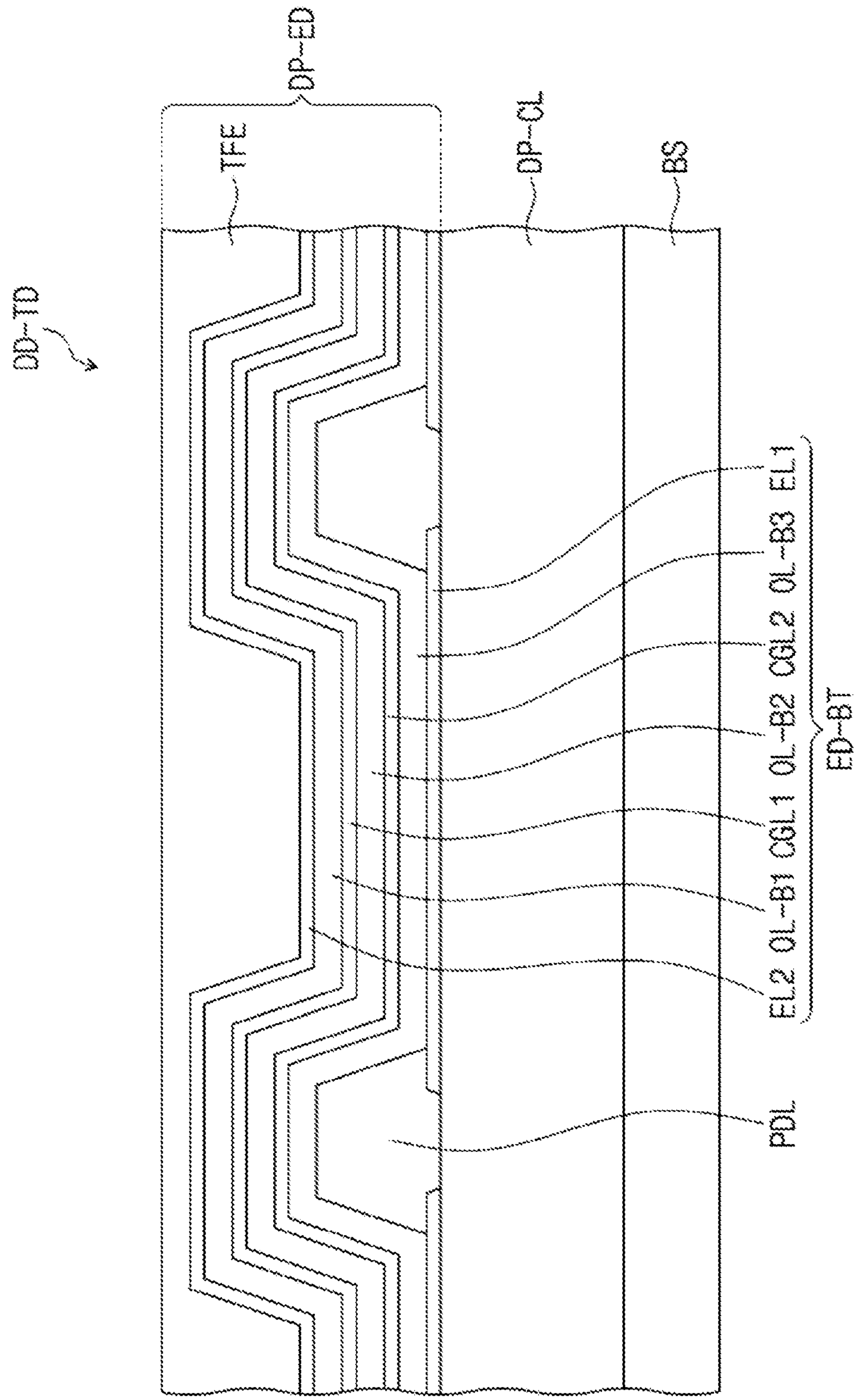
FIG. 8 is a cross-sectional view showing a display apparatus according to one or more embodiments of the present disclosure.

FIG. 7 and FIG. 8 are cross-sectional views of display apparatuses according to embodiments, respectively. In the explanation on the display apparatuses of embodiments, referring to FIG. 7 and FIG. 8, the overlapping explanations provided in connection with FIG. 1 to FIG. 6 will not be provided again, and the different features will be explained chiefly.

Referring to FIG. 7, the display apparatus DD according to one or more embodiments may include a display panel DP including a display device layer DP-ED, a light controlling layer CCL disposed on the display panel DP, and a color filter layer CFL.

In one or more embodiments shown in FIG. 7, the display panel DP includes a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, the same structures of the organic electroluminescence devices of FIG. 4 to FIG. 6 may be applied to the structure of the organic electroluminescence device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD of one or more embodiments, the emission layer EML may emit blue light. In one or more embodiments, the emission layer EML may be provided as a common layer for all luminous areas PXA-R, PXA-G and PXA-B.

The light controlling layer CCL may be disposed on the display panel DP. The light controlling layer CCL may include a light converter. The light converter may be a quantum dot or a phosphor. The light converter may transform (e.g., convert) the wavelength of light provided and then emit the converted light. For example, the light controlling layer CCL may be a layer including a quantum dot or a layer including a phosphor.

The core of the quantum dot may be selected from a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as $In_2S_3$, and/or $In_2Se_3$; a ternary compound such as $InGaS_3$, and/or $InGaSe_3$; or combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; and a quaternary compound such as $AgInGaS_2$, and/or $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In one or more embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound, and/or the quaternary compound may be present at uniform concentration in a particle or may be present at a partially different concentration distribution state in the same particle. In addition, a core/shell structure in which one quantum dot wraps another quantum dot may be possible. The interface of the core and the shell may have a concentration gradient in which the concentration of an element present in the shell is decreased toward the center.

In some embodiments, the quantum dot may have the above-described core-shell structure including a core including a nanocrystal and a shell wrapping (e.g., surrounding or around) the core. The shell of the quantum dot may play the role of a protection layer for preventing or reducing chemical deformation of the core to maintain semiconductor properties and/or a charging layer for imparting the quantum dot with electrophoretic properties. The shell may have a single layer or a multilayer.

Examples of the shell of the quantum dot may include a metal oxide, a non-metal oxide, a semiconductor compound, and combinations thereof.

For example, the metal oxide or the non-metal oxide may each independently include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), and/or a ternary compound (such as $MgAl_2O_4$, $CoFe_2O_4$, $NiFe_2O_4$ and $CoMn_2O_4$), but one or more embodiments of the present disclosure are not limited thereto.

In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but one or more embodiments of the present disclosure are not limited thereto.

The quantum dot may have a full width of half maximum (FWHM) of emission wavelength spectrum of about 45 nm or less, for example, about 40 nm or less, or about 30 nm or less. Within any of these ranges, color purity and/or color reproducibility may be improved. In addition, light emitted via such quantum dot is emitted in all directions, and light view angle properties may be improved.

The shape of the quantum dot may be any suitable shape in the art, without specific limitation. For example, the shape of spherical, pyramidal, multi-arm, and/or cubic nanoparticle, nanotube, nanowire, nanofiber, nanoplate particle, etc. may be used.

The quantum dot may control the color of light emitted according to the particle size, and accordingly, the quantum dot may have various emission colors such as blue, red and/or green.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but one or more embodiments of the present disclosure are not limited thereto. In FIG. 7, the partition pattern BMP is shown not to be overlapped with the light controlling parts CCP1, CCP2 and CCP3, but in one or more embodiments, at least a portion of the edge of the light controlling parts CCP1, CCP2 and CCP3 may be overlapped with the partition pattern BMP.

The light controlling layer CCL may include a first light controlling part CCP1 including a first quantum dot QD1 converting (e.g., to convert) first color light provided from the organic electroluminescence device ED into second color light, a second light controlling part CCP2 including a second quantum dot QD2 converting (e.g., to convert) first color light into third color light, and a third light controlling part CCP3 transmitting (e.g., to transmit) first color light.

In one or more embodiments, the first light controlling part CCP1 may provide red light which is the second color light, and the second light controlling part CCP2 may provide green light which is the third color light. The third color controlling part CCP3 may transmit and provide blue light which is the first color light provided from the organic electroluminescence device ED. For example, the first quantum dot QD1 may be a red quantum dot, and the second quantum dot QD2 may be a green quantum dot. For the quantum dots QD1 and QD2, the same descriptions as those provided above in connection with the quantum dot may be applied.

In one or more embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

The first light controlling part CCP1, the second light controlling part CCP2, and the third light controlling part CCP3 may include base resins BR1, BR2, and BR3 which respectively disperse the quantum dots QD1 and QD2, and the scatterer SP. In one or more embodiments, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer SP dispersed in the third base resin BR3. The base resins BR1, BR2, and BR3 are media in which the quantum dots QD1 and QD2, and the scatterer SP are dispersed, and may be made of one or more suitable resin compositions which may be generally referred to as binders. For example, the base resins BR1, BR2, and BR3 may be acrylic-based resins, urethane-based resins, silicone-based resins, epoxy based resins, and/or the like. The base resins BR1, BR2, and BR3 may be transparent resins. In one or more embodiments, each of the first base resin BR1, the second base resin BR2, and the third base resin BR3 may be the same as or different from each other.

The light controlling layer CCL may include a barrier layer BFL1. The barrier layer BFL1 may play the role of blocking or reducing the penetration of moisture and/or oxygen (hereinafter, will be referred to as "humidity/oxygen"). The barrier layer BFL1 may be disposed on the light controlling parts CCP1, CCP2 and CCP3 to block the exposure of the light controlling parts CCP1, CCP2 and CCP3 to humidity/oxygen. In one or more embodiments, the barrier layer BFL1 may cover the light controlling parts CCP1, CCP2 and CCP3. In addition, a barrier layer BFL2 may be provided between a color filter layer CFL and the light controlling parts CCP1, CCP2 and CCP3.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or a metal thin film securing light transmittance. In one or more embodiments, the barrier layers BFL1 and BFL2 may further include an organic layer. The barrier layers BFL1 and BFL2 may be composed of a single layer of multiple layers.

In the display apparatus DD of one or more embodiments, the color filter layer CFL may be disposed on the light controlling layer CCL. For example, the color filter layer CFL may be disposed directly on the light controlling layer CCL. In this case, the barrier layer BFL2 may be omitted.

The color filter layer CFL may include a light blocking part BM and filters CF1, CF2 and CF3. The color filter layer CFL may include a first filter CF1 transmitting (e.g., to transmit) second color light, a second filter CF2 transmitting (e.g., to transmit) third color light, and a third filter CF3 transmitting (e.g., to transmit) first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment and/or dye. The first filter CF1 may include a red pigment and/or dye, the second filter CF2 may include a green pigment and/or dye, and the third filter CF3 may include a blue pigment and/or dye. However, one or more embodiments of the present disclosure are not limited thereto, and the third filter CF3 may not include the pigment or dye. The third filter CF3 may include a polymer photosensitive resin and not include a pigment or dye. The third filter CF3 may be transparent. The third filter CF3 may be formed using a transparent photosensitive resin.

In one or more embodiments, the first filter CF1 and the second filter CF2 may be yellow filters. The first filter CF1 and the second filter CF2 may be provided in one body (e.g., integrally with each other) without distinction.

The light blocking part BM may be a black matrix. The light blocking part BM may be formed by including an organic light blocking material or an inorganic light blocking material including a black pigment and/or black dye. The light blocking part BM may prevent or reduce light leakage phenomenon and divide the boundaries among adjacent filters CF1, CF2 and CF3. In one or more embodiments, the light blocking part BM may be formed as a blue filter.

The first to third filters CF1, CF2 and CF3 may be disposed corresponding the red luminous area PXA-R, the green luminous area PXA-G, and the blue luminous area PXA-B, respectively.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, one or more embodiments of the present disclosure are not limited thereto, and the base substrate BL may be an inorganic layer, an organic layer, or a composite material layer (e.g., including an organic material and an inorganic material). In one or more embodiments, the base substrate BL may be omitted.

FIG. 8 is a cross-sectional view showing a portion of the display apparatus according to one or more embodiments. In FIG. 8, the cross-sectional view of a portion corresponding to the display panel DP in FIG. 7 is shown. In a display apparatus DD-TD of one or more embodiments, the organic electroluminescence device ED-BT may include multiple light emitting structures OL-B1, OL-B2 and OL-B3. The organic electroluminescence device ED-BT may include oppositely disposed first electrode EL1 and second electrode EL2, and the multiple light emitting structures OL-B1, OL-B2 and OL-B3 stacked in order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the organic electroluminescence device ED-BT included in the display apparatus DD-TD of one or more embodiments may be an organic electroluminescence device of a tandem structure including multiple emission layers.

In one or more embodiments shown in FIG. 8, light emitted from the light emitting structures OL-B1, OL-B2 and OL-B3 may be all blue light. However, one or more embodiments of the present disclosure are not limited thereto, and the wavelength regions of light emitted from the light emitting structures OL-B1, OL-B2 and OL-B3 may be different from each other. For example, the organic electroluminescence device ED-BT including the multiple light emitting structures OL-B1, OL-B2 and OL-B3 emitting (e.g., to emit) light in different wavelength regions may emit white light.

Between neighboring light emitting structures OL-B1, OL-B2 and OL-B3, a charge generating layer CGL may be disposed (e.g., a first charge generating layer CGL1 may be between light emitting structures OL-B1 and OL-B2, and a second charge generating layer CGL2 may be between light emitting structures OL-B2 and OL-B3). The charge generating layer CGL may include a p-type charge generating layer and/or an n-type charge generating layer.

Hereinafter, the present disclosure will be explained referring to embodiments and comparative embodiments. However, the embodiments are only illustrations to assist the understanding of the present disclosure, and the scope of the present disclosure is not limited thereto.

SYNTHETIC EXAMPLES

The polycyclic compound according to one or more embodiments of the present disclosure may be synthesized by, for example, the following. However, the synthetic method of the polycyclic compound according to one or more embodiments of the present disclosure is not limited to the embodiments below.

1. Synthesis of Compound 2
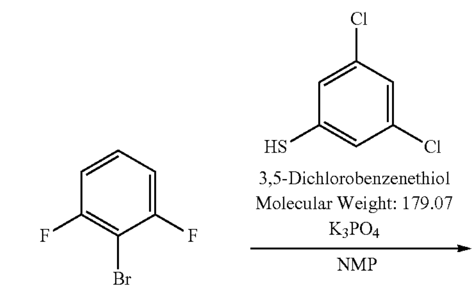
2-Bromo-1,3-difluorobenzene
Molecular Weight: 192.99
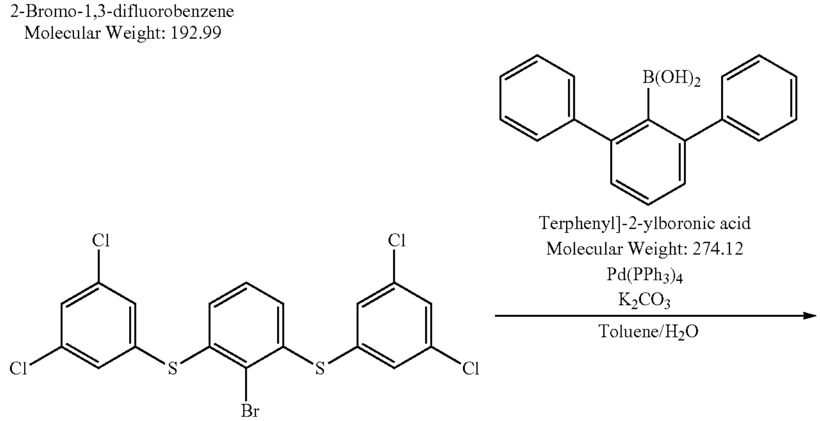
Molecular Weight: 511.09
A
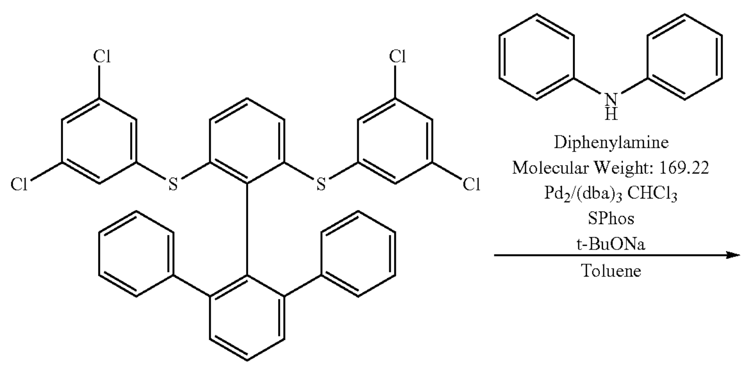
Molecular Weight: 660.49
B
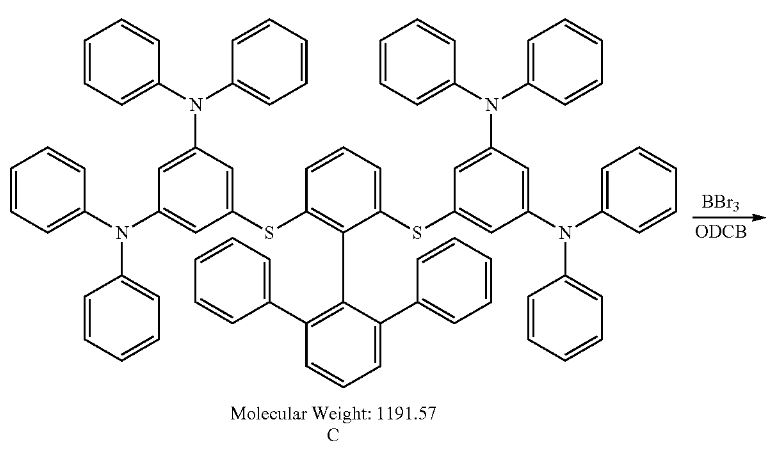
Molecular Weight: 1191.57
C -continued

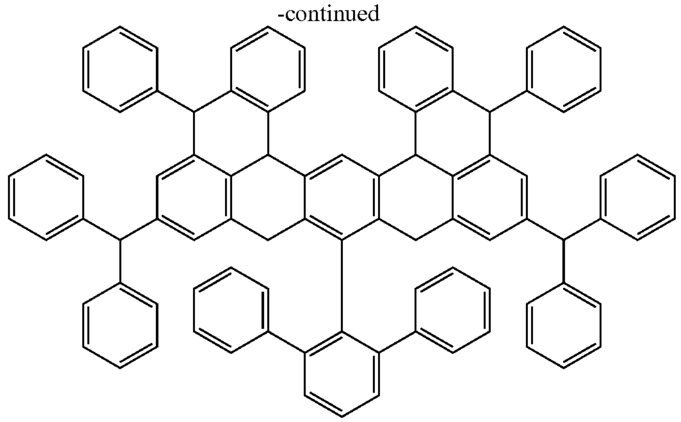

Molecular Weight: 1207.14

2

(1) Synthesis of Compound A

Under an argon (Ar) atmosphere, 2-bromo-1,3-difluorobenzene (58.0 mmol), 3,5-dichlorobenzenethiol (116 mmol), and $K_3PO_4$ (232 mmol) were added to 1-methyl-2-pyrrolidone (NMP, 250 ml), and heated and stirred at about 170° C. for about 10 hours. After cooling, water and toluene were added, liquid layers were separated, and an organic layer was concentrated. The crude product was separated by silica gel column chromatography to obtain Compound A (yield 60%). Through Fast Atom Bombardment Mass Spectrometry (FAB MS) measurement, Compound A was identified (M/Z=511).

(2) Synthesis of Compound B

Under an Ar atmosphere, Compound A (30.0 mmol), terphenyl-2-ylboronic acid (45.0 mmol), $Pd(PPh_3)_4$ (0.2 mmol), and $K_2CO_3$ (90.0 mmol) were added to a mixture solvent of toluene/$H_2O$ (200 ml/200 ml), and heated and stirred at about 110° C. for about 8 hours. After cooling, water and toluene were added, liquid layers were separated, and an organic layer was concentrated. The crude product was separated by silica gel column chromatography to obtain Compound B (yield 80%). Through FAB MS measurement, Compound B was identified (M/Z=660).

(3) Synthesis of Compound C

Under an Ar atmosphere, Compound B (40.0 mmol), diphenylamine (80.0 mmol), tris(dibenzylideneacetone) dipalladium(0)-chloroform adduct ($Pd_2(dba)_3 \cdot CHCl_3$, 2.40 mmol), 2-dicyclohexylphosphino-2',6'-dimethoxybiphenyl (SPhos, 4.80 mmol), and tBuONa (120 mmol) were added to 600 ml of toluene, and reacted at about 80° C. for about 6 hours. After cooling, water was added, filtering with celite was performed, and liquid layers were separated. An organic layer was concentrated. The crude product was separated by silica gel column chromatography to obtain Compound C (yield 85%). Through FAB MS measurement, Compound C was identified (M/Z=1191.5).

(4) Synthesis of Compound 2

Under an Ar atmosphere, Compound C (26.4 mmol) was dissolved in 1,2-dichlorobenzene (ODCB, 380 ml), and $BBr_3$ (158 mmol) was added thereto, followed by heating and stirring at about 180° C. for about 10 hours. After cooling to room temperature, N,N-diisopropylethylamine (851 mmol) was added, water was added, filtering with celite was performed, liquid layers were separated, and an organic layer was concentrated. The crude product was separated by silica gel column chromatography to obtain Compound 2 (yield 30%). Through FAB MS measurement, Compound 2 was identified (M/Z=1207). After purifying through sublimation purification (395° C., $7.5 \times 10^{-3}$ Pa), the evaluation on a device was conducted.

2. Synthesis of Compound 4

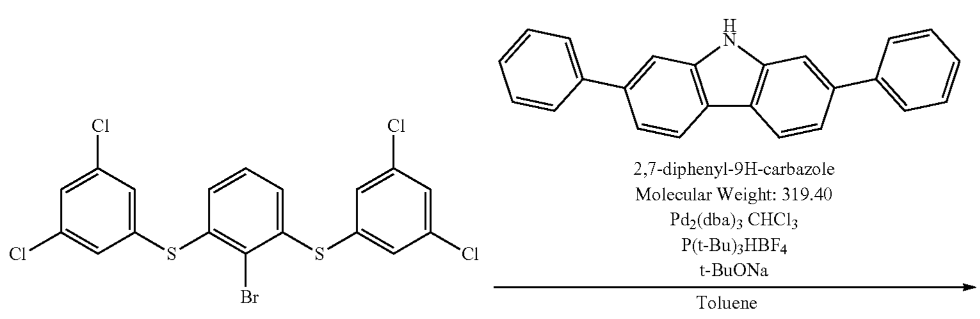

Molecular Weight: 511.09

A

-continued

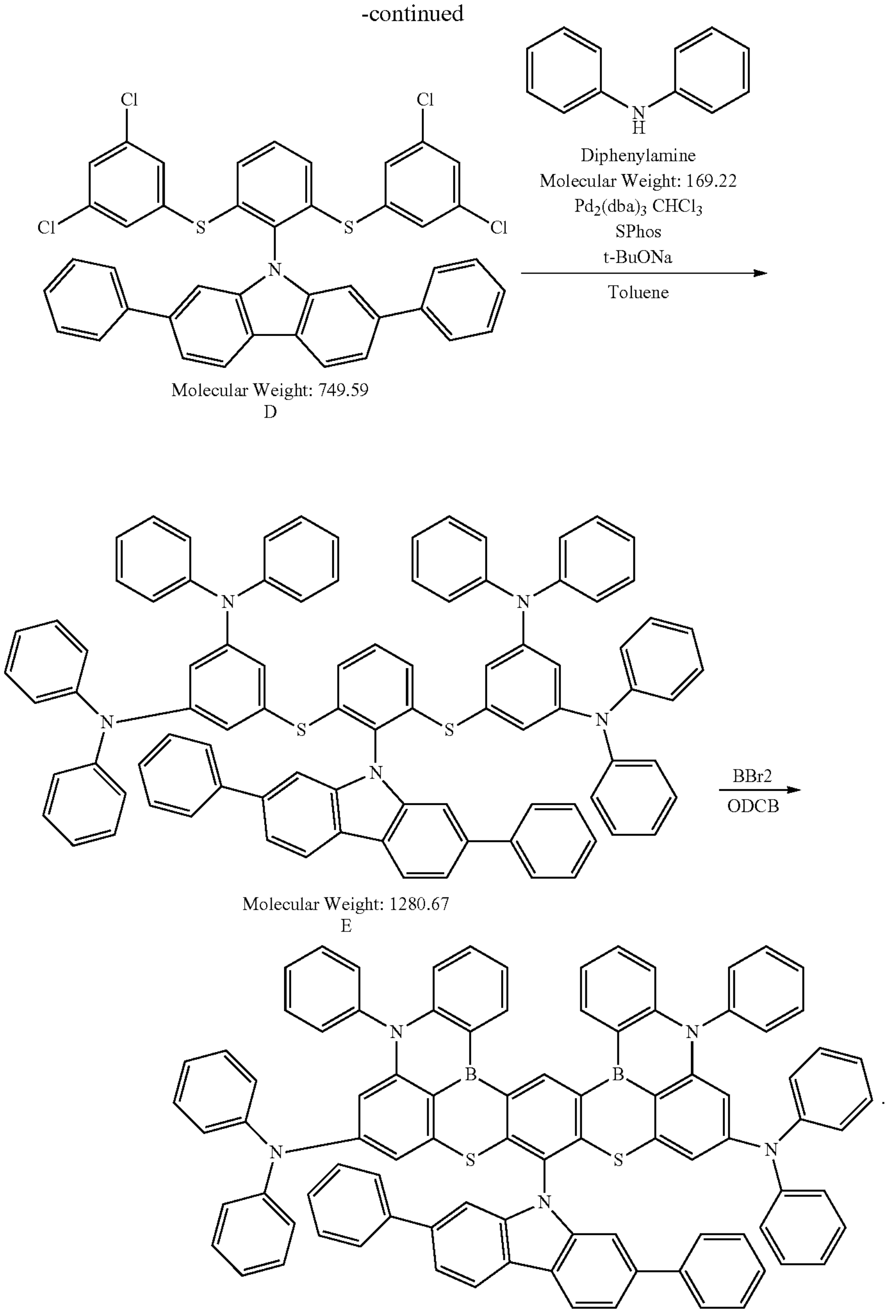

Molecular Weight: 1296.24
4

(1) Synthesis of Compound D

Under an Ar atmosphere, Compound A (197 mmol), 2,7-diphenyl-9H-carbazole (414 mmol), $Pd(dba)_2$ (9.85 mmol), $P(t\text{-}Bu)_3HBF_4$ (9.85 mmol), and tBuONa (689 mmol) were added to 700 ml of toluene, and heated and stirred at about 80° C. for about 2 hours. Water was added thereto, filtering with celite was performed, liquid layers were separated, and an organic layer was concentrated. The crude product was separated by silica gel column chromatography to obtain Compound D (yield 88%). Through FAB MS measurement, Compound D was identified (M/Z=749.6).

(2) Synthesis of Compound E

Compound E was obtained (78%) by the synthetic conditions of Compound C. Through FAB MS measurement and NMR measurement, Compound E was identified (M/Z=1281).

(3) Synthesis of Compound 4

Compound 4 was obtained (33%) by the synthetic conditions of Compound 2. Through FAB MS measurement and NMR measurement, Compound 4 was identified (M/Z=1296). After purifying through sublimation purification (400° C., $6.9\times10^{-3}$ Pa), the evaluation on a device was conducted.

Device Manufacturing Example
Organic electroluminescence devices were manufactured using Example Compounds and Comparative Compounds below as materials of an emission layer.
Example Compound
2
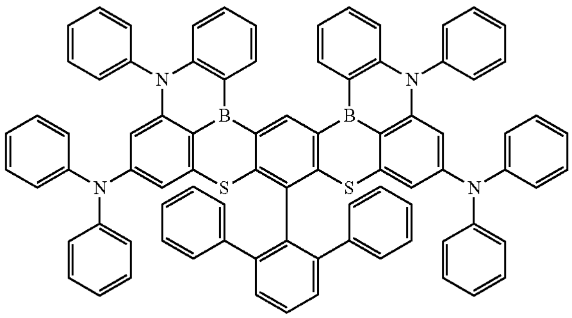
-continued
4
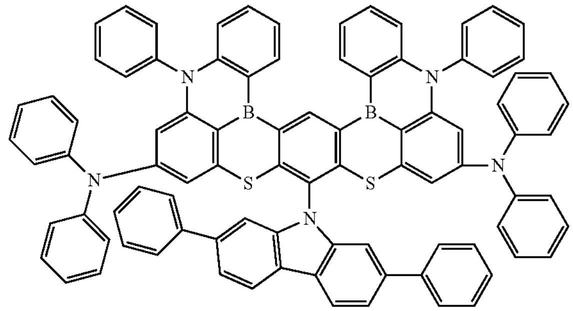
Comparative Compound
X1
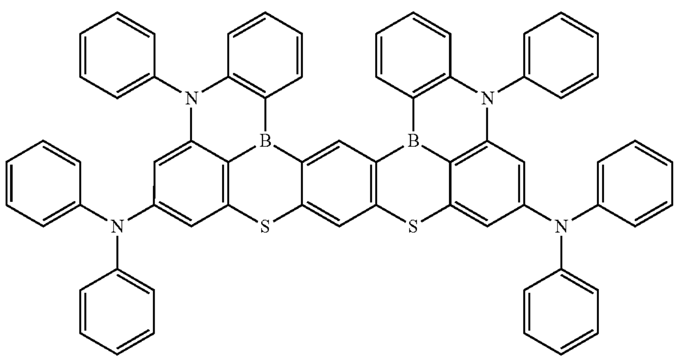
X2
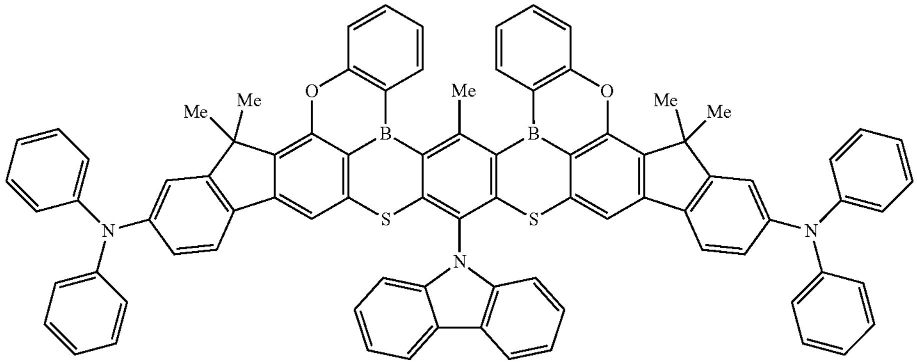

-continued

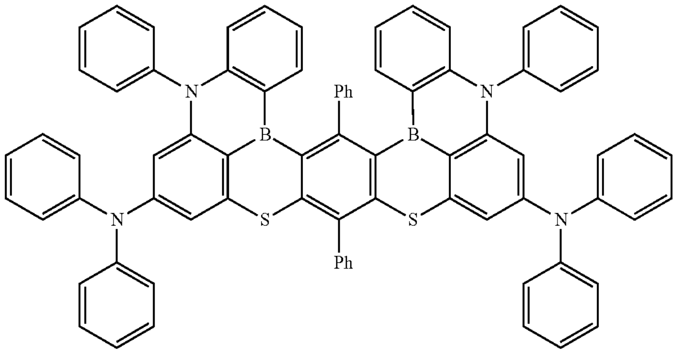

X3

The organic electroluminescence devices of the Examples and Comparative Examples were manufactured by a method below. On a glass substrate, ITO with a thickness of about 1,500 Å was patterned, washed with ultrapure water, and treated with UV ozone for about 10 minutes. Then, HAT-CN was deposited to a thickness of about 100 Å, α-NPD was deposited to a thickness of about 800 Å, and mCP was deposited to a thickness of about 50 Å to form a hole transport region.

Then, the polycyclic compound of one or more embodiments or the Comparative Compound were co-deposited with mCP in a ratio of 1:99 to form a layer having a thickness of about 200 Å to form an emission layer.

On the emission layer, a layer was formed using TPBi to a thickness of about 300 Å, and a layer was formed using LiF to a thickness of about 5 Å to form an electron transport region. Then, a second electrode was formed using aluminum (Al) to a thickness of about 1,000 Å.

Measurement values according to Examples 1 and 2 and Comparative Examples 1 to 3 are shown in Table 1 below. The maximum emission wavelength was $\lambda_{max}$, and external quantum efficiency at about 10 mA/cm$^2$ was EQEmax1000 nit.

TABLE 1

| | Dopant | $k_{RISC}$ $10^4 S^{-1}$ | λmax nm | Roll-off % | EQEmax 1000 nit % | Relative life LT50 (h) |
|---|---|---|---|---|---|---|
| Example 1 | Example Compound 2 | 20 | 461 | 14.2 | 18.5 | 1.6 |
| Example 2 | Example Compound 4 | 19 | 460 | 12.2 | 19.0 | 1.5 |
| Comparative Example 1 | Comparative Compound X1 | 20 | 463 | 18.2 | 17.4 | 1 |
| Comparative Example 2 | Comparative Compound X2 | 0.5 | 440 | 35.4 | 6.7 | 0.4 |
| Comparative Example 3 | Comparative Compound X3 | 20 | 461 | 18.3 | 17.3 | 1 |

Referring to Table 1, it could be confirmed that Examples 1 and 2 achieved low roll-off values, long life (long lifespan) and high efficiency at the same time (e.g., simultaneously or concurrently), when compared with Comparative Examples 1 to 3.

The polycyclic compound according to one or more embodiments of the present disclosure is used in an emission layer to contribute to the increase of the efficiency and life (e.g., lifespan) of an organic electroluminescence device. The polycyclic compound according to one or more embodiments of the present disclosure introduces a substituent having a large volume (at a position corresponding to $X_4$ in Formula 1), to increase the volume of a whole molecule and increase the distance from an adjacent molecule. Accordingly, it is believed, without being bound by any particular theory, that triplet-triplet annihilation (TTA) and singlet-triplet annihilation (STA) are suppressed or reduced, and the roll-off value is lowered when compared with the Comparative Examples. As a result, due to the low roll-off value, the long life (e.g., long lifespan) and high efficiency of an organic electroluminescence device may be achieved at the same time (or concurrently).

Although Comparative Examples 2 and 3 include a substituent at the $X_4$ position, the distance from an adjacent molecule is still insufficient, and the TTA and STA were not suppressed (or are not sufficiently reduced). Accordingly, it is believed that the life (e.g., lifespan) of the organic electroluminescence devices according to Comparative Examples was not increased.

The polycyclic compound according to one or more embodiments of the present disclosure is used in an emission layer and contributes to the increase of the efficiency and life of an organic electroluminescence device.

The organic electroluminescence device according to one or more embodiments of the present disclosure has excellent efficiency.

The polycyclic compound according to one or more embodiments of the present disclosure may be used as a material for an emission layer of an organic electroluminescence device, and by using thereof, the efficiency of the organic electroluminescence device may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed by the following claims and their equivalents.

What is claimed is:

1. An organic electroluminescence device, comprising:

a first electrode;

a hole transport region on the first electrode;

an emission layer on the hole transport region;

an electron transport region on the emission layer; and a second electrode on the electron transport region;

wherein the first electrode and the second electrode each independently comprise at least one selected from among Ag, Mg, Cu, Al, Pt, Pd, Au, Ni, Nd, Ir, Cr, Li, Ca, LiF/Ca, LiF/Al, Mo, Ti, In, Sn, Zn, compounds thereof, mixtures thereof, and oxides thereof, and the emission layer comprises a polycyclic compound represented Formula 1:

Formula 1

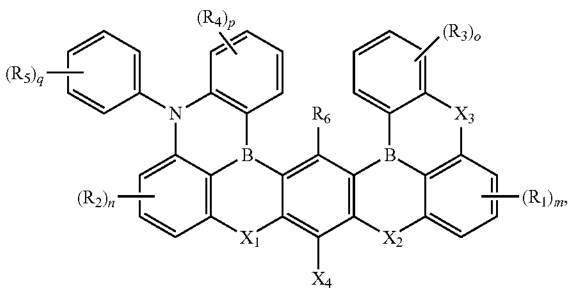

wherein in Formula 1, $X_1$ to $X_3$ are each independently O, S, Se or $NAr_1$, "m" and "n" are each independently an integer of 0 to 3, "o" and "p" are each independently an integer of 0 to 4, "q" is an integer of 0 to 5, $Ar_1$ is a substituted or unsubstituted aryl group of 6 to 30 ring-forming carbon atoms, or a substituted or unsubstituted heteroaryl group of 2 to 30 ring-forming carbon atoms, $R_1$ to $R_6$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $X_4$ is a substituted phenyl group, a substituted or unsubstituted aryl group of 7 to 30 ring-forming carbon atoms, or a substituted or unsubstituted heterocycle of 2 to 30 ring-forming carbon atoms, or is represented by the following Formula 2:

Formula 2

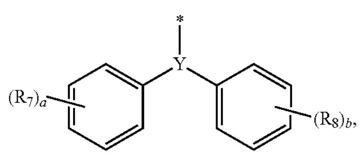

and wherein in Formula 2,

Y is B, P, P═O, P═S, or N, $R_7$ and $R_8$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "a" and "b" are each independently an integer of 0 to 5.

2. The organic electroluminescence device of claim 1, wherein the emission layer is to emit delayed fluorescence.

3. The organic electroluminescence device of claim 1, wherein the emission layer is a delayed fluorescence emission layer comprising a first compound and a second compound, and the first compound comprises the polycyclic compound.

4. The organic electroluminescence device of claim 1, wherein the emission layer is a thermally activated delayed fluorescence emission layer to emit blue light.

5. The organic electroluminescence device of claim 1, wherein Formula 1 is represented by any one selected from among Formula 3-1 to Formula 3-5:

Formula 3-1

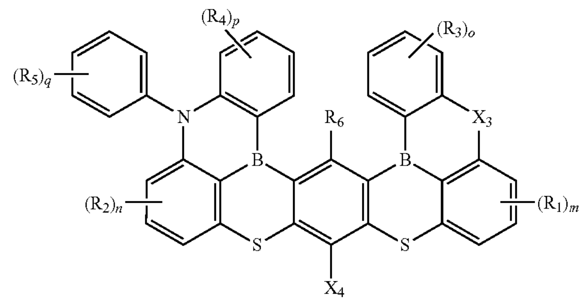

Formula 3-2

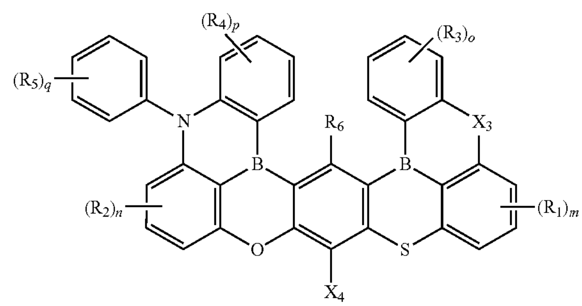

Formula 3-3

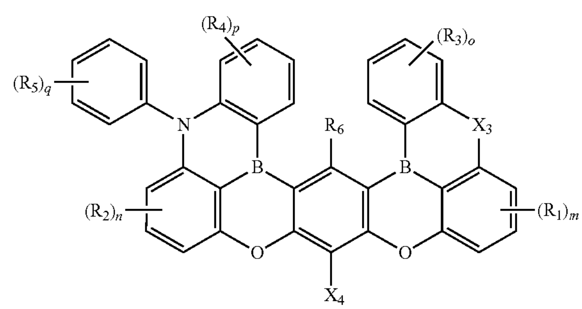

-continued

Formula 3-4

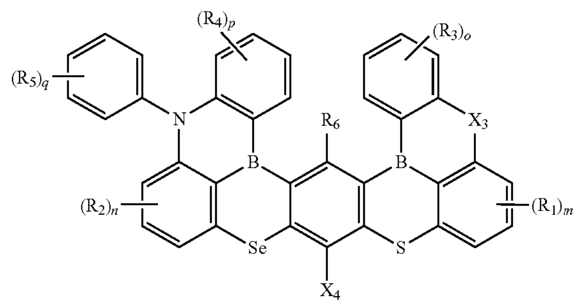

Formula 3-5

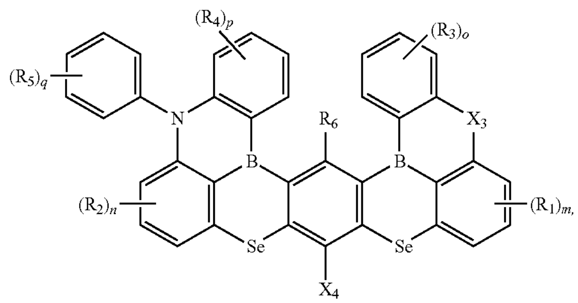

and wherein in Formula 3-1 to Formula 3-5, $X_3$, $X_4$, $R_1$ to $R_6$, and "m" to "q" are the same as defined in Formula 1.

6. The organic electroluminescence device of claim 1, wherein, in Formula 1, a sum of "m" and "n" is 1 or more, and at least one selected from among $R_1$ and $R_2$ is the substituted or unsubstituted amine group.

7. The organic electroluminescence device of claim 1, wherein Formula 1 is represented by Formula 4:

Formula 4

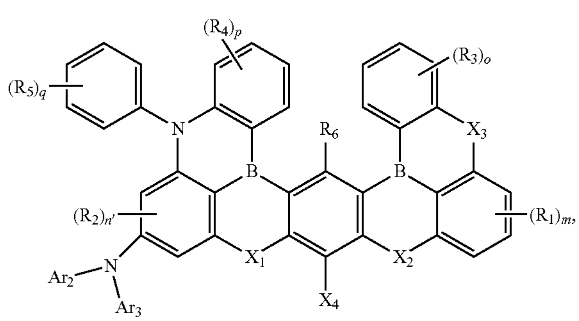

and wherein in Formula 4, n' is an integer of 0 to 2, $Ar_2$ and $Ar_3$ are each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $X_1$ to $X_4$, $R_1$ to $R_6$, "m" and "o" to "q" are the same as defined in Formula 1.

8. The organic electroluminescence device of claim 7, wherein Formula 4 is represented by Formula 5:

Formula 5

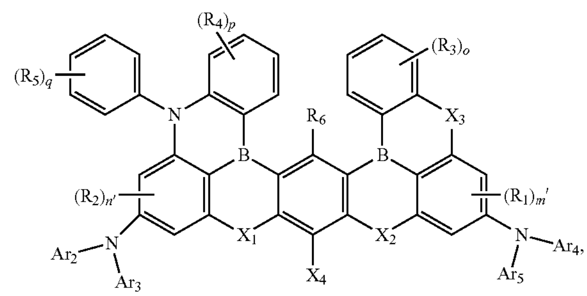

and wherein in Formula 5, m' is an integer of 0 to 2, $Ar_4$ and $Ar_5$ are each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $X_1$ to $X_4$, $R_1$ to $R_6$, $Ar_2$, $Ar_3$, n', and "o" to "q" are the same as defined in Formulae 1 and 4.

9. The organic electroluminescence device of claim 8, wherein $Ar_2$ to $Ar_5$ are each independently represented by Formula 6:

Formula 6

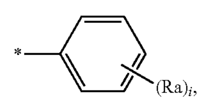

and wherein in Formula 6,

Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "i" is an integer of 0 to 5.

10. The organic electroluminescence device of claim 1, wherein Formula 1 is represented by Formula 7:

Formula 7

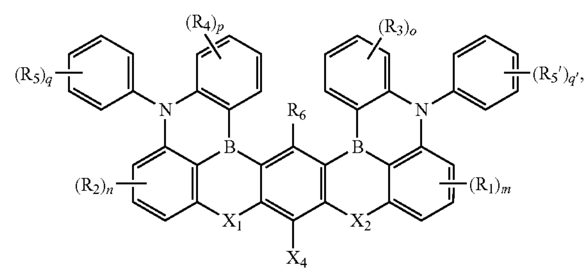

and wherein in Formula 7, q' is an integer of 0 to 5, $R_5$' is a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and $X_1$, $X_2$, $X_4$, $R_1$ to $R_6$, and "m" to "q" are the same as defined in Formula 1.

11. The organic electroluminescence device of claim 8, wherein Formula 5 is represented by Formula 8:

Formula 8

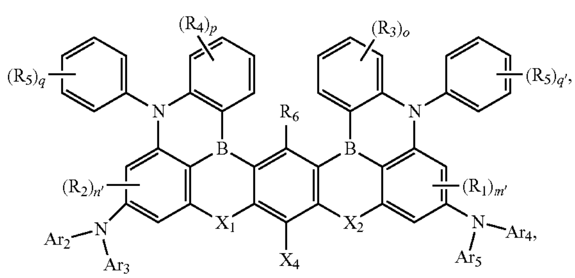

and wherein in Formula 8, q' is an integer of 0 to 5, $R_5$' is a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and $X_1$, $X_2$, $X_4$, $R_1$ to $R_6$, $Ar_2$ to $Ar_5$, m', n', and "o" to "q" are the same as defined in Formulae 1, 4, and 5.

12. The organic electroluminescence device of claim 1, wherein Formula 2 is represented by any one selected from among Formulae 2-1, 2-2, and 2-4:

2-1

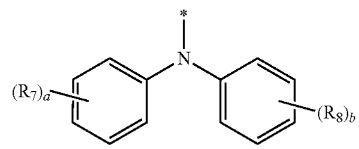

2-2

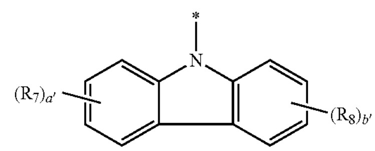

2-4

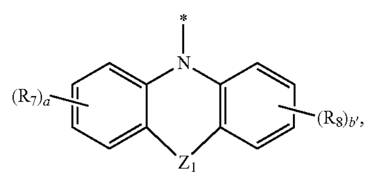

and wherein in Formulae 2-1, 2-2, and 2-4, $Z_1$ is O, S, or $NAr_6$, $Ar_6$ is a phenyl group, a' and b' are each independently an integer of 0 to 4, and $R_7$, $R_8$, "a" and "b" are the same as defined in Formula 2.

13. The organic electroluminescence device of claim 1, wherein the polycyclic compound represented by Formula 1 is at least one selected from among compounds represented in Compound Group 1:

Compound Group 1

1

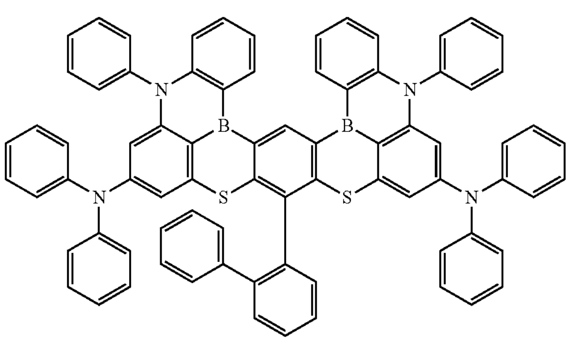

2

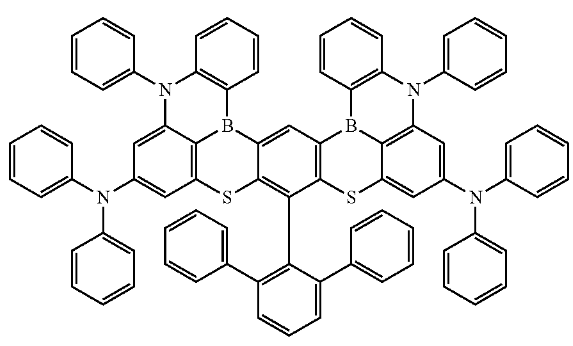

-continued
3
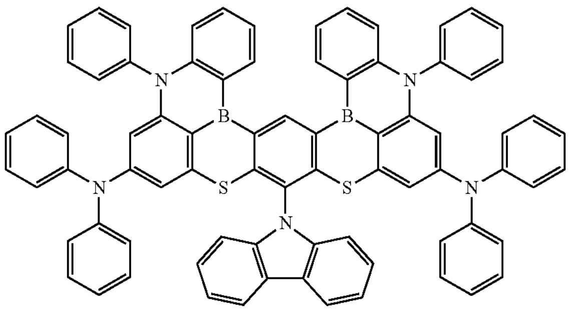
4
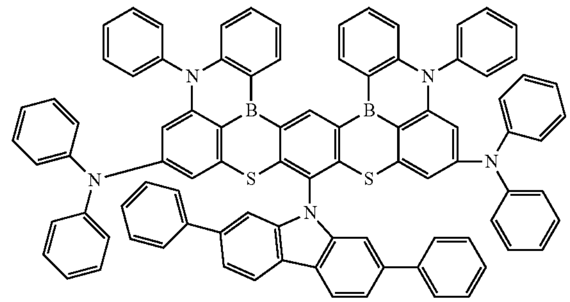
5
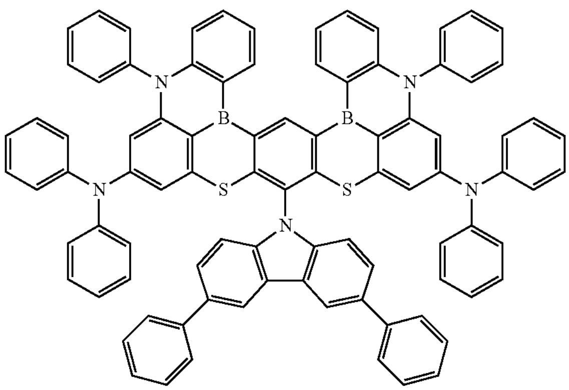
6
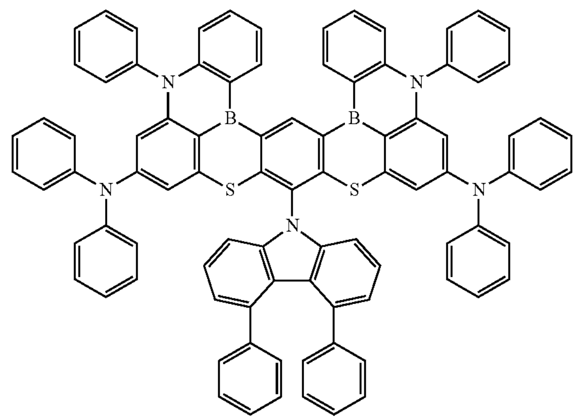
7
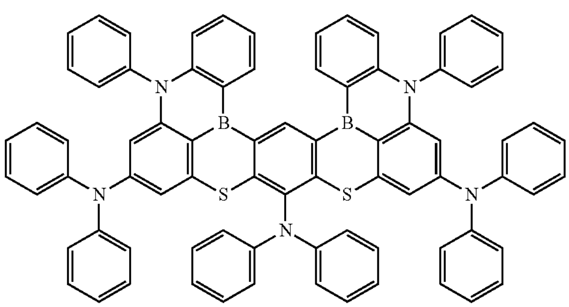
8
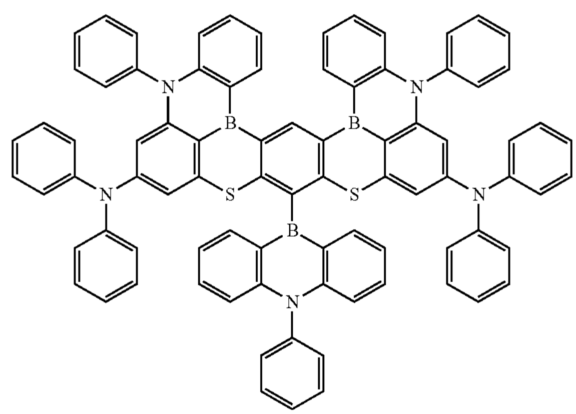
9
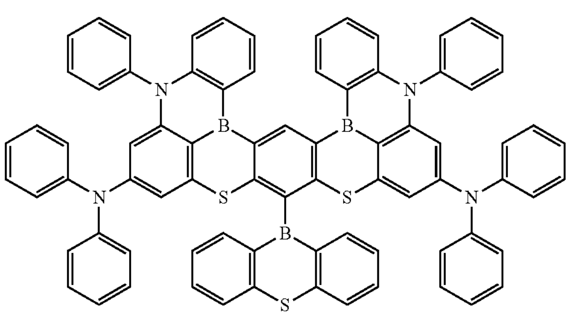
10
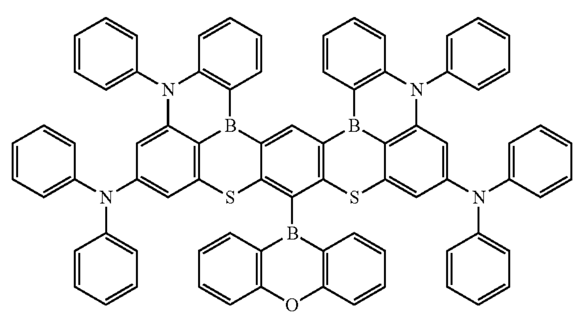

-continued
11
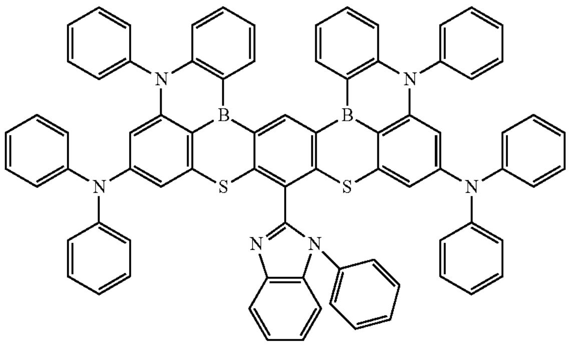
12
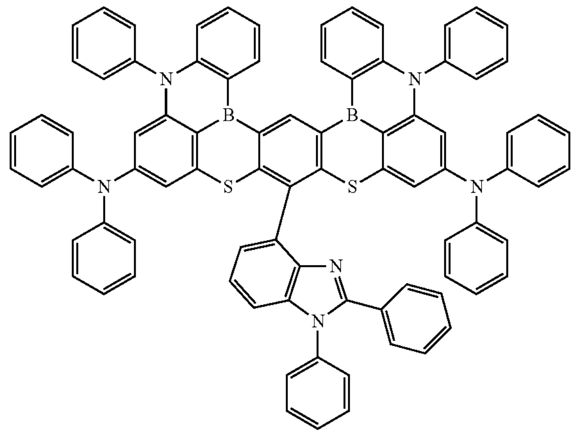
13
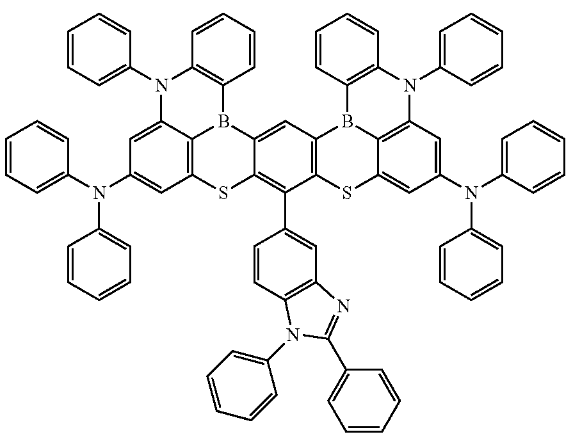
14
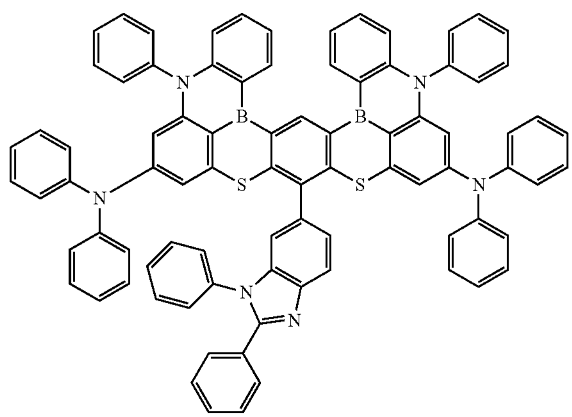
15
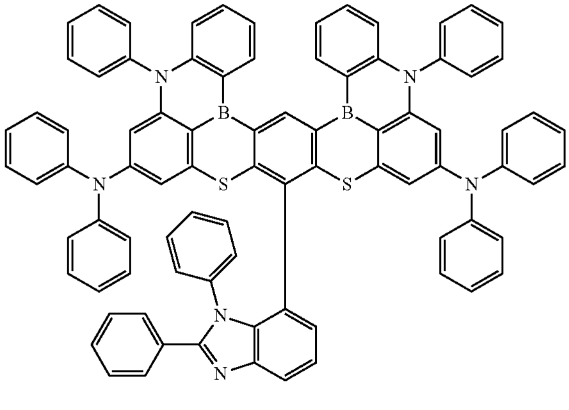
16
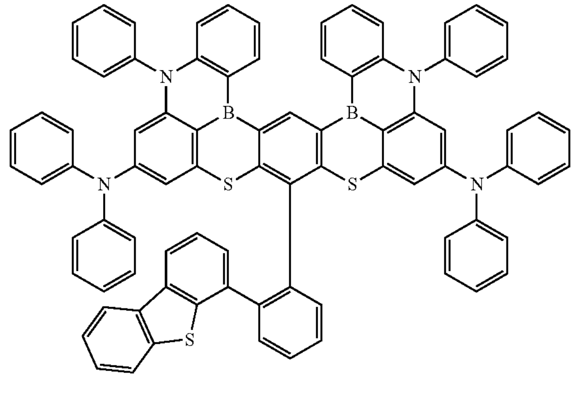

-continued
17
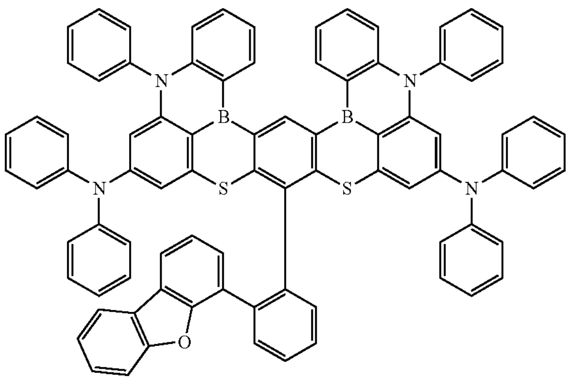
18
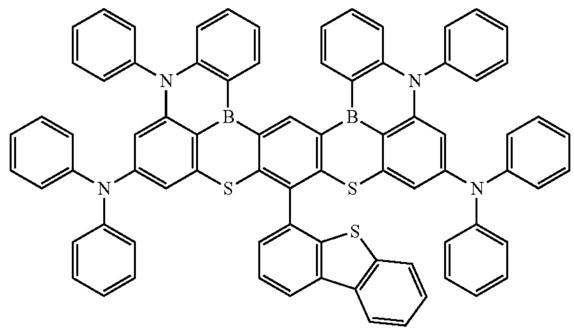
19
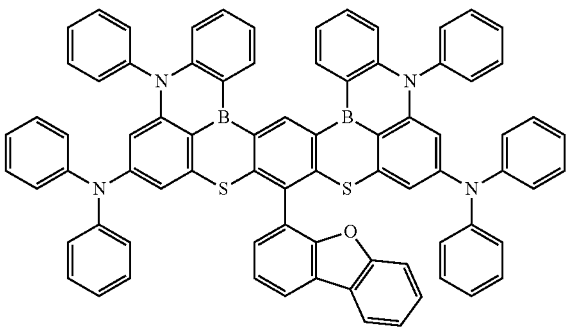
20
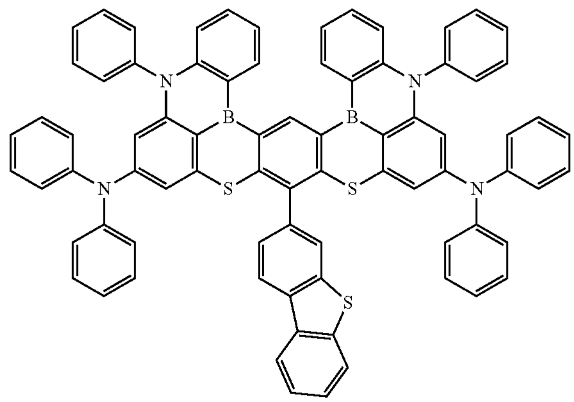
21
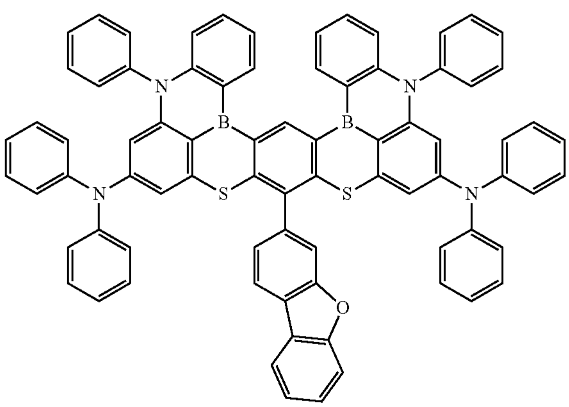
22
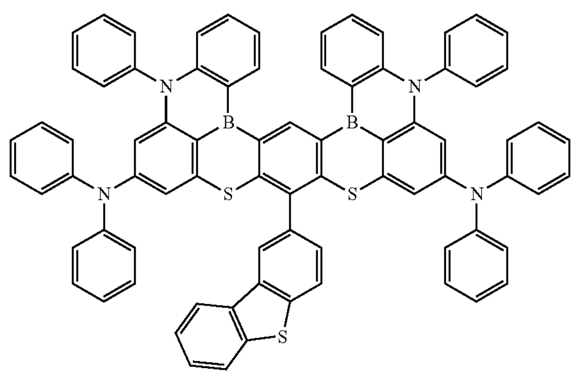
23
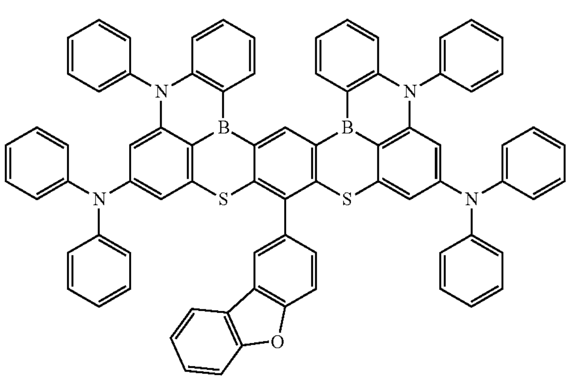
24
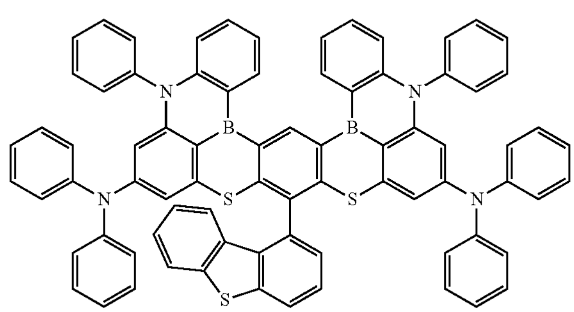

-continued
25
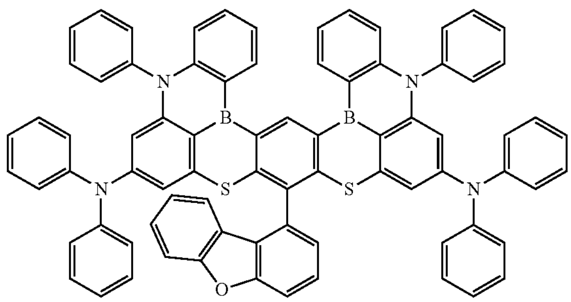
26
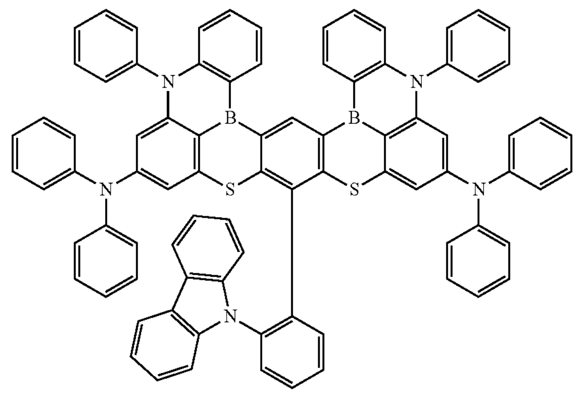
27
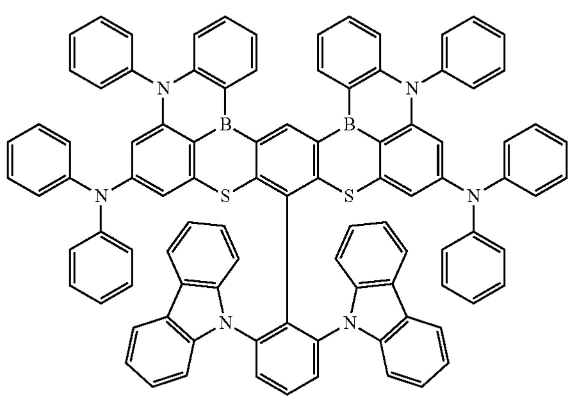
28
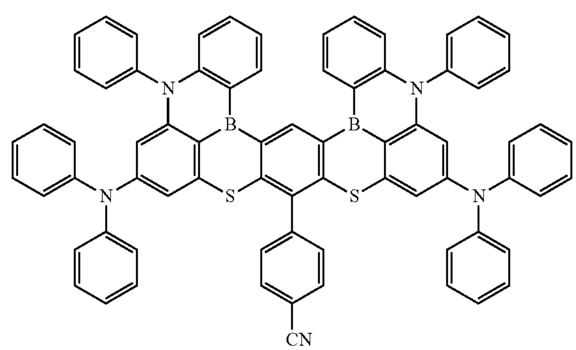
29
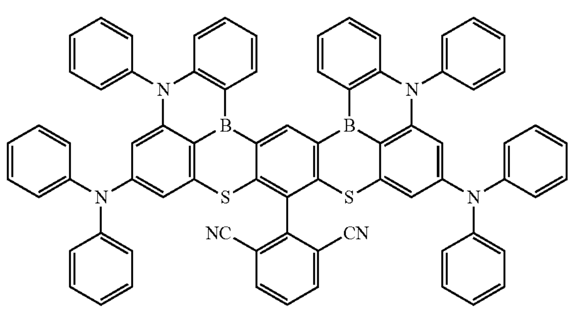
30
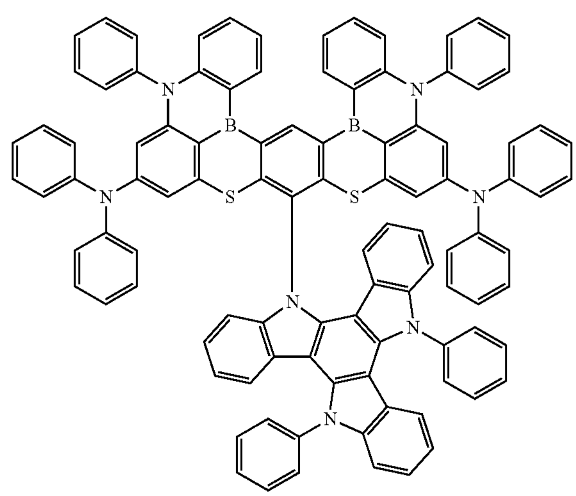

-continued
31
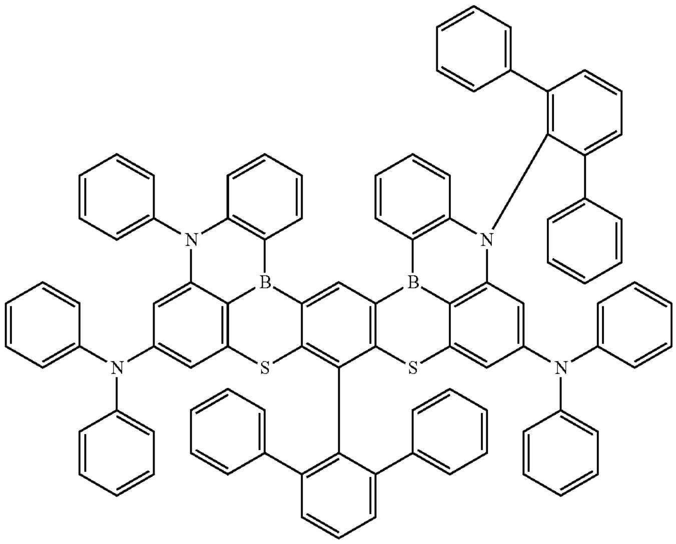
32
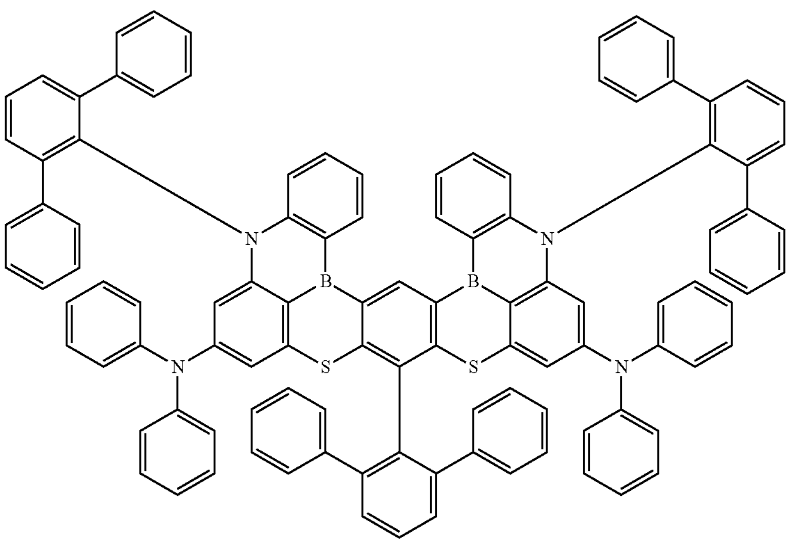
33
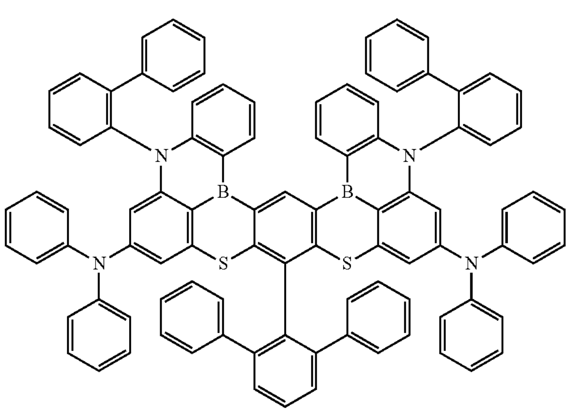
34
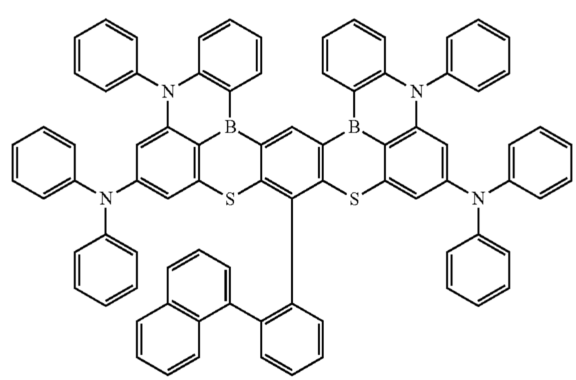

-continued
35
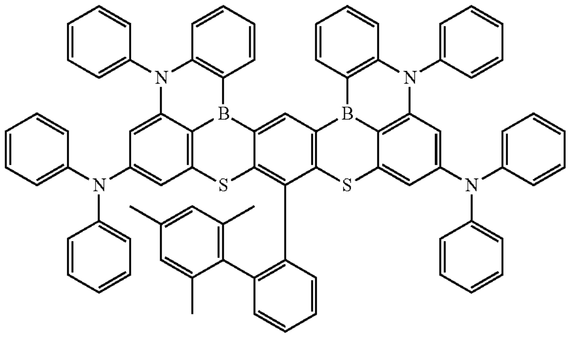
36
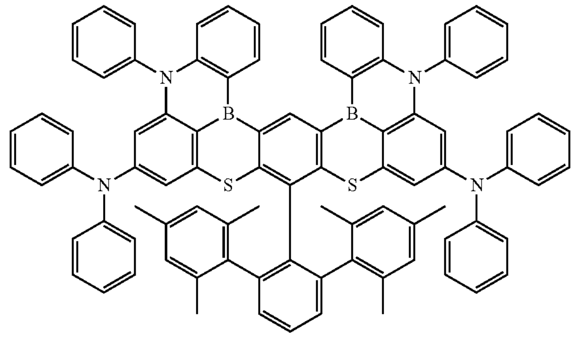
37
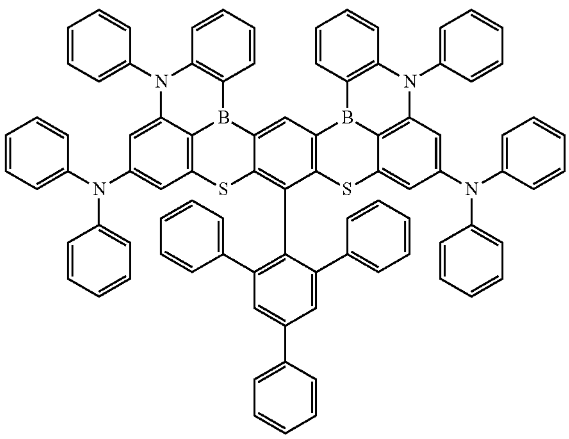
38
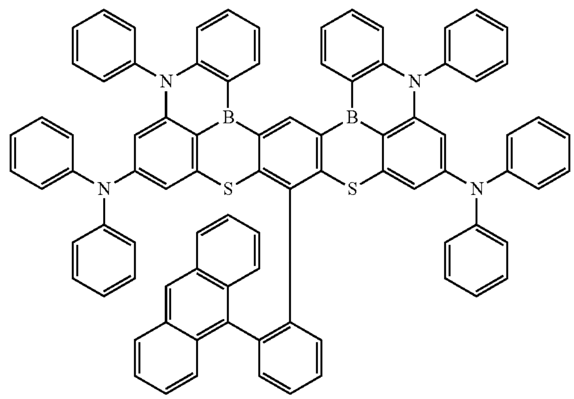
39
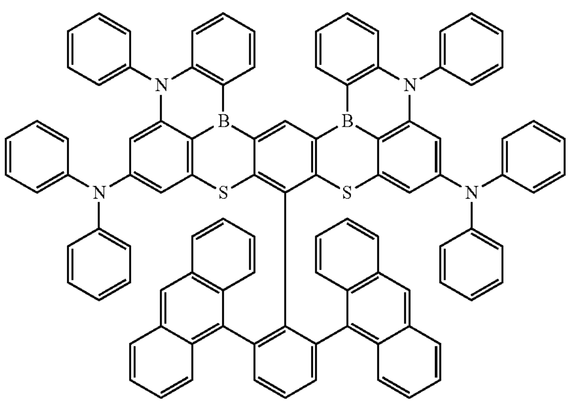
40
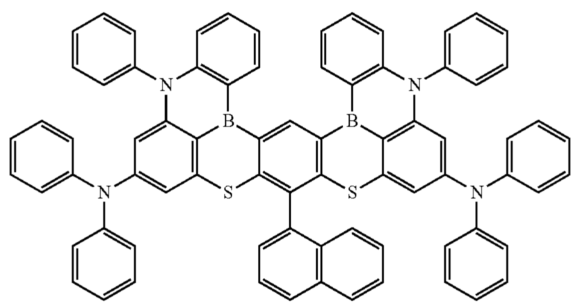
41
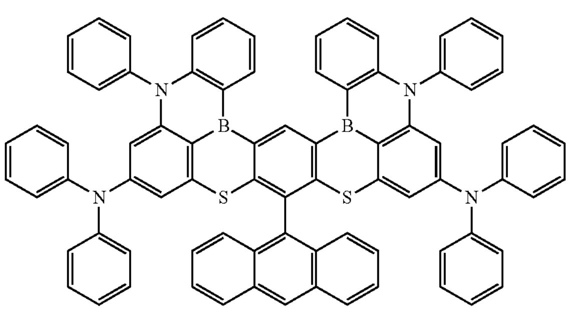
42
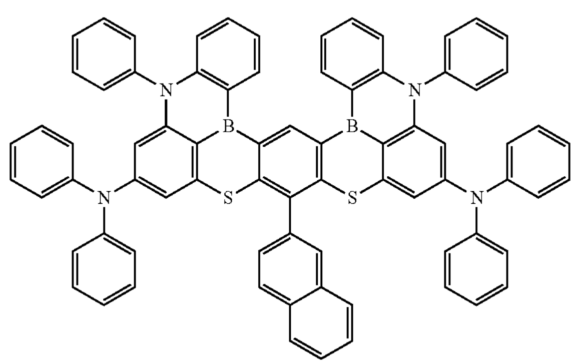

-continued
43
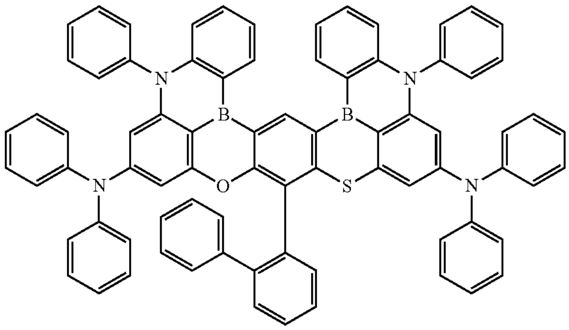
44
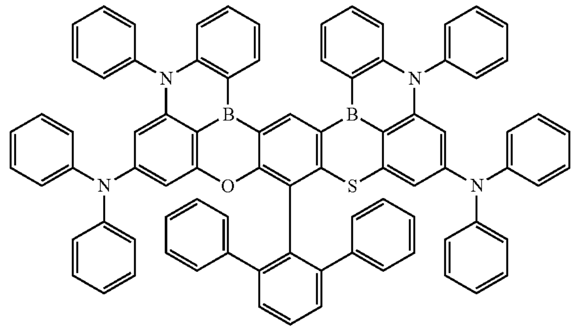
45
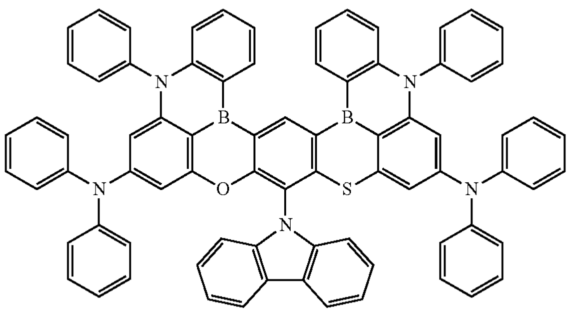
46
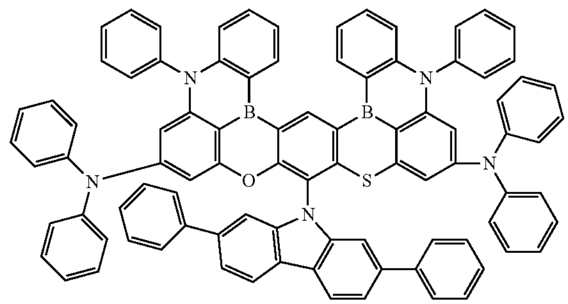
47
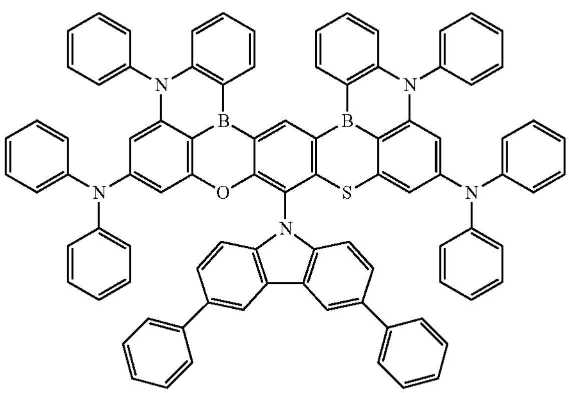
48
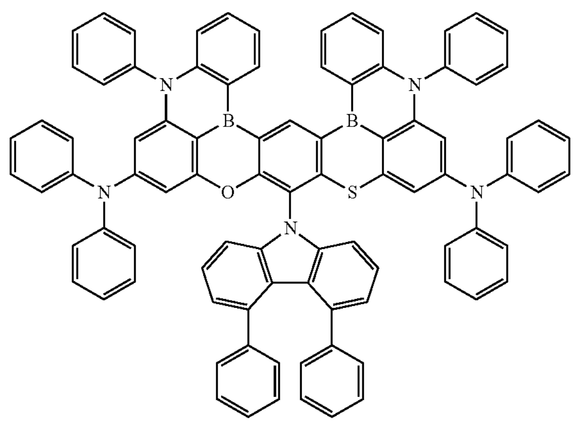
49
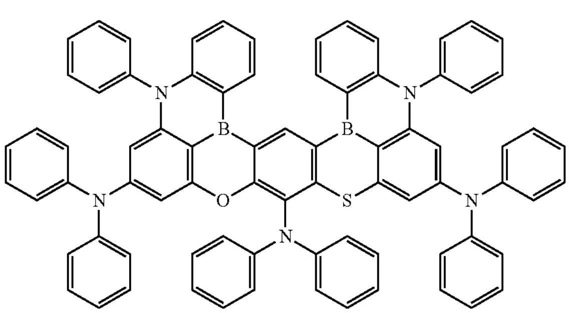
50
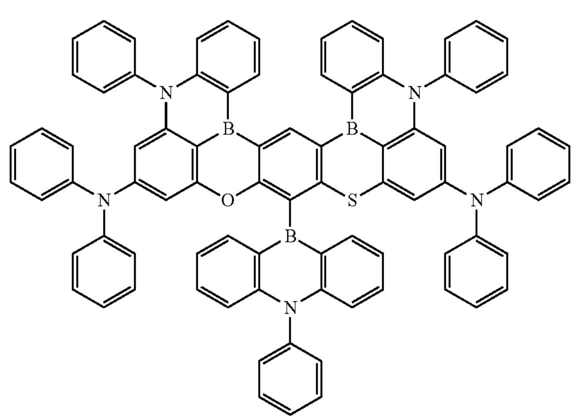

-continued
51
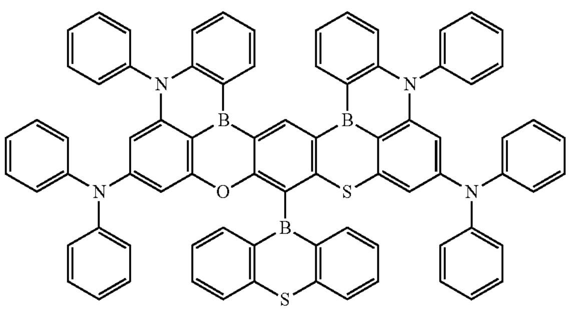
52
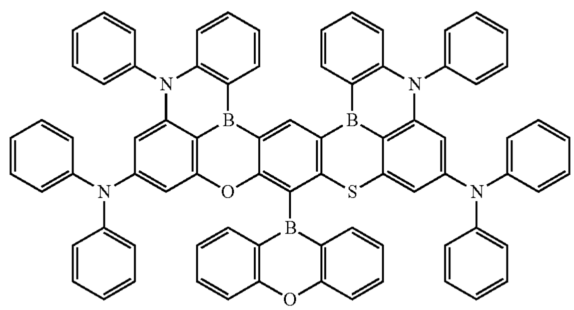
53
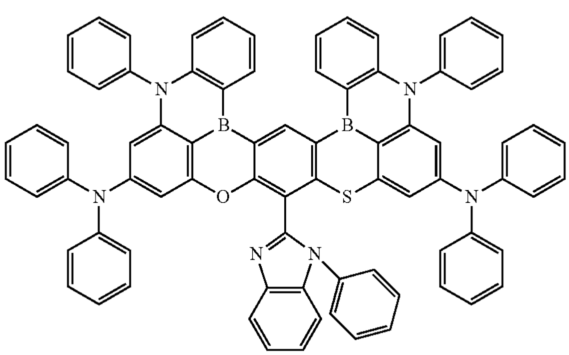
54
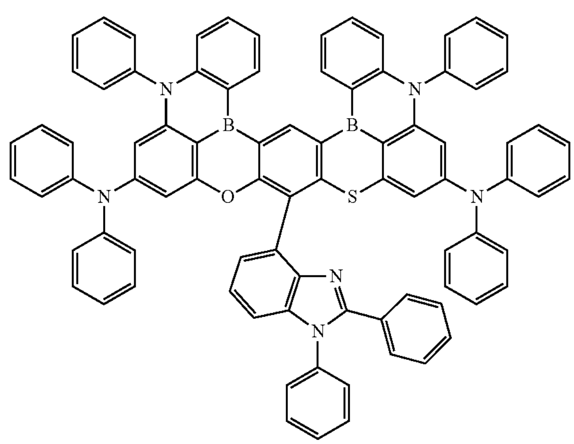
55
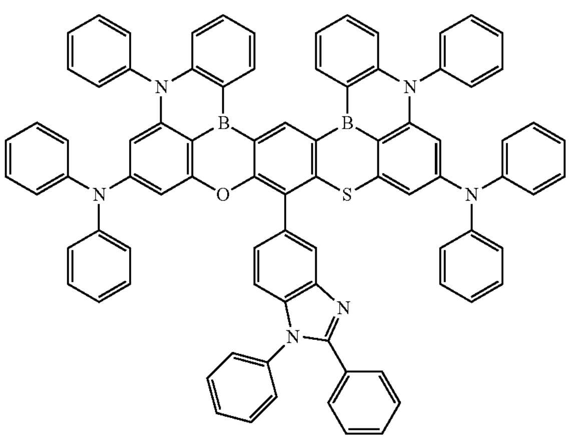
56
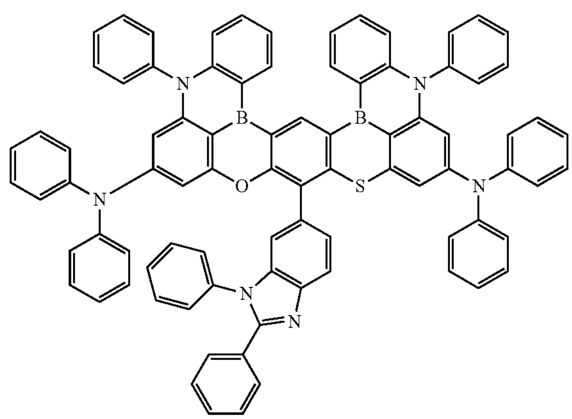
57
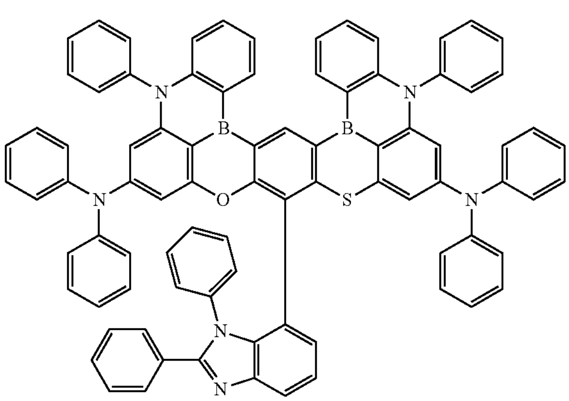
58
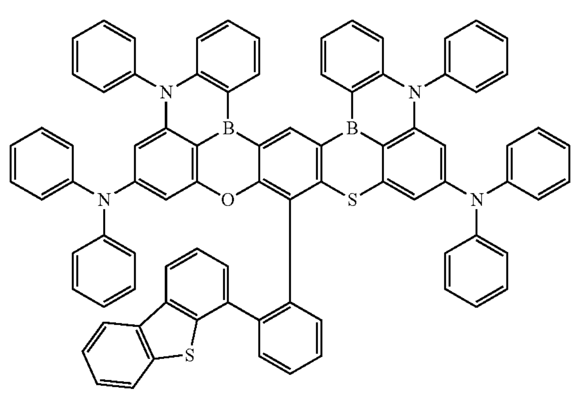

-continued
59
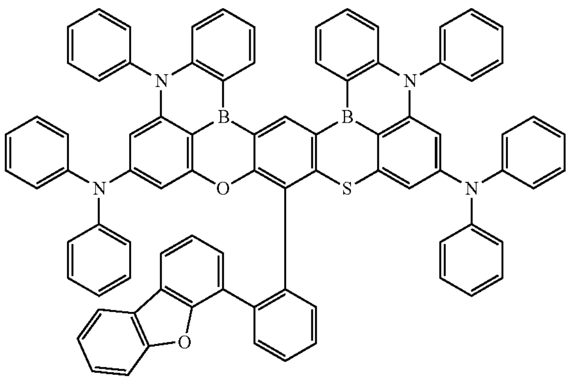
60
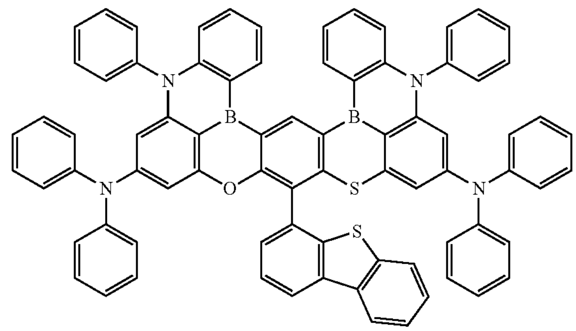
61
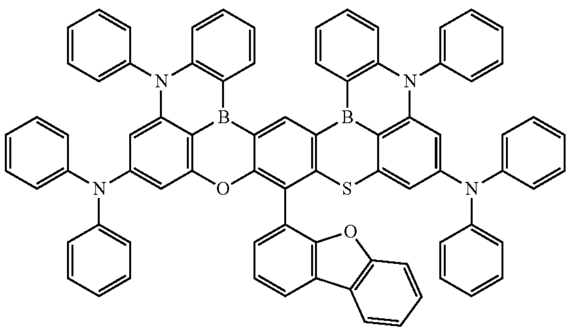
62
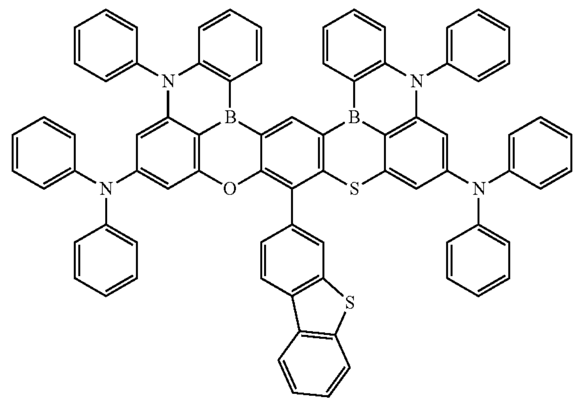
63
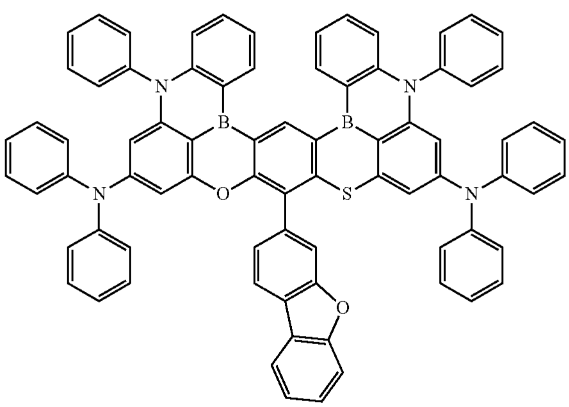
64
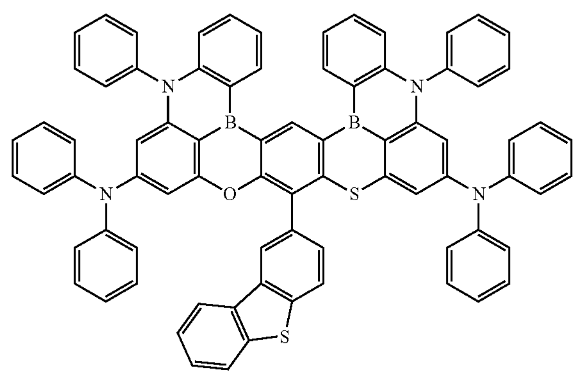
65
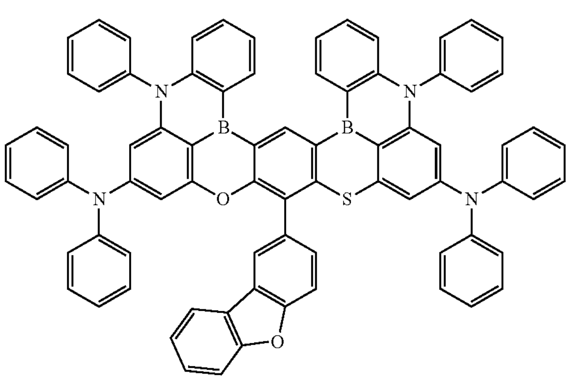
66
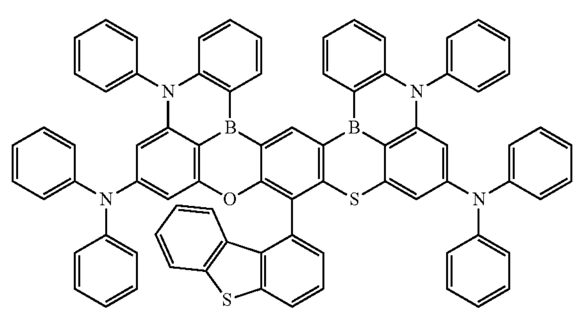

-continued
67
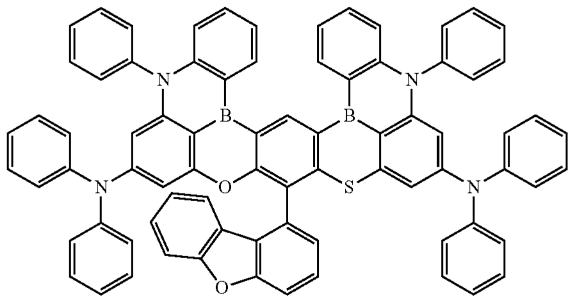
68
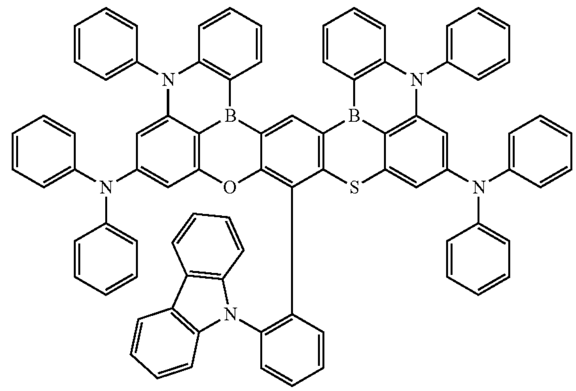
69
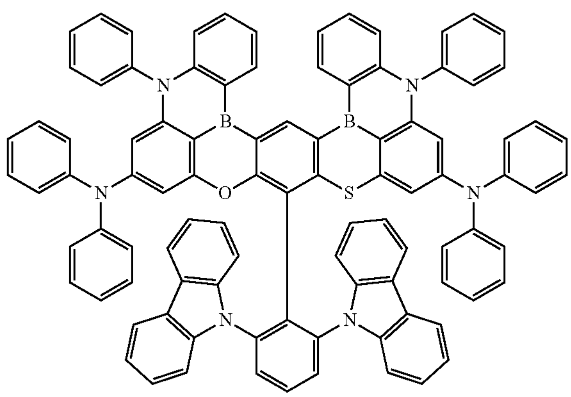
70
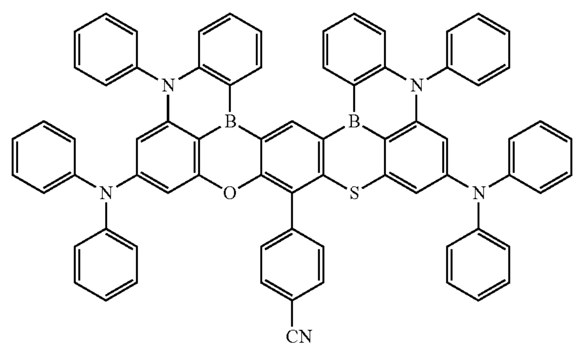
71
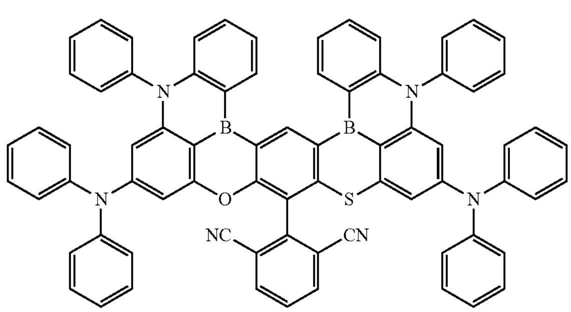
72
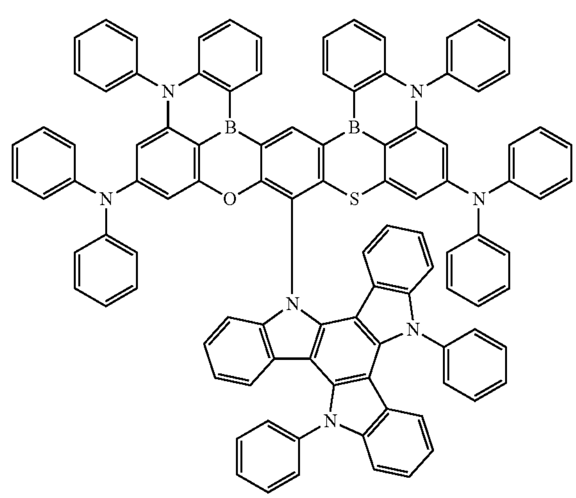

-continued
73
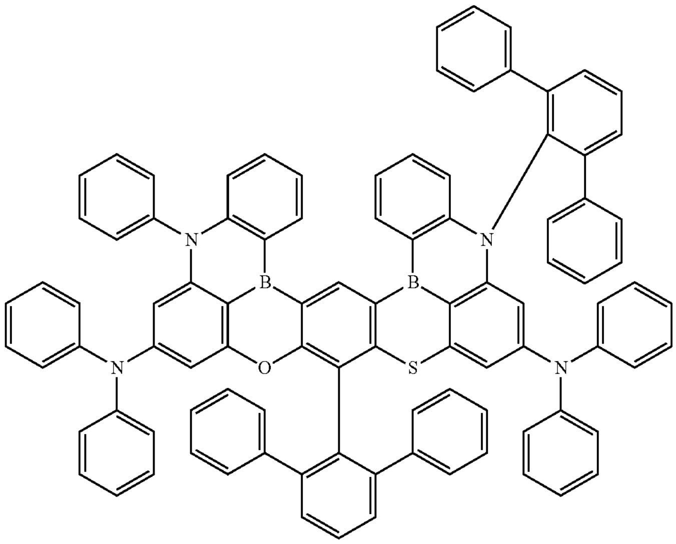
74
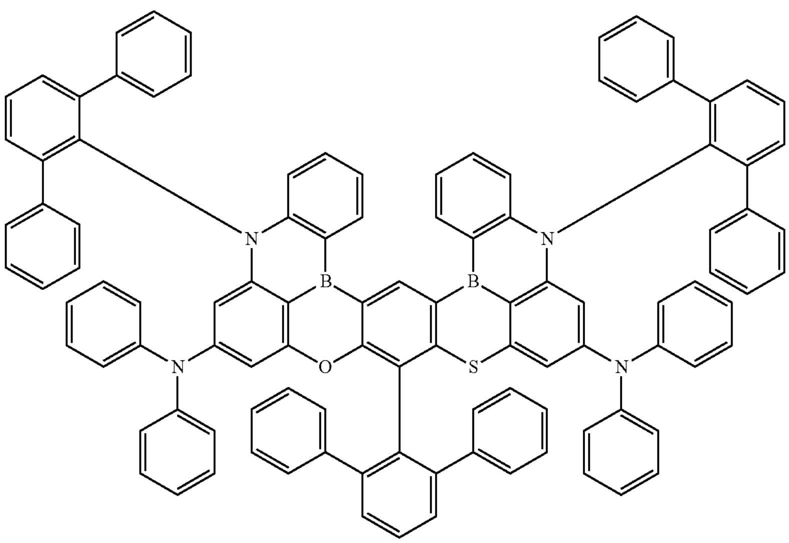
75
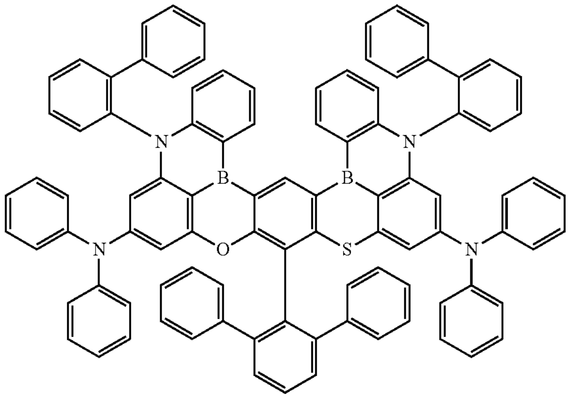
76
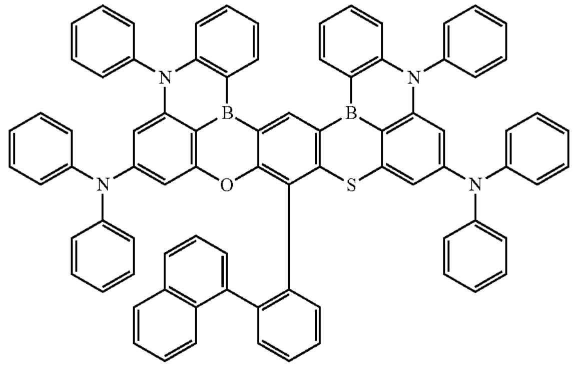

-continued
77
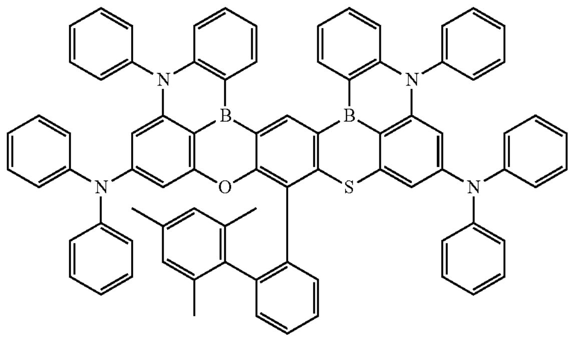
78
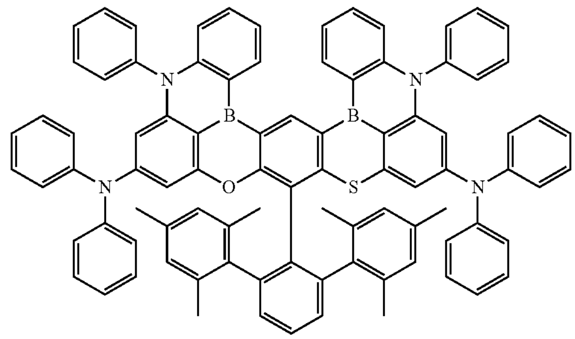
79
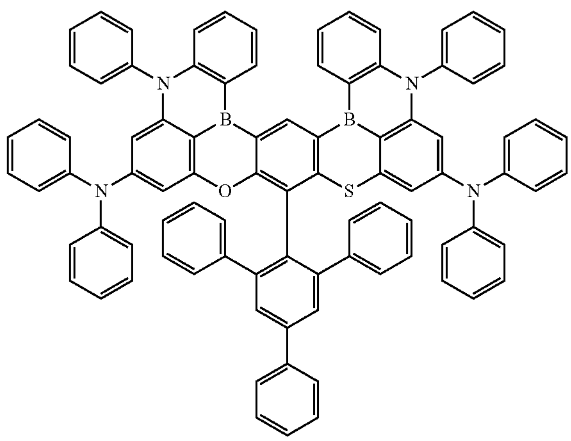
80
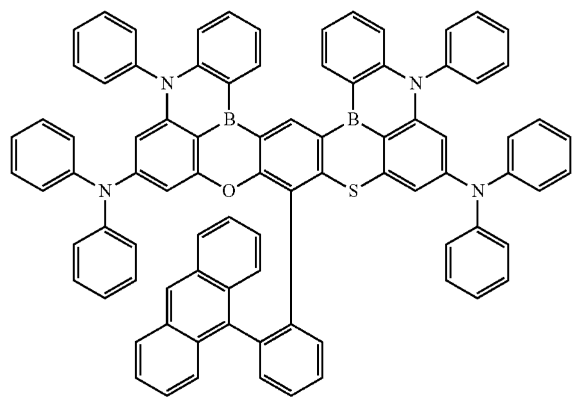
81
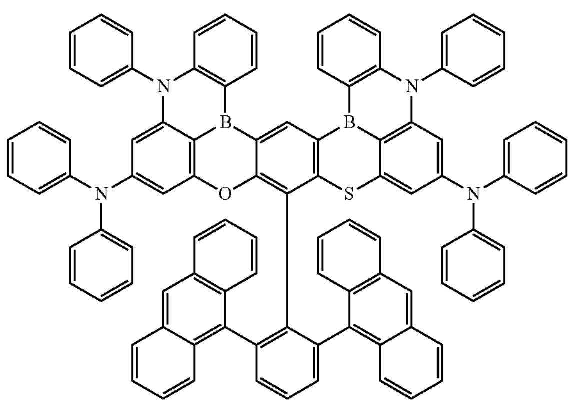
81-1
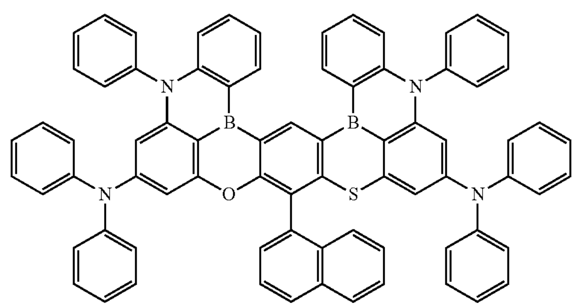
82
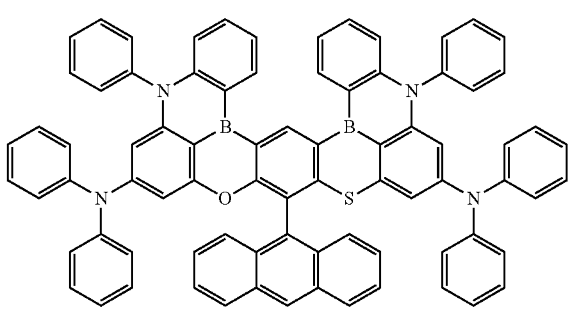
83
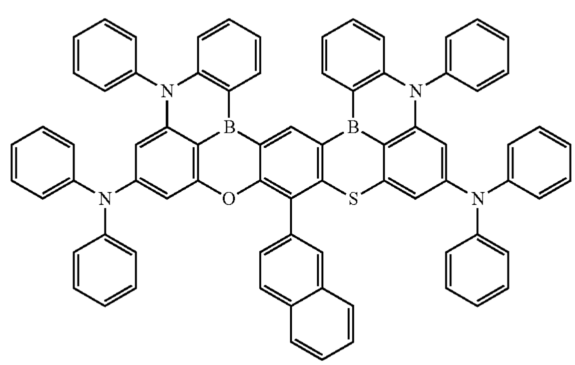

-continued
84
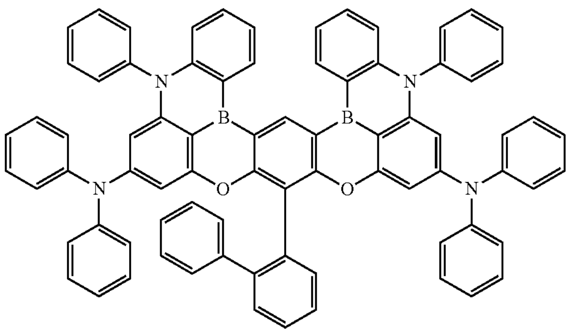
85
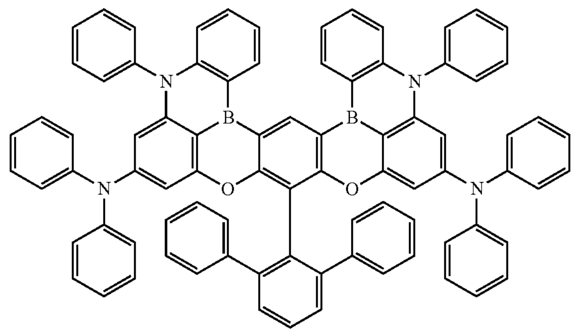
86
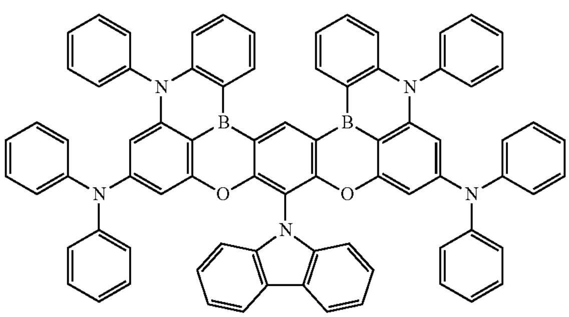
87
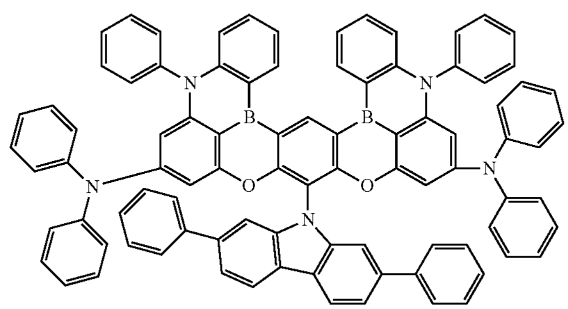
88
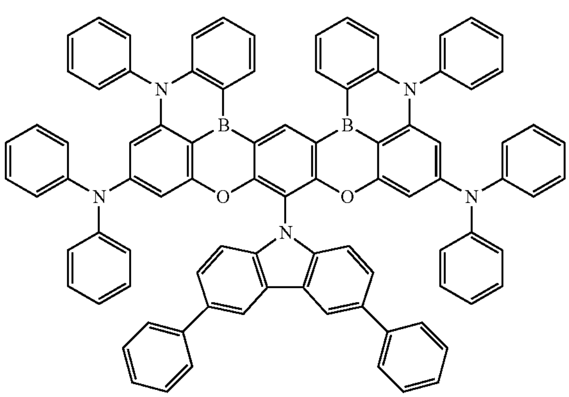
89
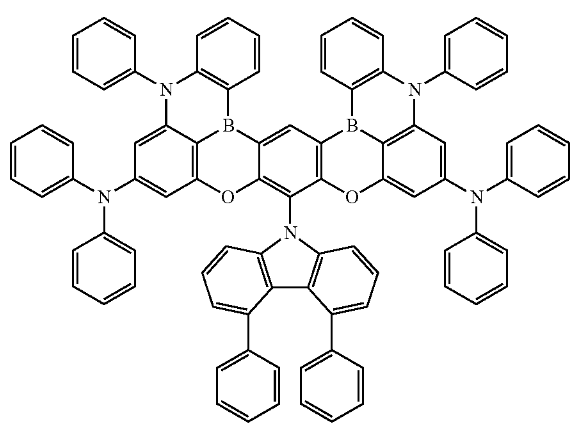
90
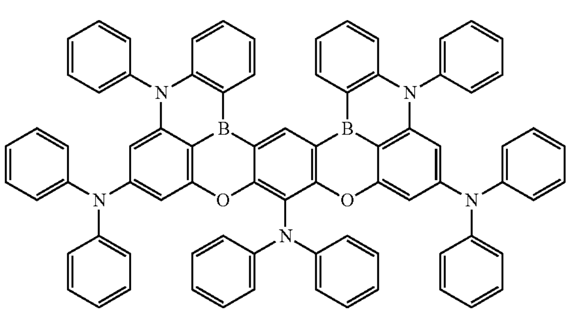
91
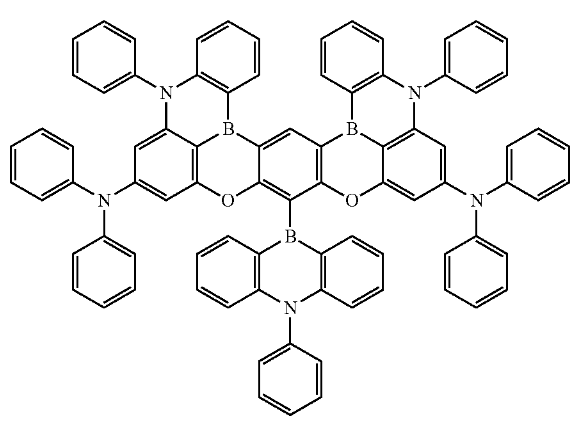

-continued
92
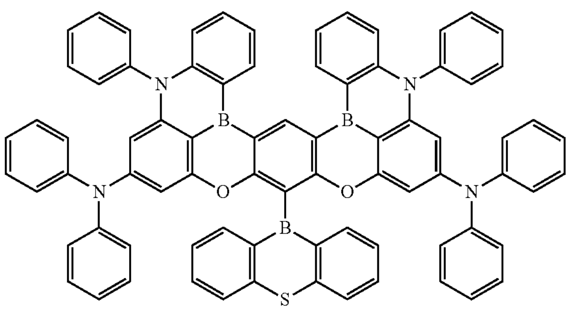
93
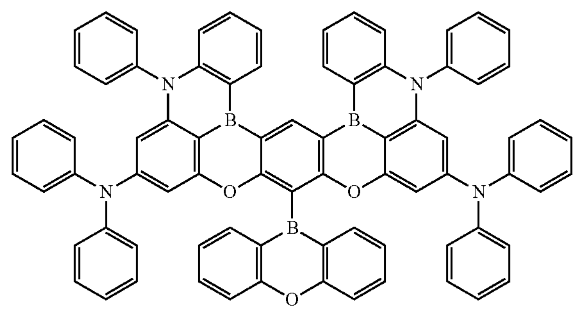
94
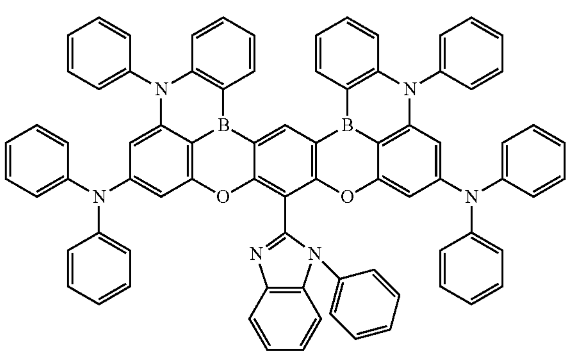
95
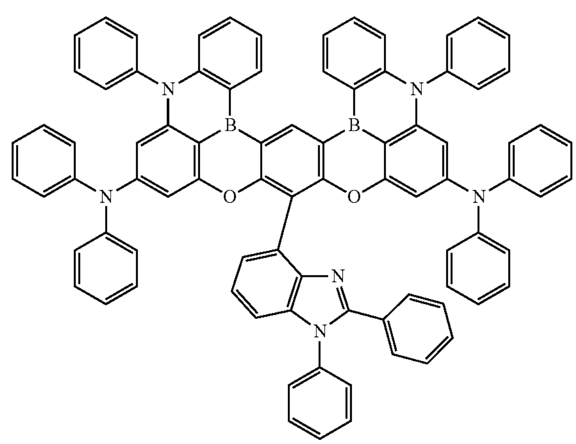
96
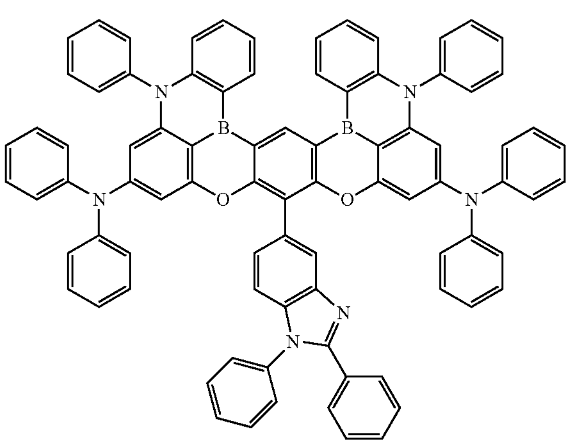
97
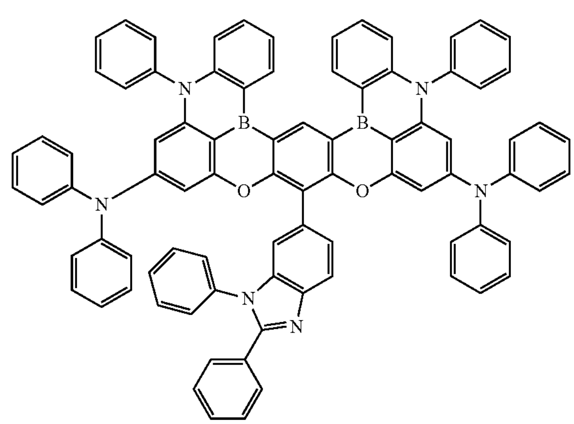
98
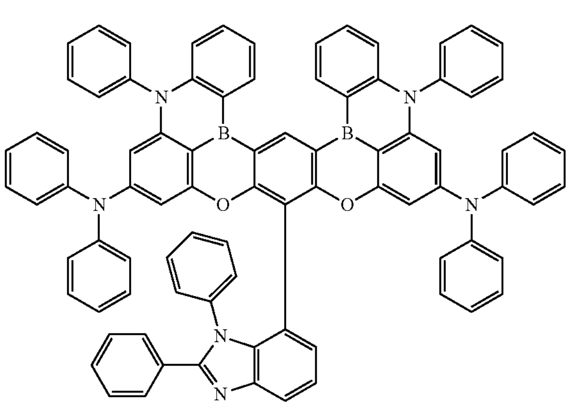
99
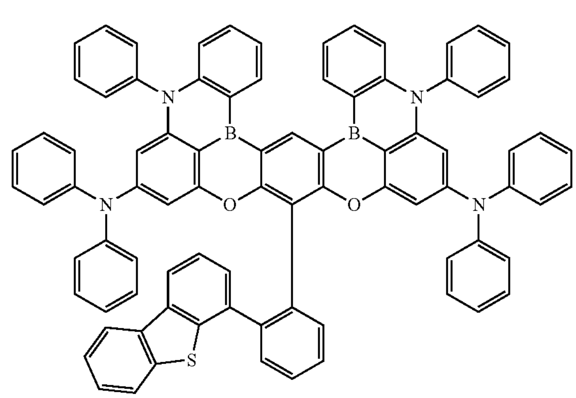

-continued
100
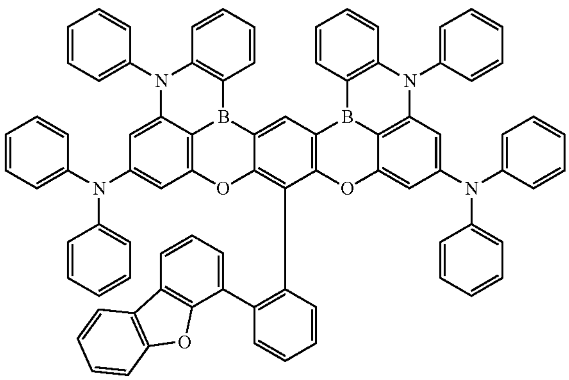
101
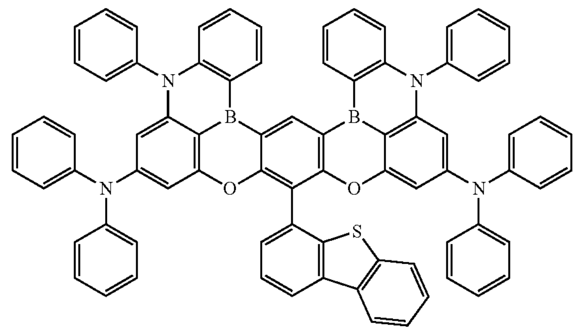
102
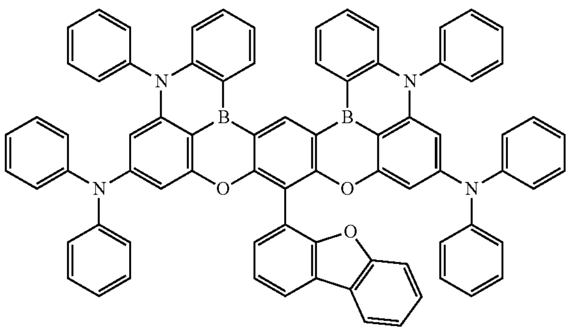
103
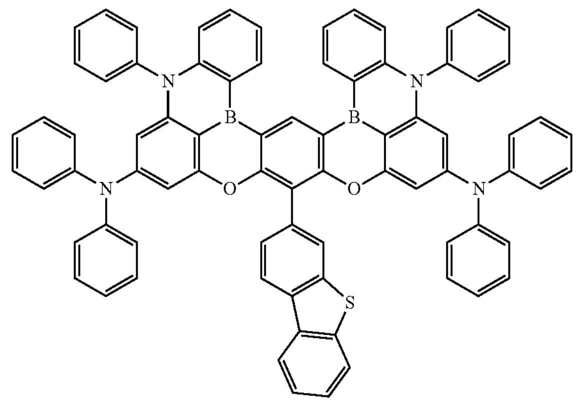
104
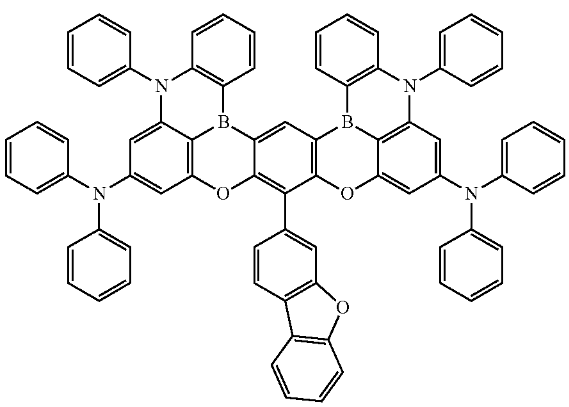
105
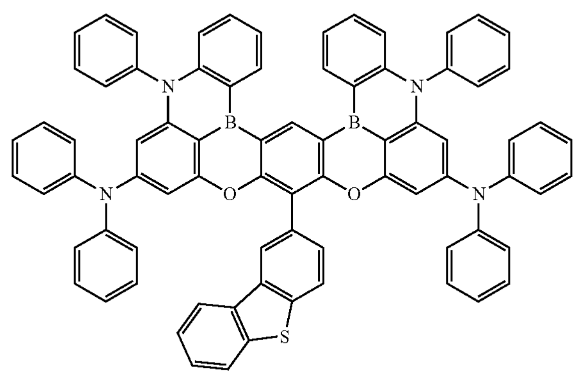
106
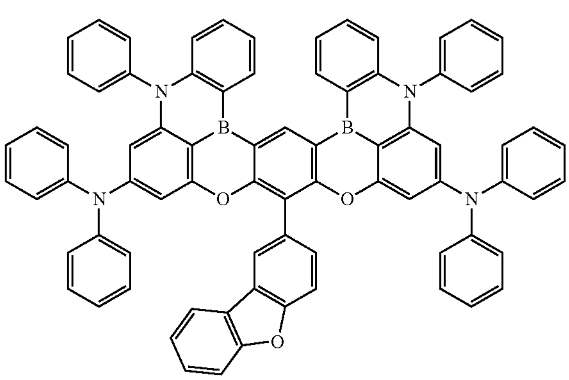
107
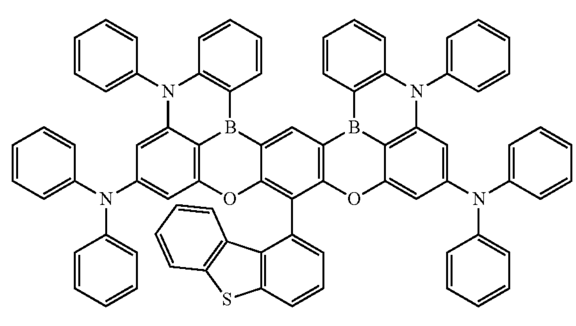

-continued
108
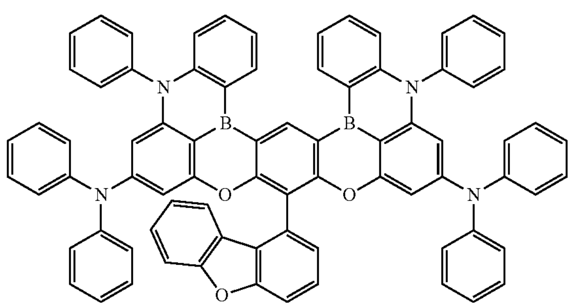
109
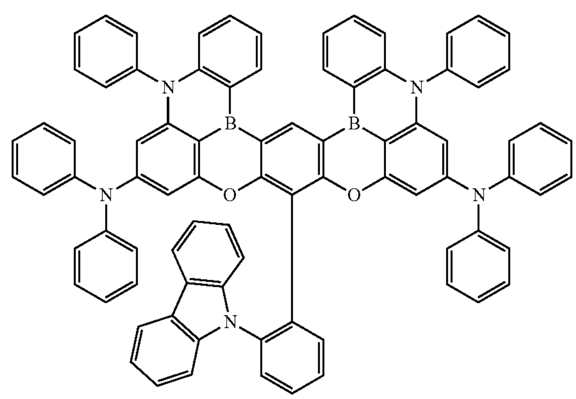
110
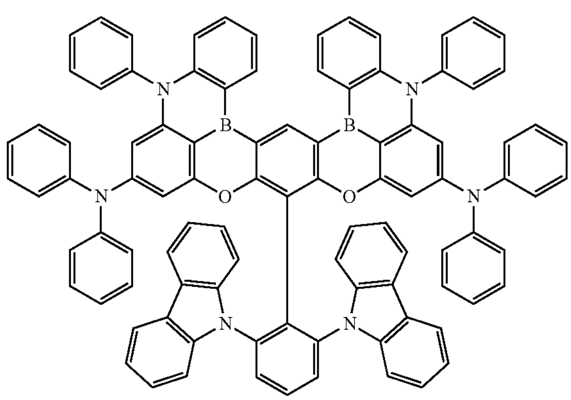
111
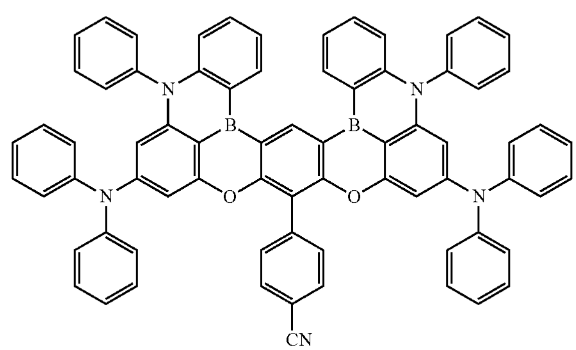
112
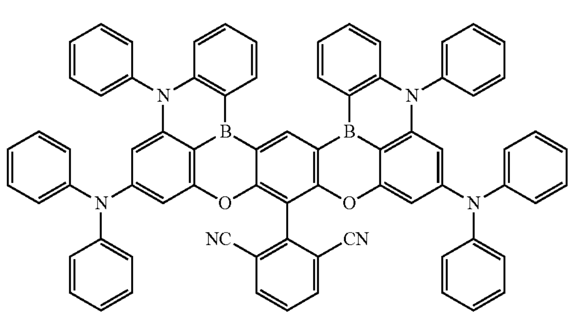
113
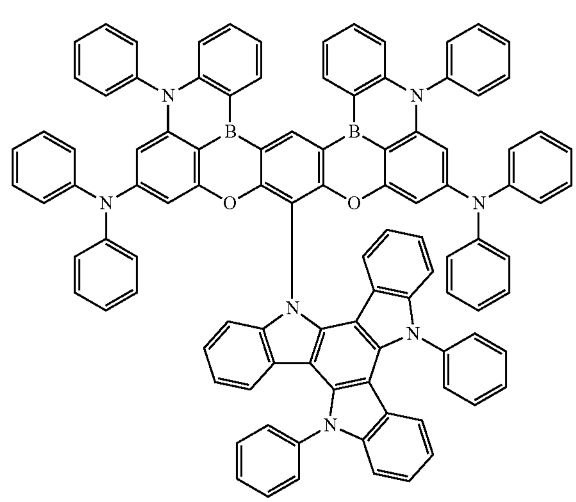

-continued
114
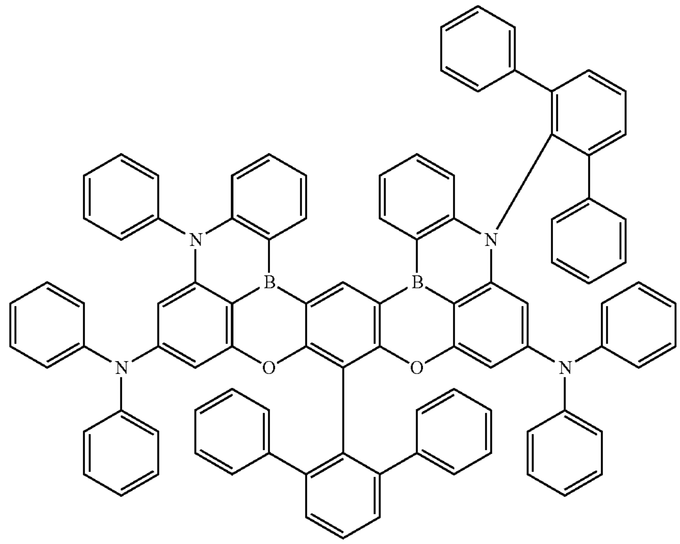
115
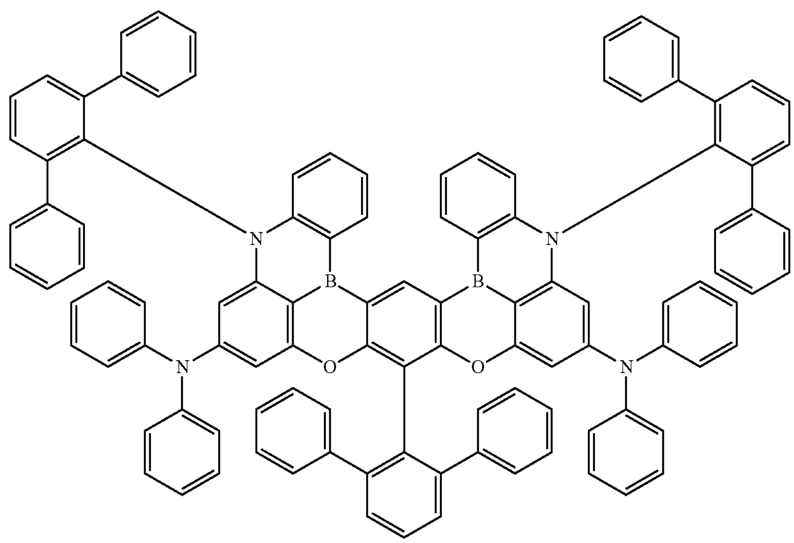
116
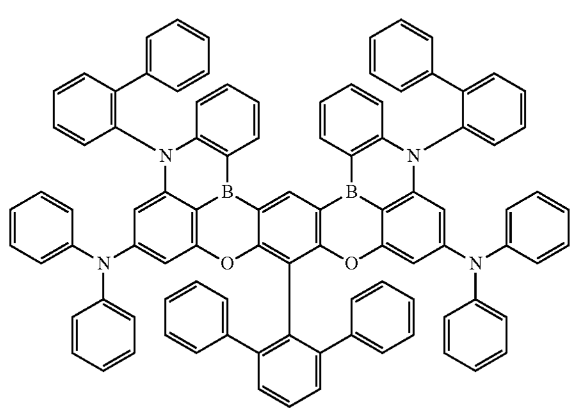
117
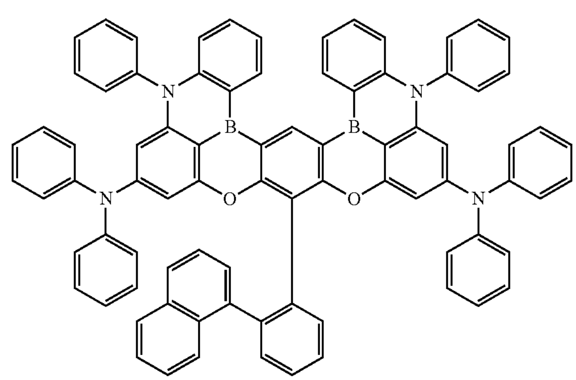

-continued
118
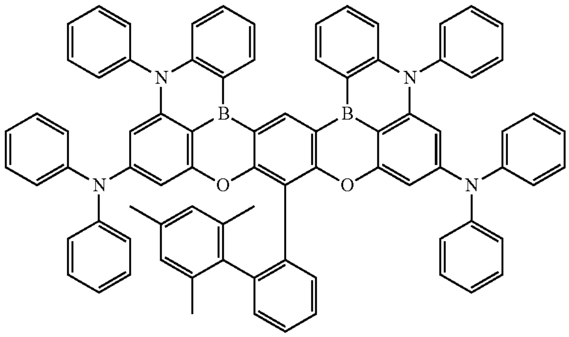
119
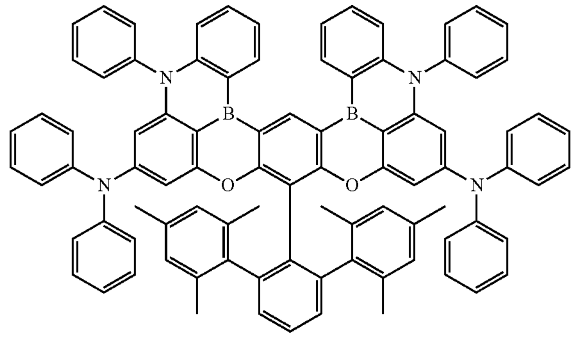
120
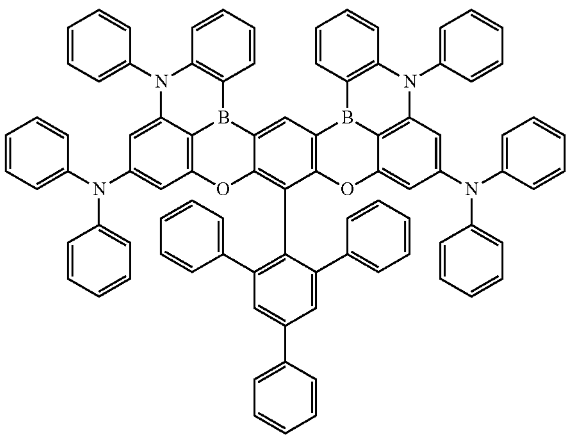
121
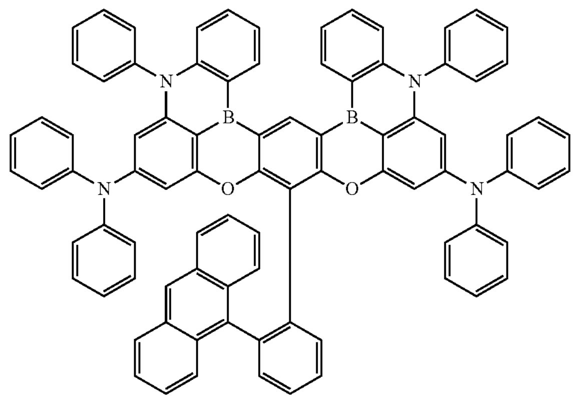
122
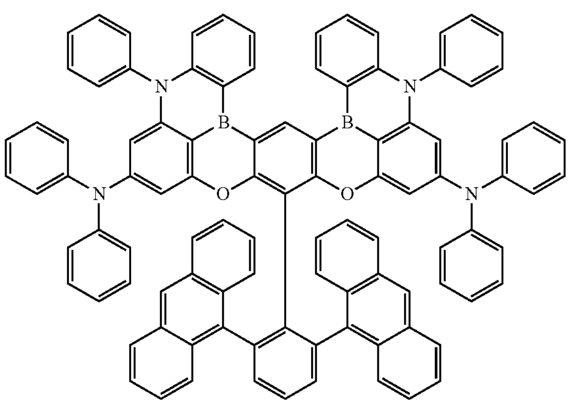
123
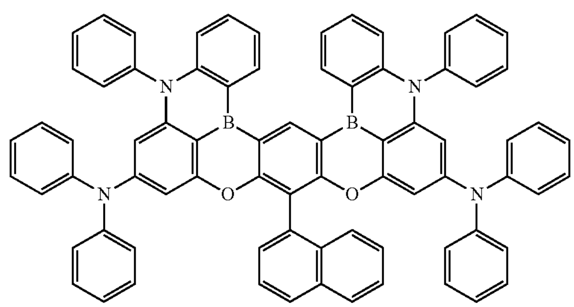
124
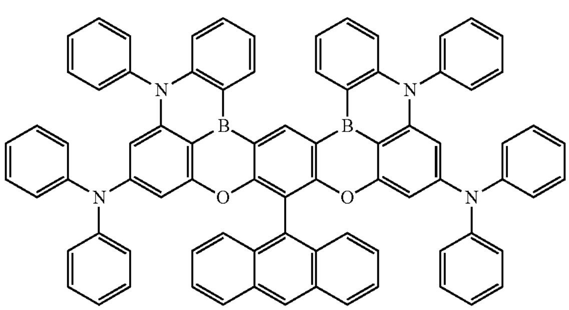
125
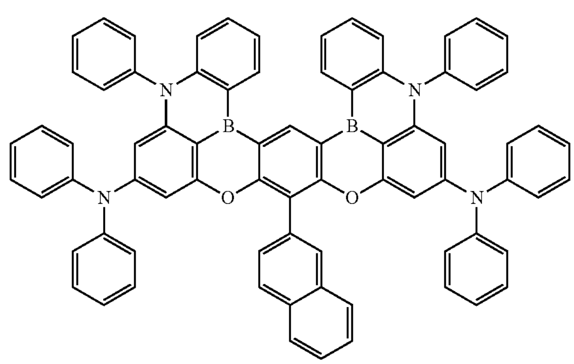

-continued
126
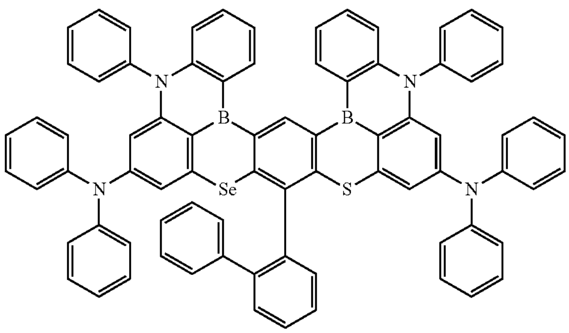
127
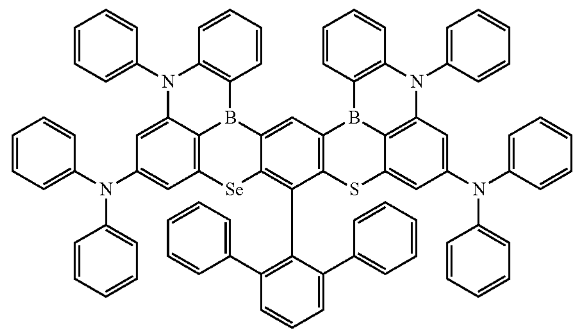
128
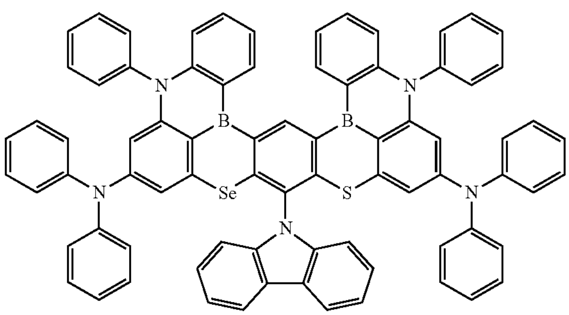
129
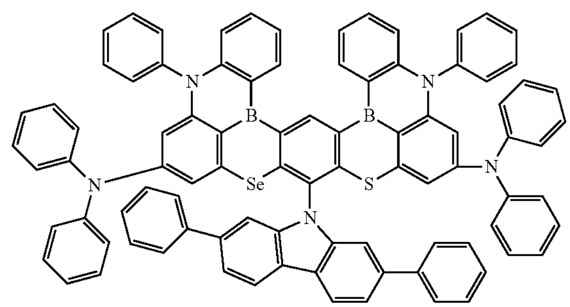
130
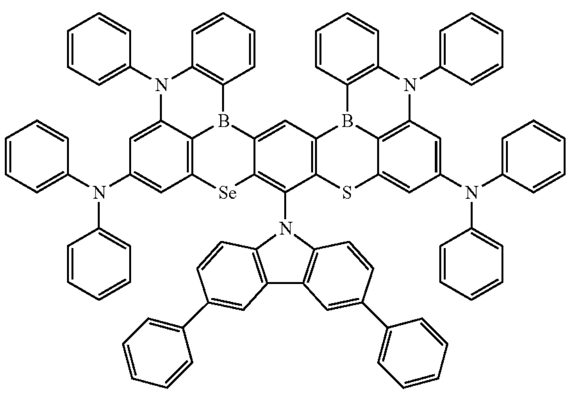
131
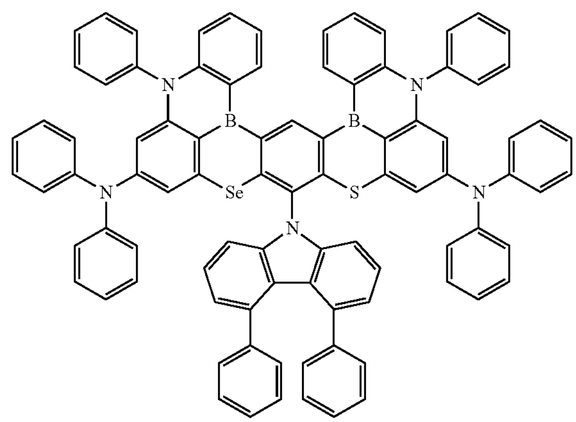
132
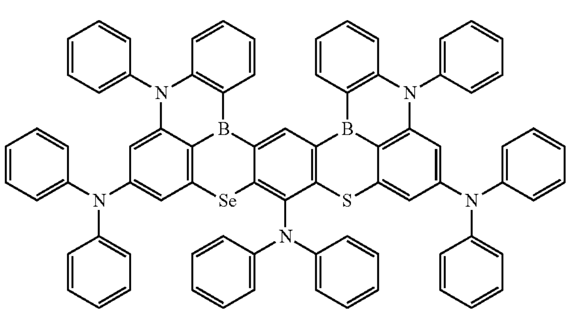
133
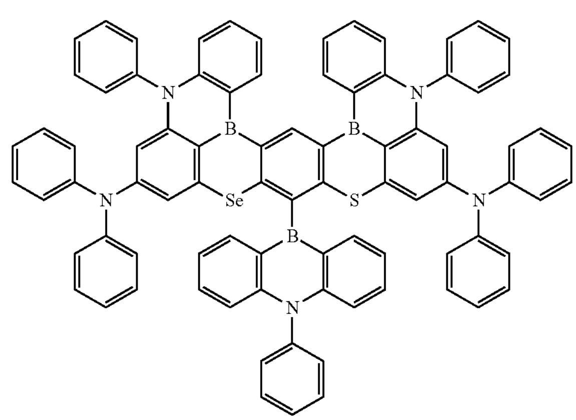

-continued
134
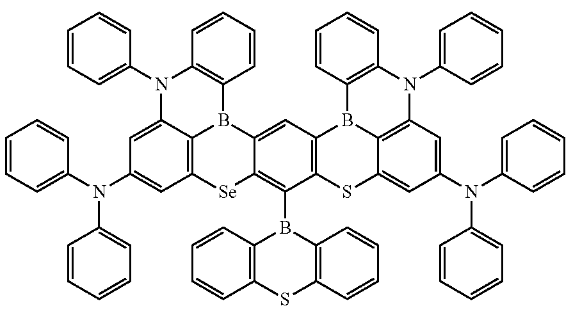
135
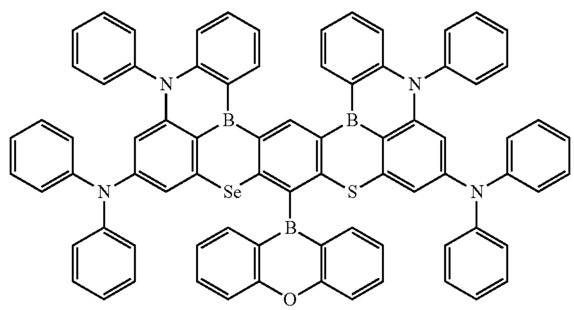
136
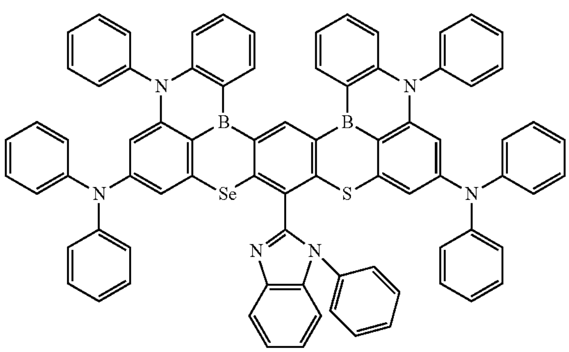
137
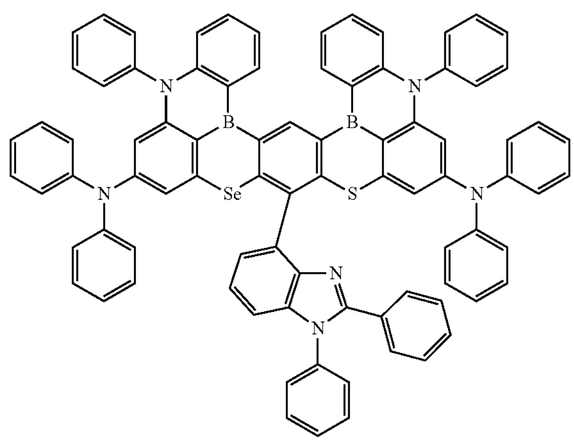
138
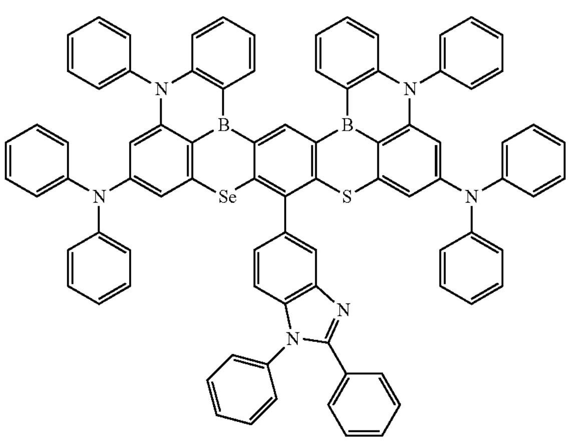
139
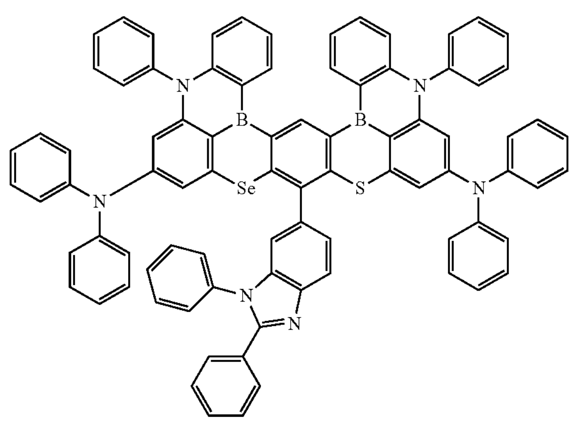
140
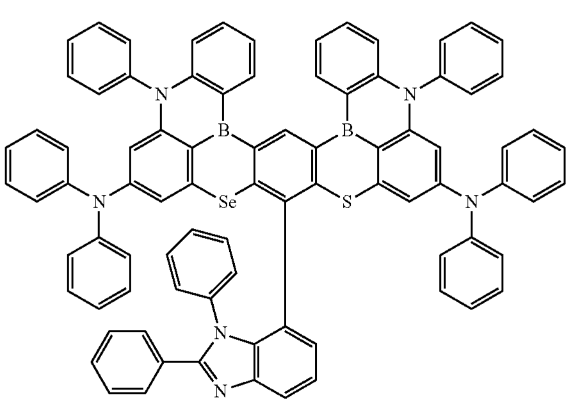
141
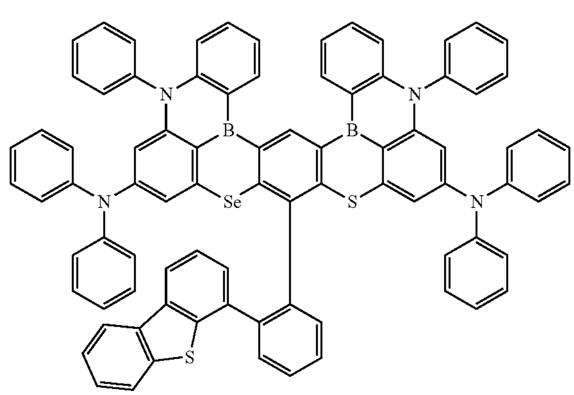

-continued
142
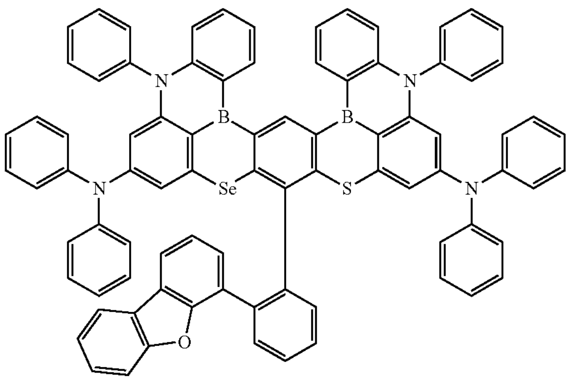
143
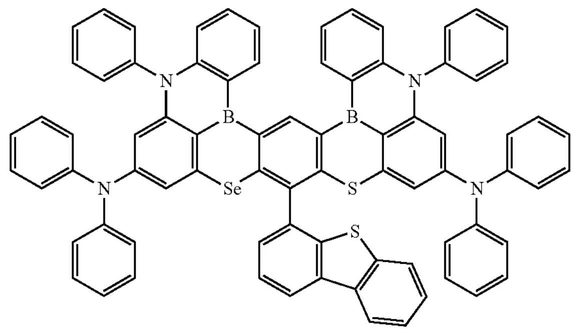
144
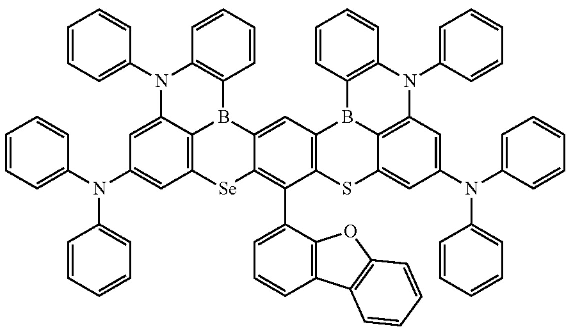
145
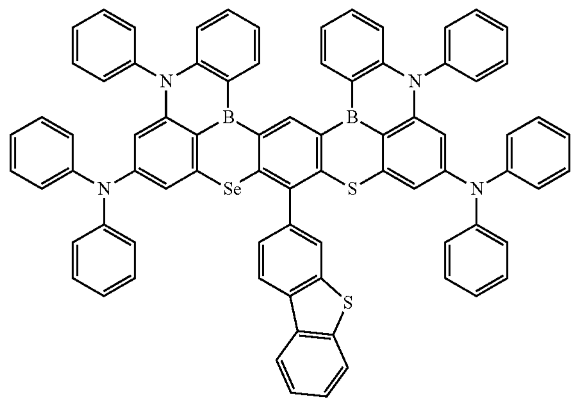
146
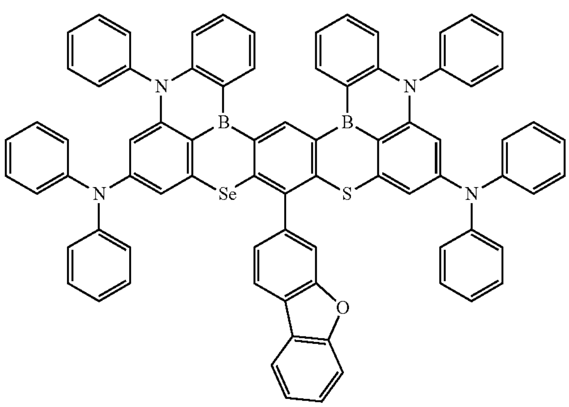
147
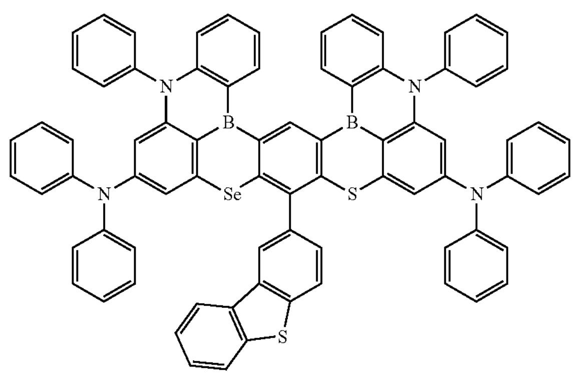
148
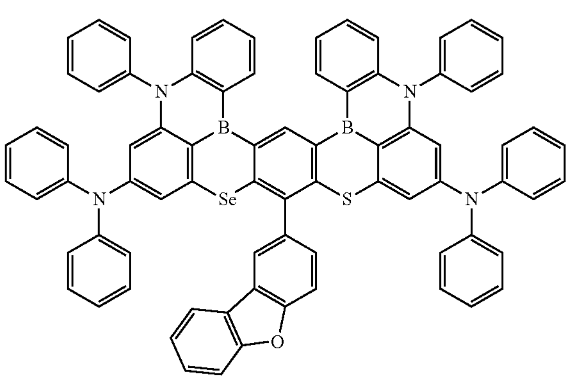
149
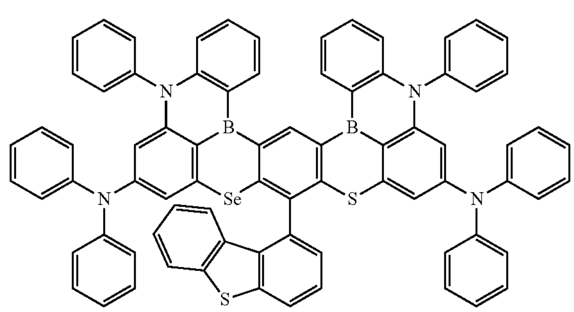

-continued
150
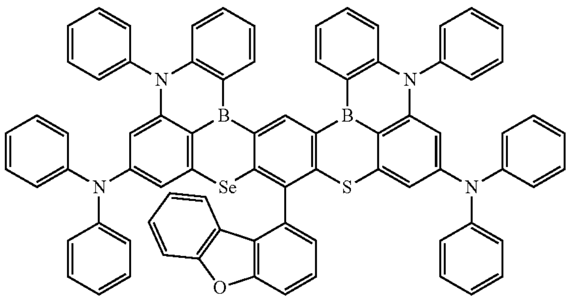
151
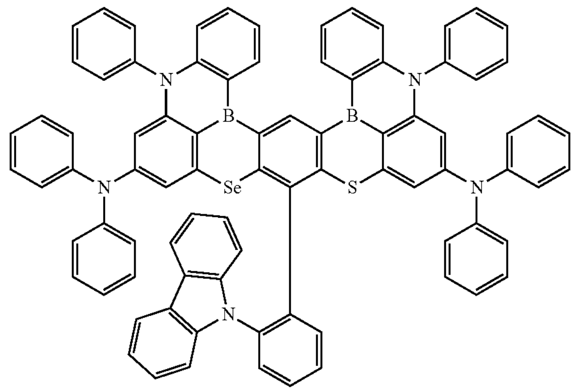
152
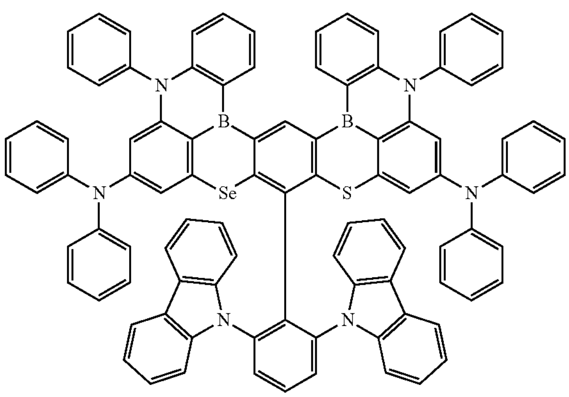
153
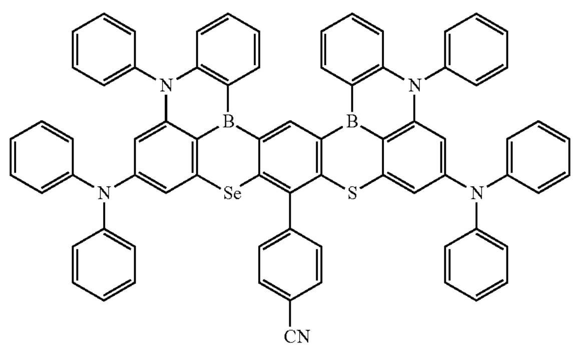
154
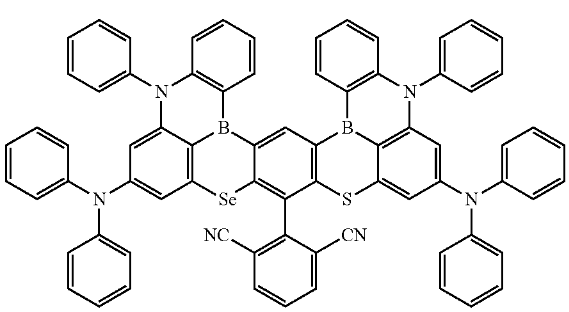
155
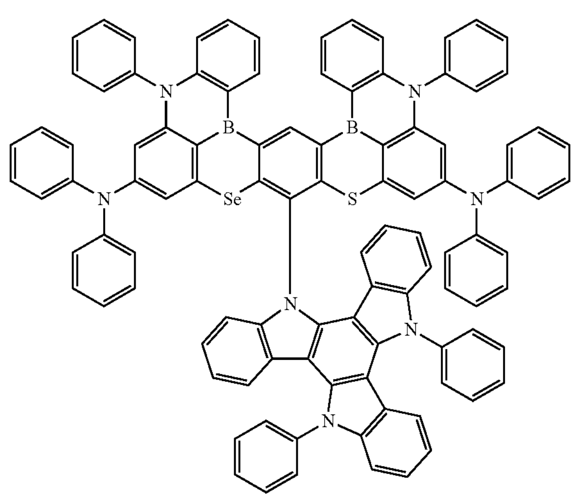

-continued
156
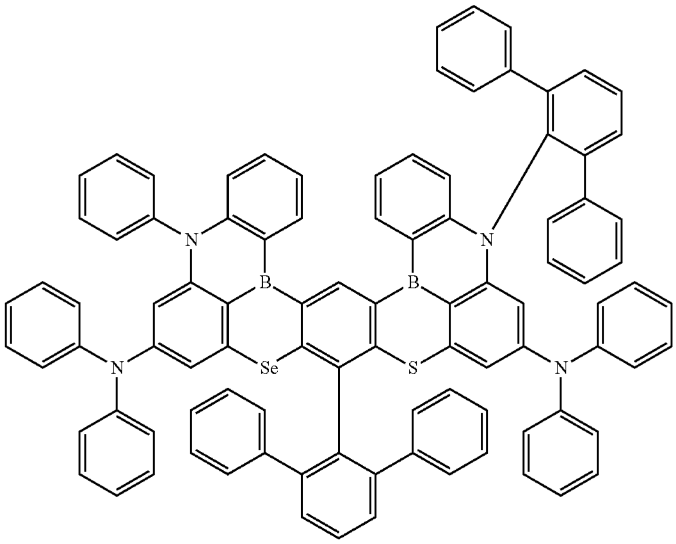
157
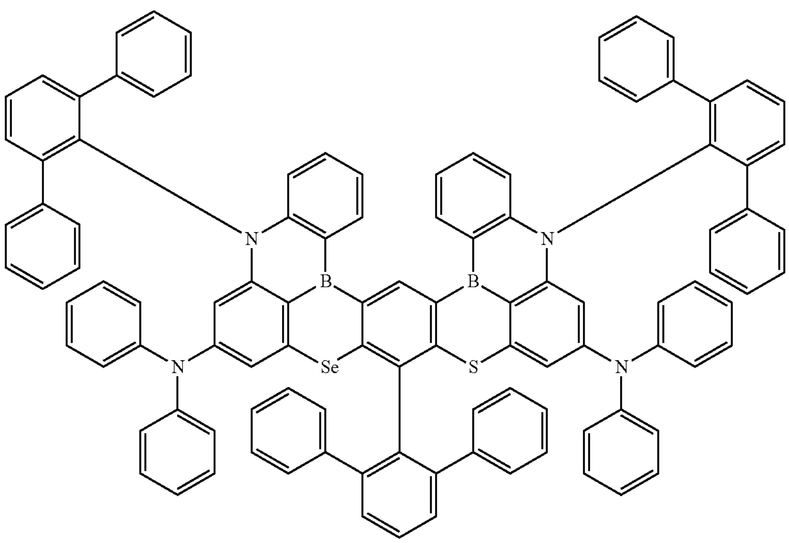
158
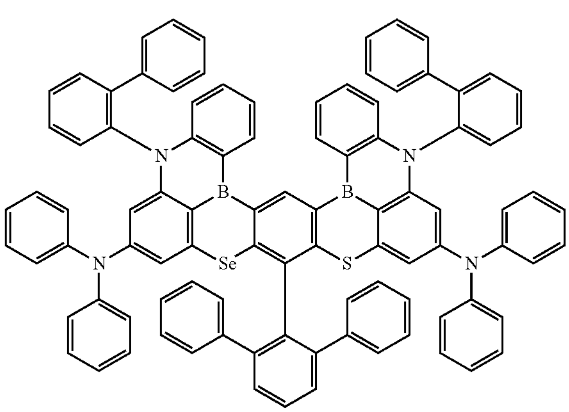
159
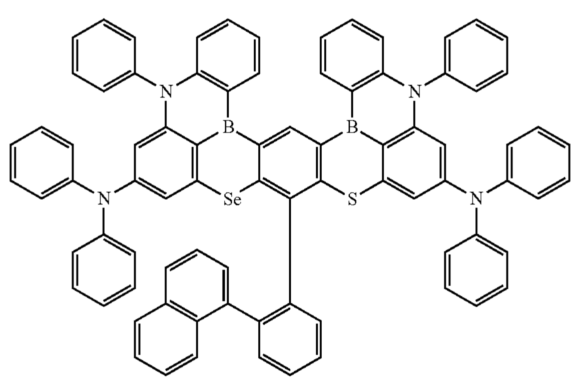

-continued
160
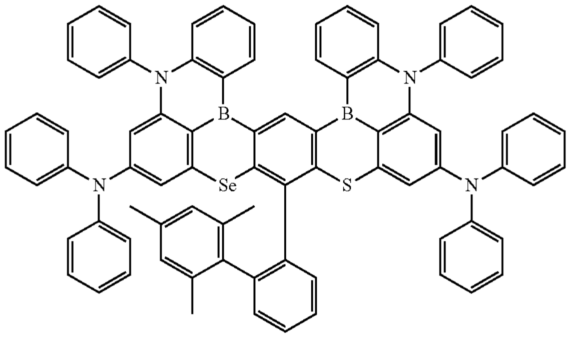
161
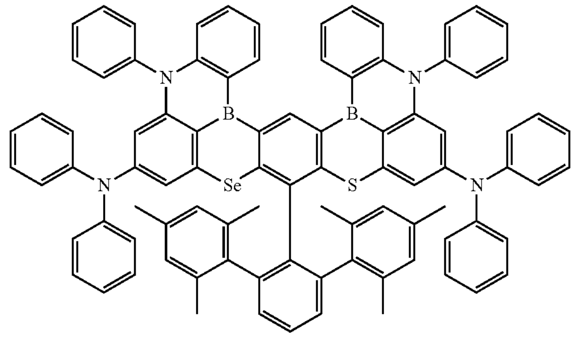
162
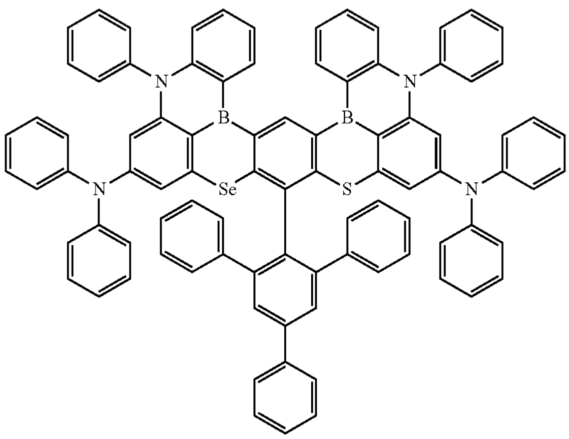
163
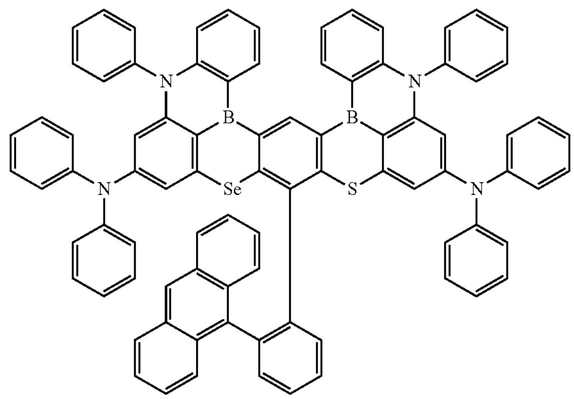
164
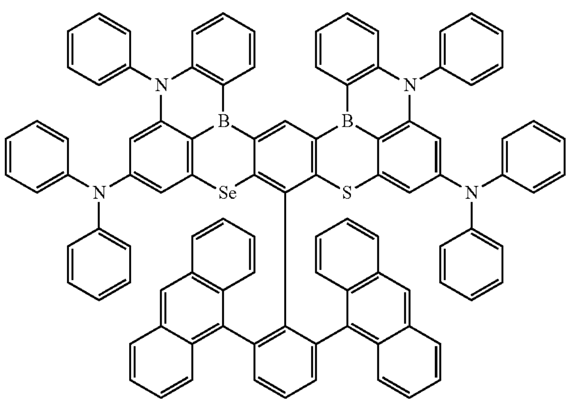
165
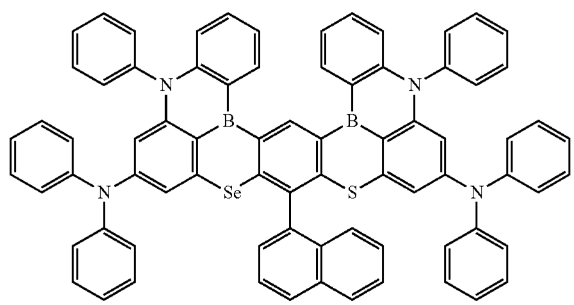
166
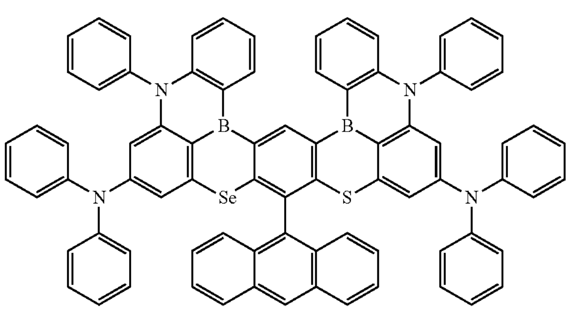
167
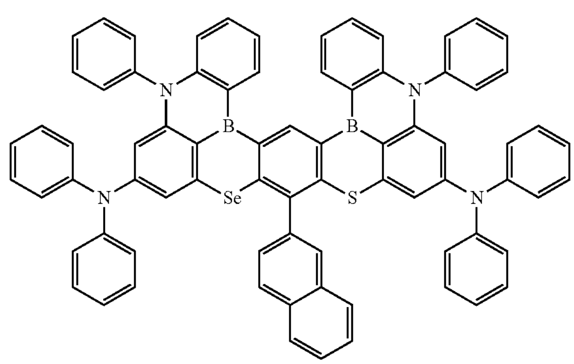

-continued
168
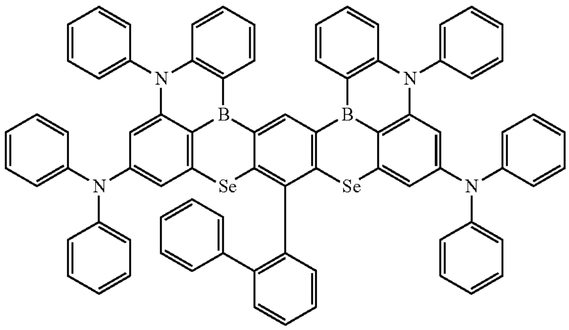
169
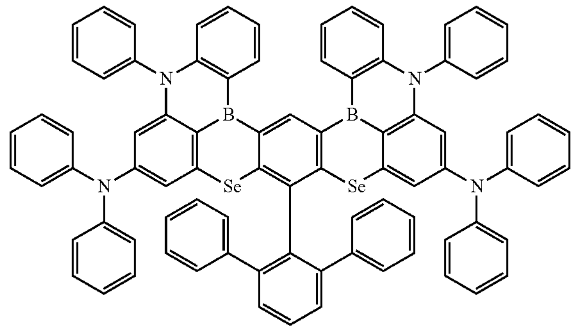
170
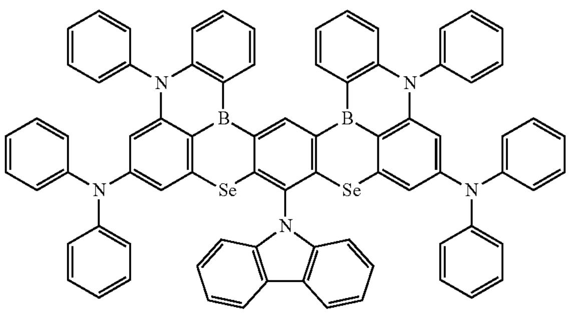
171
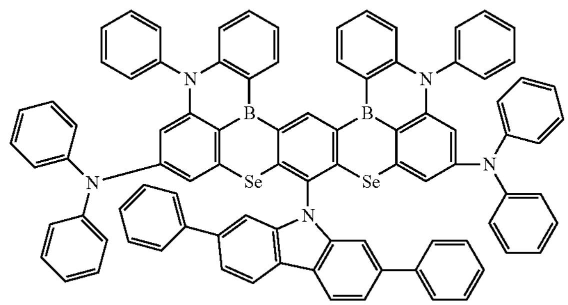
172
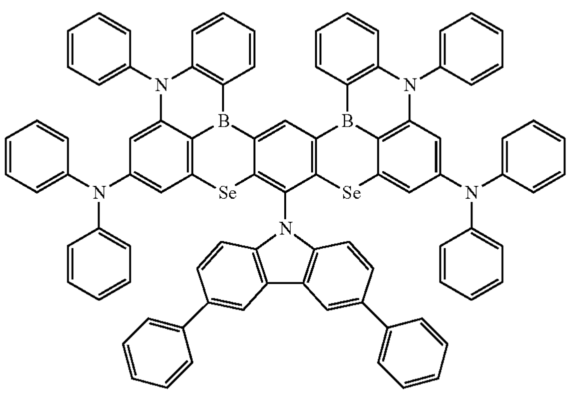
173
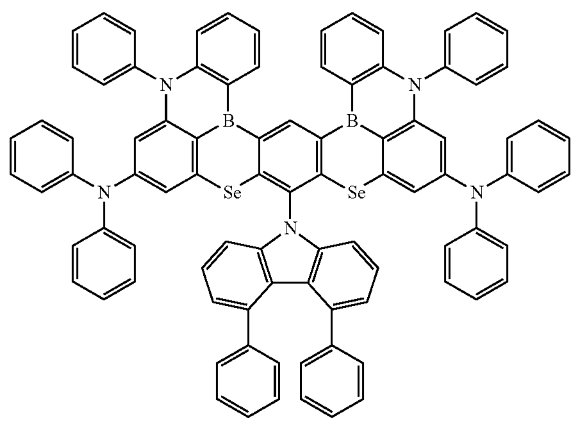
174
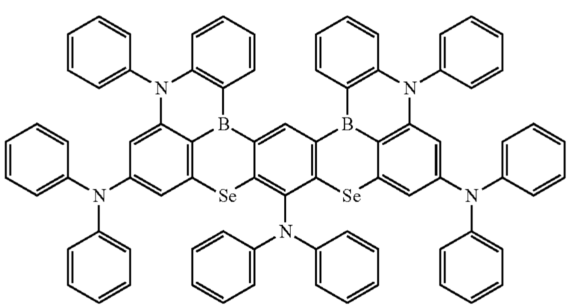
175
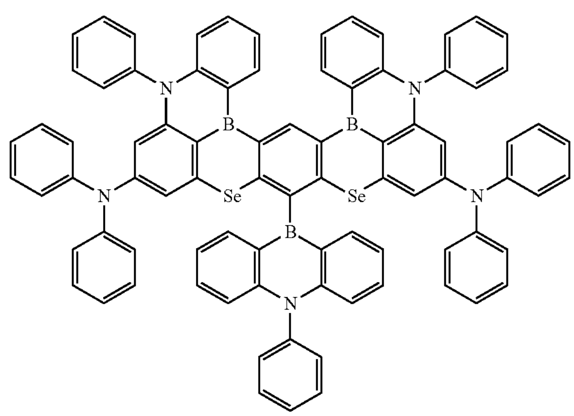

-continued
176
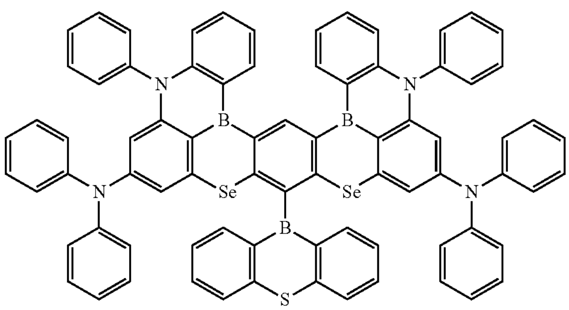
177
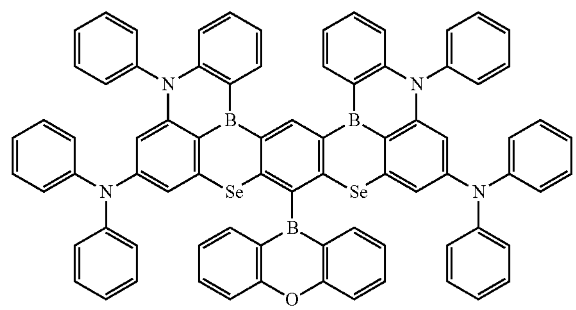
178
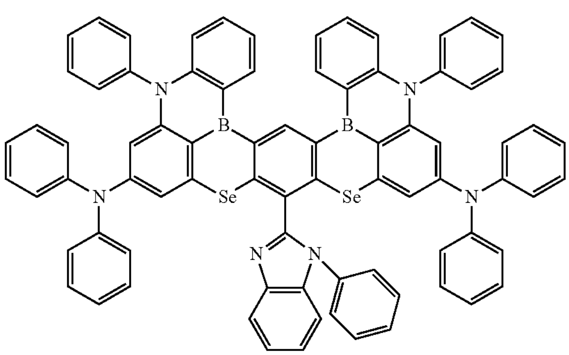
179
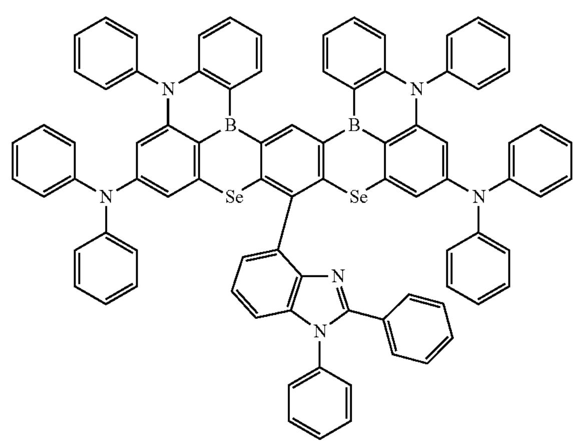
180
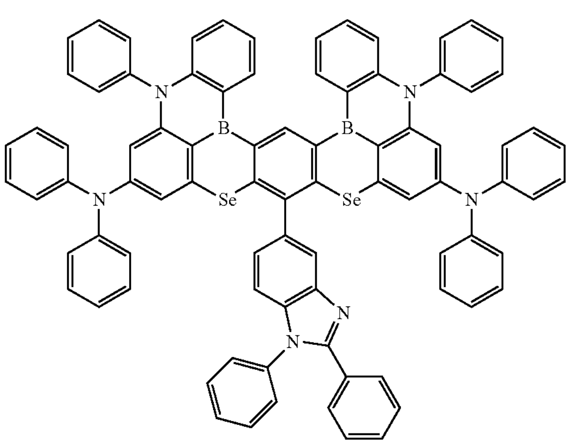
181
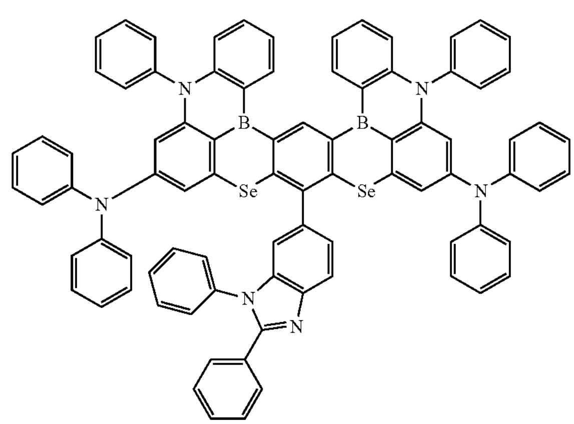
182
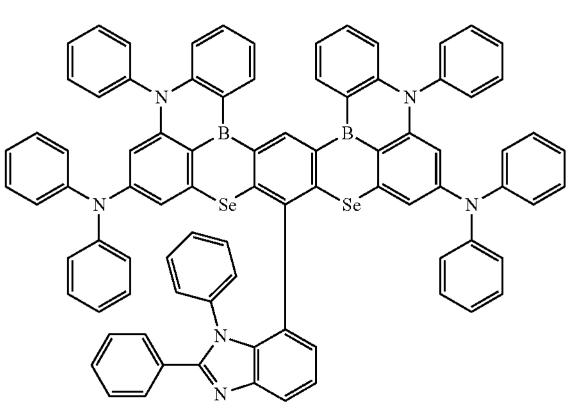
183
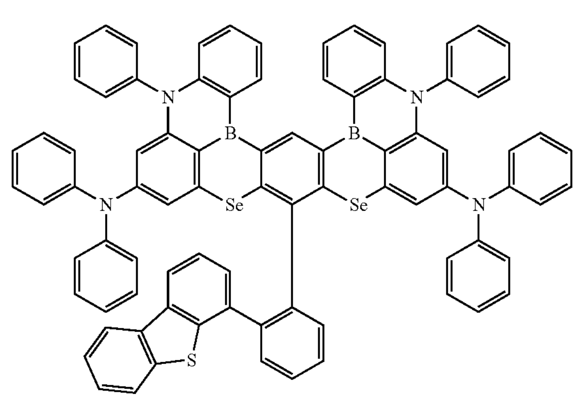

-continued
184
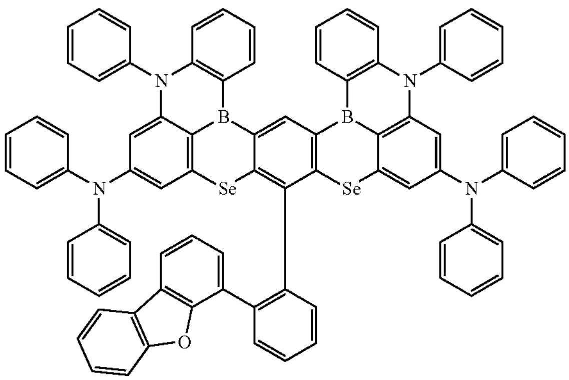
185
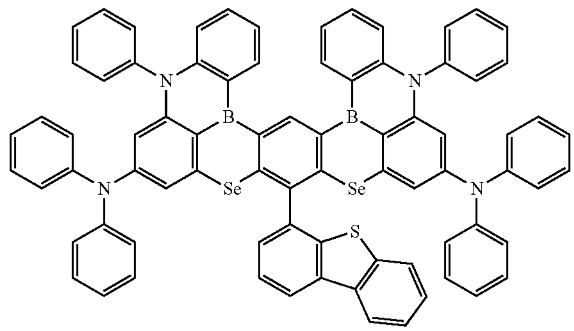
186
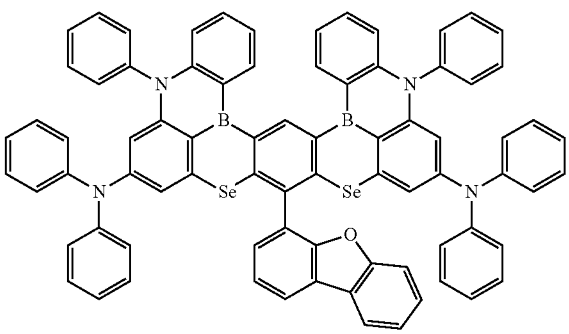
187
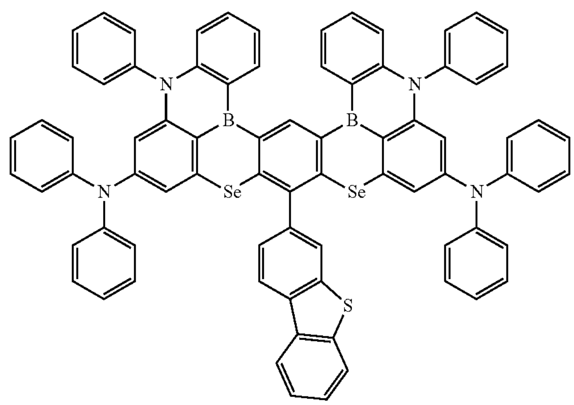
188
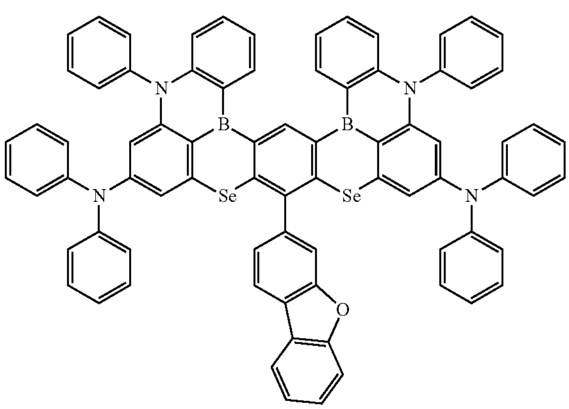
189
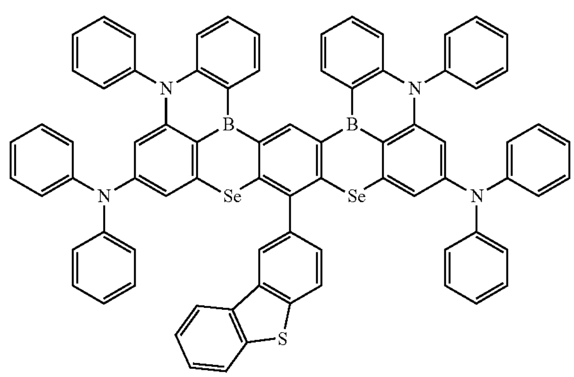
190
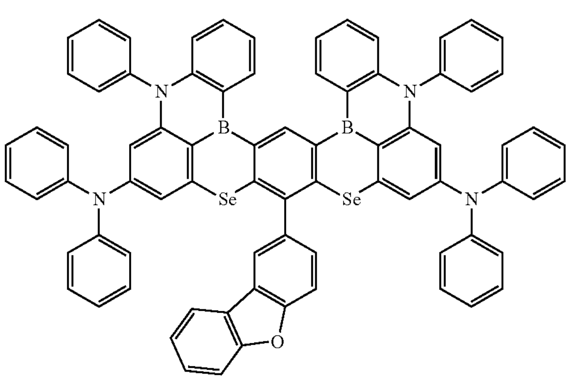
191
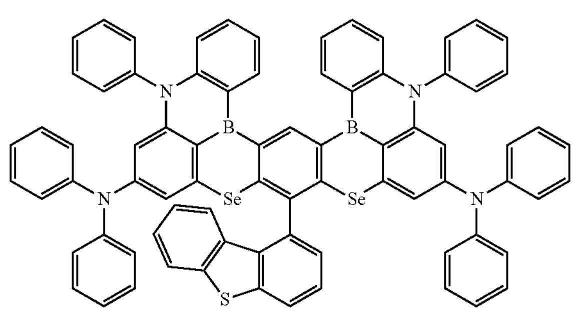

-continued
192
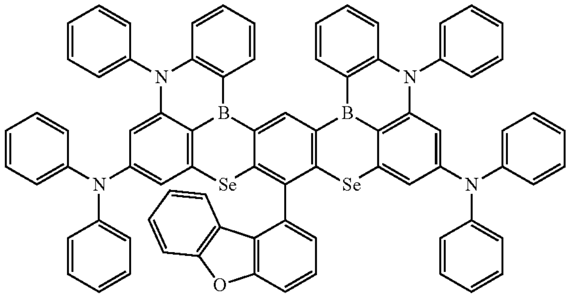
193
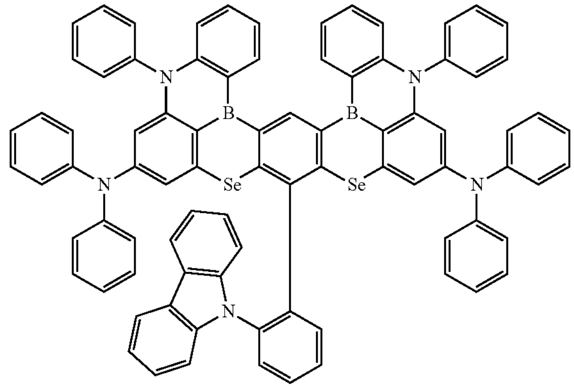
194
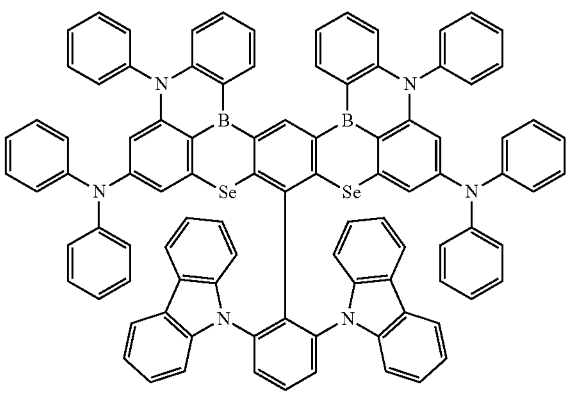
195
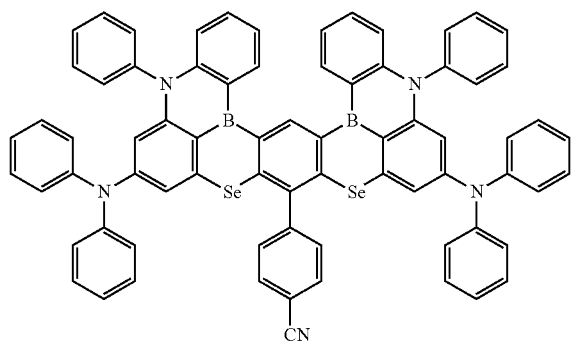
196
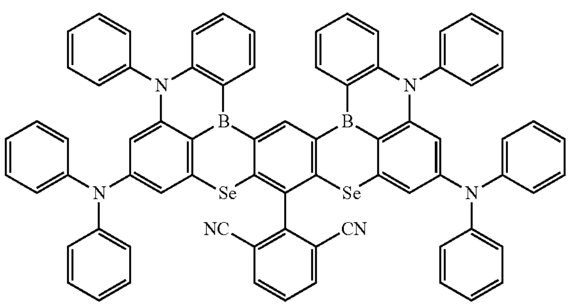
197
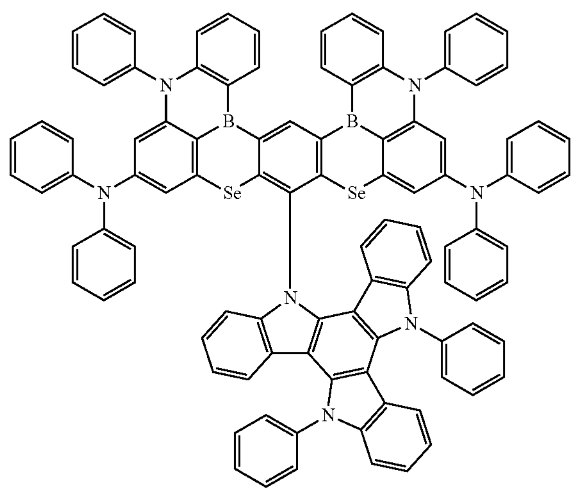

-continued
198
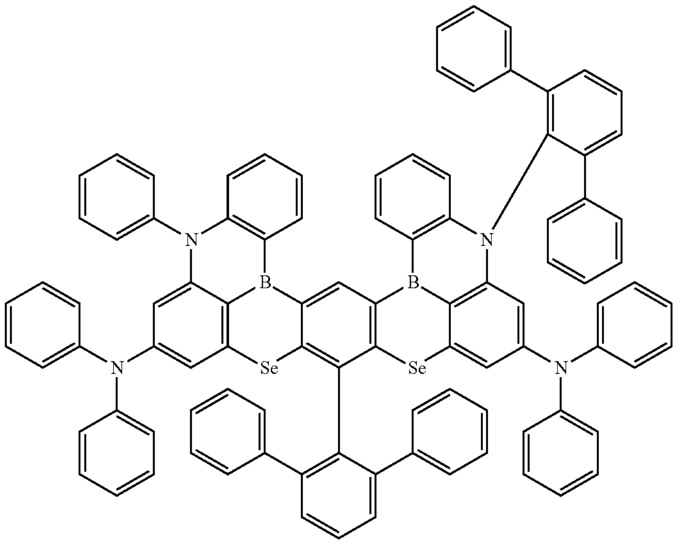
199
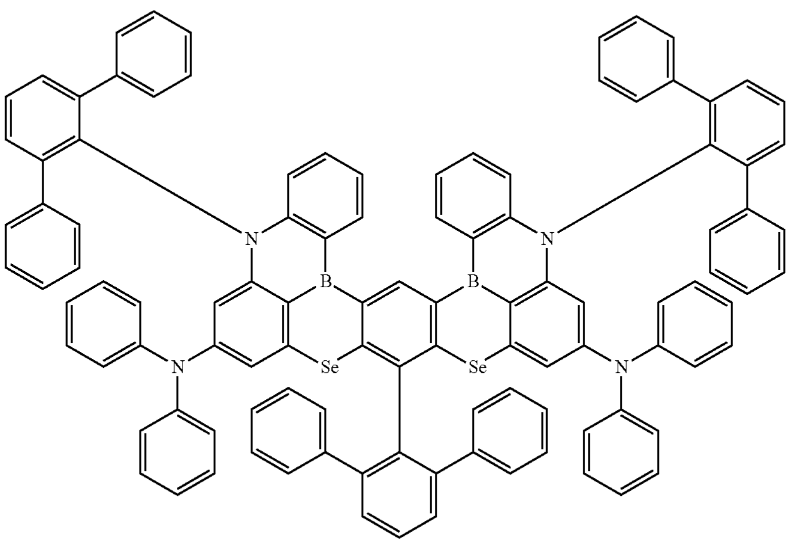
200
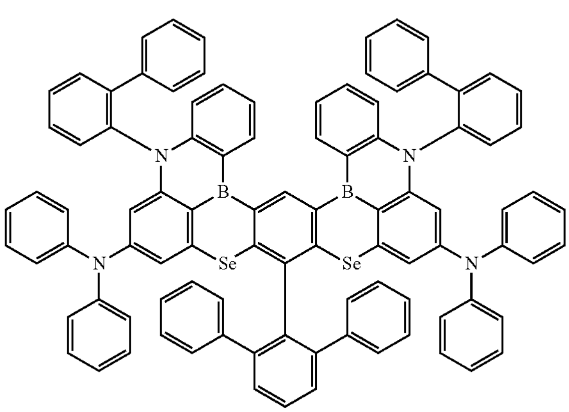
201
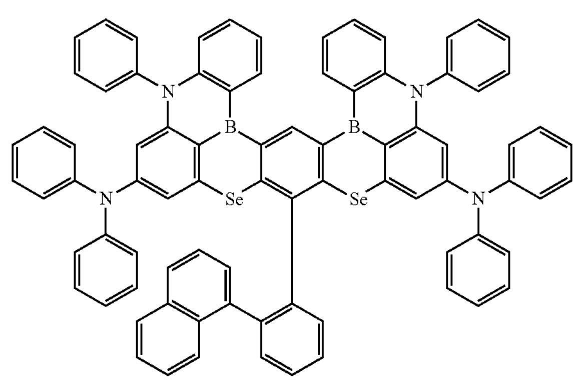

-continued
202
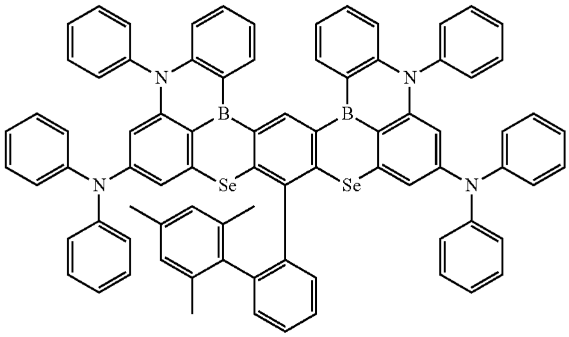
203
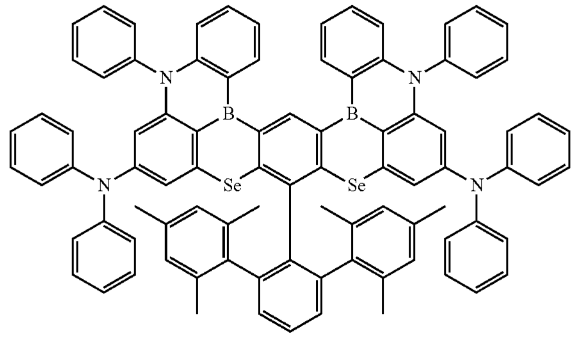
204
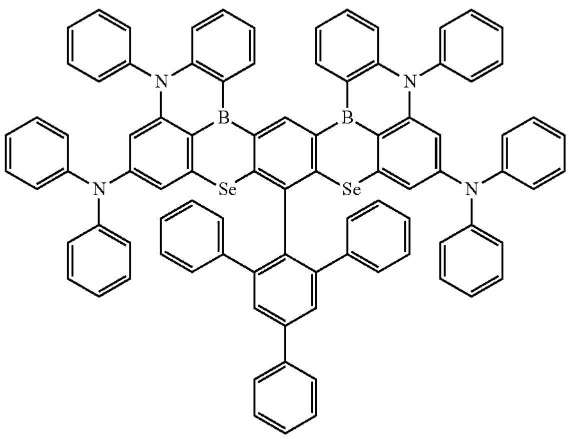
205
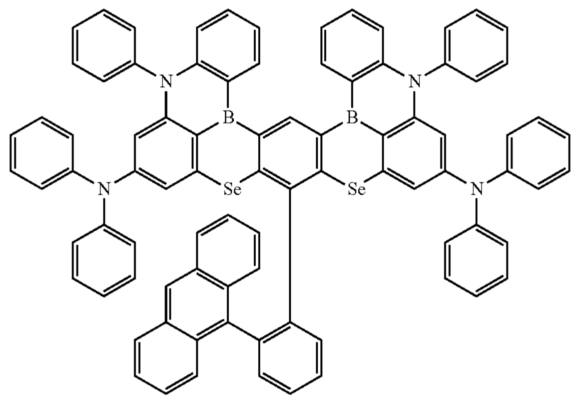
206
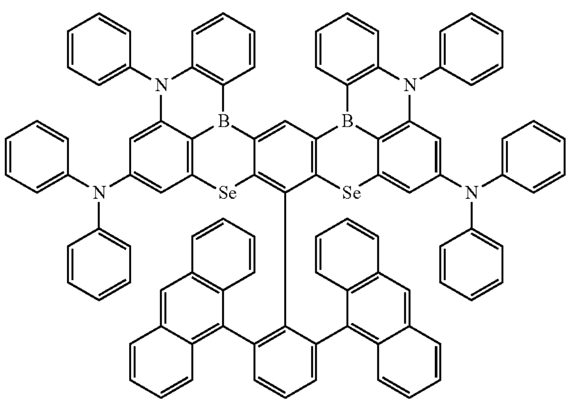
207
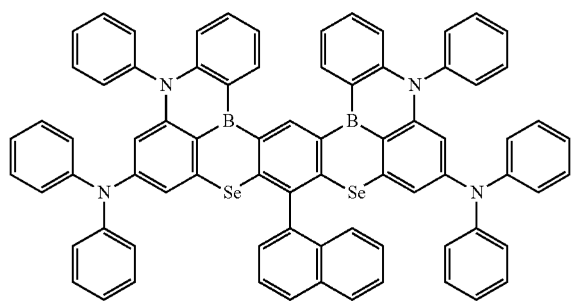
208
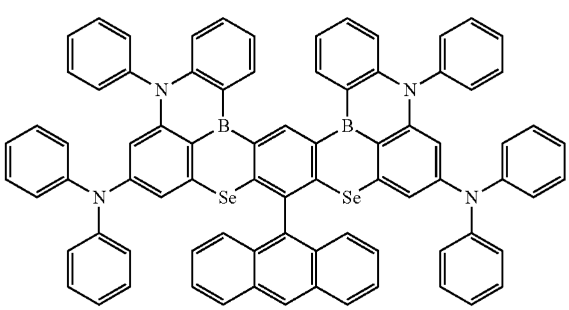
209
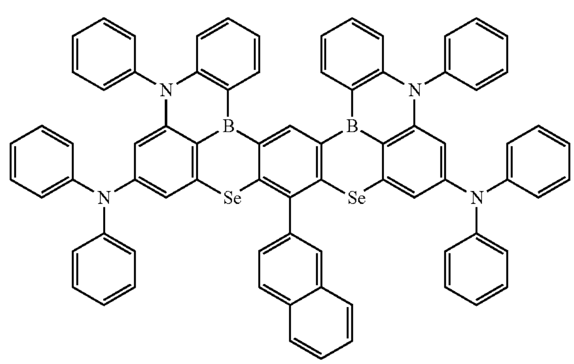

-continued

D-1

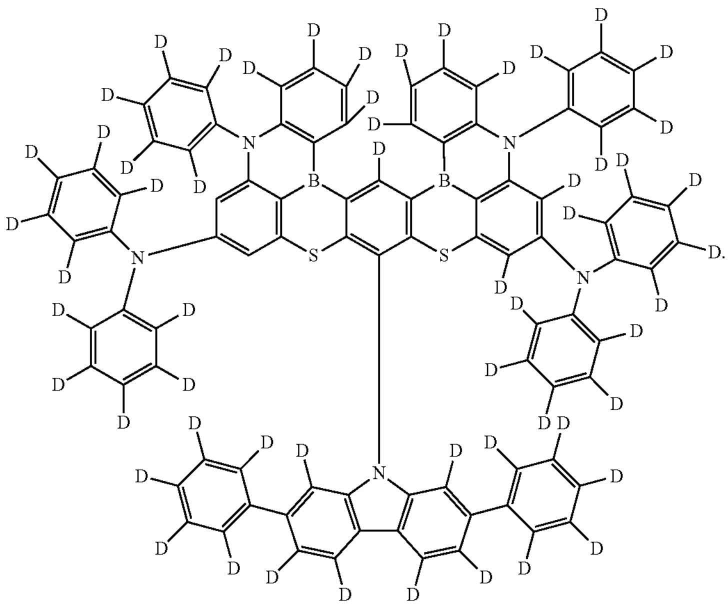

14. A polycyclic compound represented by Formula 1:

Formula 1

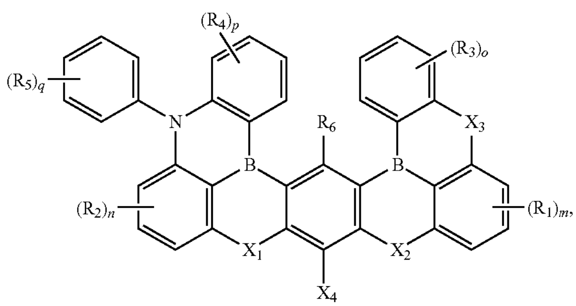

wherein in Formula 1, $X_1$ to $X_3$ are each independently O, S, Se or $NAr_1$, "m" and "n" are each independently an integer of 0 to 3, "o" and "p" are each independently an integer of 0 to 4, "q" is an integer of 0 to 5, $Ar_1$ is a substituted or unsubstituted aryl group of 6 to 30 ring-forming carbon atoms, or a substituted or unsubstituted heteroaryl group of 2 to 30 ring-forming carbon atoms, $R_1$ to $R_6$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $X_4$ is a substituted phenyl group, a substituted or unsubstituted aryl group of 7 to 30 ring-forming carbon atoms, or a substituted or unsubstituted heterocycle of 2 to 30 ring-forming carbon atoms, or represented by Formula 2:

Formula 2

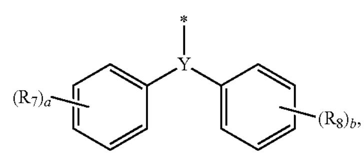

and wherein in Formula 2,

Y is B, P, P═O, P═S, or N, $R_7$ and $R_8$ are each independently a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "a" and "b" are each independently an integer of 0 to 5.

15. The polycyclic compound of claim 14, wherein Formula 1 is represented by any one selected from among Formula 3-1 to Formula 3-5:

Formula 3-1

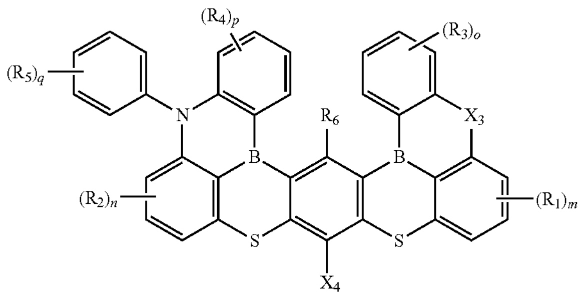

Formula 3-2

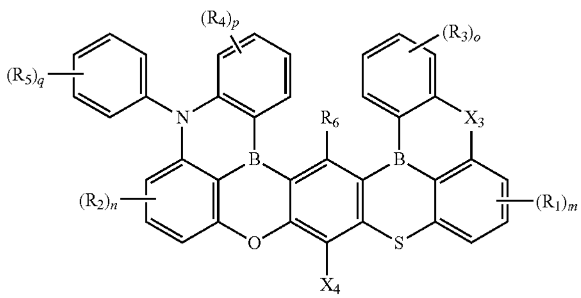

Formula 3-3

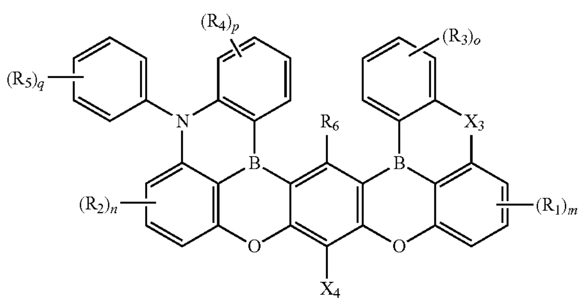

Formula 3-4

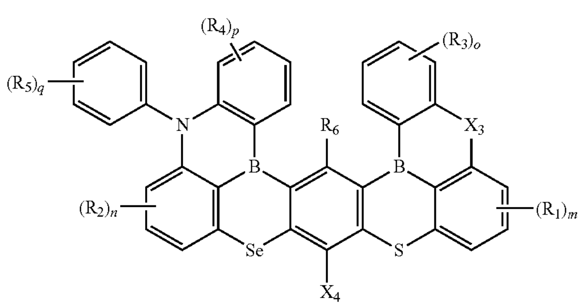

Formula 3-5

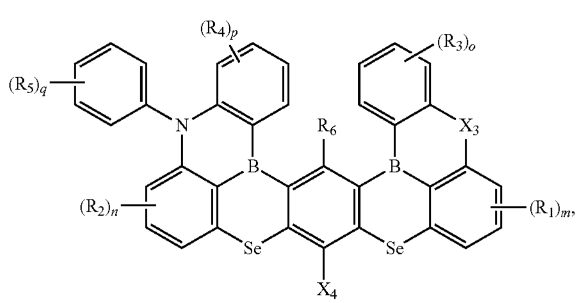

and wherein in Formula 3-1 to Formula 3-5, $X_3$, $X_4$, $R_1$ to $R_6$, and "m" to "q" are the same as defined in Formula 1.

16. The polycyclic compound of claim 14, wherein Formula 1 is represented by Formula 4 or Formula 5:

Formula 4

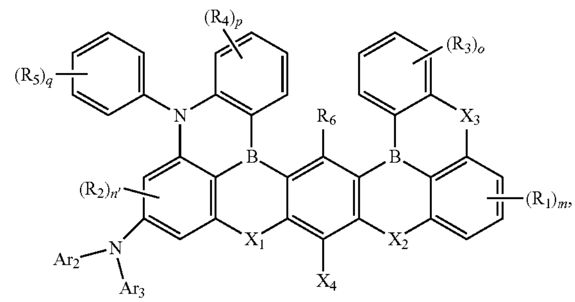

Formula 5

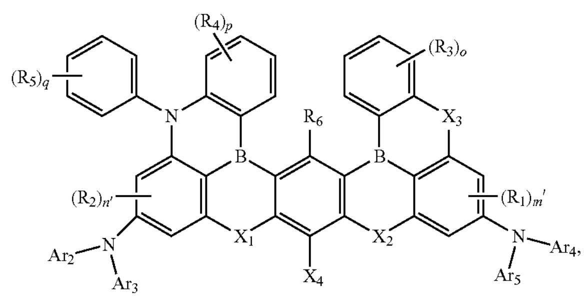

and wherein in Formula 4 and Formula 5, m' and n' are integers of 0 to 2, $Ar_2$ to $Ar_5$ are each independently a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $X_1$ to $X_4$, $R_1$ to $R_6$, "m", and "o" to "q" are the same as defined in Formula 1.

17. The polycyclic compound of claim 16, wherein $Ar_2$ to $Ar_5$ are each independently represented by Formula 6:

Formula 6

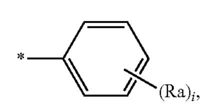

and wherein in Formula 6,

Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "b" is an integer of 0 to 5.

18. The polycyclic compound of claim 14, wherein Formula 1 is represented by Formula 7:

Formula 7

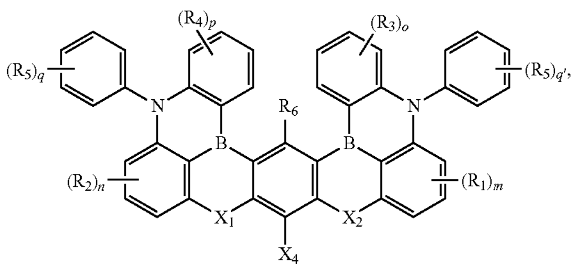

and wherein in Formula 7, q' is an integer of 0 to 5, $R_5$' is a hydrogen atom, a deuterium atom, a halogen atom, a cyano group, a substituted or unsubstituted amine group, a substituted or unsubstituted thiol group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and $X_1$, $X_2$, $X_4$, $R_1$ to $R_6$, and "m" to "q" are the same as defined in Formula 1.

19. The polycyclic compound of claim 14, wherein Formula 2 is represented by any one selected from among Formulae 2-1, 2-2, and 2-4:

2-1

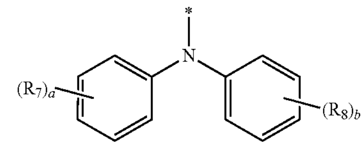

2-2

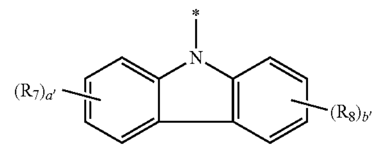

2-4

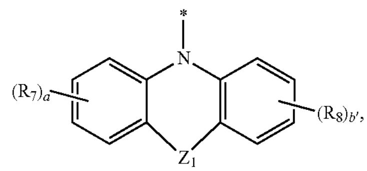

and wherein in Formulae 2-1, 2-2, and 2-4, $Z_1$ is O, S, or $NAr_6$, $Ar_6$ is a phenyl group, a' and b' are each independently an integer of 0 to 4, and $R_7$, $R_8$, "a" and "b" are the same as defined in Formula 2.

20. The polycyclic compound of claim 14, wherein the polycyclic compound represented by Formula 1 is at least one selected among compounds represented in Compound Group 1:

Compound Group 1

1

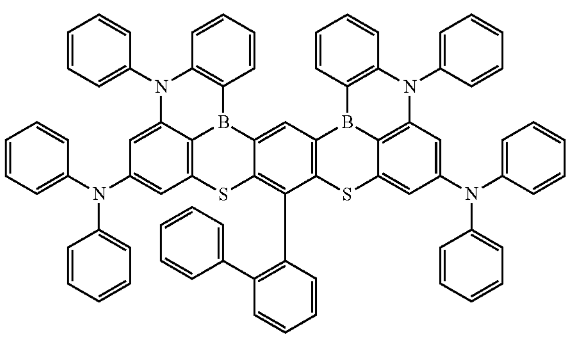

2

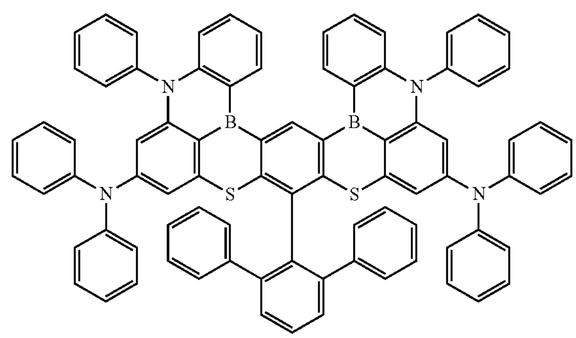

3

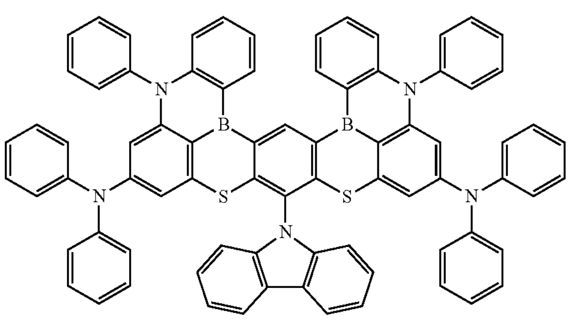

4

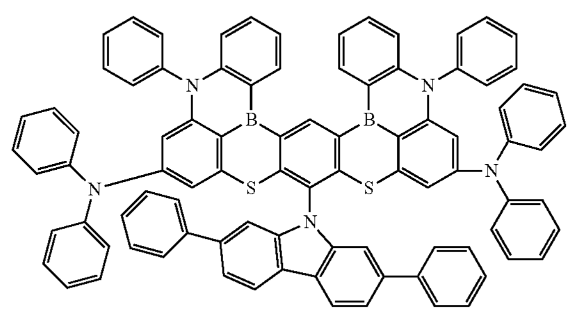

-continued
5
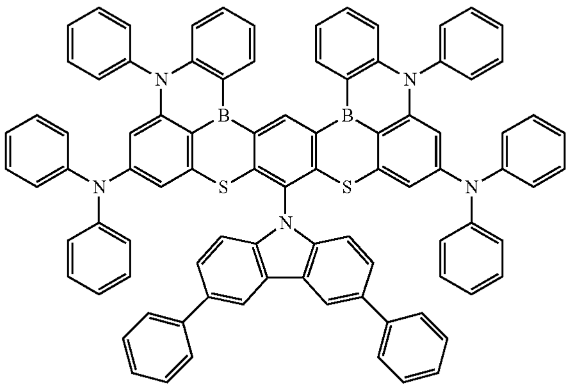
6
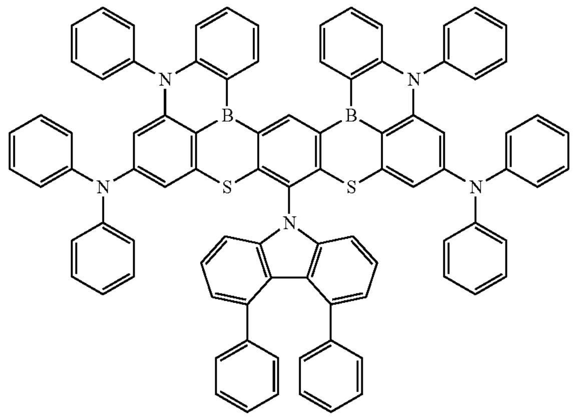
7
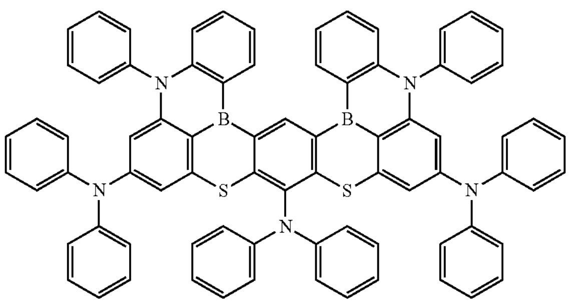
8
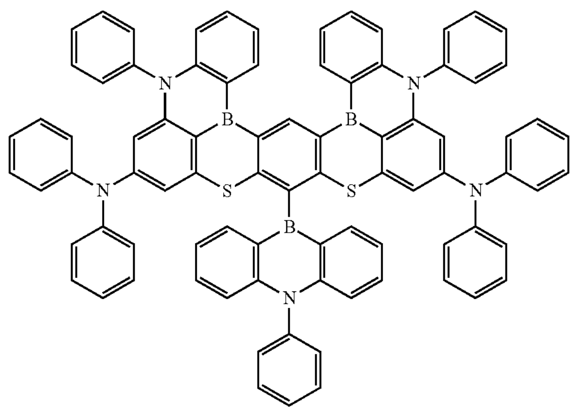
9
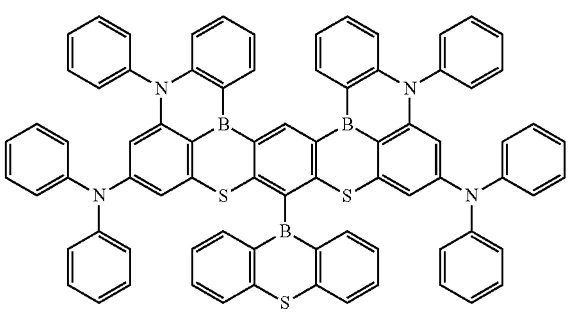
10
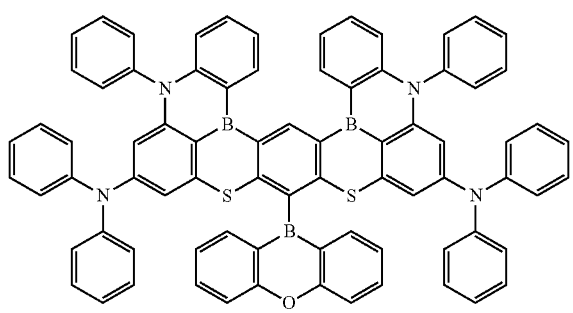
11
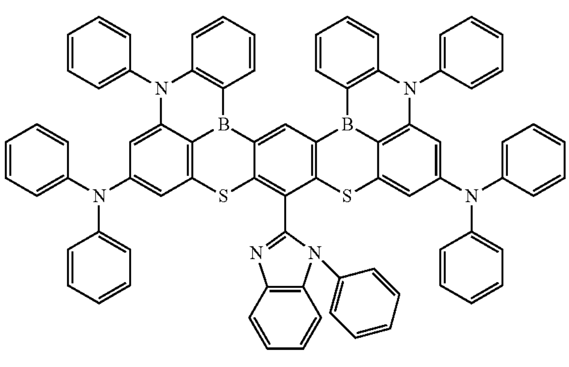
12
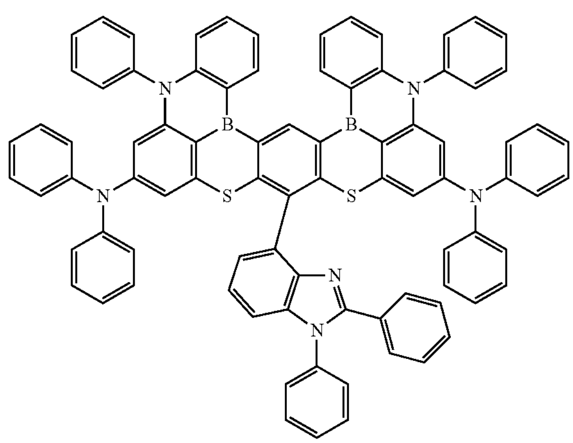

-continued
13
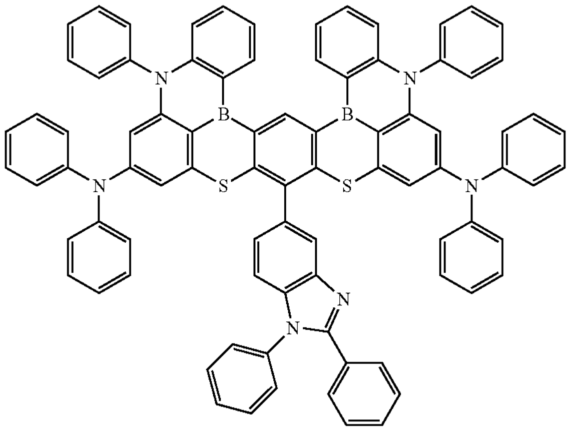
14
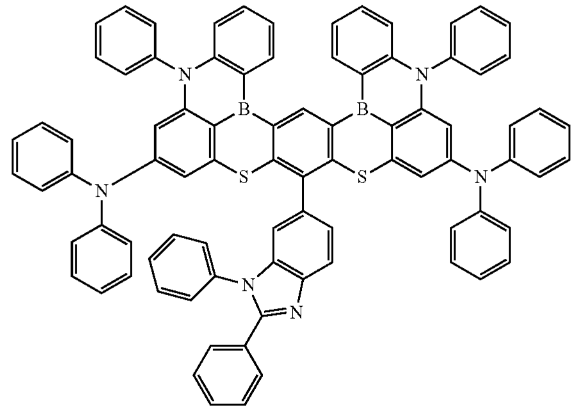
15
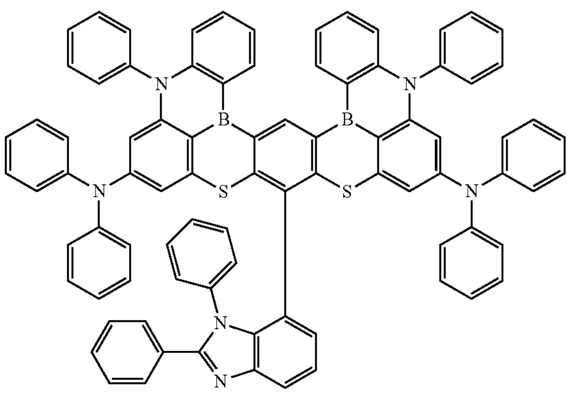
16
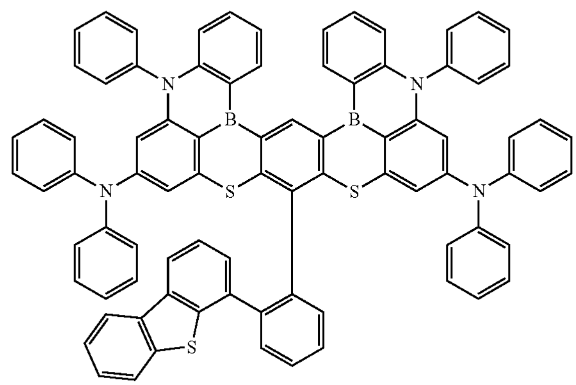
17
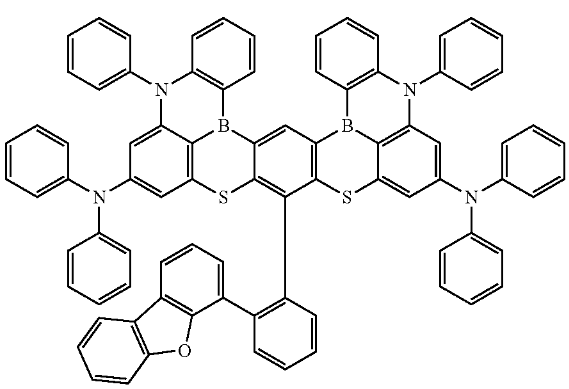
18
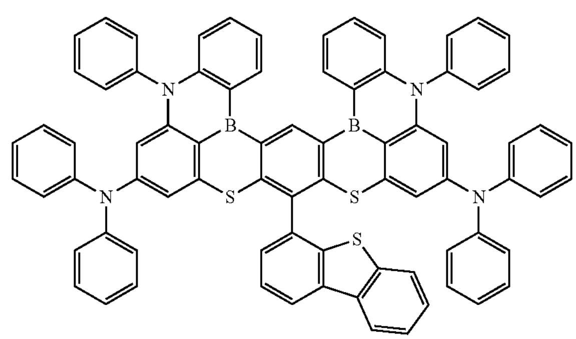

-continued
19
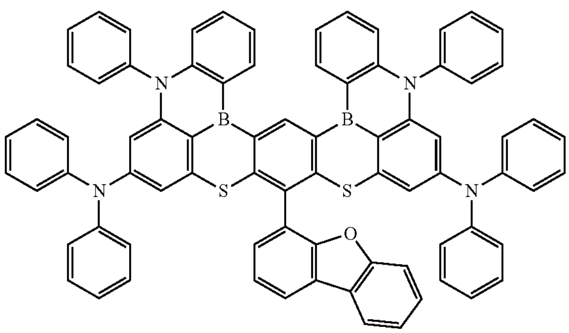
20
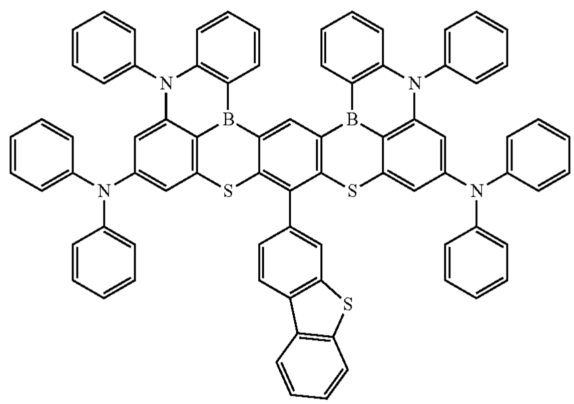
21
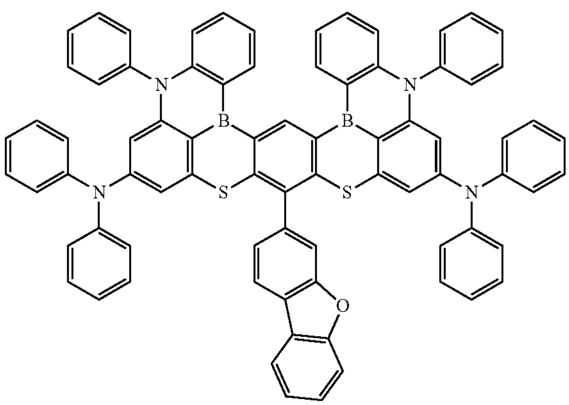
22
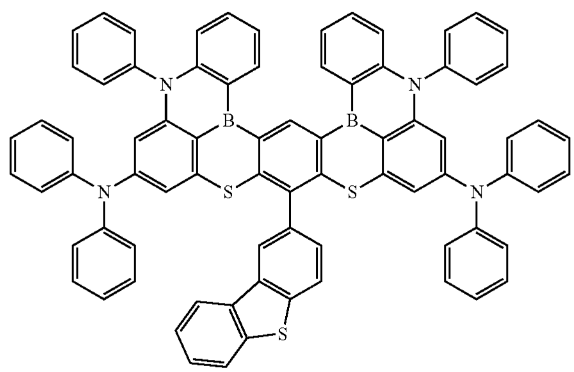
23
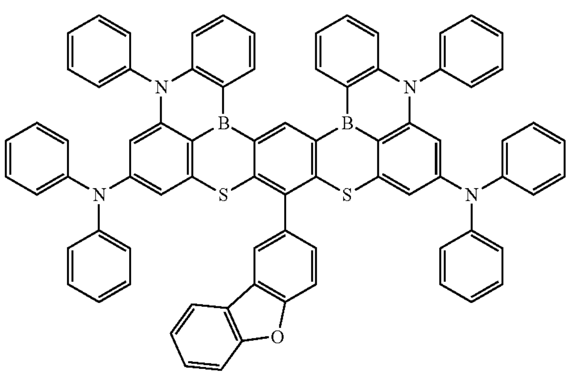
24
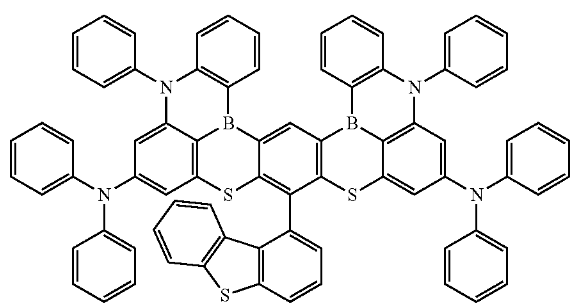
25
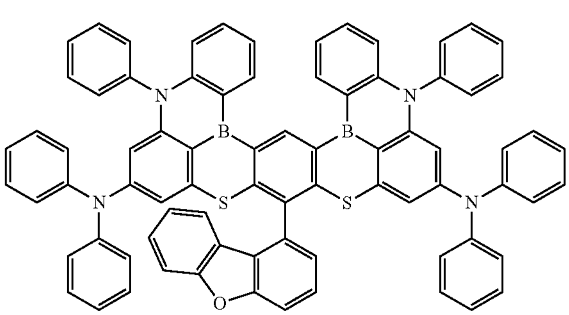
26
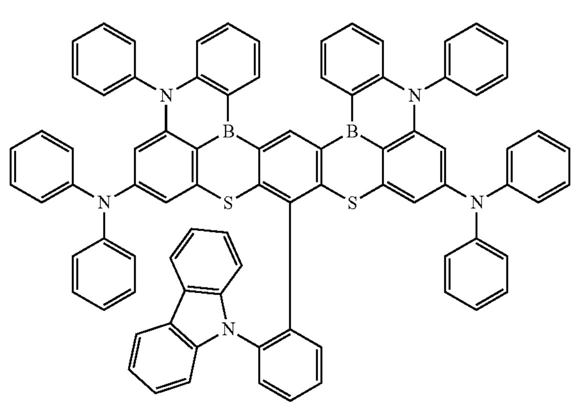

-continued
27
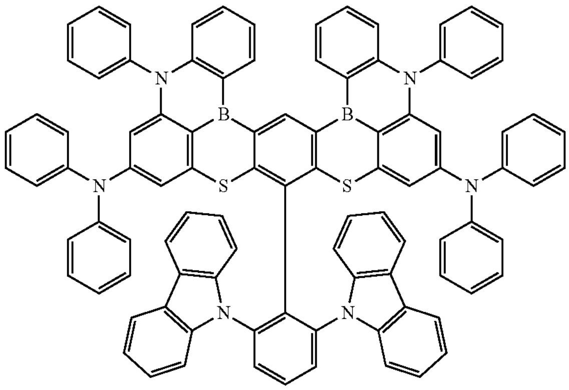
28
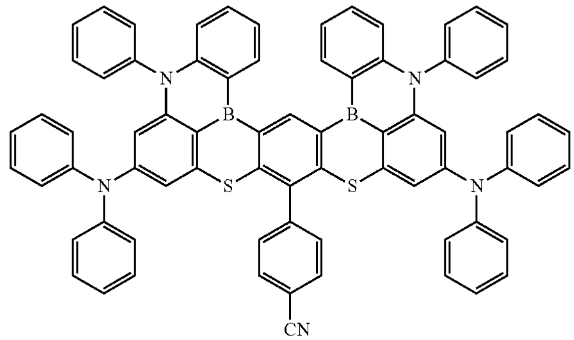
29
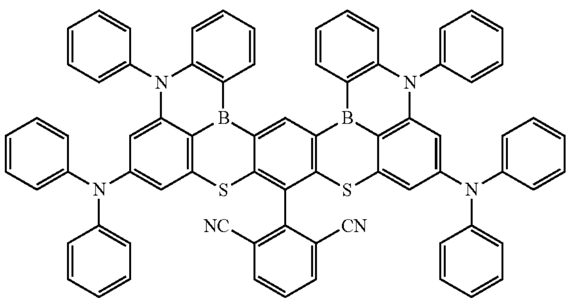
30
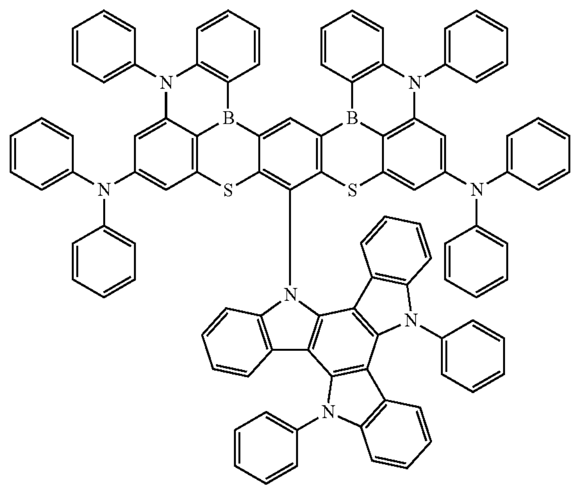
31
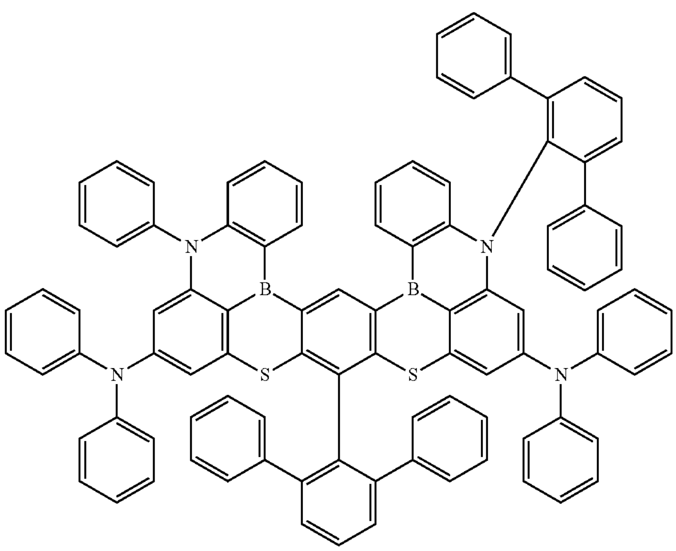

-continued
32
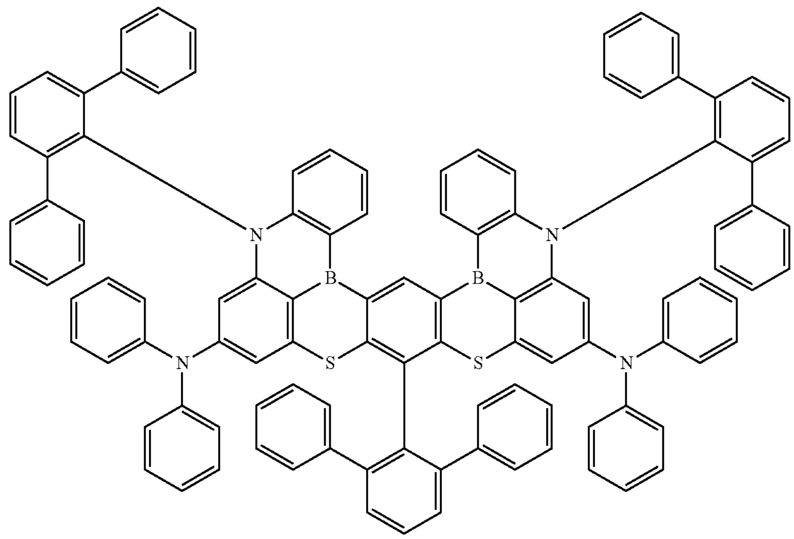
33
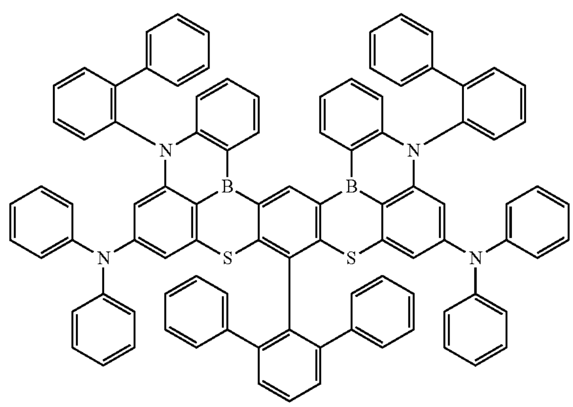
34
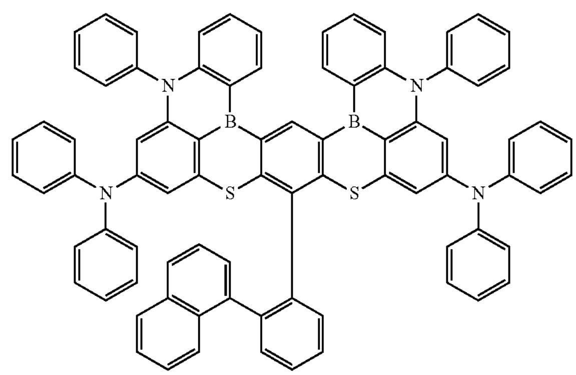
35
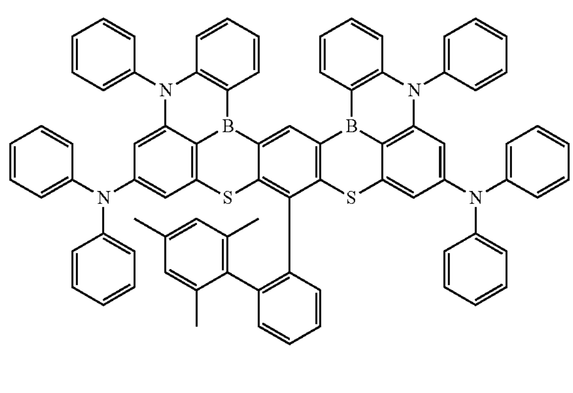
36
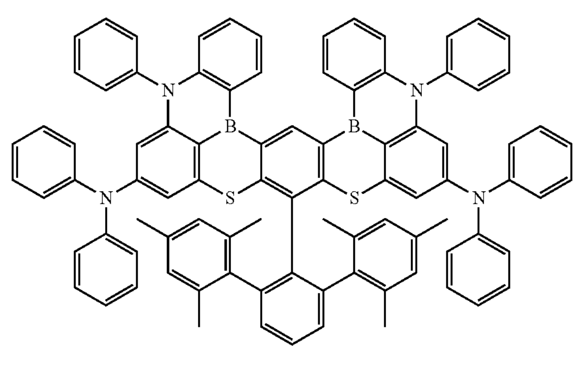

-continued
37
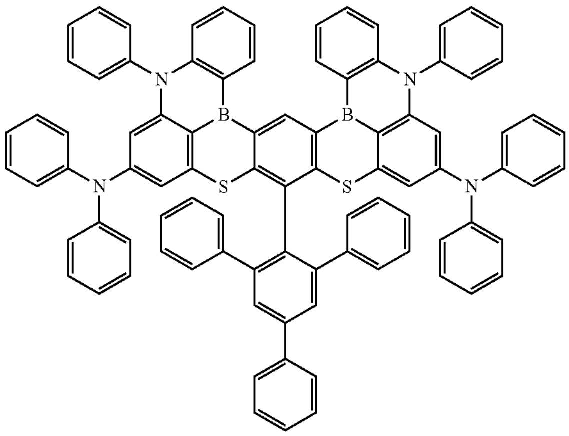
38
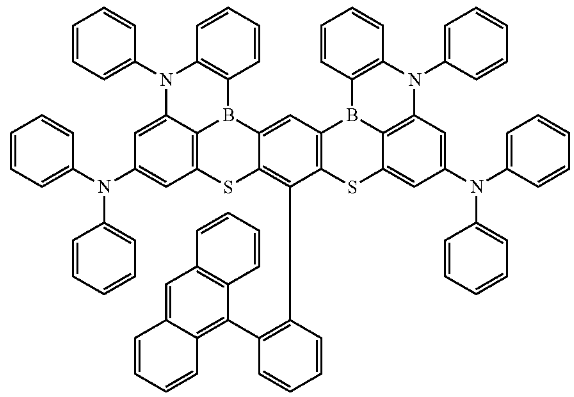
39
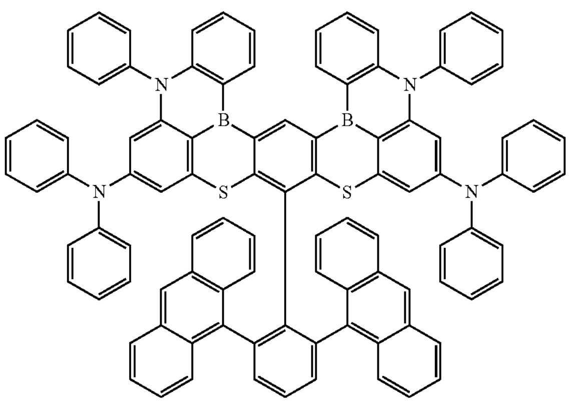
40
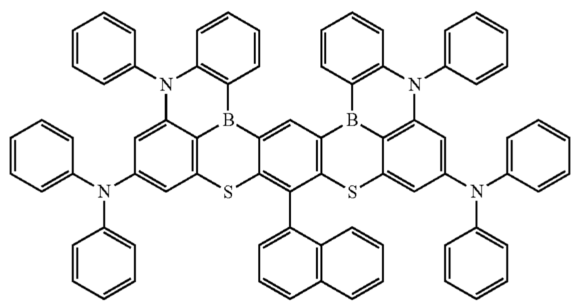
41
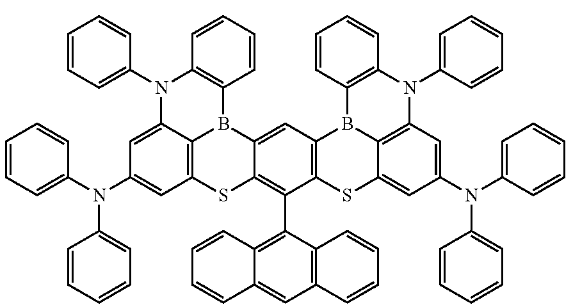
42
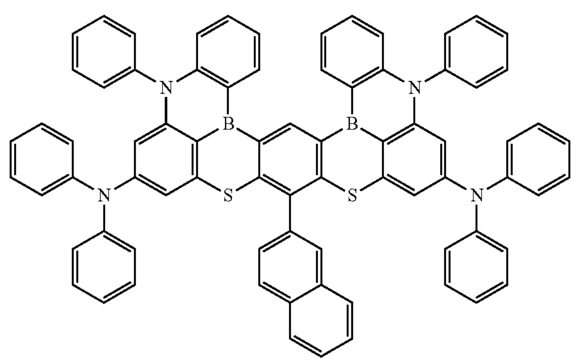
43
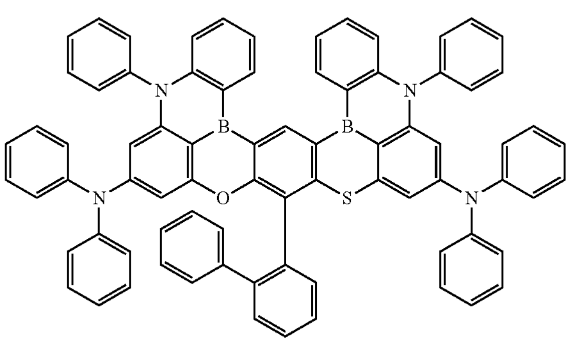
44
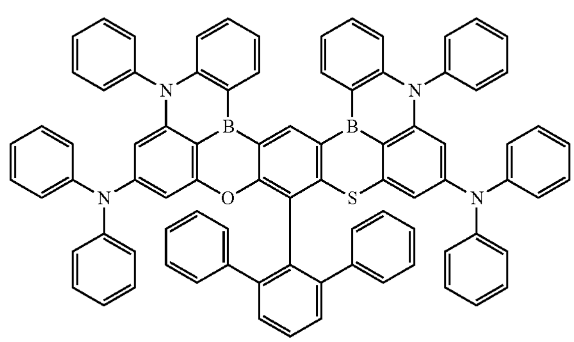

-continued
45
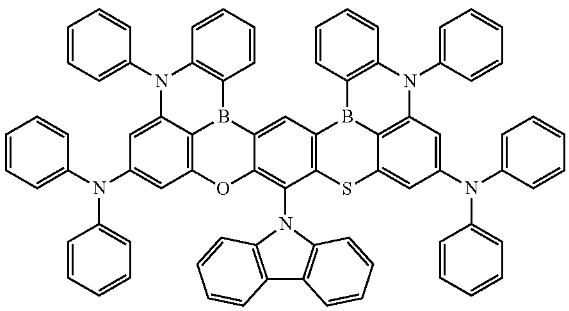
46
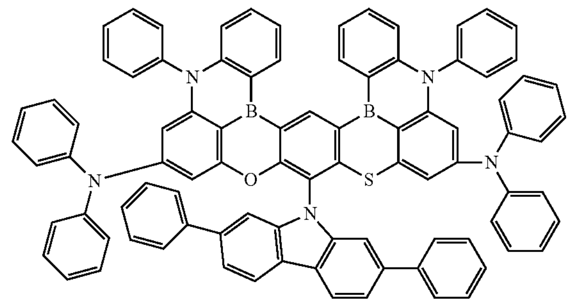
47
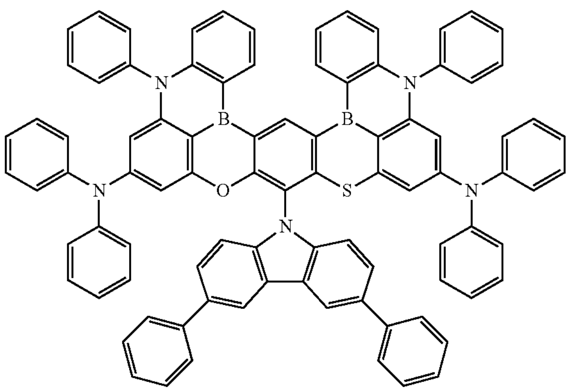
48
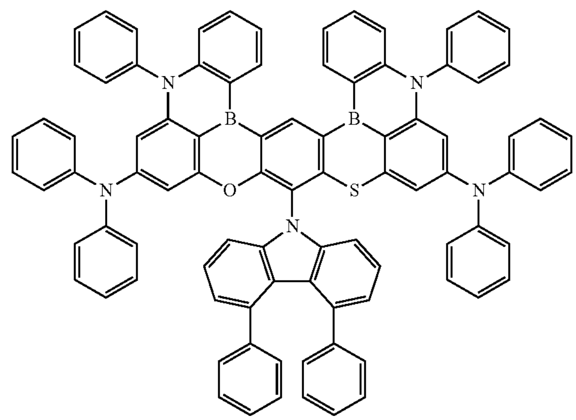
49
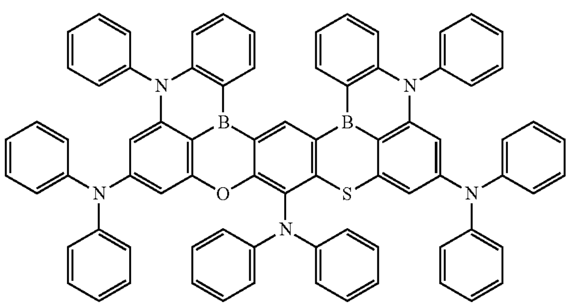
50
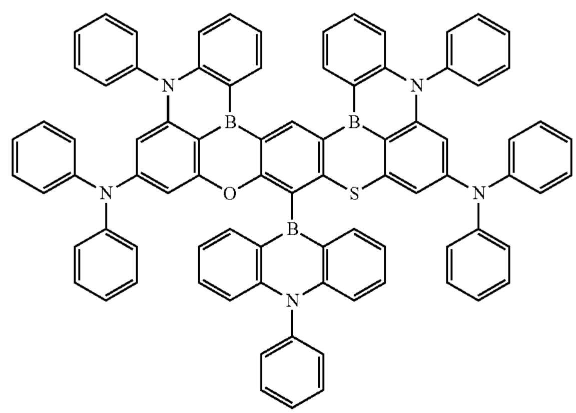
51
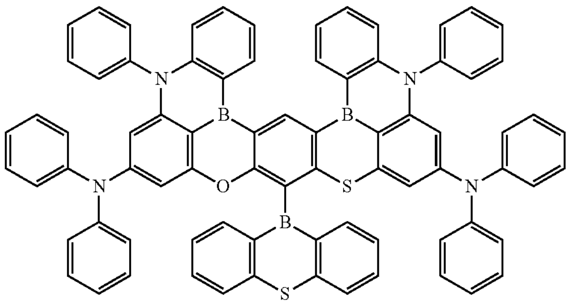
52
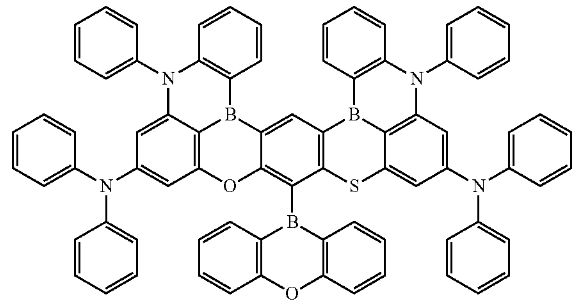

-continued
53
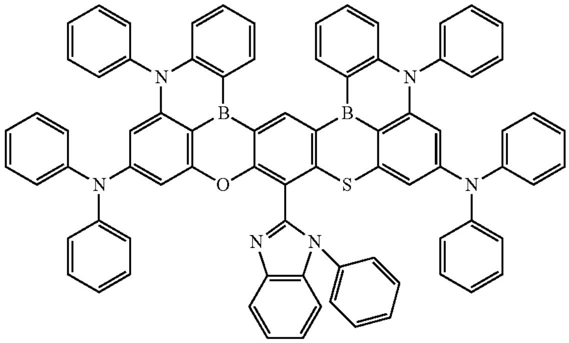
54
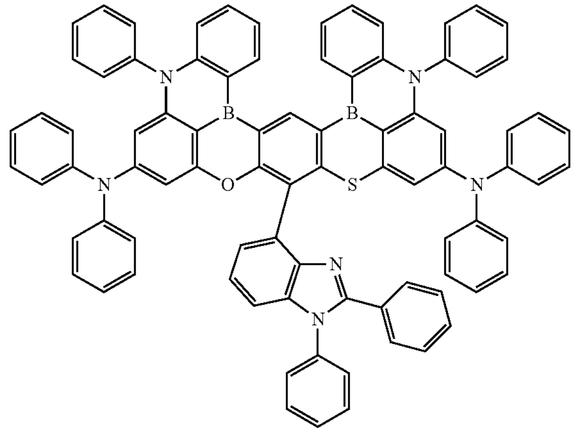
55
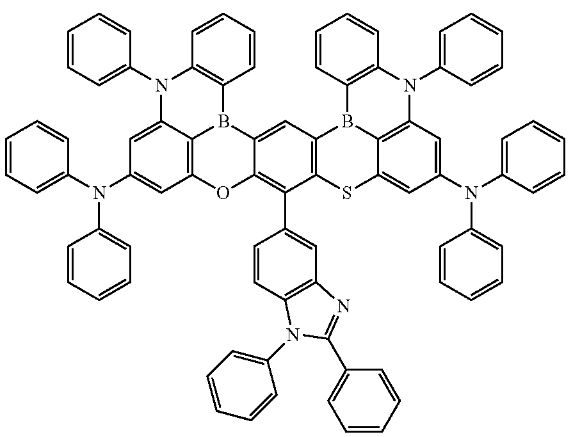
56
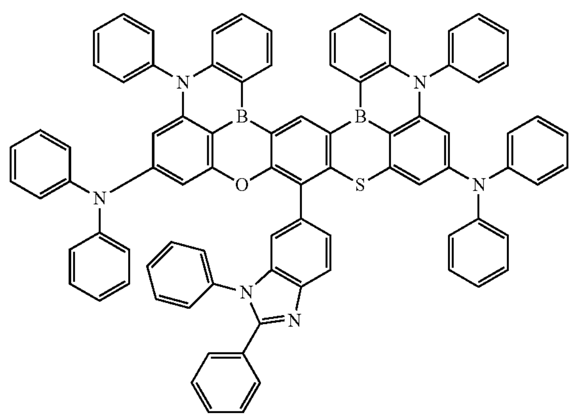
57
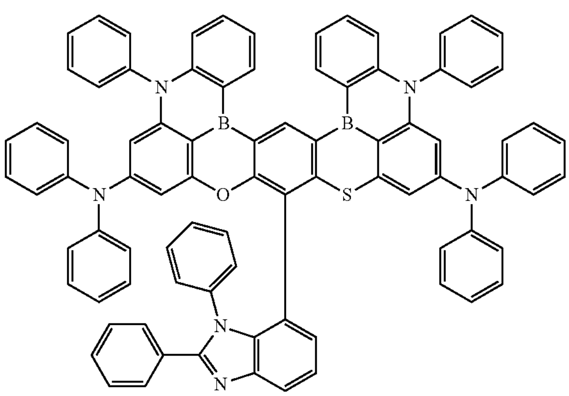
58
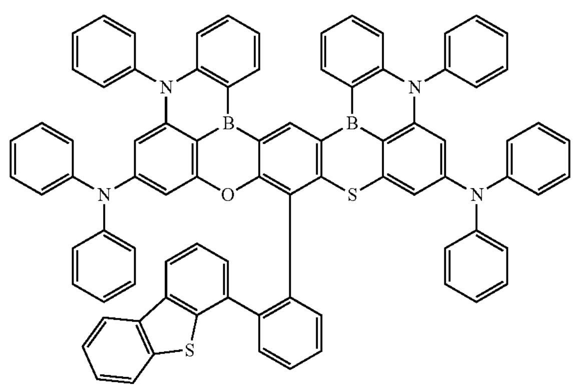

-continued
59
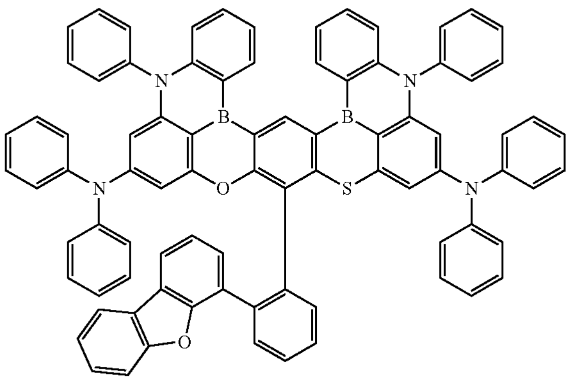
60
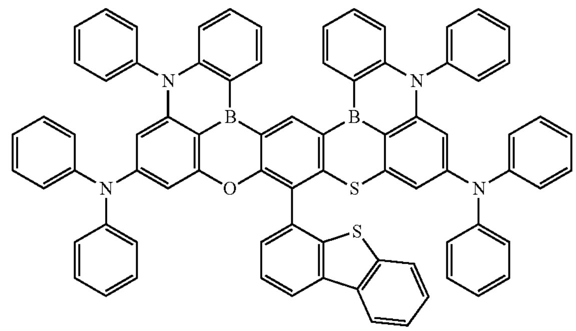
61
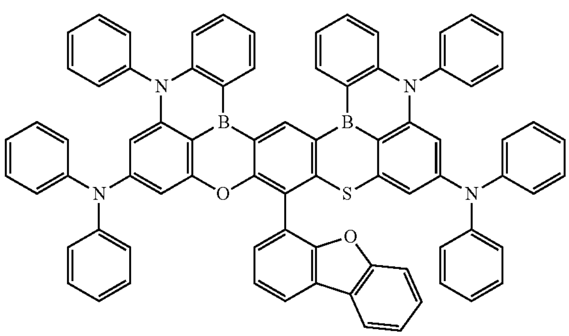
62
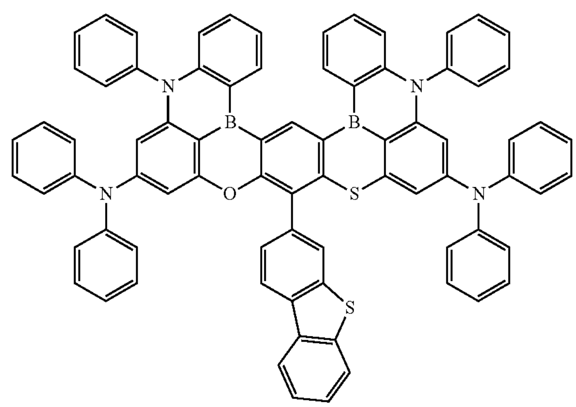
63
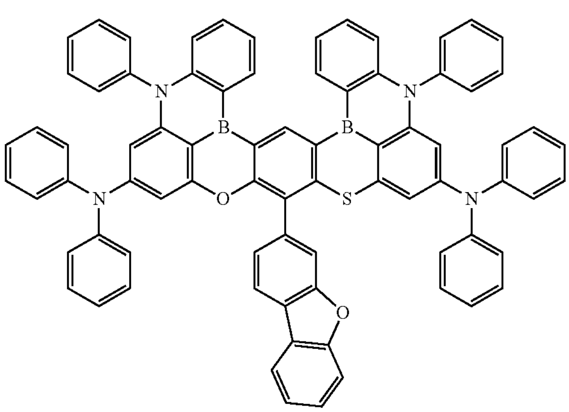
64
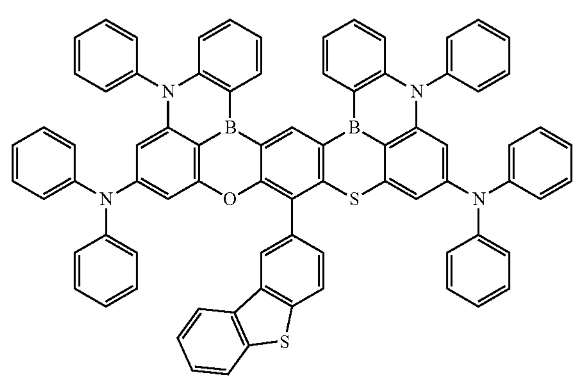
65
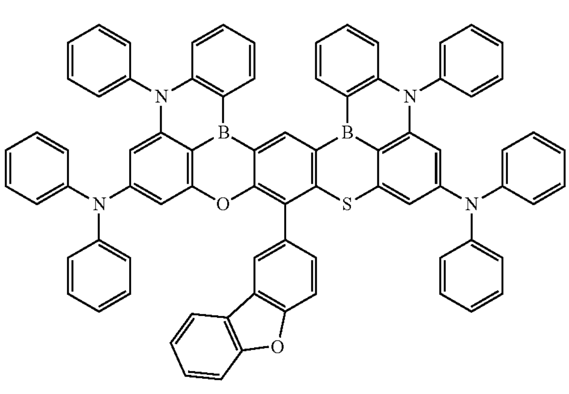
66
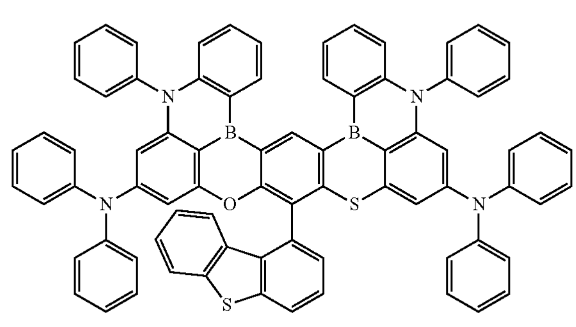

-continued
67
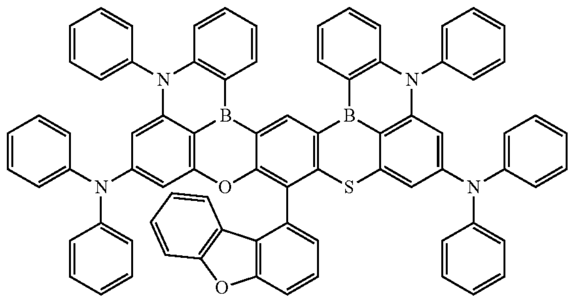
68
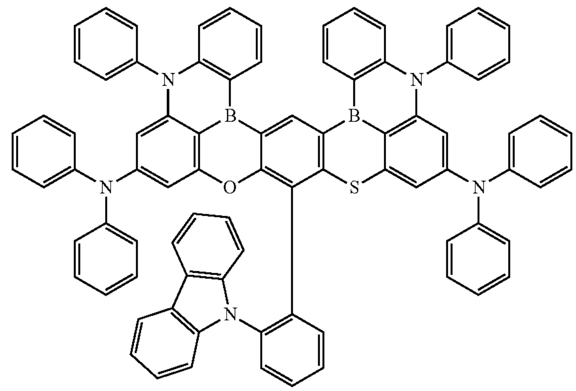
69
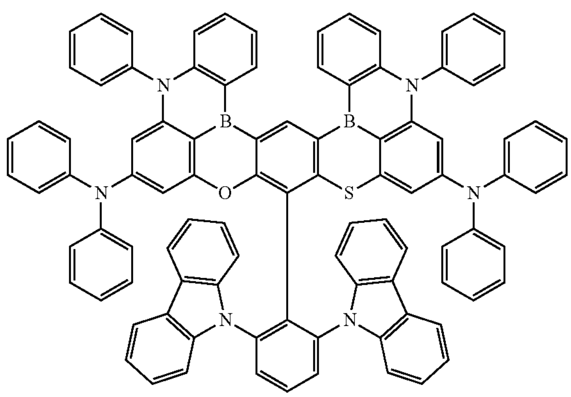
70
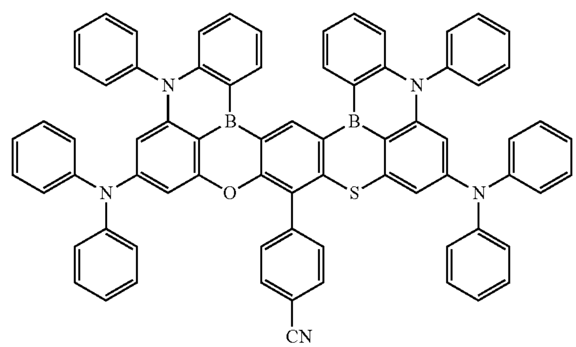
71
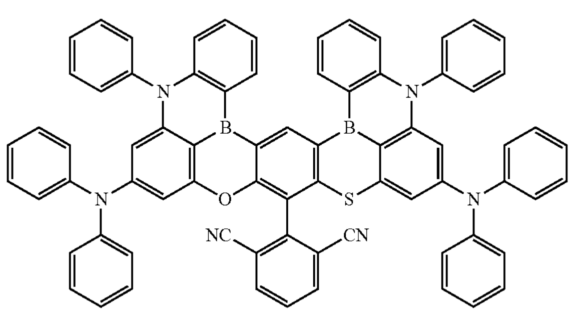
72
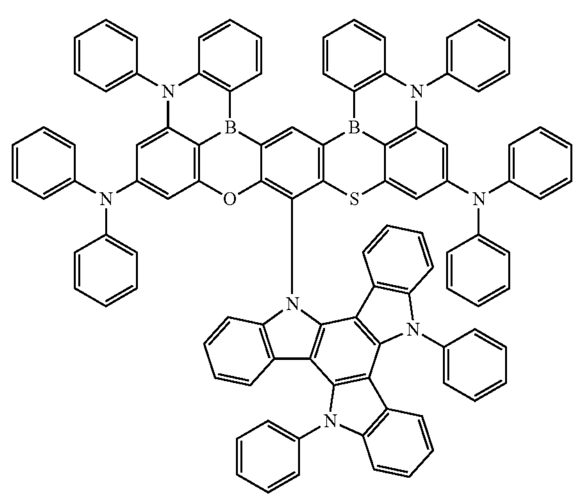

-continued
73
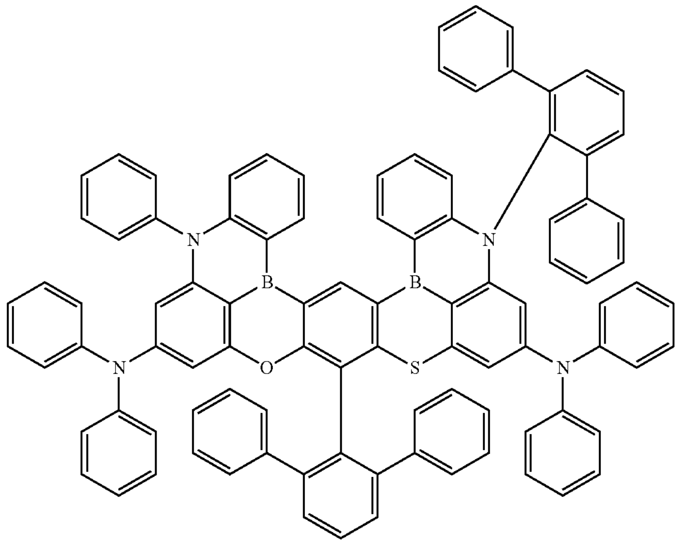
74
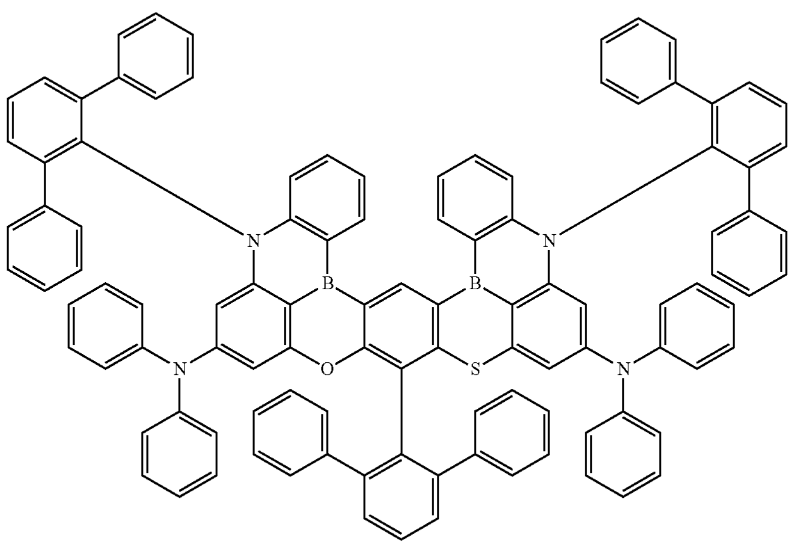
75
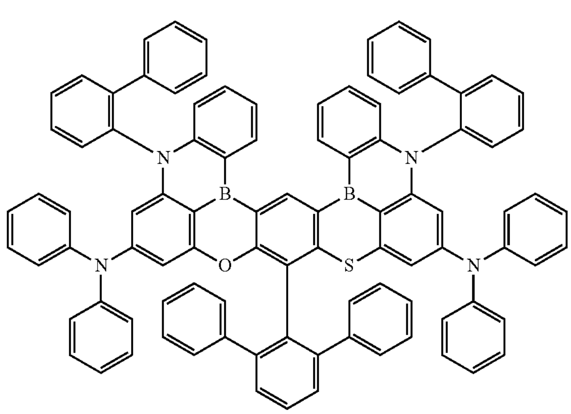
76
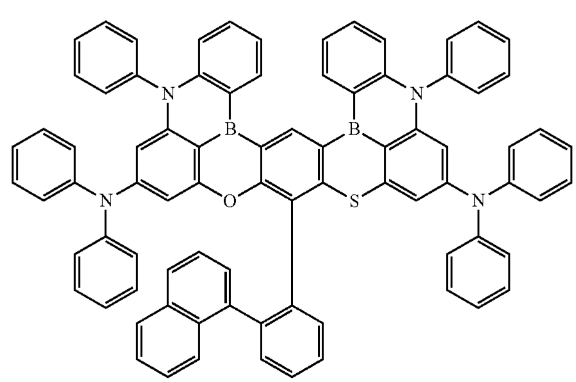

-continued
77
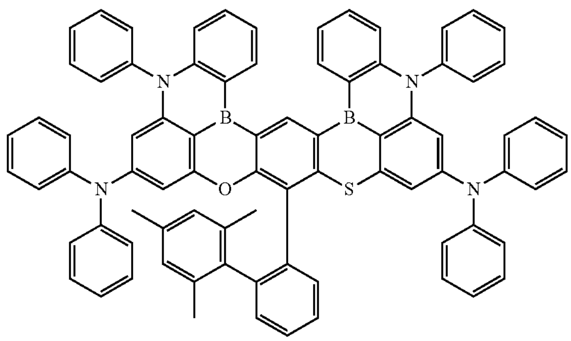
78
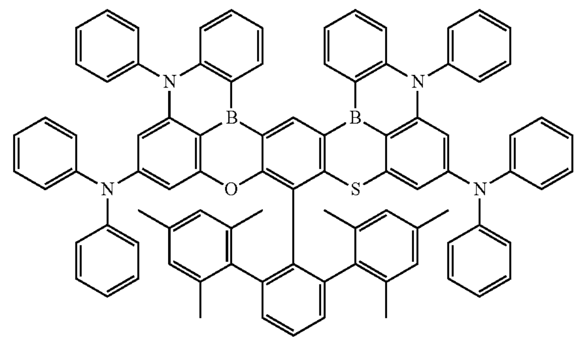
79
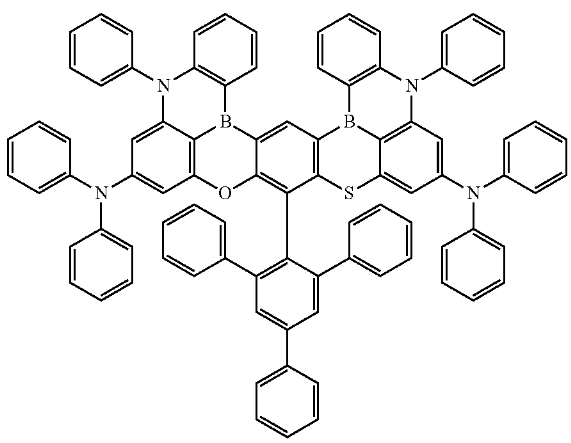
80
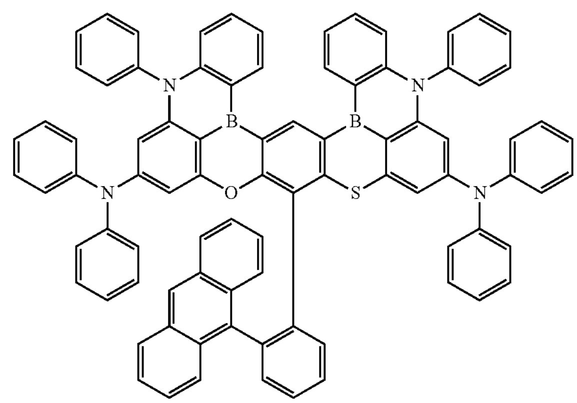
81
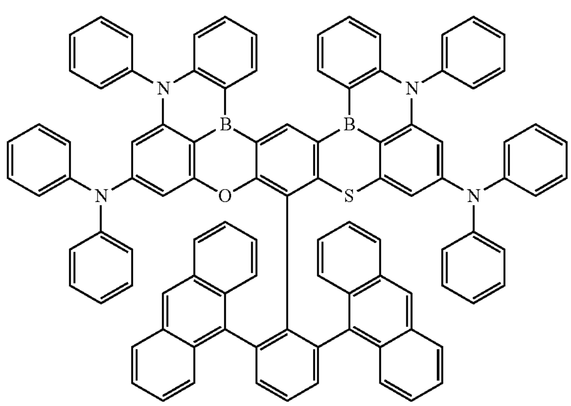
81-1
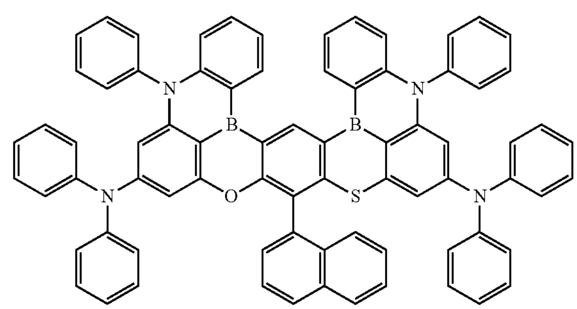
82
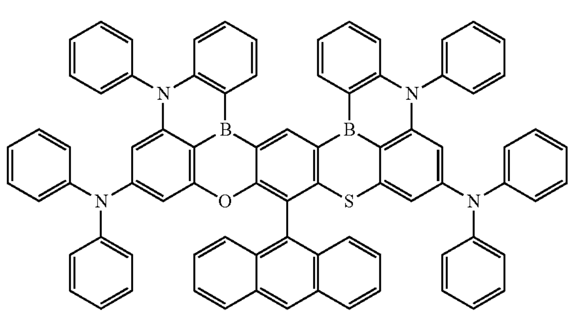
83
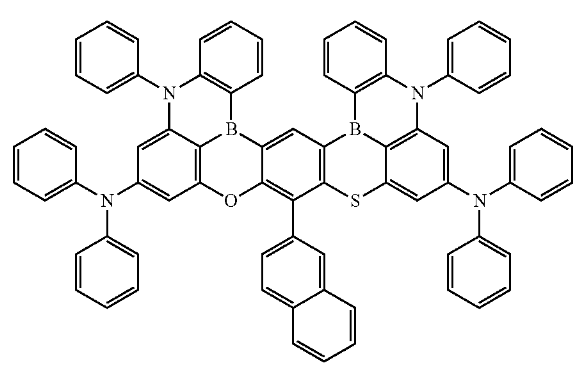

-continued
84
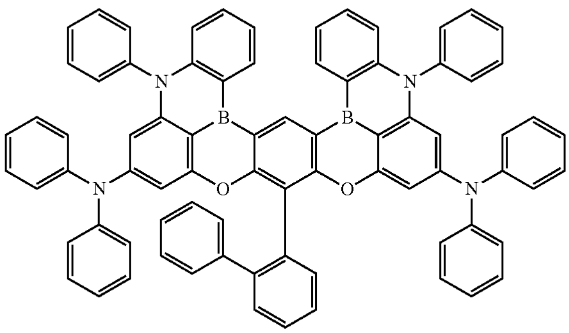
85
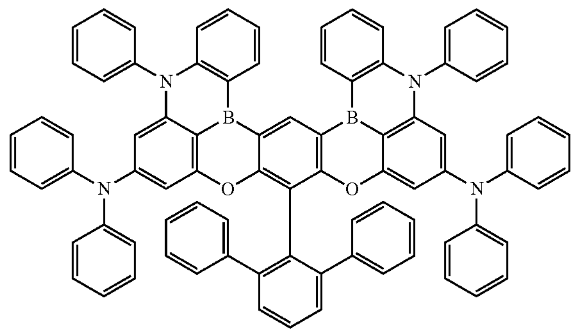
86
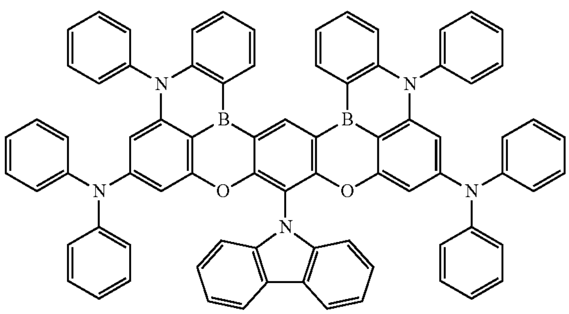
87
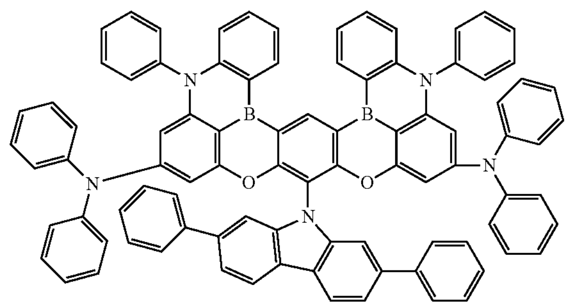
88
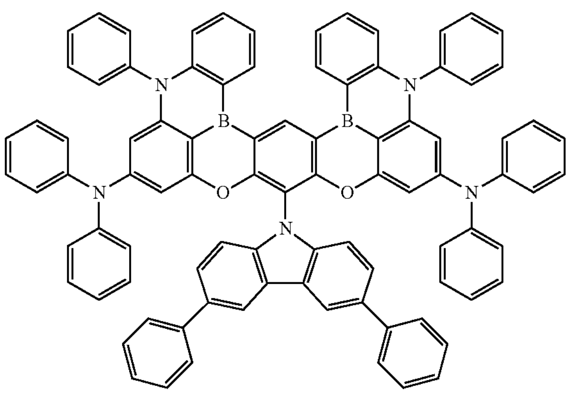
89
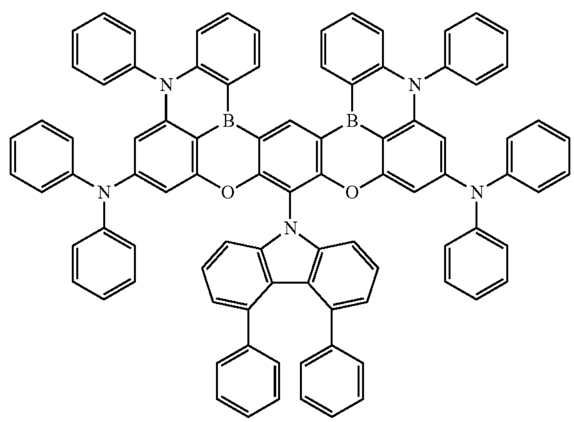
90
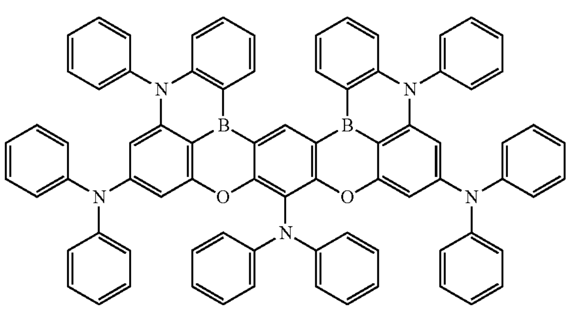
91
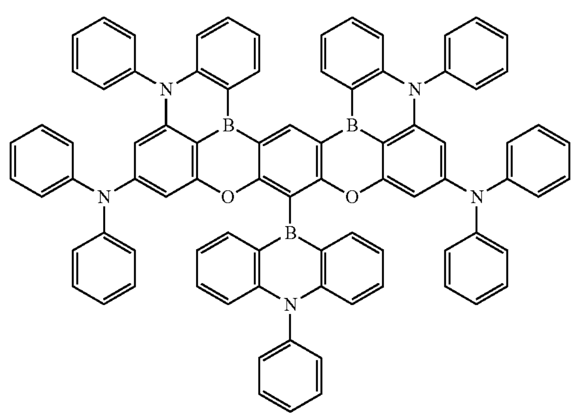

-continued
92
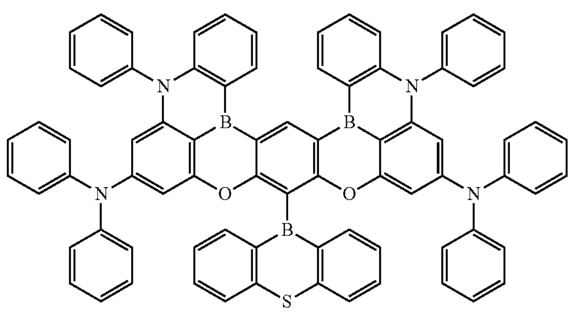
93
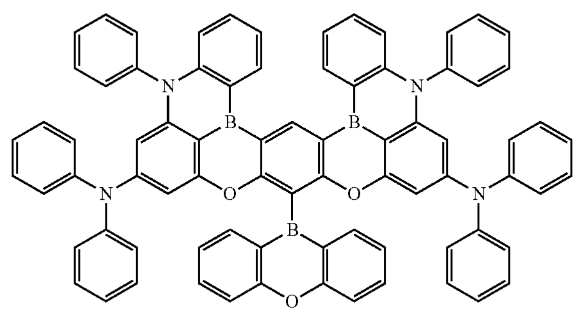
94
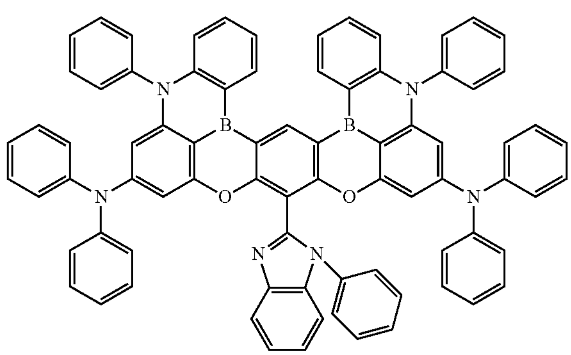
95
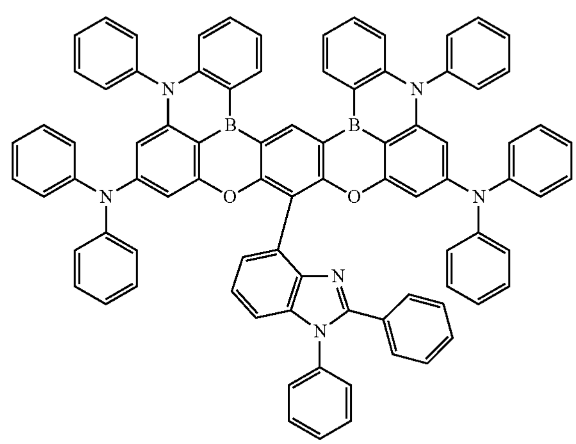
96
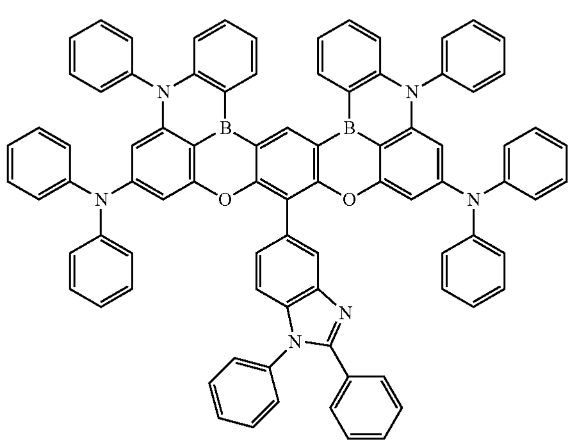
97
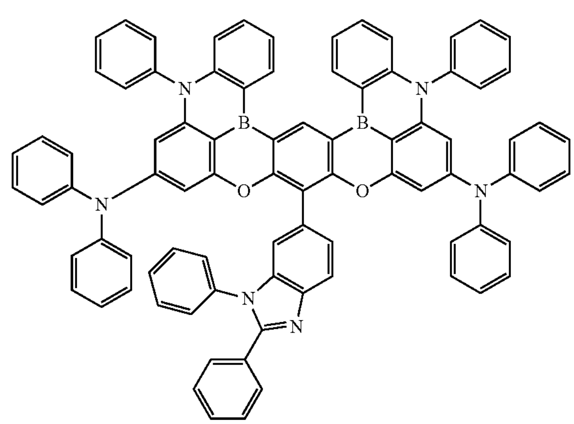
98
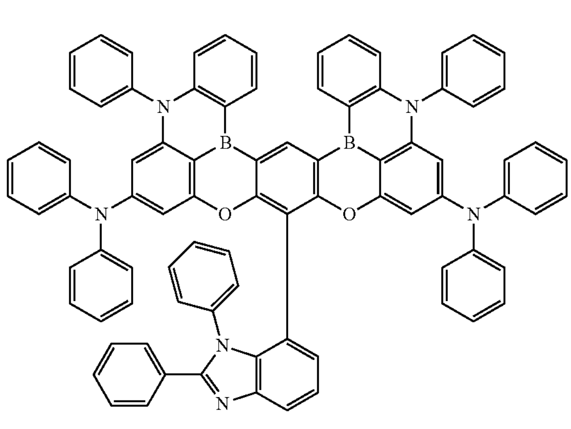
99
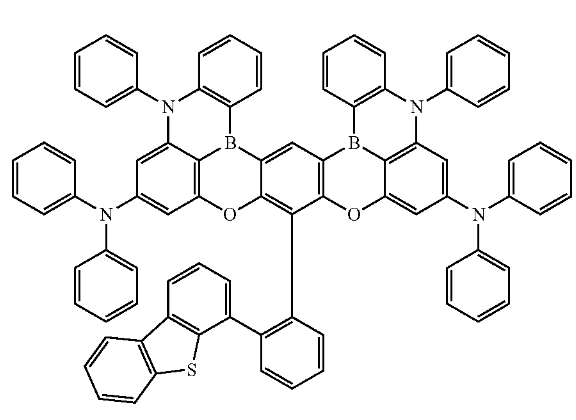

-continued
100
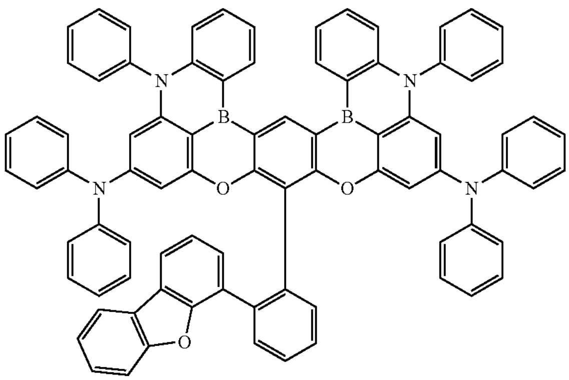
101
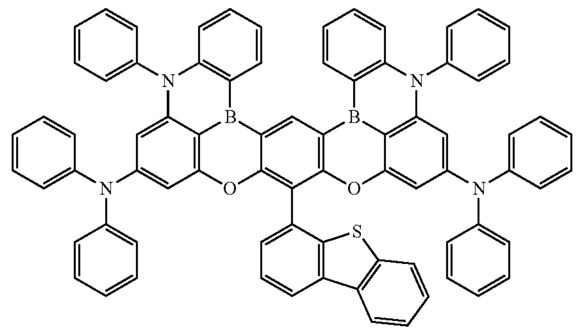
102
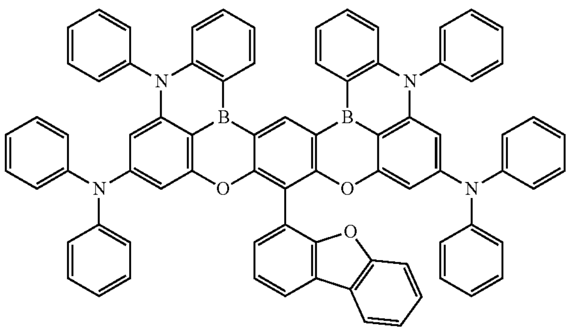
103
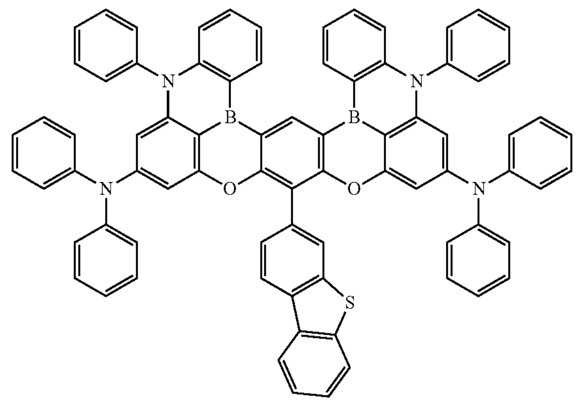
104
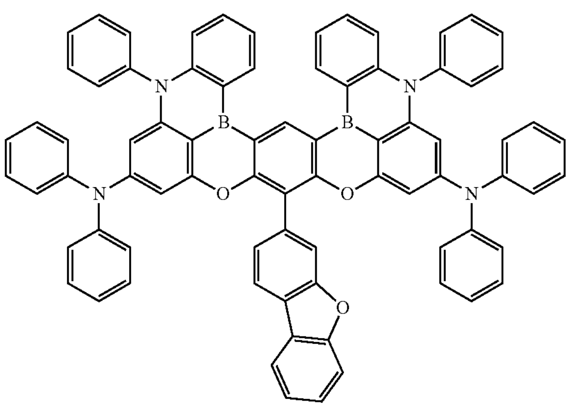
105
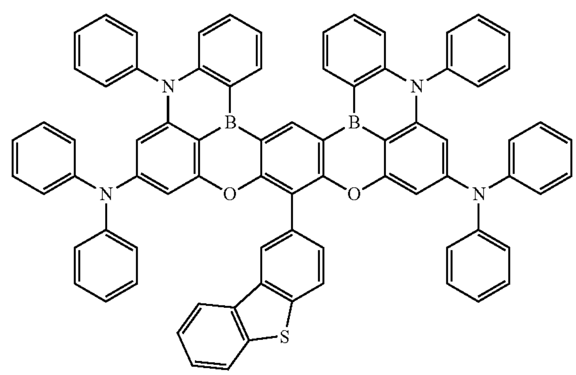
106
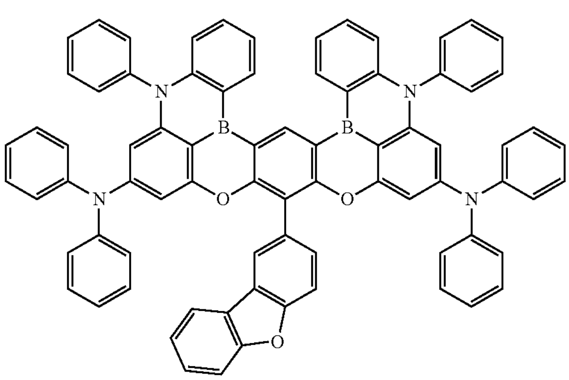
107
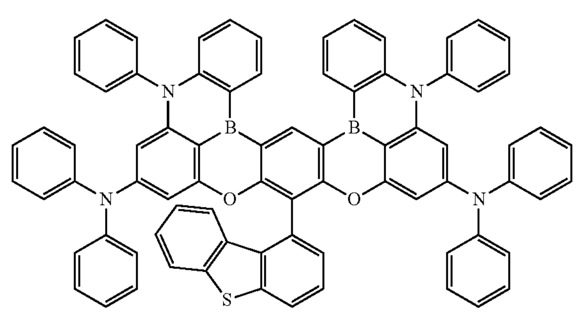

-continued
108
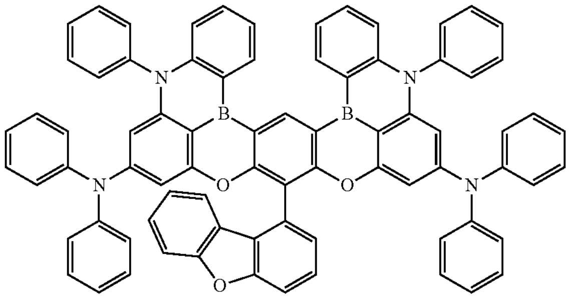
109
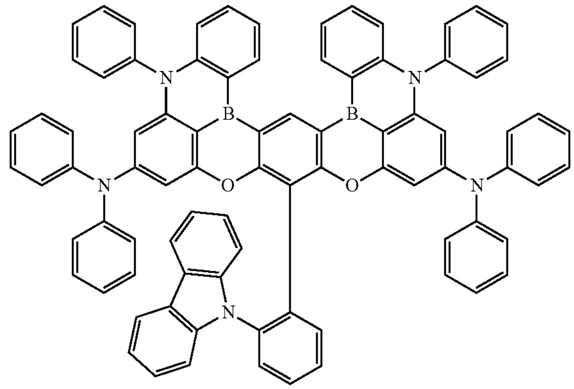
110
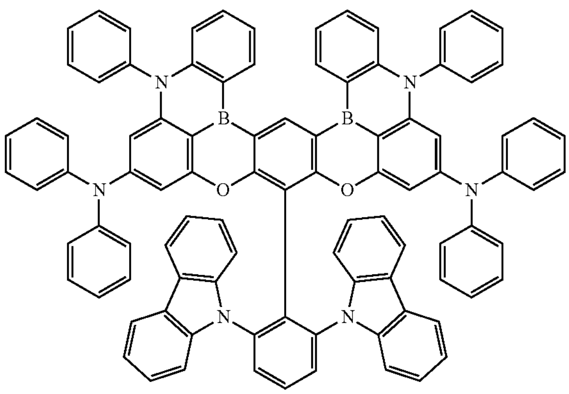
111
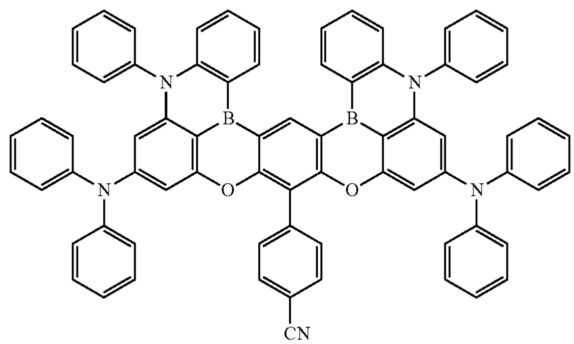
112
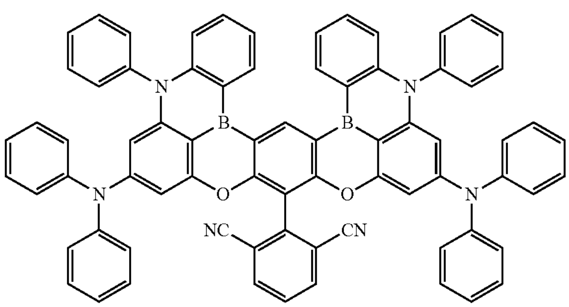
113
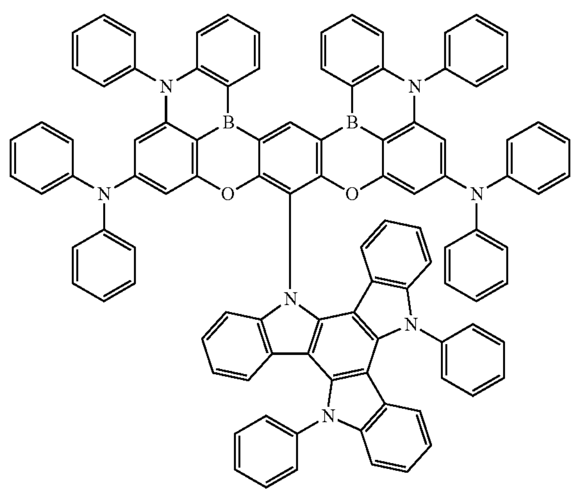

-continued
114
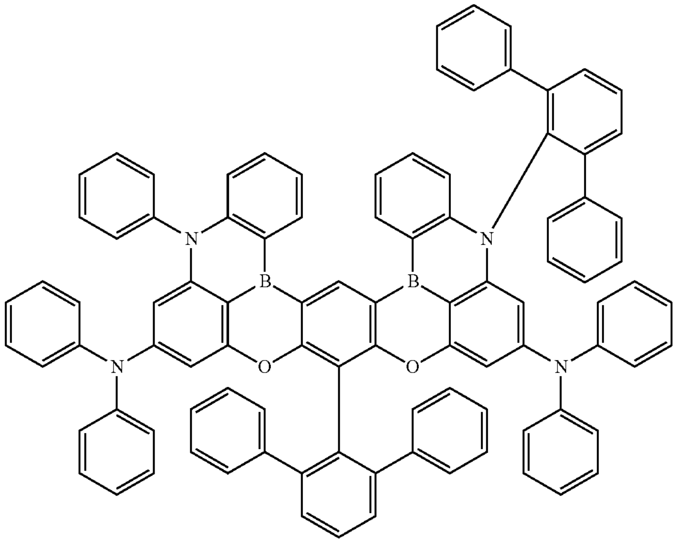
115
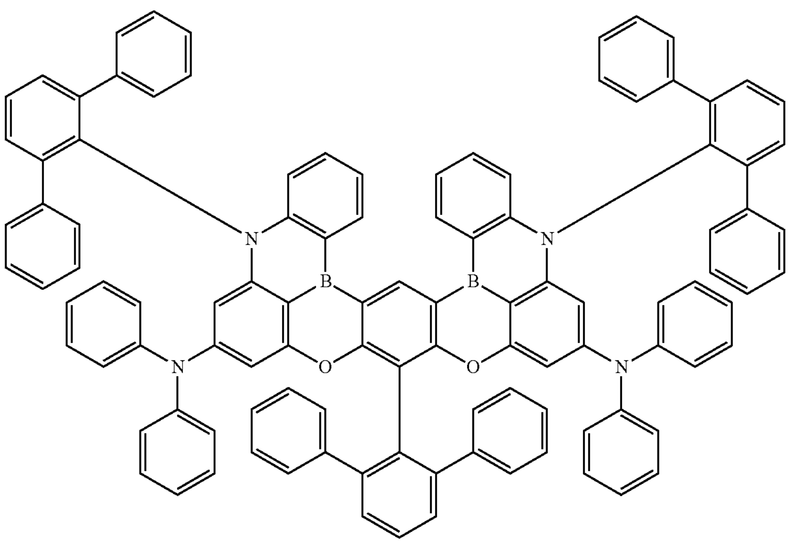
116
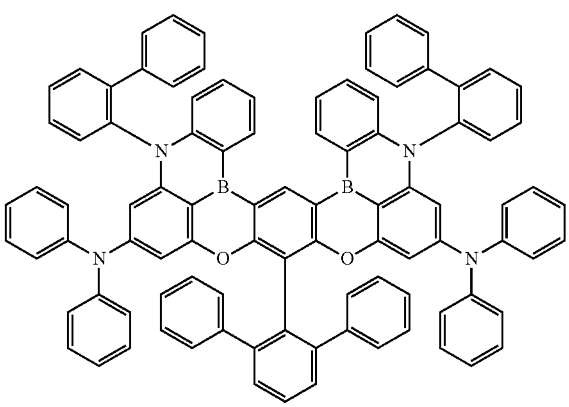
117
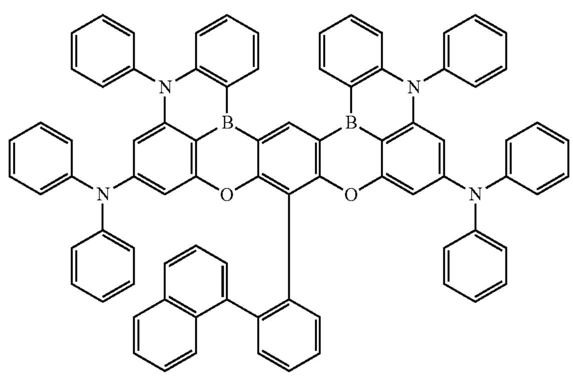

-continued
118
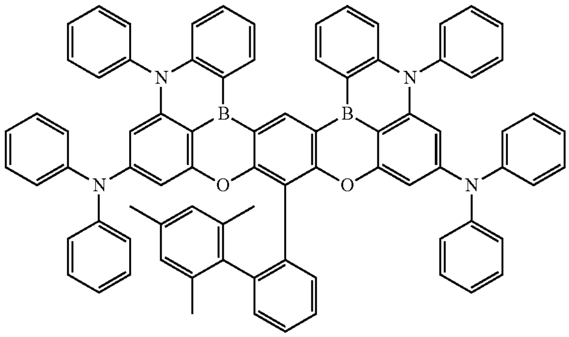
119
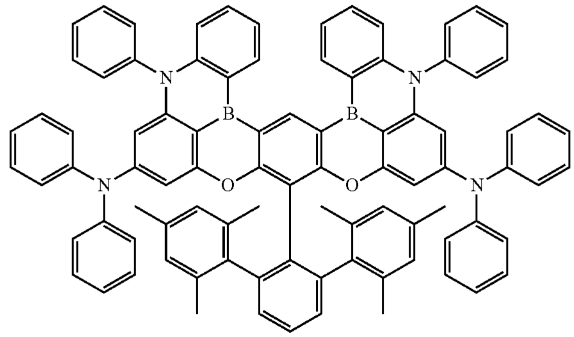
120
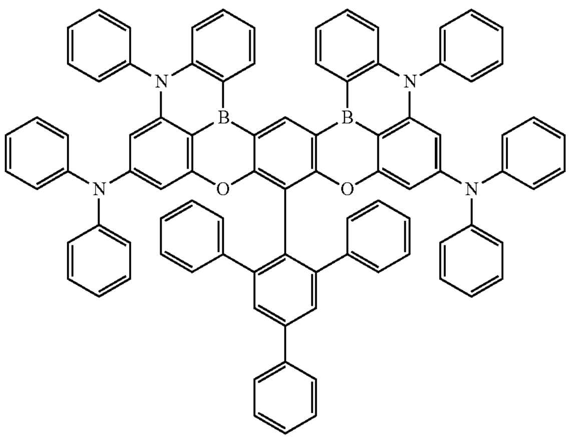
121
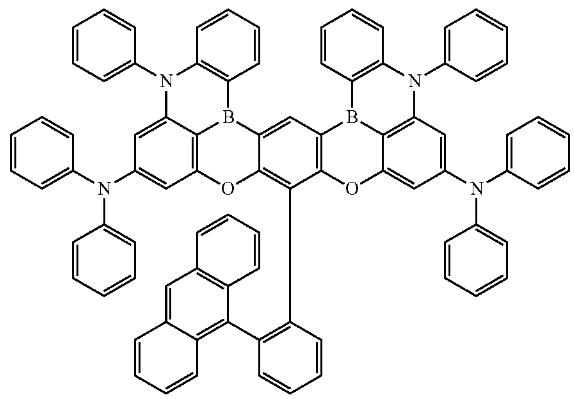
122
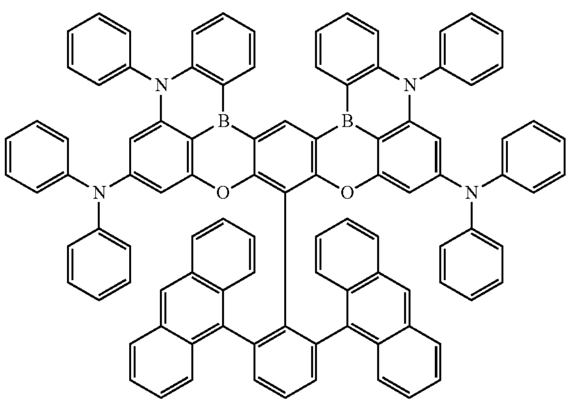
123
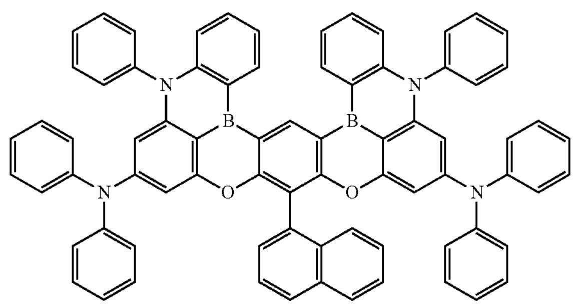
124
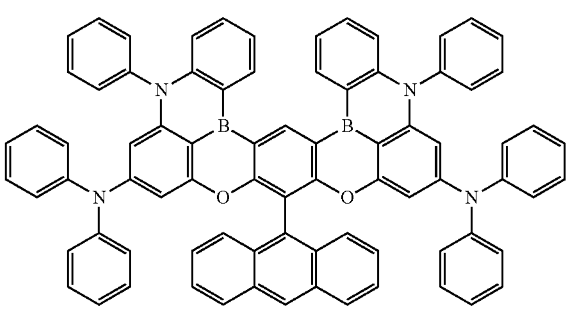
125
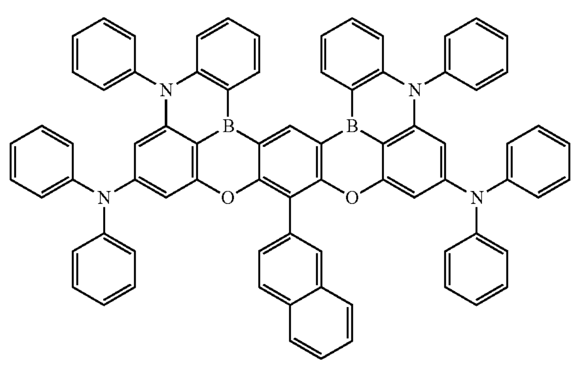

-continued
126
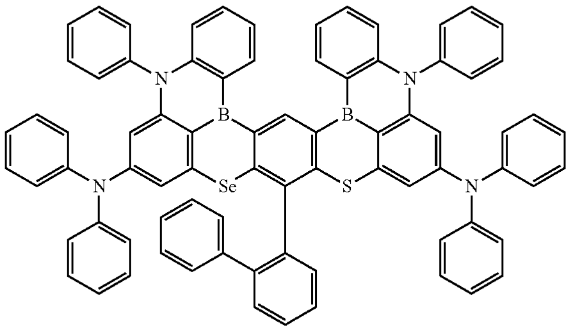
127
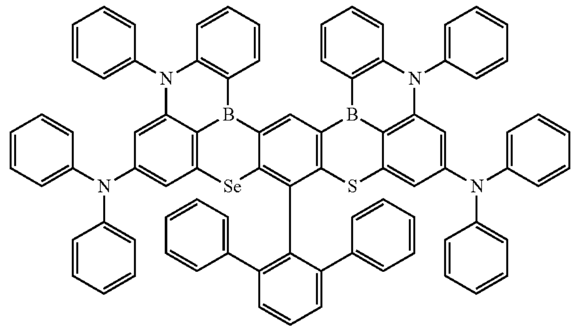
128
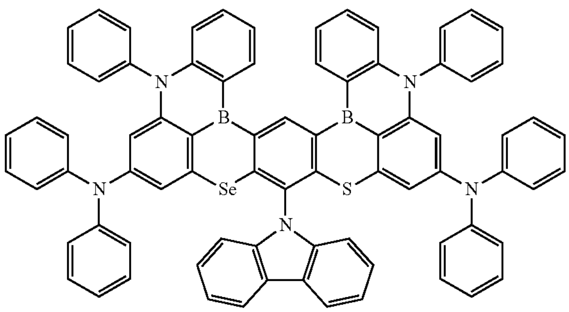
129
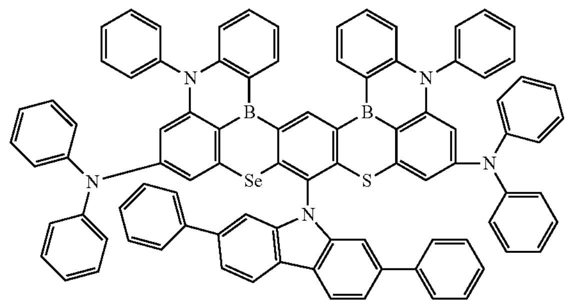
130
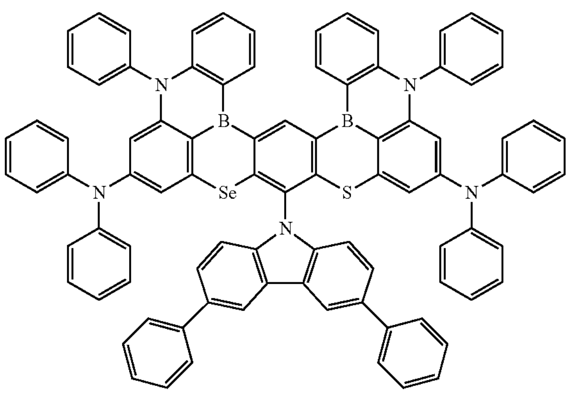
131
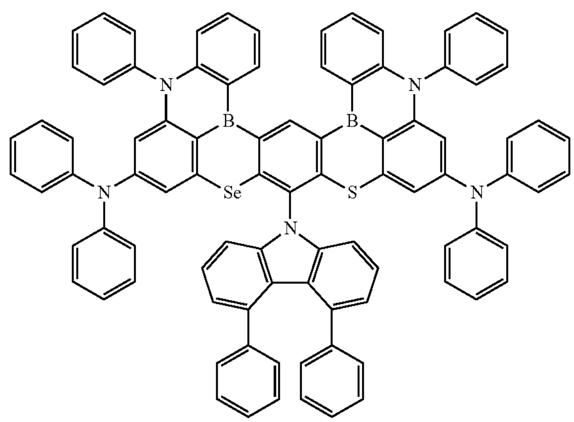
132
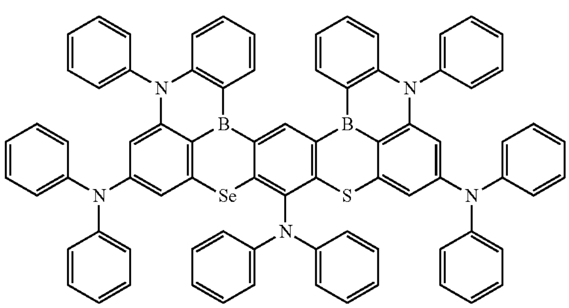
133
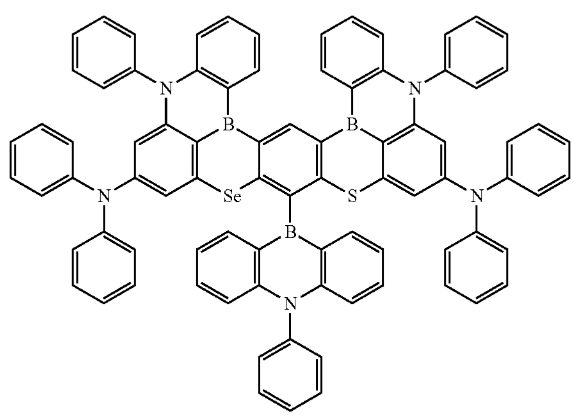

-continued
134
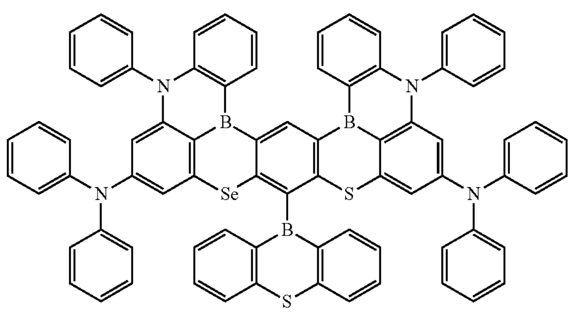
135
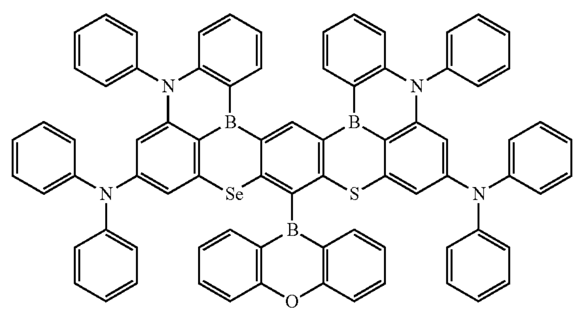
136
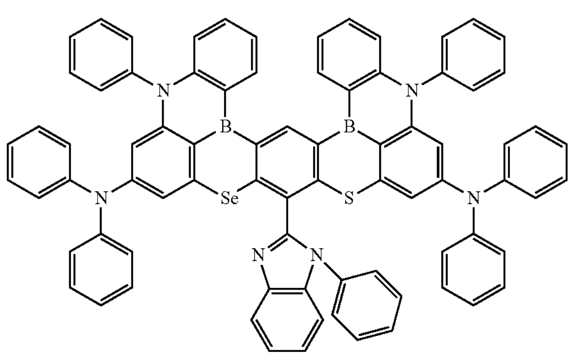
137
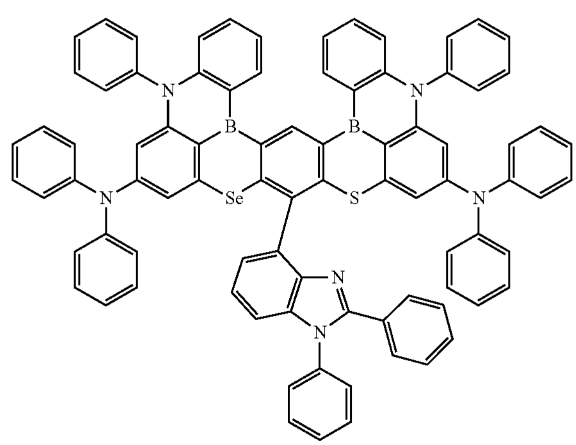
138
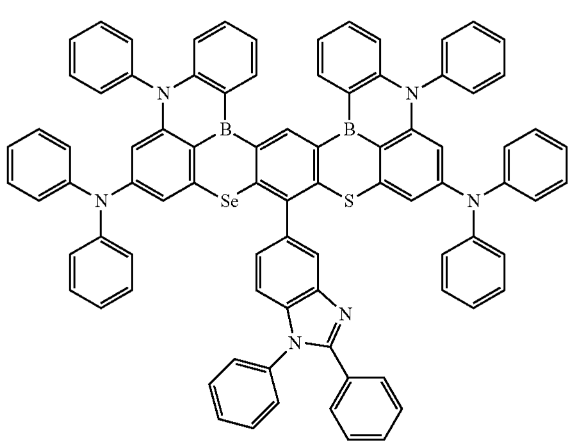
139
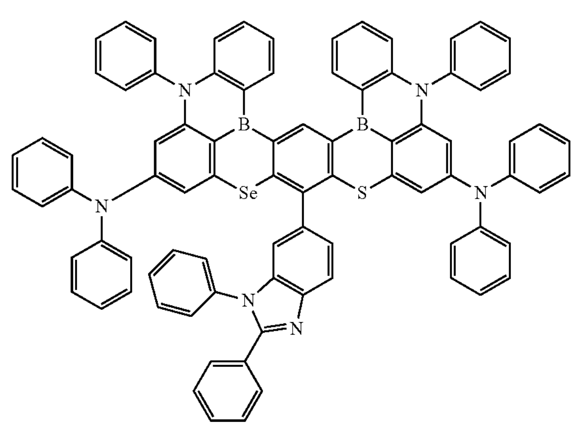
140
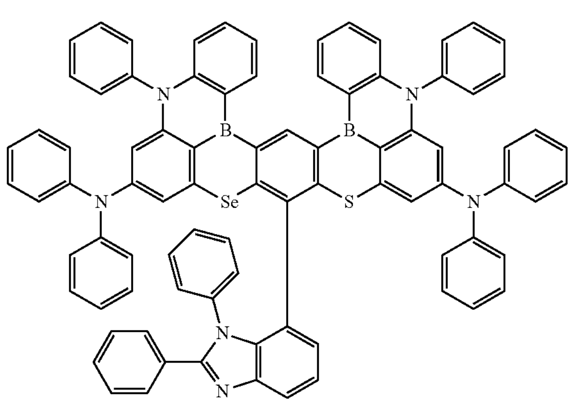
141
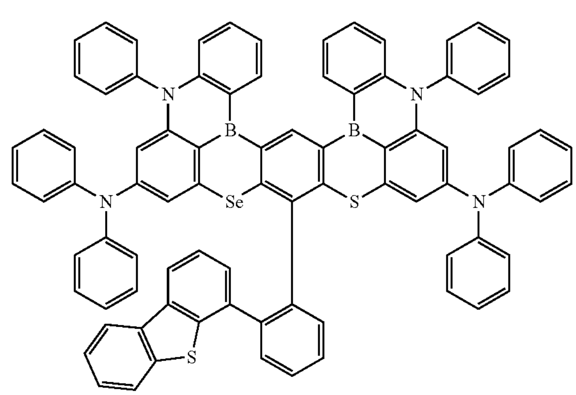

-continued
142
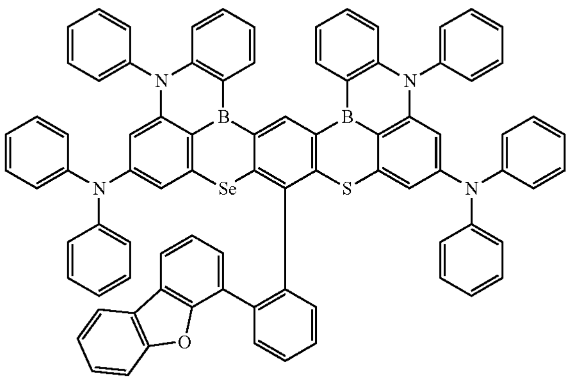
143
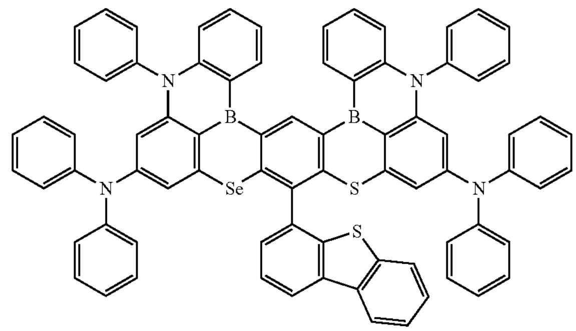
144
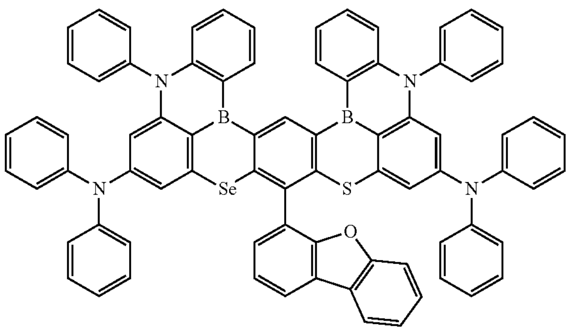
145
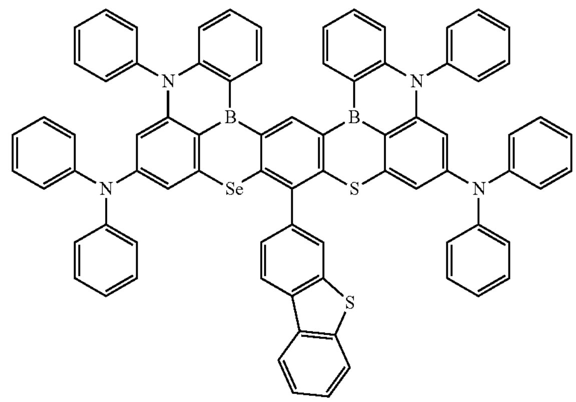
146
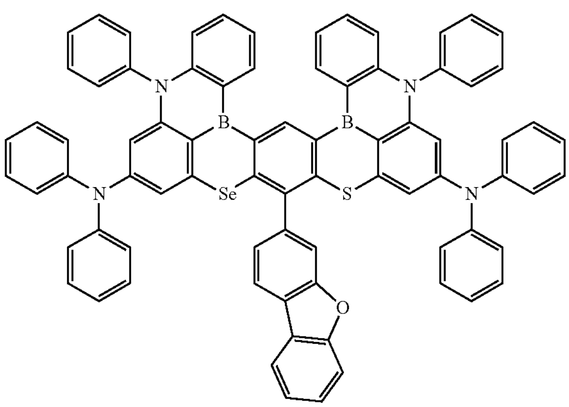
147
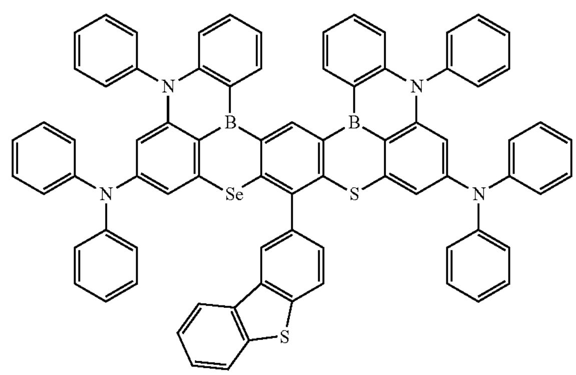
148
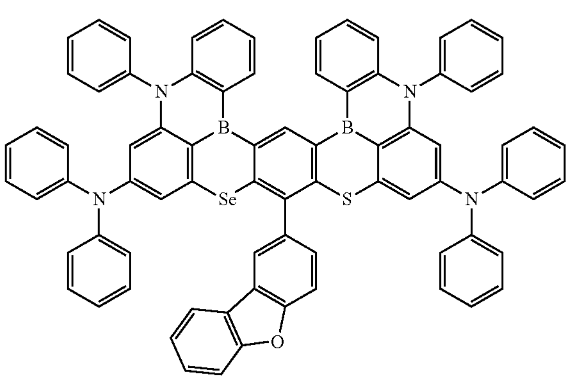
149
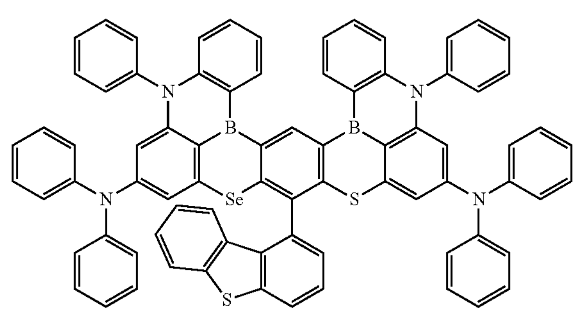

-continued
150
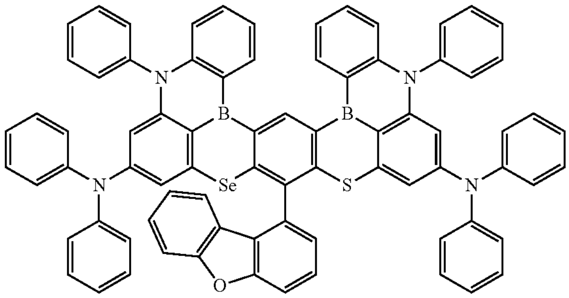
151
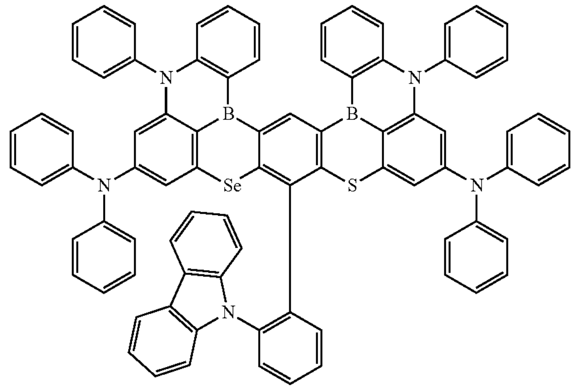
152
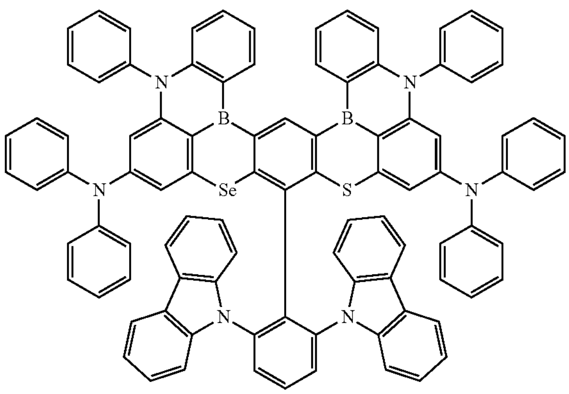
153
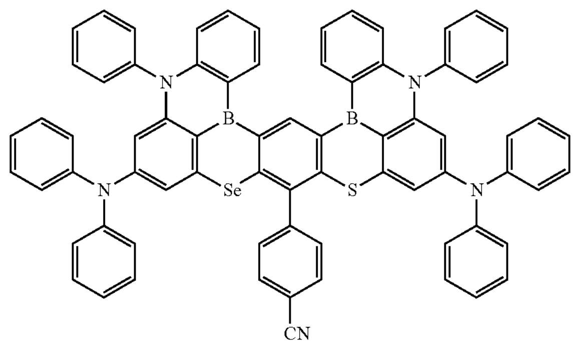
154
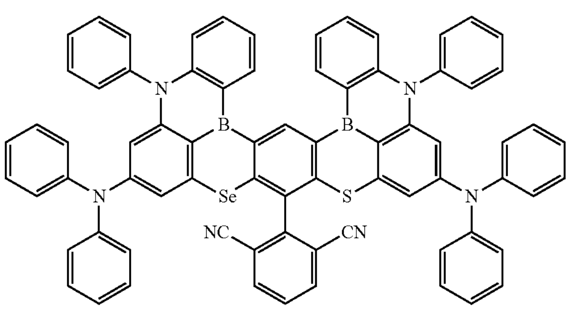
155
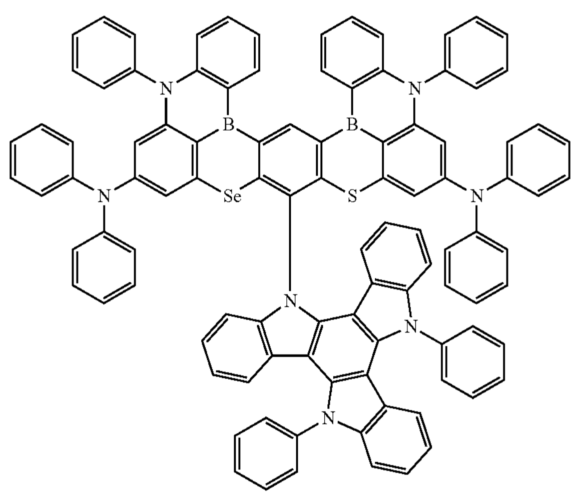

-continued
156
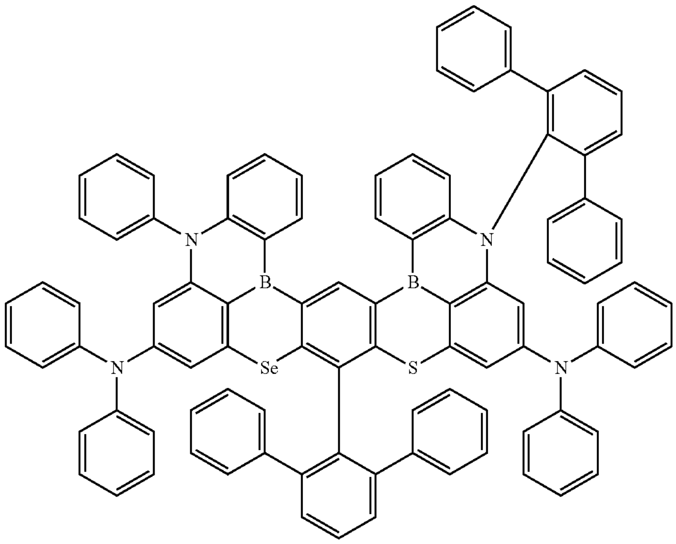
157
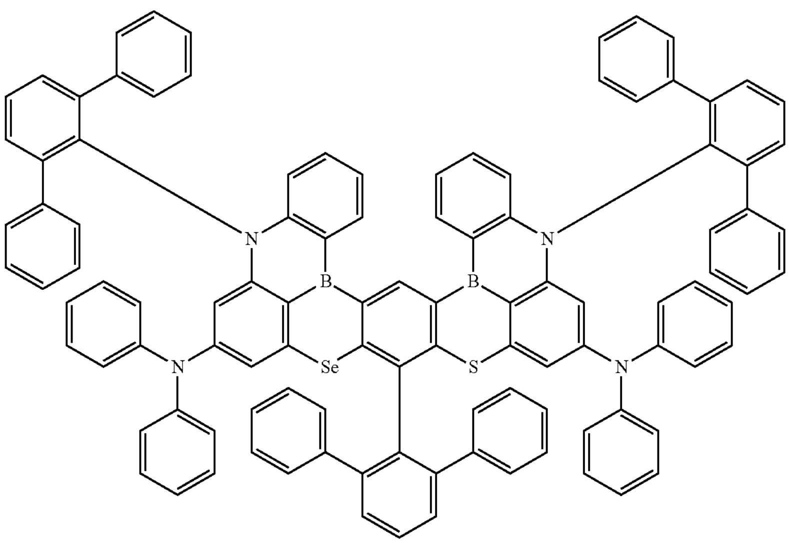
158
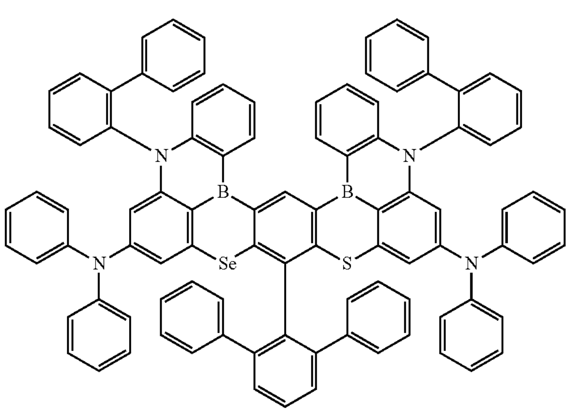
159
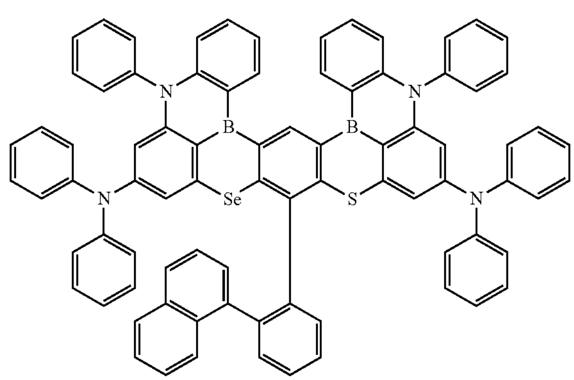

-continued
160
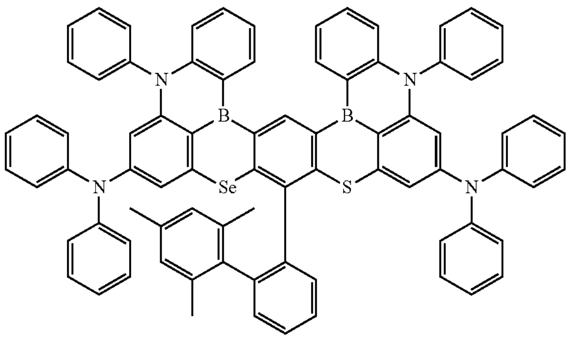
161
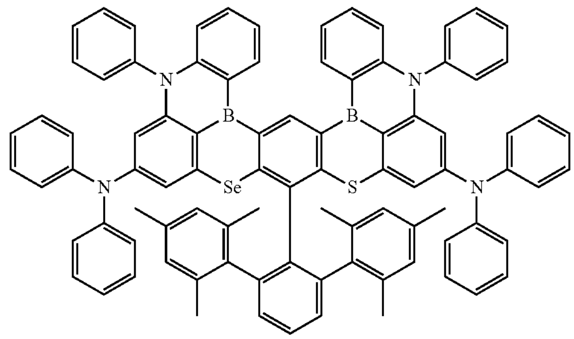
162
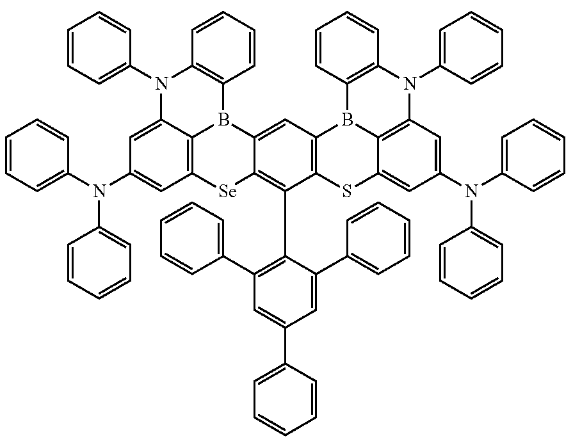
163
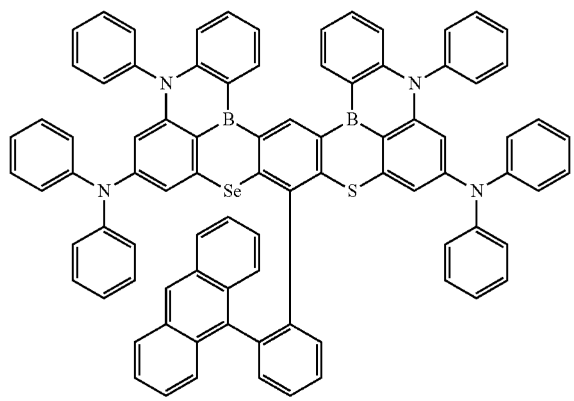
164
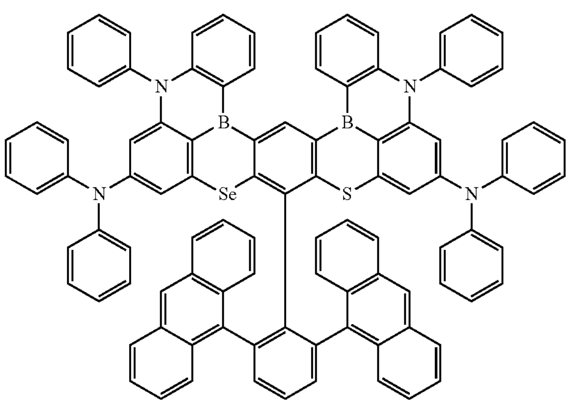
165
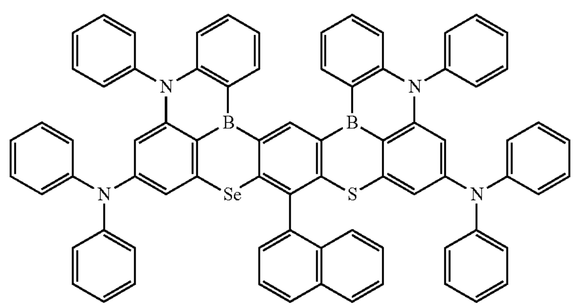
166
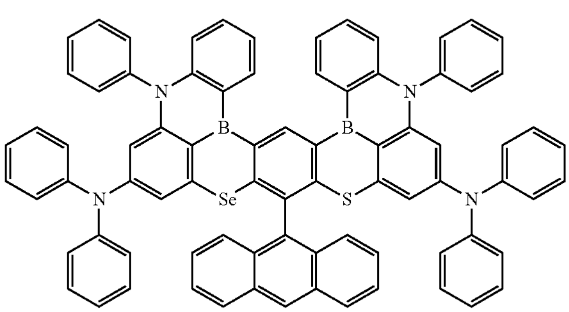
167
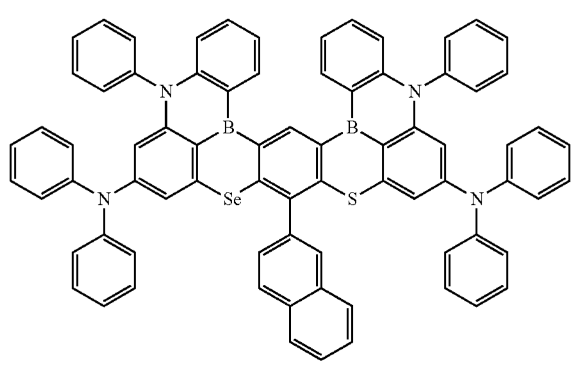

-continued
168
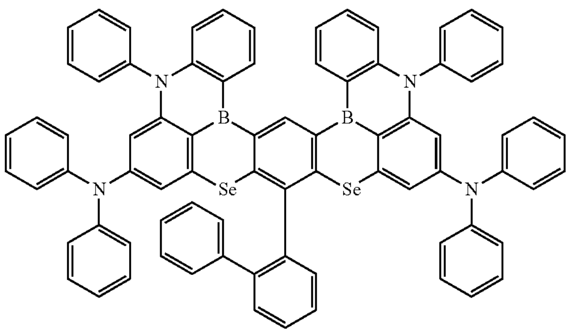
169
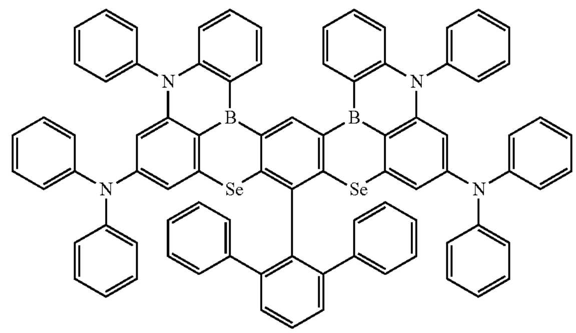
170
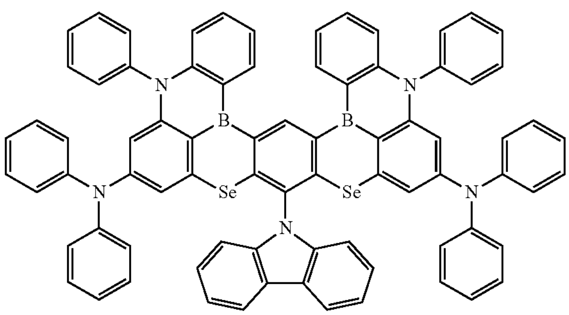
171
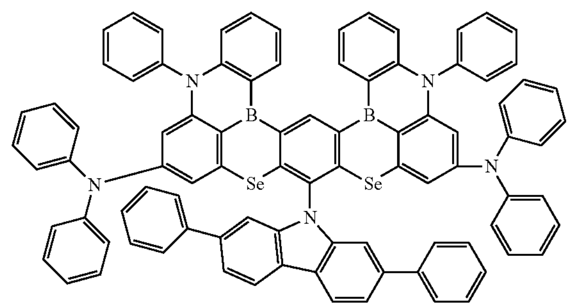
172
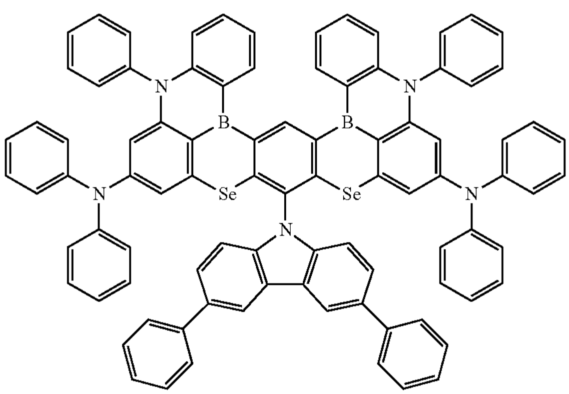
173
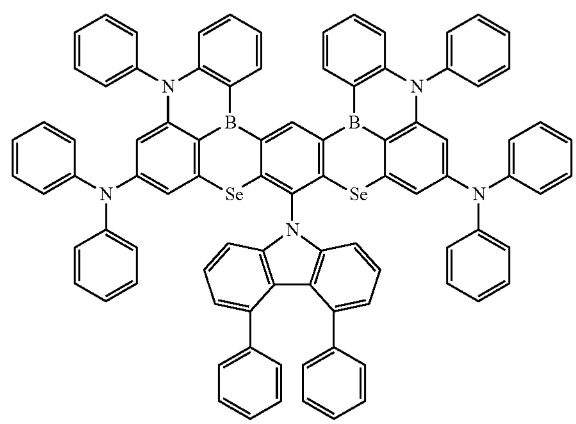
174
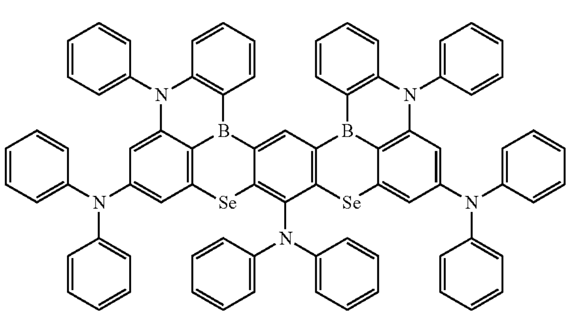
175
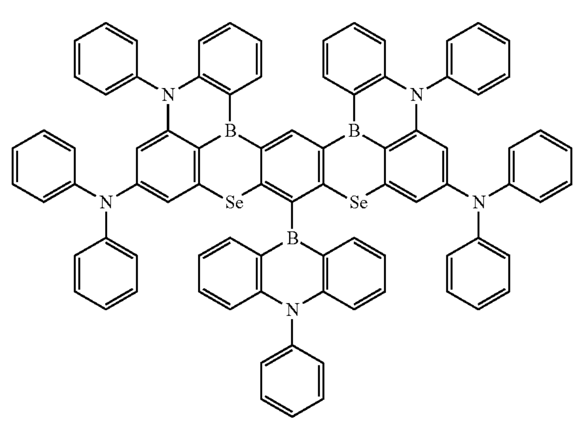

-continued
176
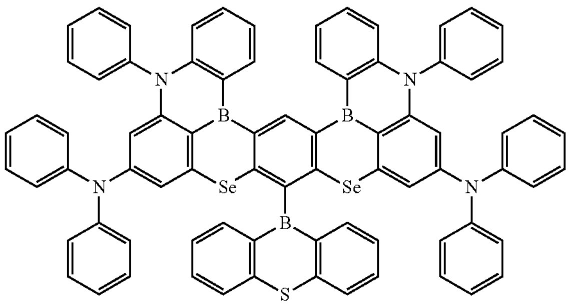
177
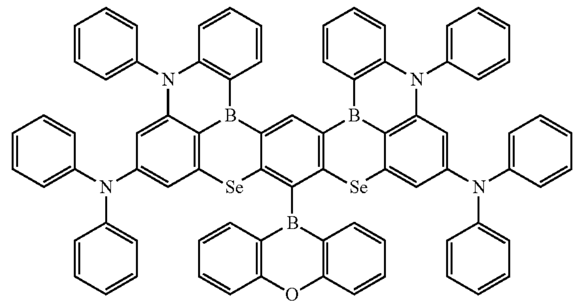
178
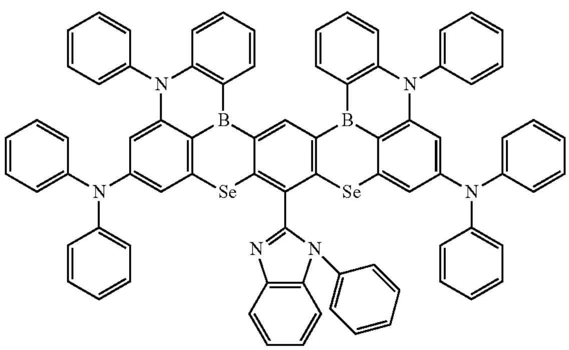
179
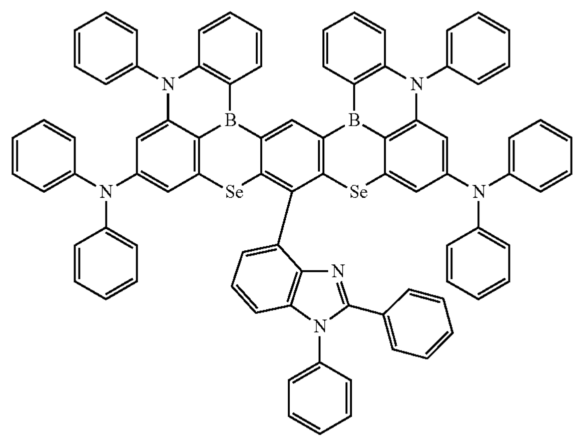
180
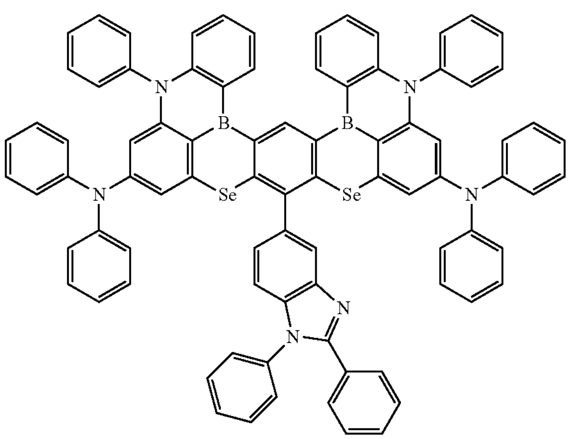
181
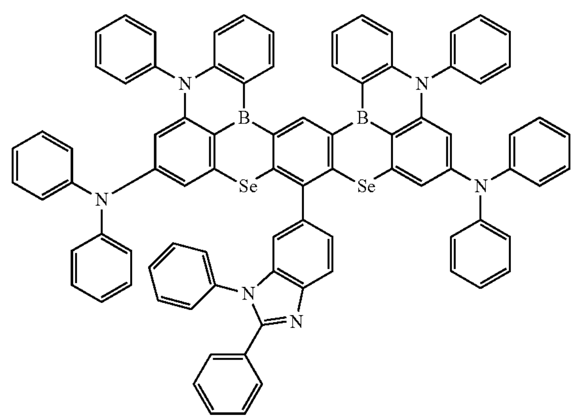
182
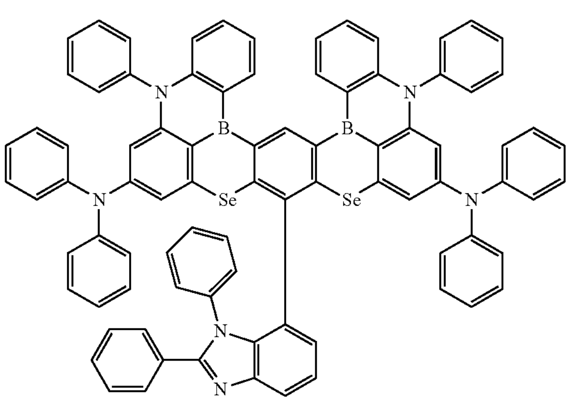
183
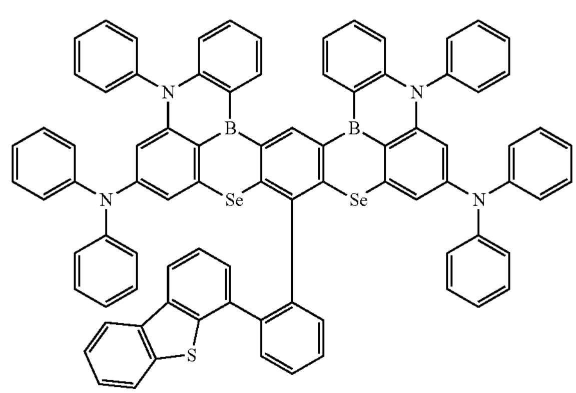

-continued
184
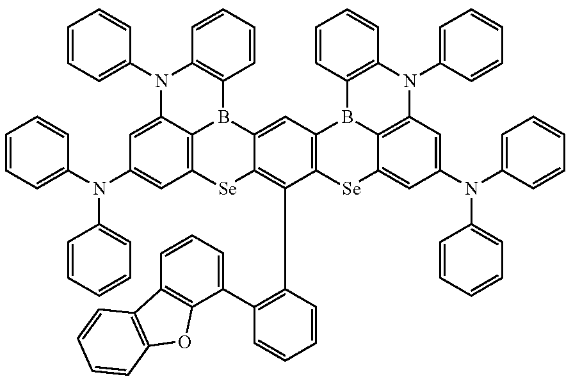
185
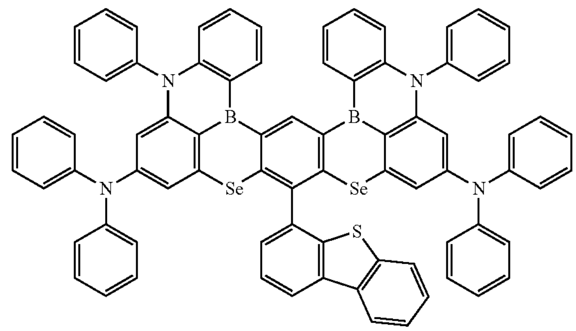
186
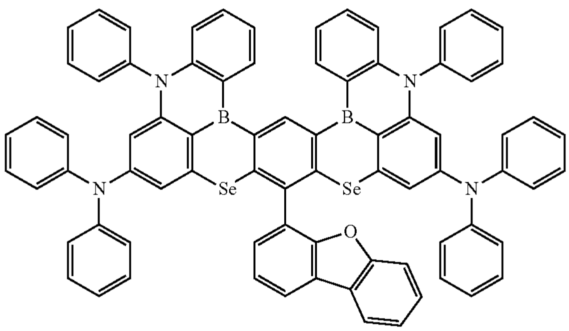
187
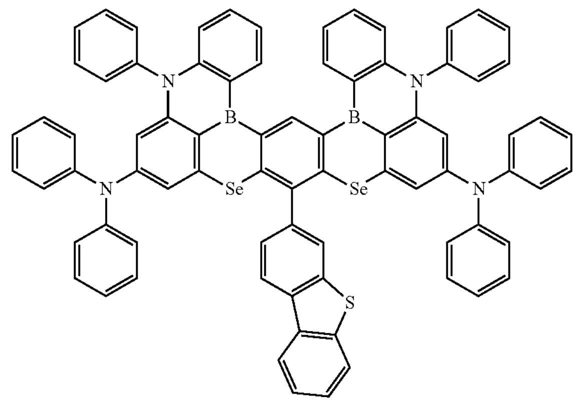
188
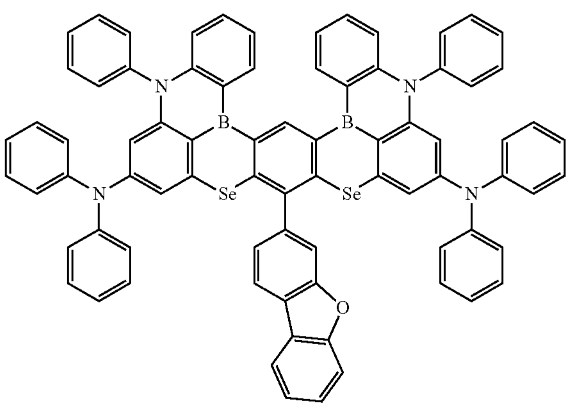
189
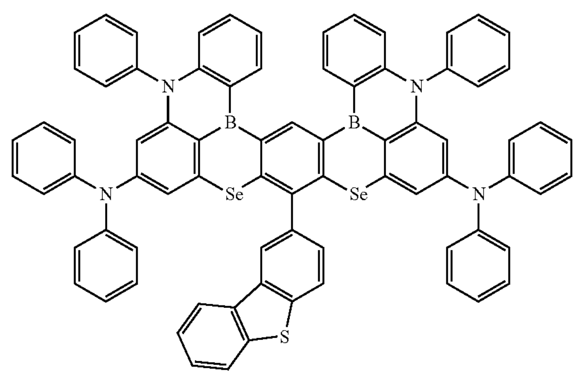
190
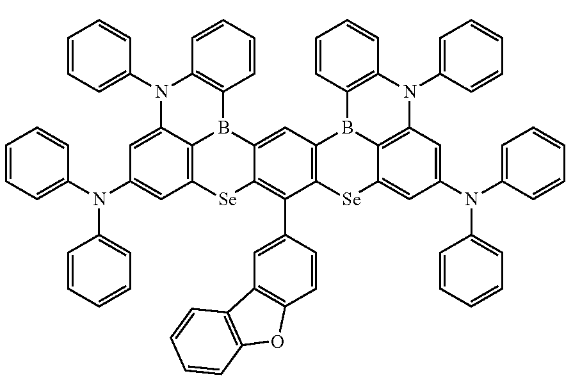
191
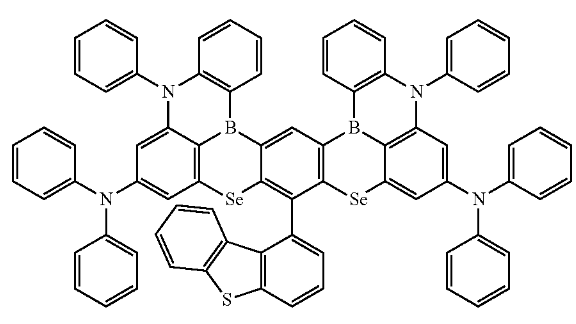

-continued
192
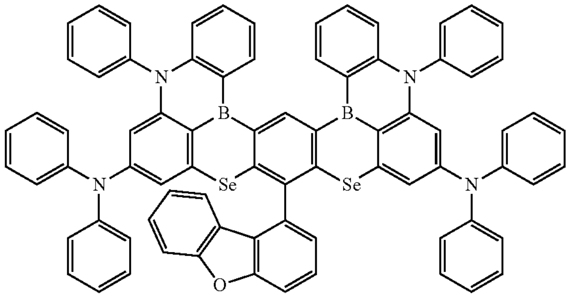
193
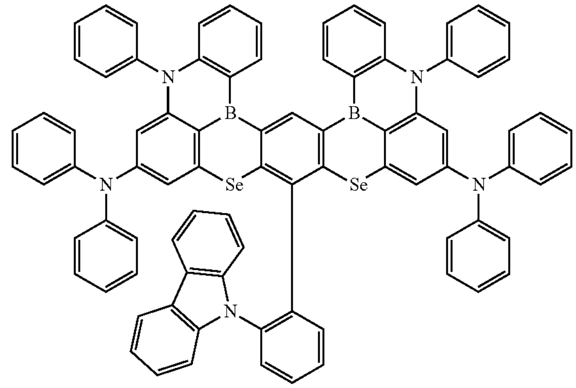
194
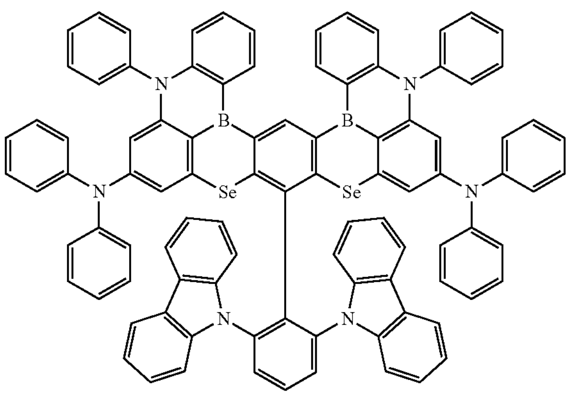
195
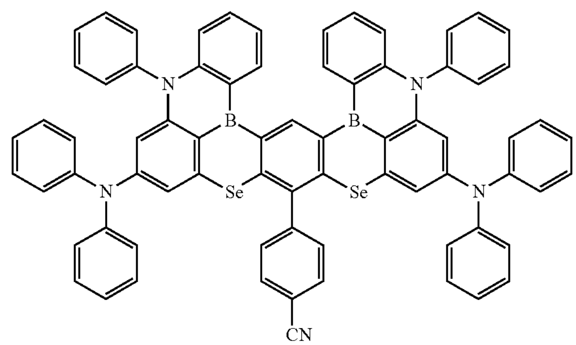
196
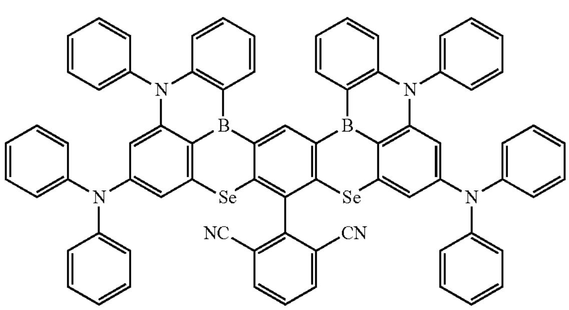
197
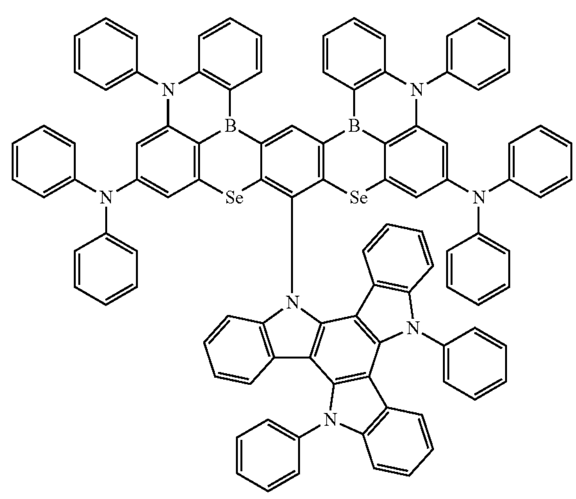

-continued
198
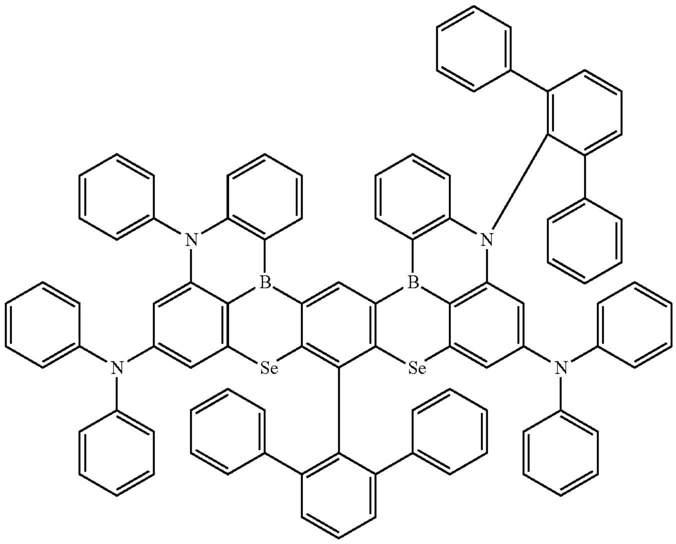
199
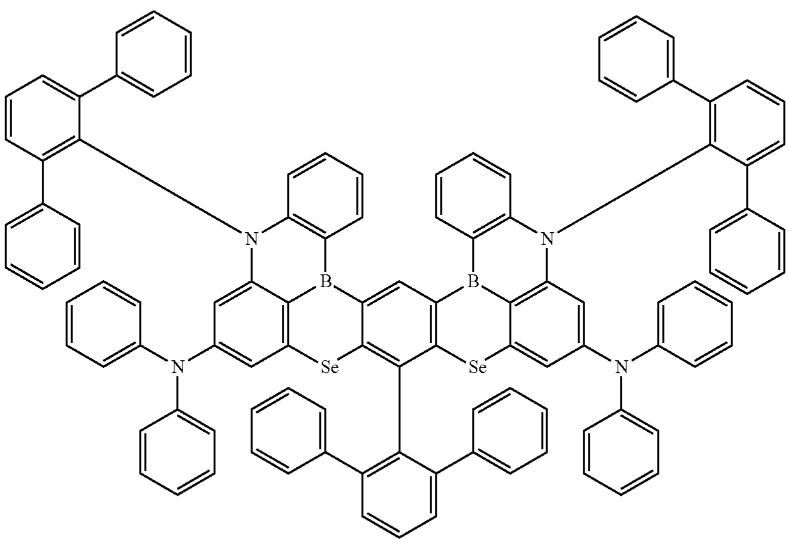
200
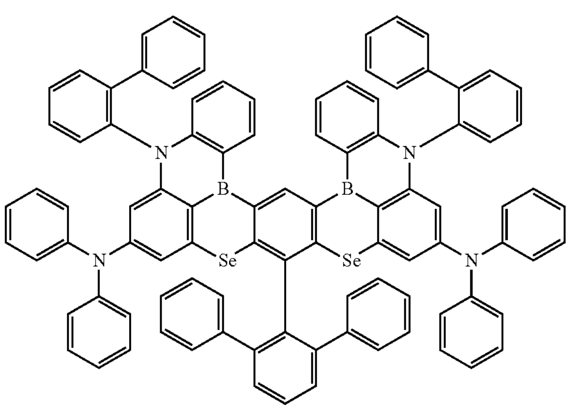
201
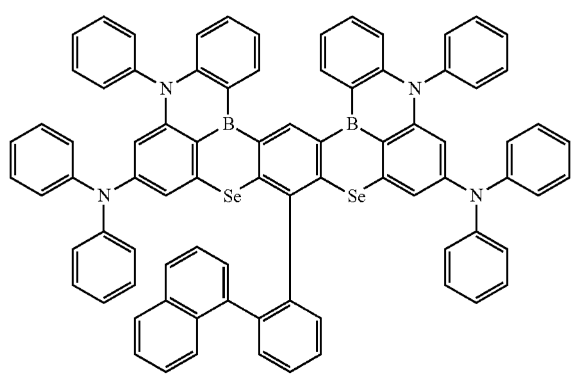

-continued
202
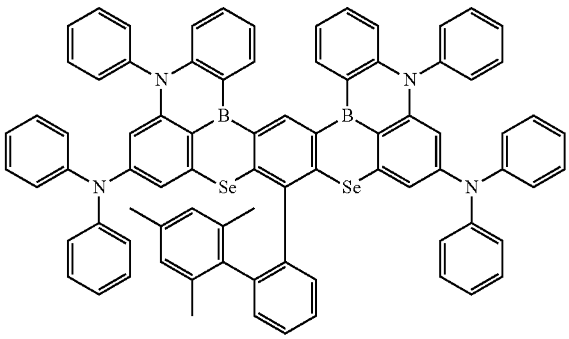
203
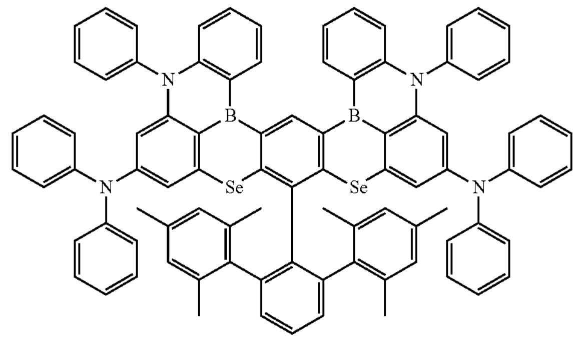
204
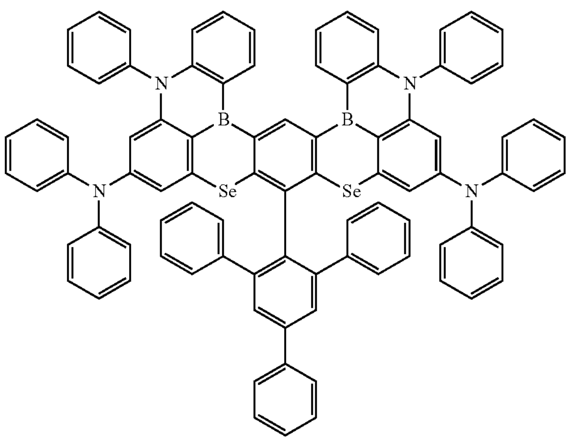
205
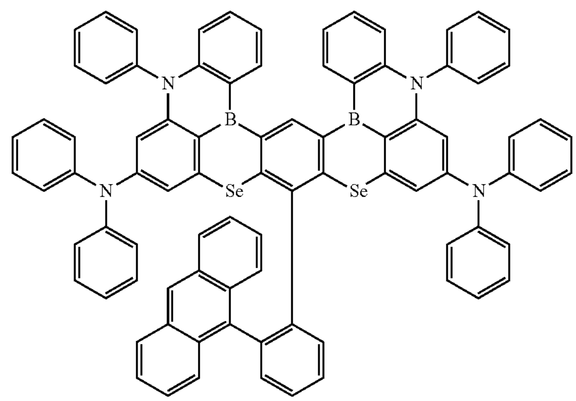
206
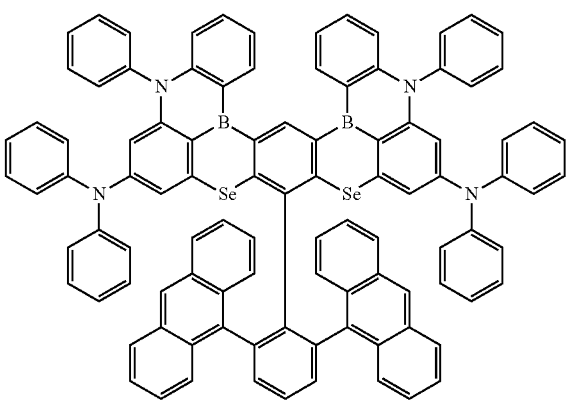
207
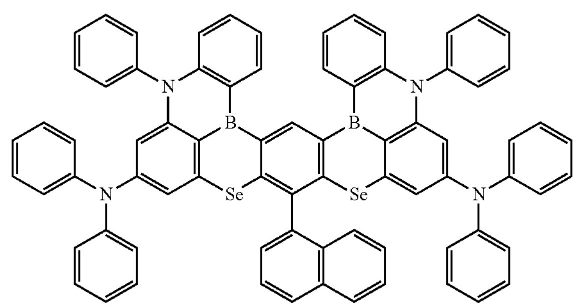
208
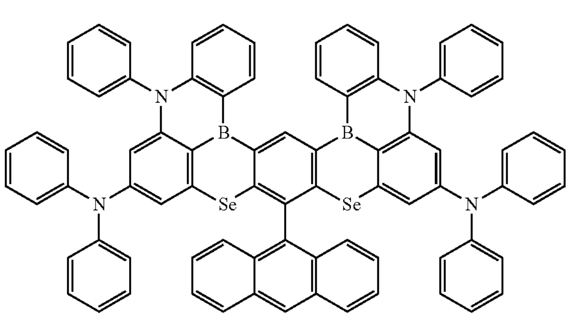
209
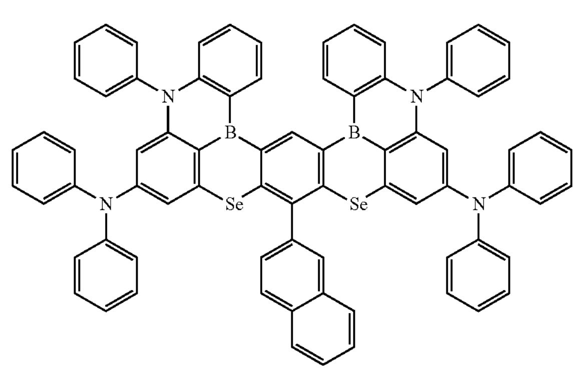

-continued
D-1
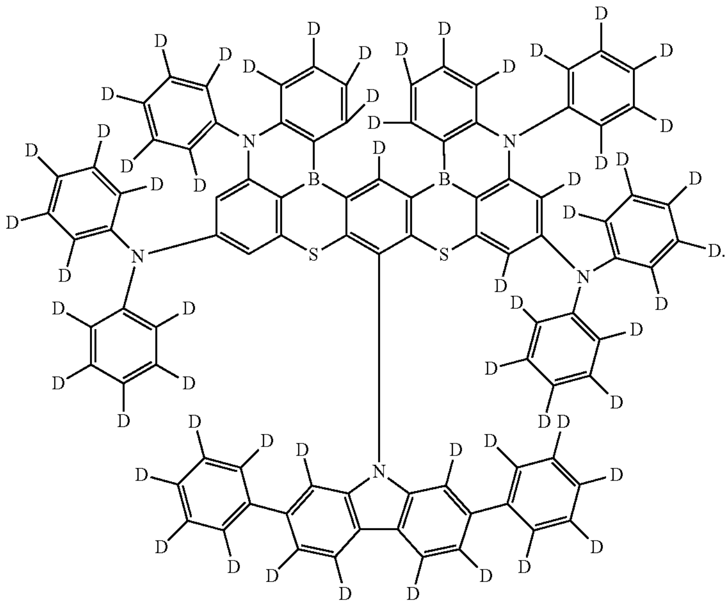
* * * * *